US012116377B2

(12) United States Patent
Park et al.

(10) Patent No.: US 12,116,377 B2
(45) Date of Patent: Oct. 15, 2024

(54) ORGANOMETALLIC COMPOUND, ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Hee-Jun Park, Paju-si (KR); Do-Han Kim, Paju-si (KR); Hye-Seung Kang, Paju-si (KR); Jae-Min Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 518 days.

(21) Appl. No.: 17/082,416

(22) Filed: Oct. 28, 2020

(65) Prior Publication Data

US 2021/0130382 A1 May 6, 2021

(30) Foreign Application Priority Data

Oct. 30, 2019 (KR) ........................ 10-2019-0136398

(51) Int. Cl.
*H01L 51/00* (2006.01)
*C07F 15/00* (2006.01)
(Continued)

(52) U.S. Cl.
CPC ....... *C07F 15/0006* (2013.01); *H10K 85/322* (2023.02); *H10K 85/346* (2023.02); *H10K 50/12* (2023.02)

(58) Field of Classification Search
CPC .................................................... H10K 85/322
See application file for complete search history.

(56) References Cited

U.S. PATENT DOCUMENTS

| | | | | |
|---|---|---|---|---|
| 9,231,218 | B2 | 1/2016 | Lin et al. | |
| 2006/0188745 | A1 * | 8/2006 | Liao | H10K 50/19 428/917 |

(Continued)

FOREIGN PATENT DOCUMENTS

| | | | |
|---|---|---|---|
| KR | 10-2018-0118559 | A | 10/2018 |
| KR | 10-2019-0000812 | | 1/2019 |

OTHER PUBLICATIONS

Cebrian et al., "Recent advances in phosphorescent platinum complexes for organic light-emitting diodes," Beilstein J. Org. Chem. 14:1459-1481, 2018.

(Continued)

*Primary Examiner* — Alexander C Kollias
(74) *Attorney, Agent, or Firm* — Morgan, Lewis & Bockius LLP

(57) ABSTRACT

The present disclosure provides an organometallic compound below and an organic light emitting diode and an organic light emitting display device including the organometallic compound.

(Continued)

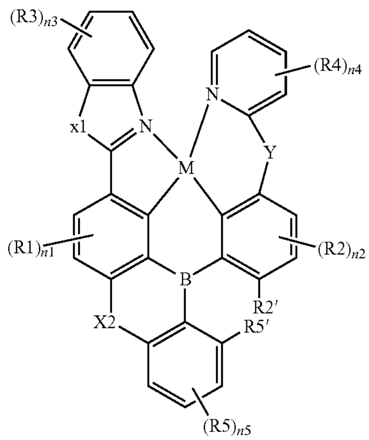

22 Claims, 7 Drawing Sheets

(51) Int. Cl.

| | |
|---|---|
| ***H10K 85/30*** | (2023.01) |
| *H10K 50/12* | (2023.01) |

(56) References Cited

U.S. PATENT DOCUMENTS

2014/0014922 A1* 1/2014 Lin .................... H10K 85/322 546/4
2014/0070196 A1* 3/2014 Kim .................... H10K 50/13 257/40
2014/0084269 A1* 3/2014 Weaver ................ H10K 50/131 257/40
2015/0188083 A1 7/2015 Jang
2016/0181350 A1* 6/2016 Lee .................... H10K 59/1315 438/34
2018/0166647 A1 6/2018 Shin et al.
2018/0305384 A1 10/2018 Chen et al.
2018/0375036 A1 12/2018 Chen et al.
2020/0168816 A1 5/2020 Jeon et al.
2020/0203634 A1 6/2020 Kim et al.
2020/0274079 A1 8/2020 Tsai et al.
2020/0388774 A1 12/2020 Tsai et al.

OTHER PUBLICATIONS

U.S. Office Action dated Mar. 2, 2023, in related technology U.S. Appl. No. 17/009,609.
Office Action dated Dec. 12, 2023, in related U.S. Appl. No. 17/009,609.

* cited by examiner

ORGANOMETALLIC COMPOUND, ORGANIC LIGHT EMITTING DIODE AND ORGANIC LIGHT EMITTING DEVICE INCLUDING THE SAME

CROSS-REFERENCE TO RELATED APPLICATIONS

The present application claims the benefit of Korean Patent Application No. 10-2019-0136398 filed in the Republic of Korea on Oct. 30, 2019, which is hereby incorporated by reference in its entirety.

BACKGROUND

Technical Field

The present disclosure relates to an organometallic compound, and more particularly, to an organometallic compound being capable of improving an emitting efficiency and a lifespan, and an organic light emitting diode and an organic light emitting device including the organometallic compound.

Discussion of the Related Art

Recently, requirement for flat panel display devices having small occupied area is increased. Among the flat panel display devices, a technology of an organic light emitting display device, which includes an organic light emitting diode (OLED) and may be called to as an organic electroluminescent device, is rapidly developed.

The OLED includes a cathode as an electron injection electrode, an anode as a hole injection electrode, and an organic emitting layer, which includes a host and a dopant, between the cathode and the anode. The OLED emits light by injecting electrons from a cathode as an electron injection electrode and holes from an anode as a hole injection electrode into an emitting material layer, combining the electrons with the holes, generating an exciton, and transforming the exciton from an excited state to a ground state. A flexible transparent substrate, for example, a plastic substrate, can be used as a base substrate where elements are formed. In addition, the organic light emitting diode can be operated at a voltage (e.g., 10V or below) lower than a voltage required to operate other display devices and has low power consumption. Moreover, the light from the organic light emitting diode has excellent color purity.

The dopant may be classified into a fluorescent material and a phosphorescent material.

In the related art fluorescent material, only singlet exciton is involved in the emission such that the related art fluorescent material has low emitting efficiency. In the phosphorescent material, both the singlet exciton and the triplet exciton are involved in the emission such that the phosphorescent material has higher emitting efficiency than the fluorescent material. However, the metal complex compound, which is a typical phosphorescent material, has a short emitting lifespan and thus has a limitation in commercialization. It is necessary to develop a compound having improved emitting efficiency and lifespan.

SUMMARY

The embodiments of the present disclosure are directed to an organometallic compound, an OLED and an organic light emitting device that substantially obviate one or more of the problems associated with the limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages in accordance with the purpose of the embodiments of the present disclosure, as described herein, an aspect of the present disclosure is an organometallic compound of Formula 1:

[Formula 1]

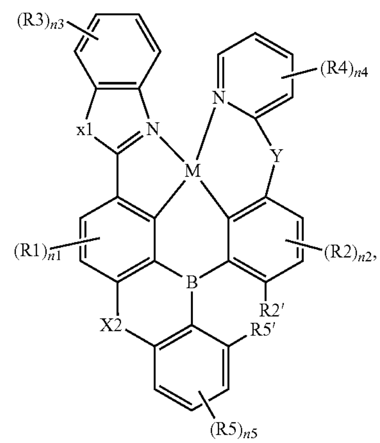

wherein M is platinum (Pt) or palladium (Pd), and each of X1 and X2 is independently selected from the group consisting of oxygen (O), sulfur (S) or NR6, wherein Y is selected from the group consisting of a single bond, *—O—*, *—S—*, *—Se—*, *—CR7R8-*, *—CR7=CR8-*, *—NR9-*, *—C(═O)—*, *—S(═O)—*, *—$S(═O)_2$—* and *—SiR7R8-*, wherein each of R1 to R9, R2' and R5' is independently selected from the group consisting of deuterium, halogen, hydroxy group, cyano group, nitro group, amidino group, hydrazine group, hydrazone group, C1 to C20 alkyl group, C2 to C20 alkenyl group, C2~C20 alkynyl group, C1~C20 alkoxy group, C3~C20 alicyclic, C3~C20 heteroalicyclic, and C6~C30 aromatic and C3~C30 heteroaromatic, or adjacent two of R1 to R9, R2' and R5' are combined with each other to form a fused ring, and wherein each of n1, n2, and n5 is independently an integer of 0 to 2, and each of n3 and n4 is independently an integer of 0 to 4.

Another aspect of the present disclosure is an organic light emitting diode including a first electrode; a second electrode facing the first electrode; a first emitting unit positioned between the first and second electrodes and including a first emitting material layer, wherein the first emitting material layer includes an organometallic compound of Formula 1:

[Formula 1]

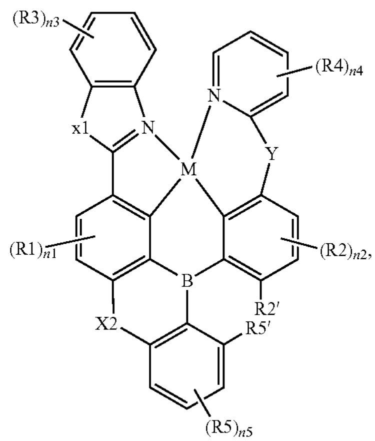

wherein M is platinum (Pt) or palladium (Pd), and each of X1 and X2 is independently selected from the group consisting of oxygen (O), sulfur (S) or NR6, wherein Y is selected from the group consisting of a single bond, *—O—*, *—S—*, *—Se—*, *—CR7R8-*, *—CR7=CR8-*, *—NR9-*, *—C(=O)—*, *—S(=O)—*, *—S(=O)$_2$—* and *—SiR7R8-*, wherein each of R1 to R9, R2' and R5' is independently selected from the group consisting of deuterium, halogen, hydroxy group, cyano group, nitro group, amidino group, hydrazine group, hydrazone group, C1 to C20 alkyl group, C2 to C20 alkenyl group, C2~C20 alkynyl group, C1~C20 alkoxy group, C3~C20 alicyclic, C3~C20 heteroalicyclic, and C6~C30 aromatic and C3~C30 heteroaromatic, or adjacent two of R1 to R9, R2' and R5' are combined with each other to form a fused ring, and wherein each of n1, n2, and n5 is independently an integer of 0 to 2, and each of n3 and n4 is independently an integer of 0 to 4.

Another aspect of the present disclosure is an organic light emitting display device including a substrate; an organic light emitting diode disposed on or over the substrate, the organic light emitting diode including: a first electrode; a second electrode facing the first electrode; a first emitting unit positioned between the first and second electrodes and including a first emitting material layer; and a thin film transistor positioned between the substrate and the organic light emitting diode and connected to the organic light emitting diode, wherein the first emitting material layer includes an organometallic compound of Formula 1:

[Formula 1]

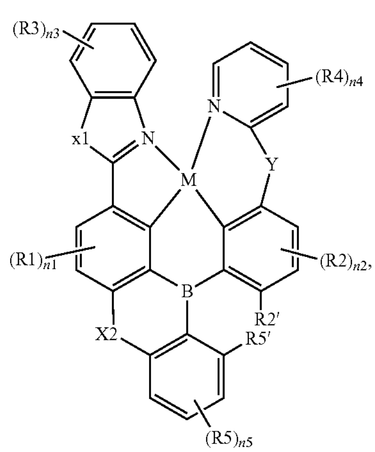

wherein M is platinum (Pt) or palladium (Pd), and each of X1 and X2 is independently selected from the group consisting of oxygen (O), sulfur (S) or NR6, wherein Y is selected from the group consisting of a single bond, *—O—*, *—S—*, *—Se—*, *—CR7R8-*, *—CR7=CR8-*, *—NR9-*, *—C(=O)—*, *—S(=O)—*, *—S(=O)$_2$—* and *—SiR7R8-*, wherein each of R1 to R9, R2' and R5' is independently selected from the group consisting of deuterium, halogen, hydroxy group, cyano group, nitro group, amidino group, hydrazine group, hydrazone group, C1 to C20 alkyl group, C2 to C20 alkenyl group, C2~C20 alkynyl group, C1~C20 alkoxy group, C3~C20 alicyclic, C3~C20 heteroalicyclic, and C6~C30 aromatic and C3~C30 heteroaromatic, or adjacent two of R1 to R9, R2' and R5' are combined with each other to form a fused ring, and wherein each of n1, n2, and n5 is independently an integer of 0 to 2, and each of n3 and n4 is independently an integer of 0 to 4.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain the principles of the present disclosure.

DETAILED DESCRIPTION

Figure 1:
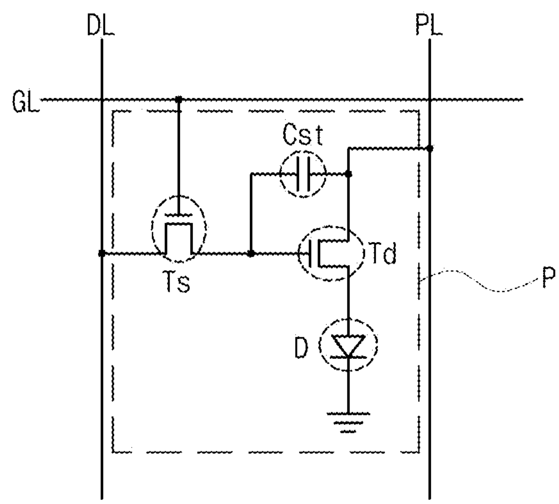
FIG. 1 is a schematic circuit diagram of an organic light emitting display device of the present disclosure.

Reference will now be made in detail to some of the examples and preferred embodiments, which are illustrated in the accompanying drawings.

The organometallic compound (organic metal compound) of the present disclosure has a rigid chemical structure and provides improved emitting efficiency and emitting lifespan. The organometallic compound of the present disclosure is represented by Formula 1.

[Formula 1]

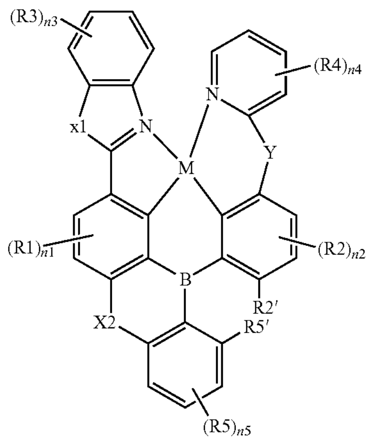

In Formula 1, M is platinum (Pt) or palladium (Pd), and each of X1 and X2 is independently selected from the group consisting of oxygen (O), sulfur (S) or NR6. Y is selected from the group consisting of a single bond, *—O—*, *—S—*, *—Se—*, *—CR7R8-*, *—CR7=CR8-*, *—NR9-*, *—C(═O)—*, *—S(═O)—*, *—S(═O)$_2$—* and *—SiR7R8-*. In addition, each of R1 to R9, R2' and R5' is independently selected from the group consisting of deuterium, halogen, hydroxy group, cyano group, nitro group, amidino group, hydrazine group, hydrazone group, C1 to C20 alkyl group, C2 to C20 alkenyl group, C2~C20 alkynyl group, C1~C20 alkoxy group, C3~C20 alicyclic, C3~C20 heteroalicyclic, and C6~C30 aromatic and C3~C30 heteroaromatic, or adjacent two of R1 to R9, R2' and R5' may be combined with each other to form a fused ring. Each of n1, n2, and n5 is independently an integer of 0 to 2, and each of n3 and n4 is independently an integer of 0 to 4.

When each of n1 to n5 is an integer of 1 or more, adjacent two of R1 to R9 may be combined with each other to form a fused ring. For example, when n1 is 2, two adjacent R1 may be combined with each other to form a fused ring.

For example, the fused ring may be a C5 to C20 aromatic ring, a C5 to C20 alicyclic ring, a C4 to C20 heteroalicyclic ring, or a C4 to C20 heteroaromatic ring. Further, each of the aromatic ring, alicyclic ring, heteroalicyclic ring, and heteroaromatic ring may be substituted.

Alkyl group, alkenyl group, alkynyl group, alkoxy group, alicyclic, heteroalicyclic, aromatic and heteroaromatic may be substituted. In this case, the substituent may be one of a halogen, an alkyl group, an alkoxy group, an alkyl silyl group, and an aryl silyl group, but it is not limited thereto.

In Formula 1, when R1 to R9, R2' and R5' are a C6 to C30 aromatic group, each of R1 to R9, R2' and R5' may independently be a C6 to C30 aryl group, an aralkyl group, an aryloxy group, an aryl amino group, and the like. For example, when R1 to R9, R2' and R5' are a C6 to C30 aryl group, the aryl group may be one of phenyl, biphenyl, terphenyl, naphthyl, and anthracenyl.

In addition, in Formula 1, when R1 to R9, R2' and R5' are a C3 to C30 heteroaromatic group, each of R1 to R9, R2' and R5' may independently be a C3 to C30 heteroaryl group, a heteroaralkyl group, a heteroaryloxy group, a heteroaryl amino group, and the like. For example, when R1 to R9, R2' and R5' are a C3 to C30 heteroaryl group, the heteroaryl group may independently be one of pyridinyl, pyrimidinyl, pyrazinyl, triazinyl, imidazolyl, pyrazolyl, carbazolyl, quinolinyl, acridinyl, phenanthrolinyl, furanyl, triazolyl, benzofuranyl, dibenzofuranyl, and dibenzothiophenyl.

The organometallic compound having the structure of Formula 1 includes platinum or palladium having a planar square structure as a central coordination metal and a ligand in which a plurality of aromatic rings and/or a plurality of heteroaromatic rings are fused. Since the central coordination metal has the planar square structure, the number of d orbitals involved in the bond between a metal and a ligand is reduced. Accordingly, the organometallic compound provides narrow full-width at half maximum (FWHM) in the emission spectrum. In particular, since the organometallic compound has a rigid chemical structure, it is possible to stably maintain a good luminescence lifespan without rotating the chemical structure during the luminescence. In addition, since the emission spectrum of the metal compound according to the present disclosure can be limited to a specific range by the emission of excitons, the color purity is improved.

In addition, the organometallic compound of the present disclosure is a heteropleptic metal complex with different bidentate ligands bound to the central metal.

Emission color purity and emission color can be easily controlled by binding of different bidentate ligands. In addition, it is possible to adjust the color purity or emission peak by introducing various substituents to each ligand. The organometallic compound having the structure of Formula 1 may emit green light or yellow-green light, and the emitting efficiency of the OLED including the organometallic compound is improved.

In Formula 1, R2' and R5' may be combined to form a fused ring. Namely, the organometallic compound of Formula 1 may be represented by Formula 2.

[Formula 2]

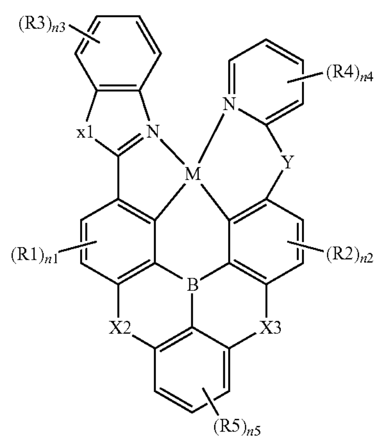

In Formula 2, X1, X2, R1 to R9, and n1 to n5 are the same as defined in Formula 1.

In addition, X3 may be one of NR10, O, S, and CR11R12, and each of R10 to R12 is independently selected from the group consisting of deuterium, halogen, hydroxy group, cyano group, nitro group, amidino group, hydrazine group, hydrazone group, C1~C20 alkyl group, C2~C20 alkenyl group, C2~C20 alkynyl group, C1~C20 alkoxy group, C3~C20 cycloaliphatic group, C3~C20 heteroalicyclic group, C6~C30 aromatic group and C3~C30 heteroaromatic group. For example, X2 and X3 may be oxygen.

On the other hand, in Formula 1, Y may be one of a single bond, *—O—*, and *—NR9-*, and R9 may be combined with R2 to form a fused ring. Namely, the organometallic compound of Formula 1 may be represented by one of Formulas 3-1 to 3-3.

[Formula 3-1]

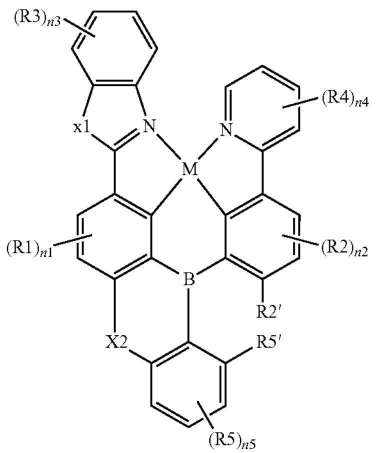

[Formula 3-2]

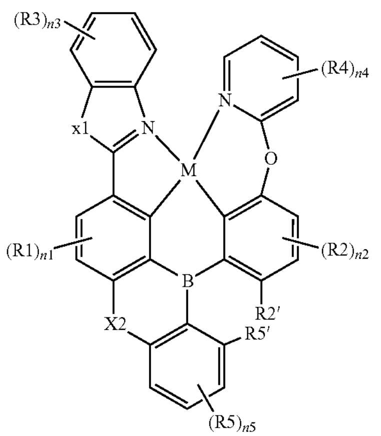

[Formula 3-3]

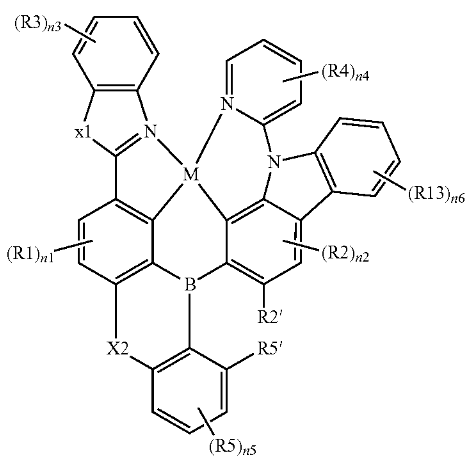

In Formulas 3-1 to 3-3, X1, X2, R1 to R6, R2', R5' and n1 to n5 are the same as defined in Formula 1.

In addition, R13 is selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3~C20 alicyclic group, C3~C20 heteroalicyclic group, C6~C30 aromatic and C3~C30 heteroaromatic group, and n6 is an integer of 0 to 4.

In Formulas 3-1 to 3-3, R2' and R5' may be combined to form a fused ring. Namely, the organometallic compound of Formulas 3-1 to 3-3 may be represented by Formulas 4-1 to 4-3.

[Formula 4-1]

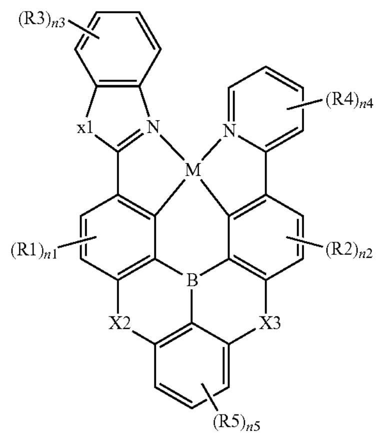

[Formula 4-2]

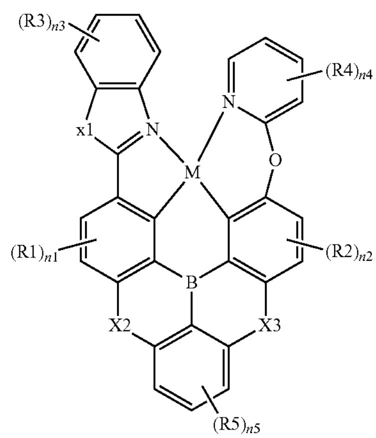

[Formula 4-3]

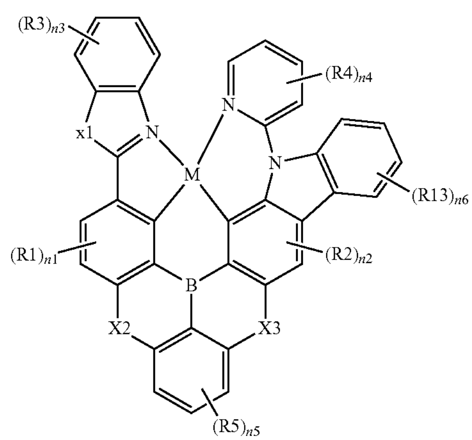

In Formulas 4-1 to 4-3, X1, X2, R1 to R6, and n1 to n5 are the same as defined in Formula 1.

In Formulas 4-1 to 4-3, X3 is one of NR10, O, S and CR11R12, and each of R10 to R12 is independently selected from the group consisting of deuterium, halogen, hydroxy group, cyano group, nitro group, amidino group, hydrazine group, hydrazone group, C1~C20 alkyl group, C2~C20 alkenyl group, C2~C20 alkynyl group, C1~C20 alkoxy group, C3~C20 alicyclic group, C3~C20 heteroalicyclic group, C6~C30 aromatic group and C3~C30 heteroaromatic group.

In addition, R13 is selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3~C20 alicyclic group, C3~C20 heteroalicyclic group, C6~C30 aromatic and C3~C30 heteroaromatic group, and n6 is an integer of 0 to 4.

For example, the organometallic compound of the present disclosure may be one of compounds in Formula 5.

[Formula 5]

1

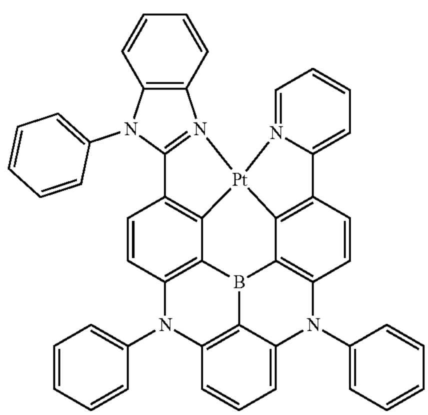

2

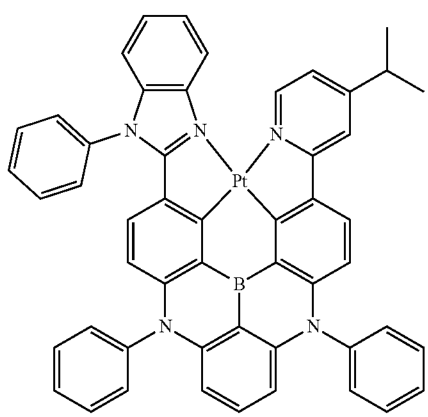

-continued

3

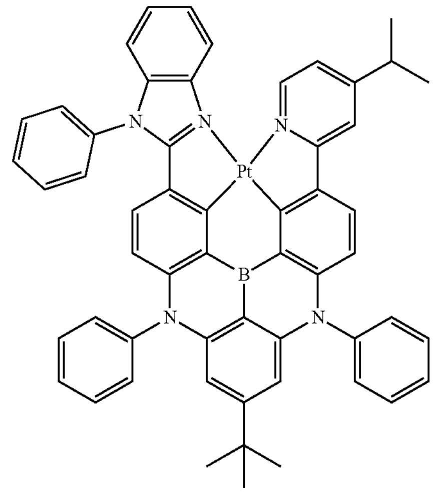

4

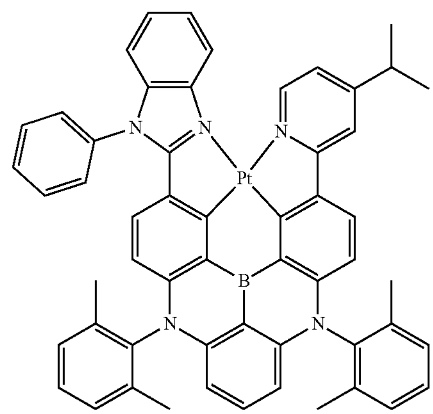

5

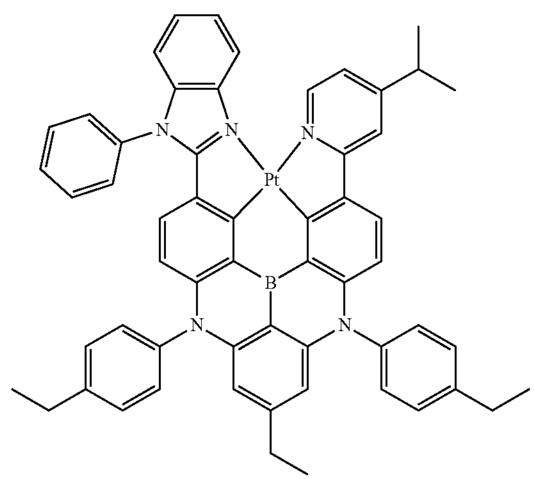

-continued
6
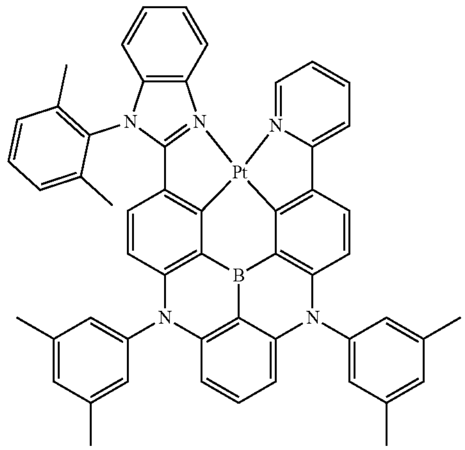
7
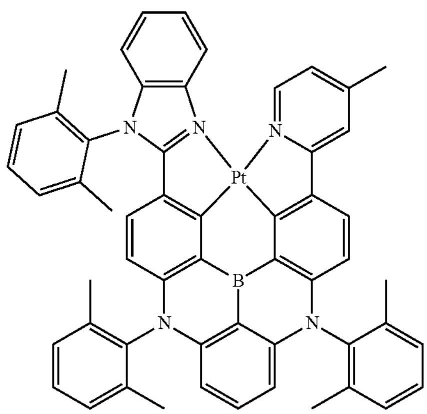
8
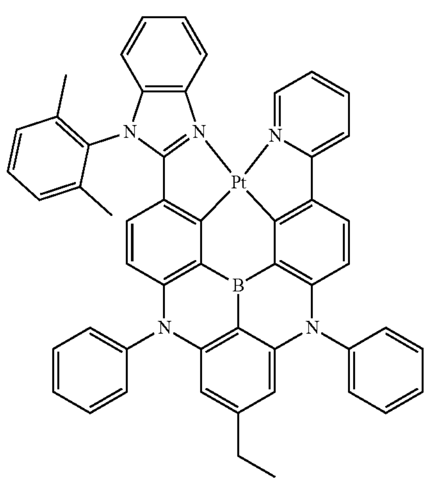
-continued
9
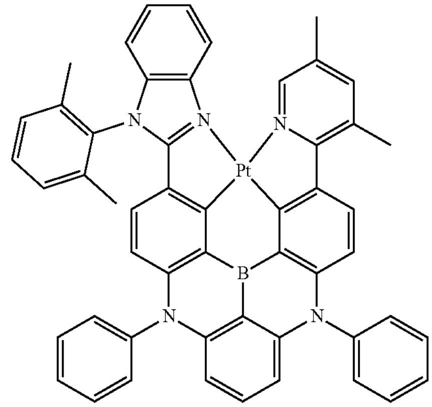
10
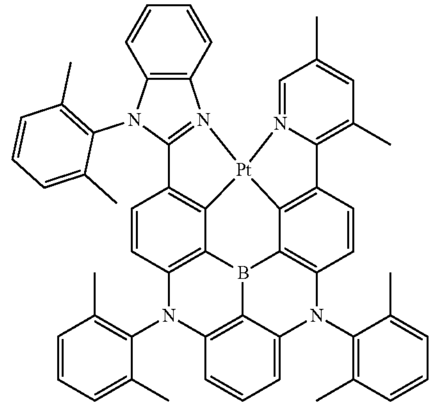
11
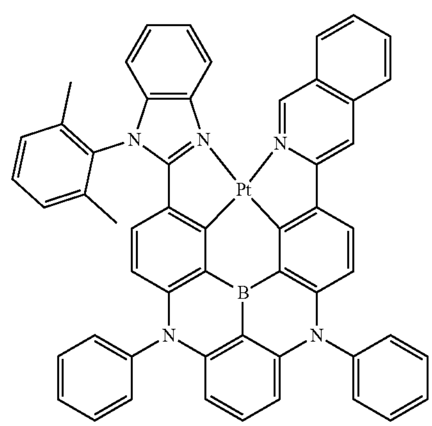
12
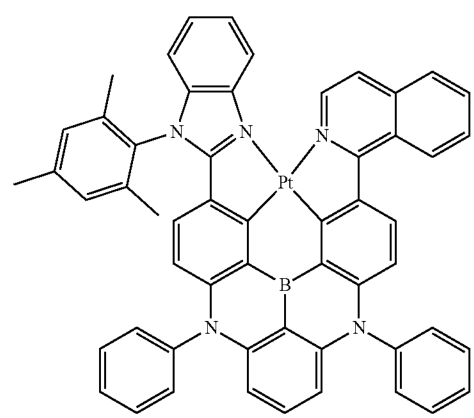

-continued
13
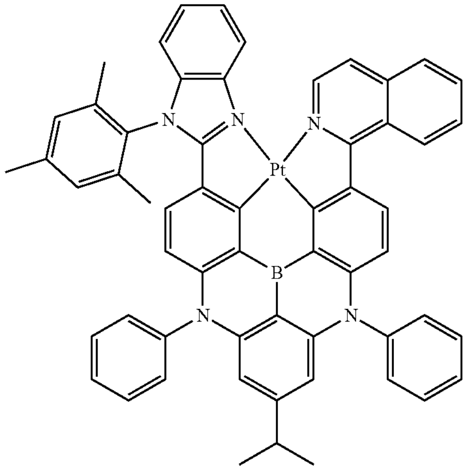
14
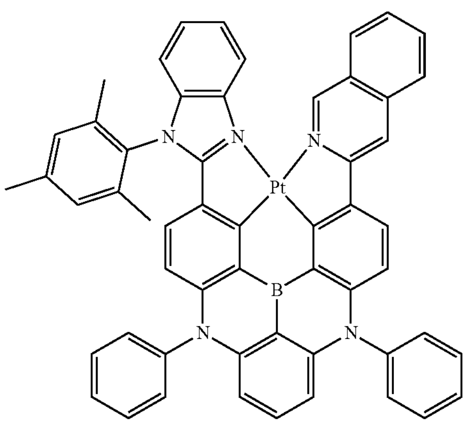
15
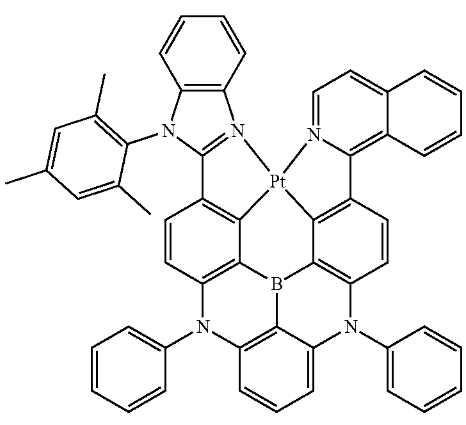
-continued
16
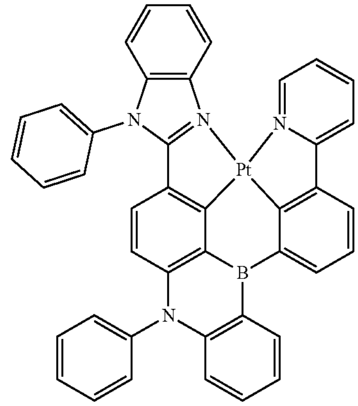
17
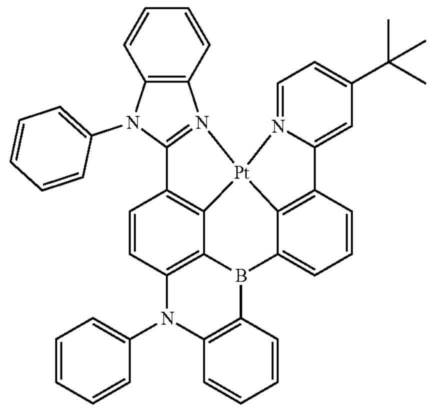
18
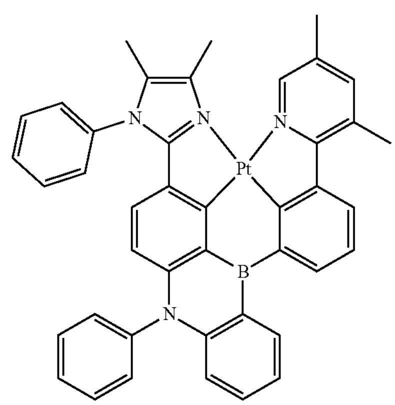
19
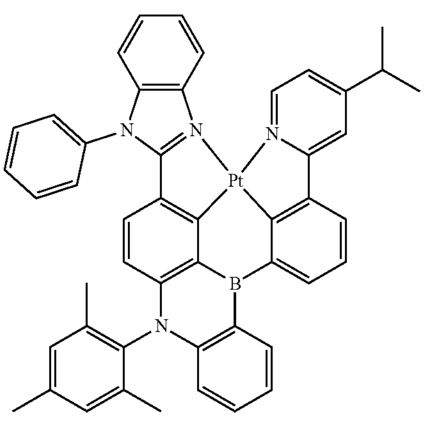

-continued
20
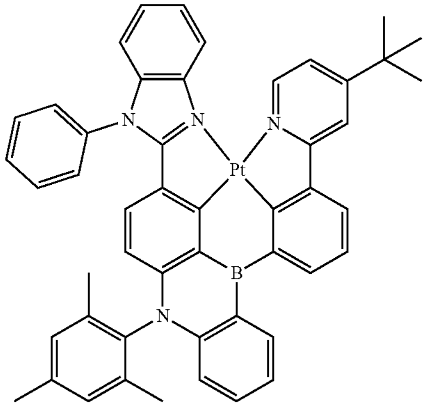
21
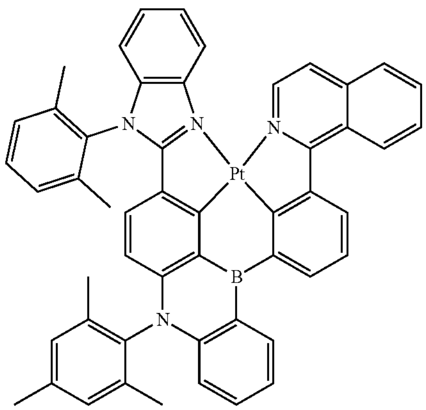
22
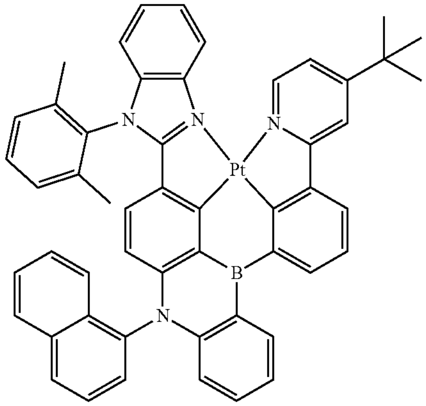
23
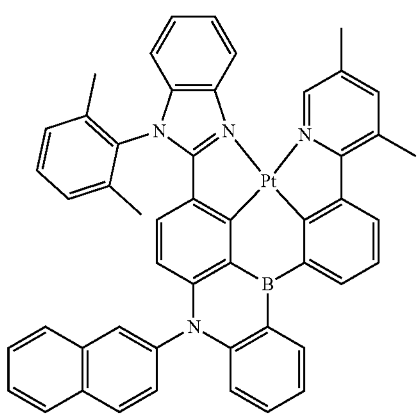
-continued
24
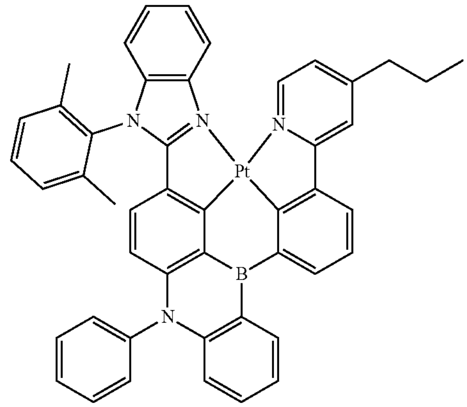
25
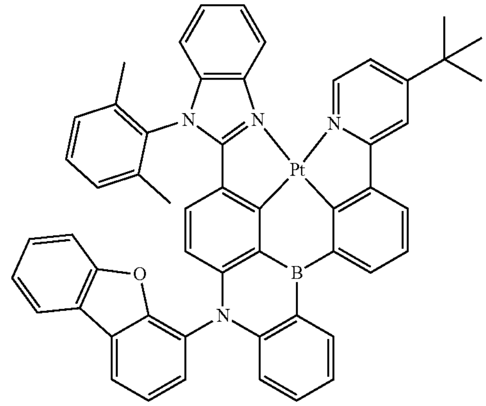
26
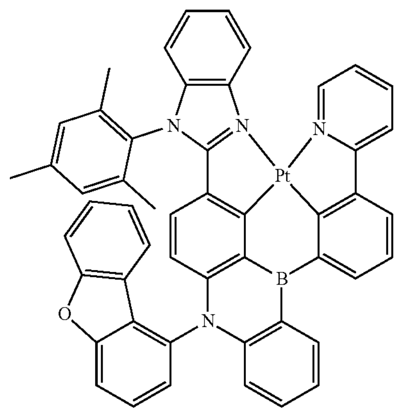
27
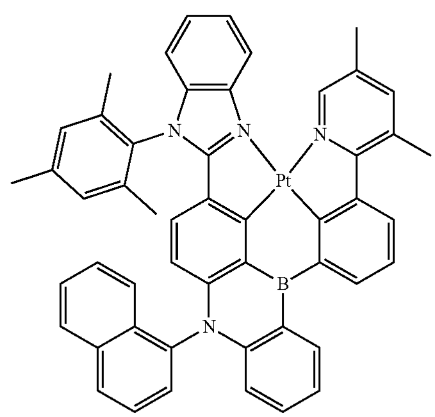

-continued
28
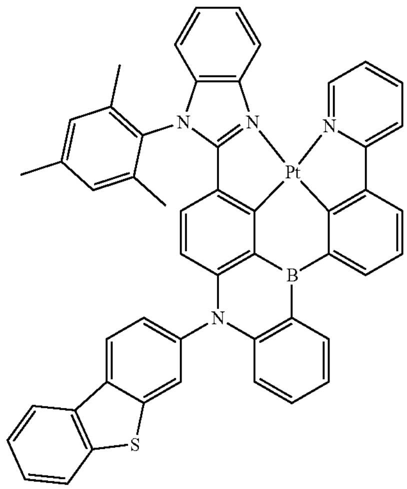
29
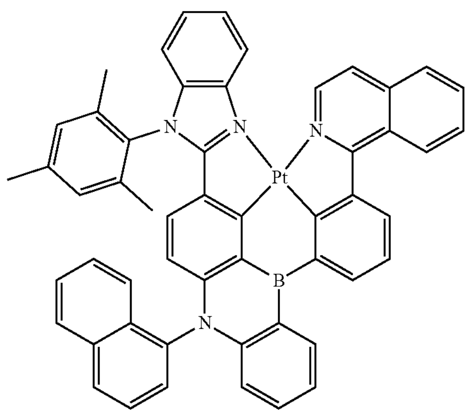
30
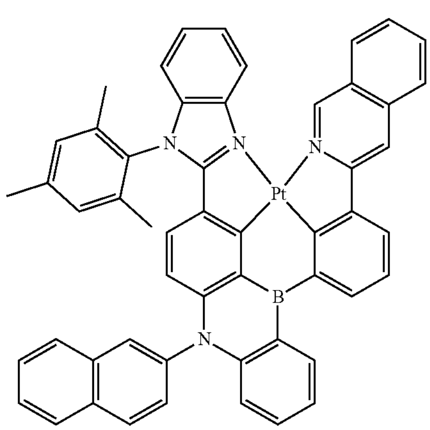
-continued
31
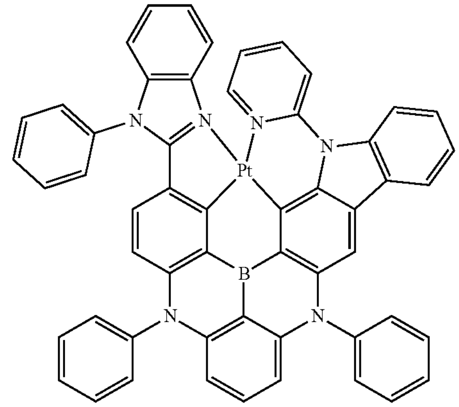
32
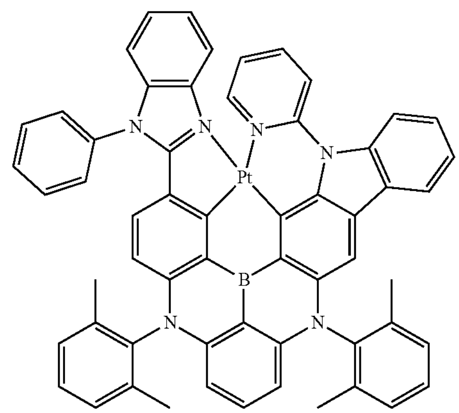
33
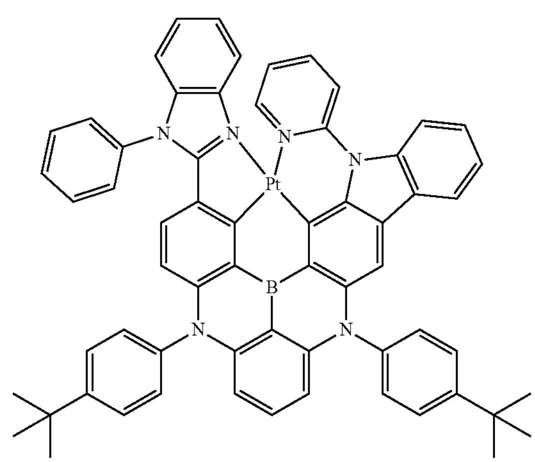

-continued
34
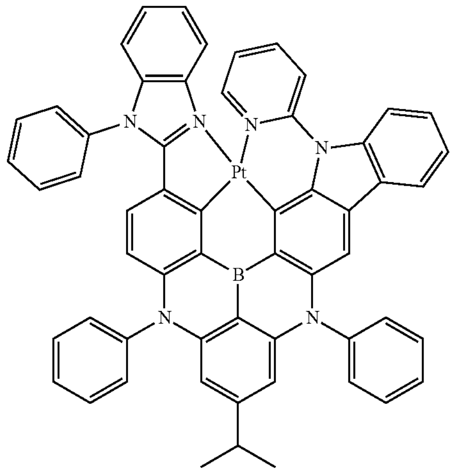
35
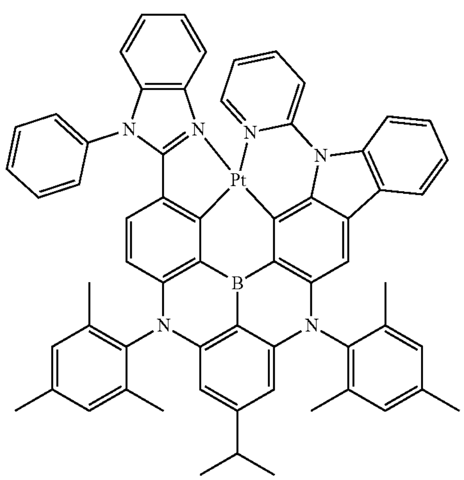
36
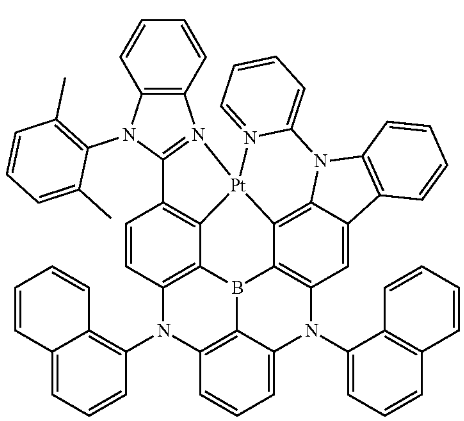
-continued
37
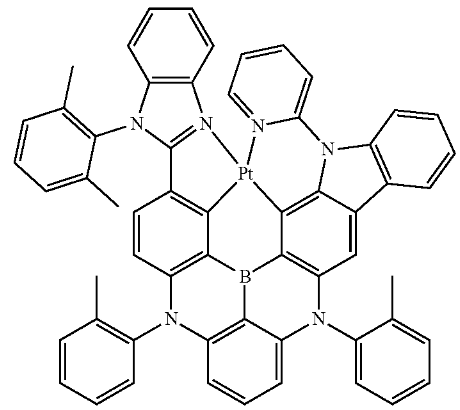
38
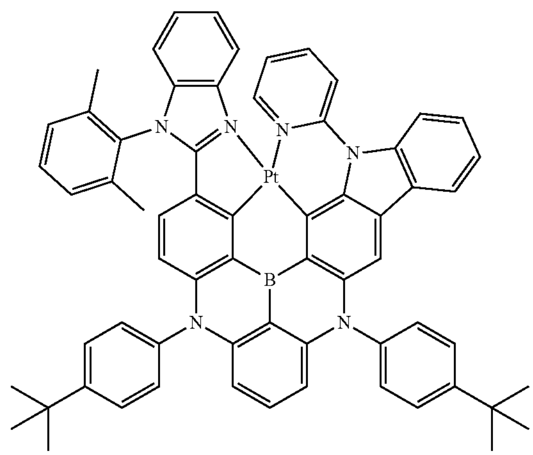
39
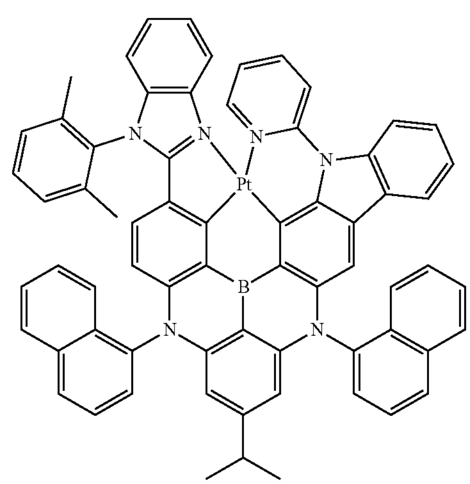

-continued
40
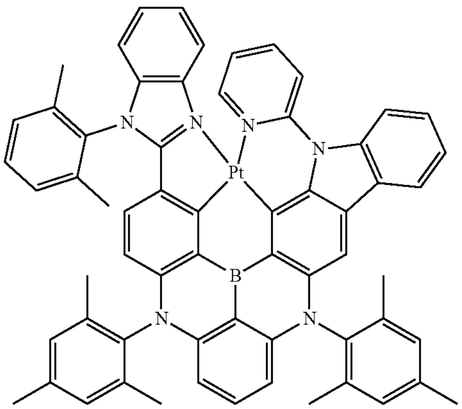
41
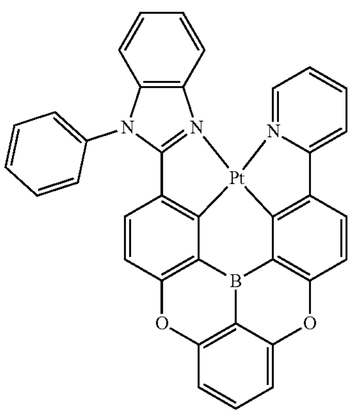
42
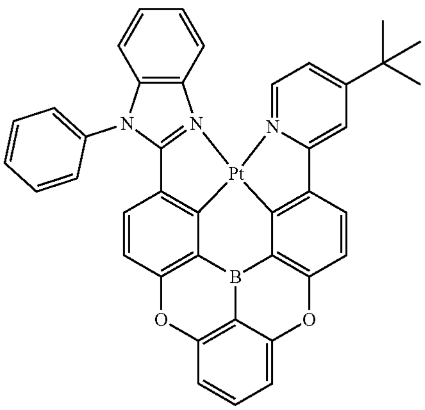
-continued
43
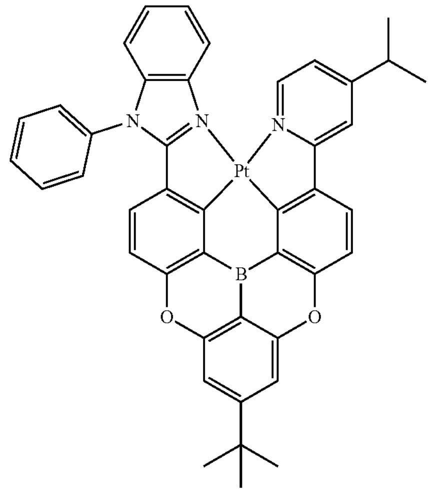
44
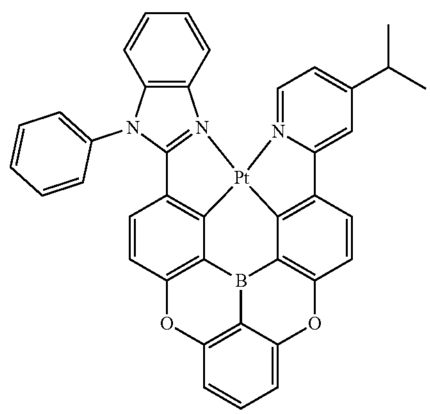
45
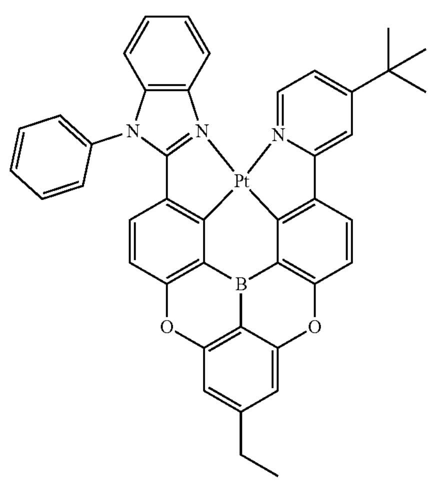

-continued
46
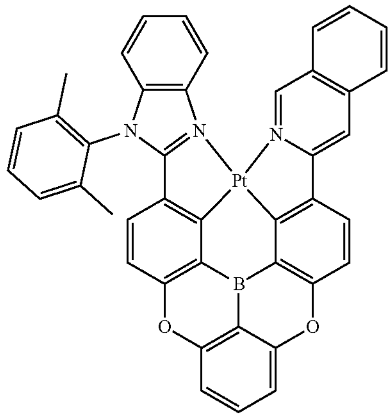
47
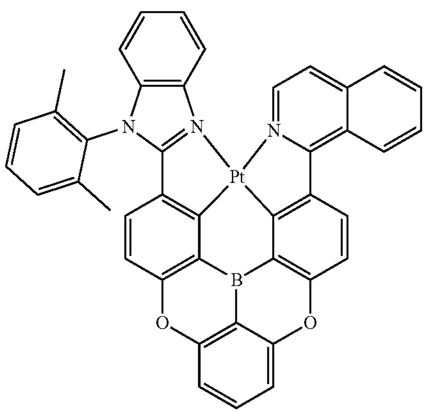
48
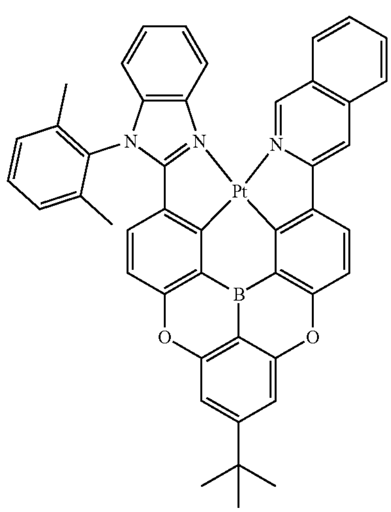
-continued
49
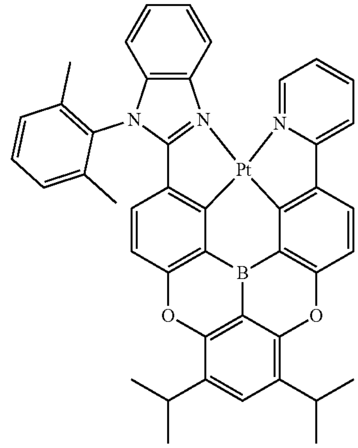
50
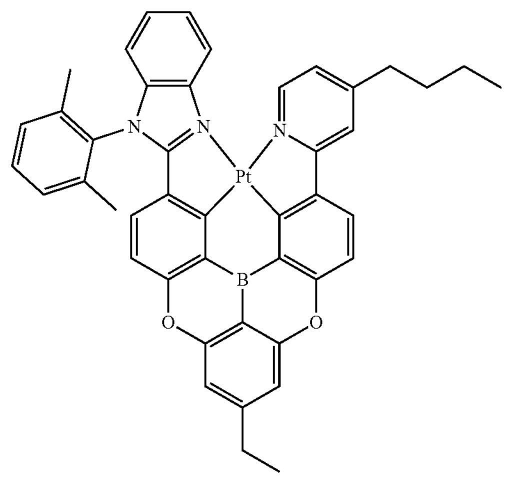
51
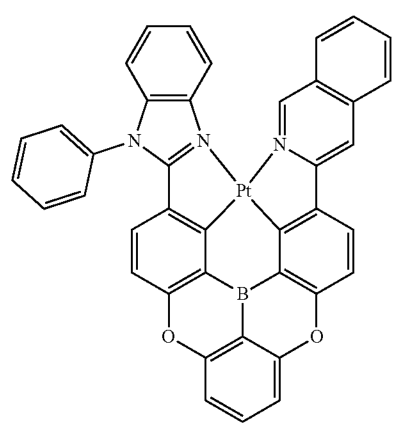

-continued
52
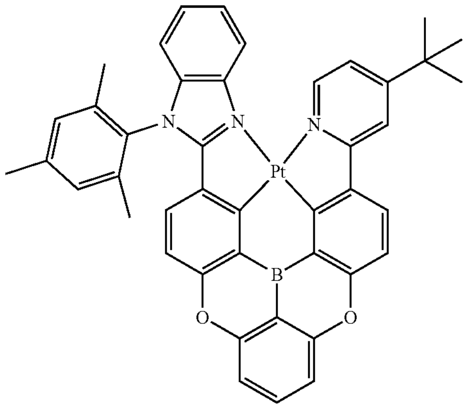
53
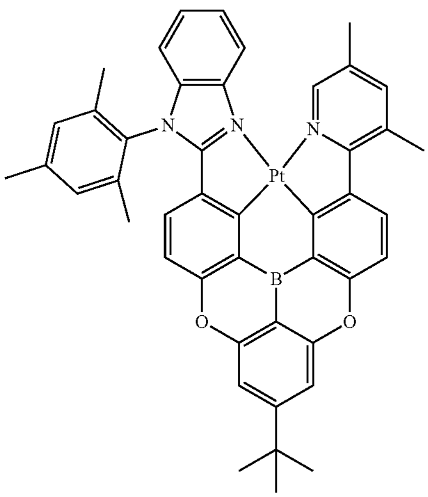
54
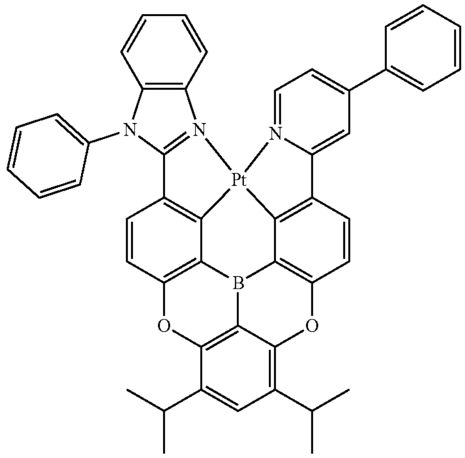
-continued
55
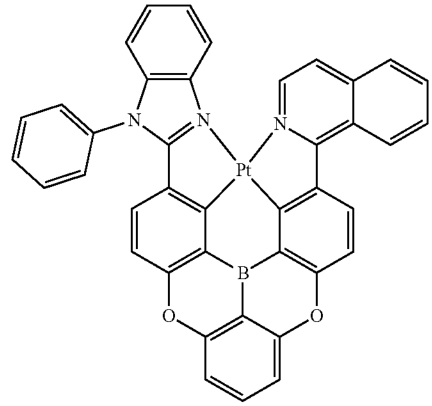
56
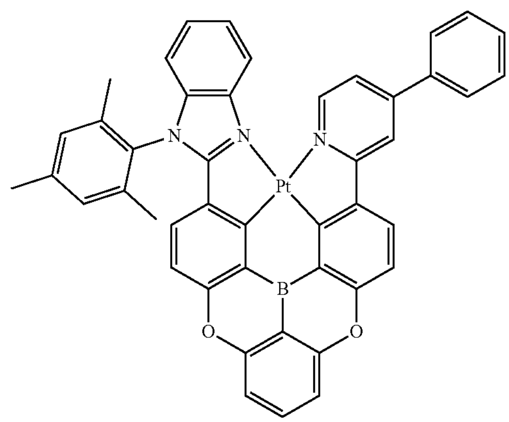
57
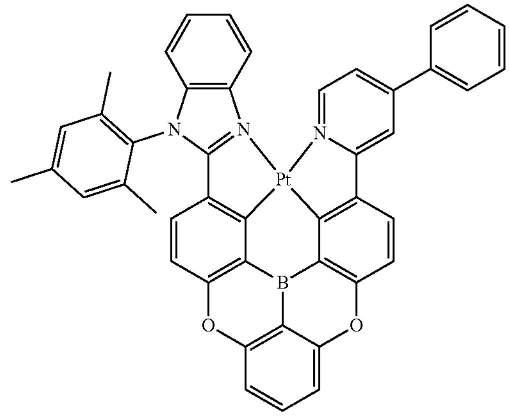

-continued
58
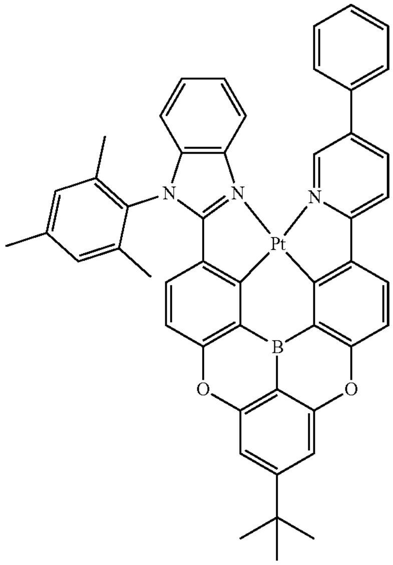
59
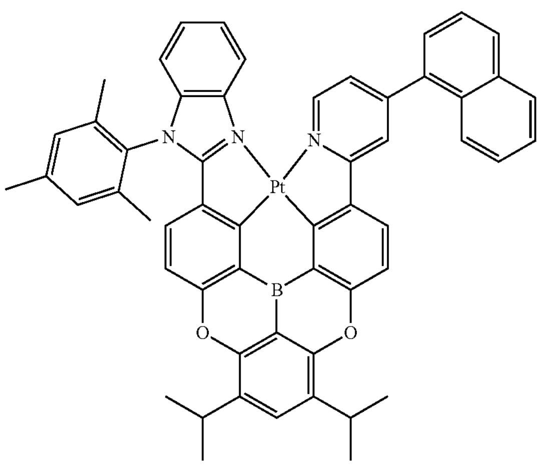
60
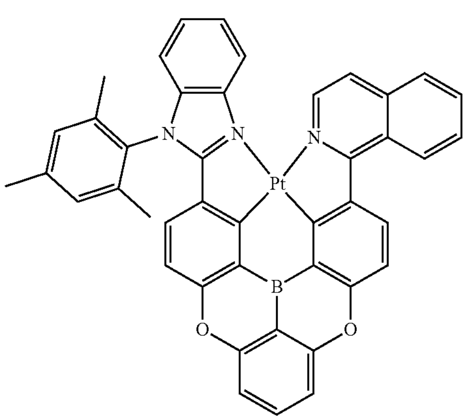
-continued
61
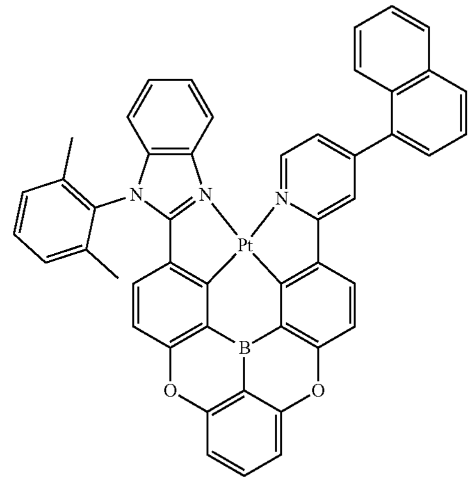
62
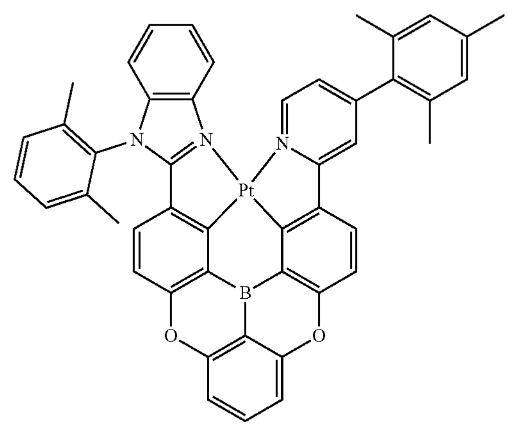
63
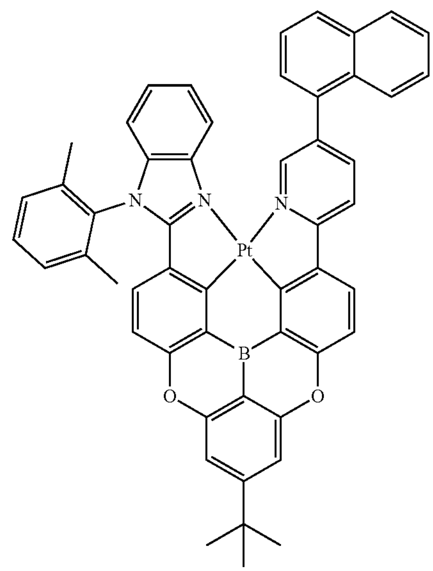

64
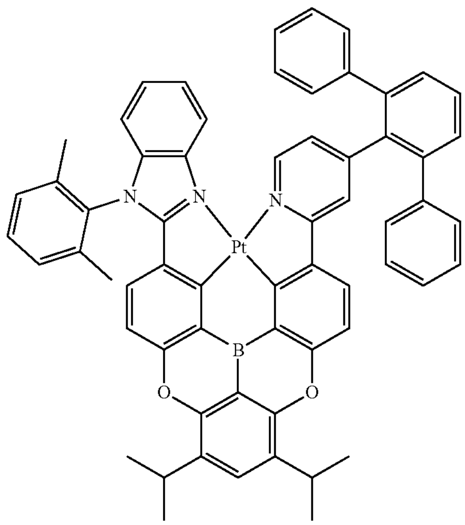
65
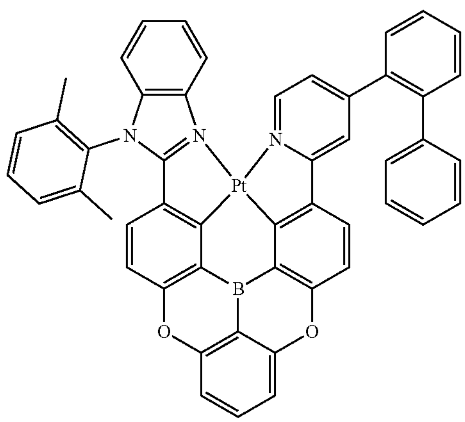
66
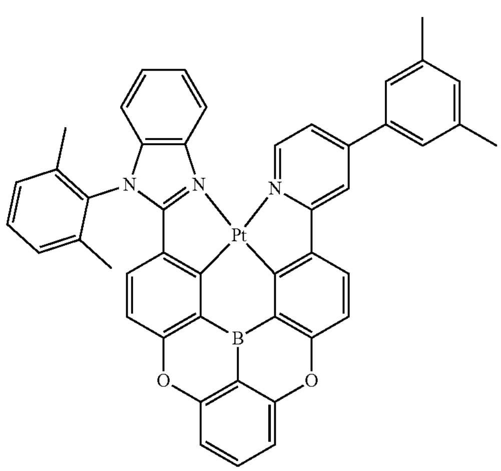
67
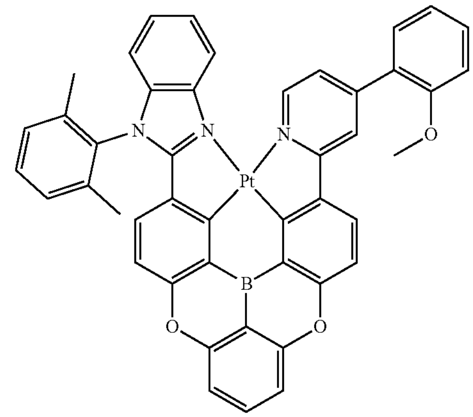
68
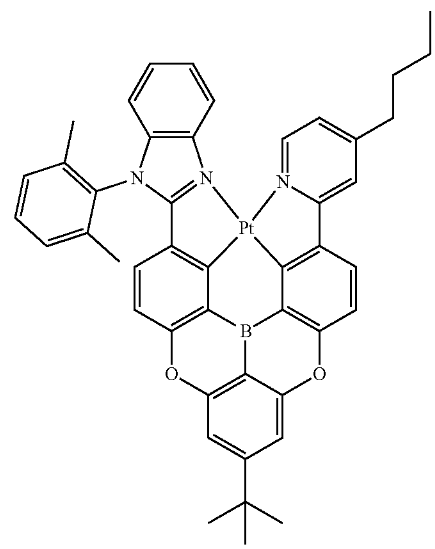
69
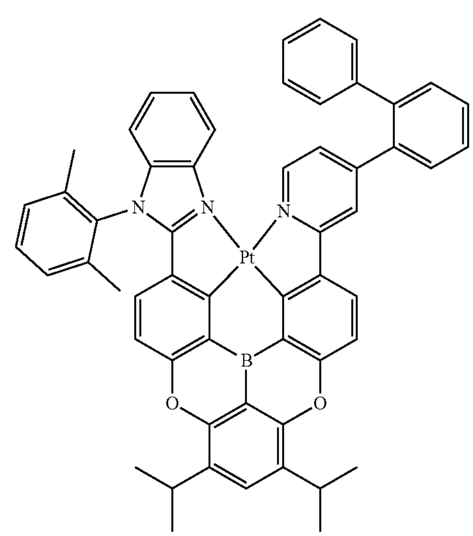

-continued
70
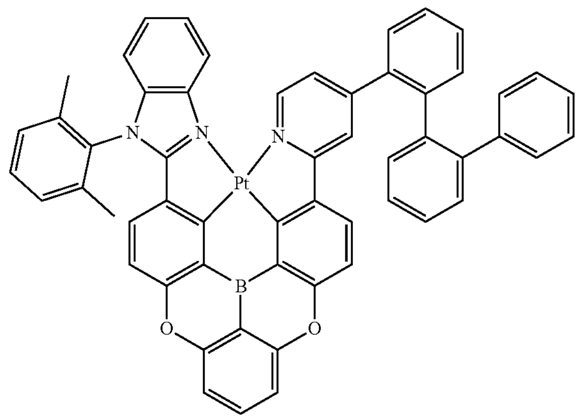
71
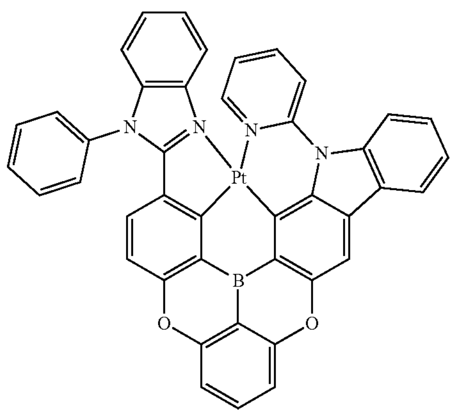
72
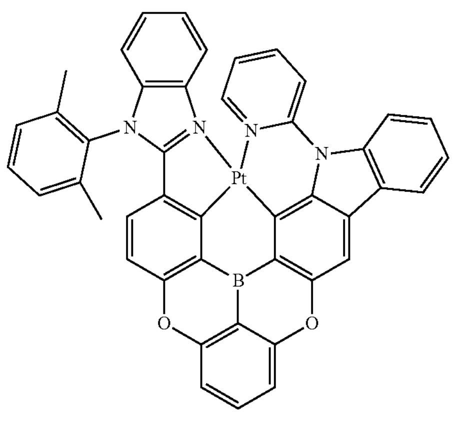
-continued
73
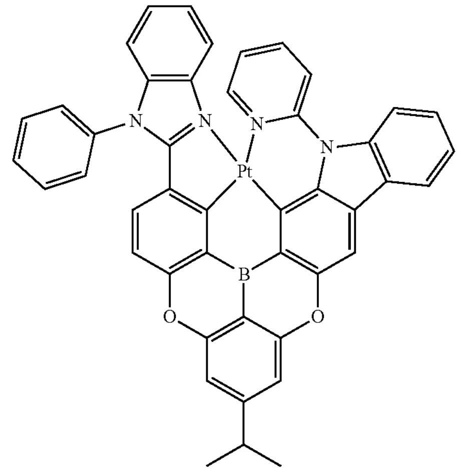
74
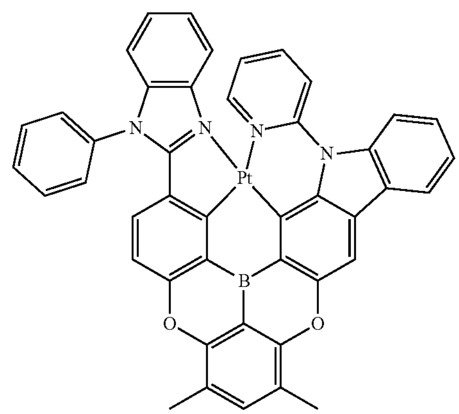
75
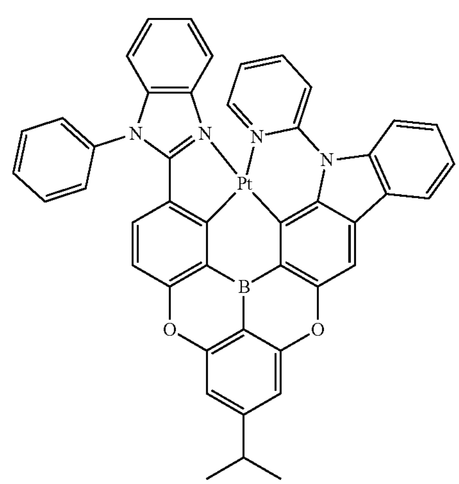

-continued
76
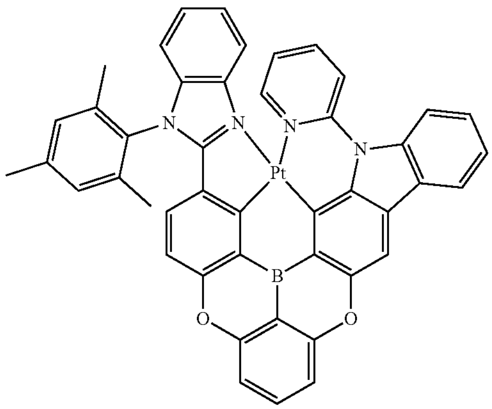
77
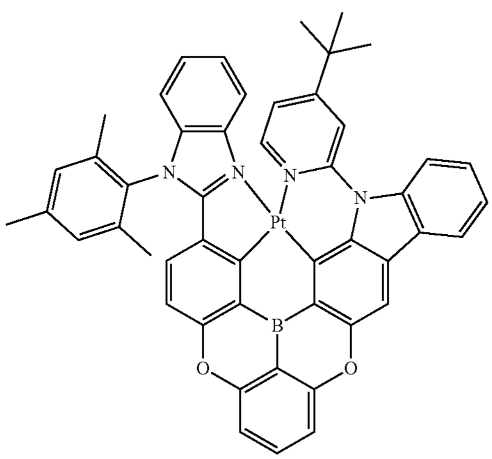
78
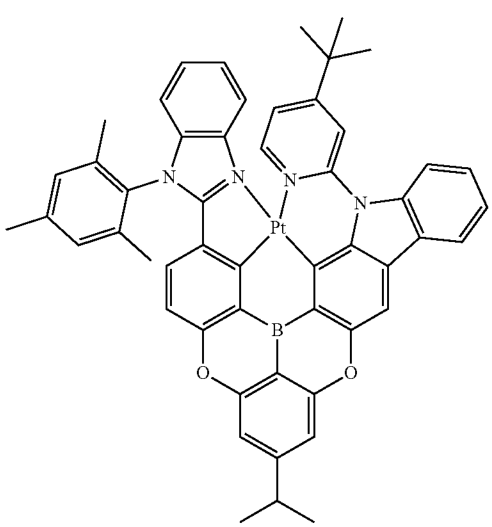
-continued
79
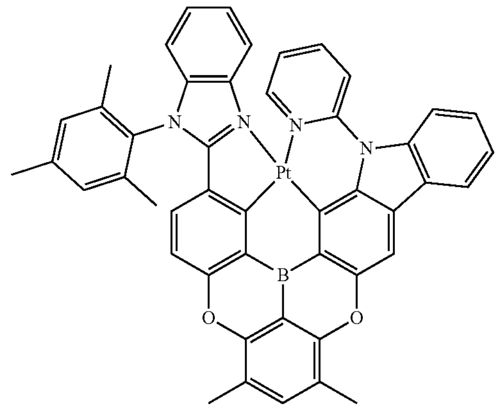
80
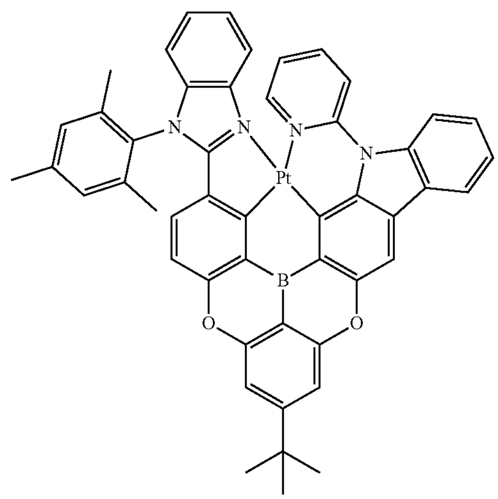
81
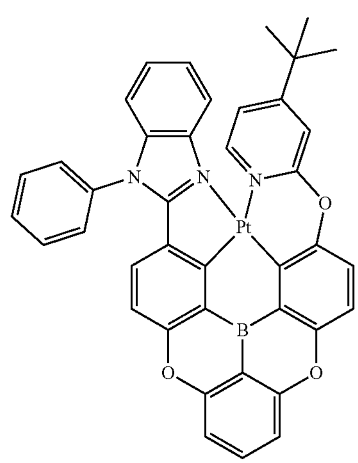

-continued
82
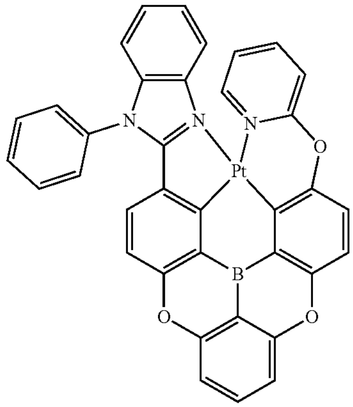
83
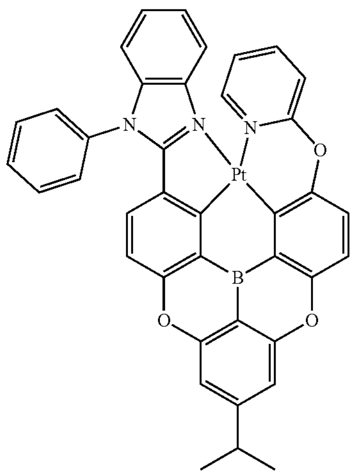
84
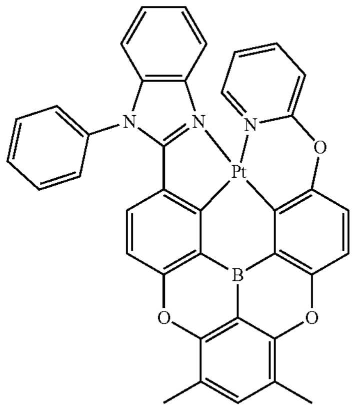
-continued
85
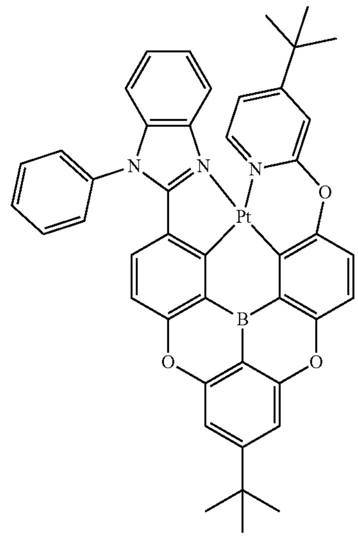
86
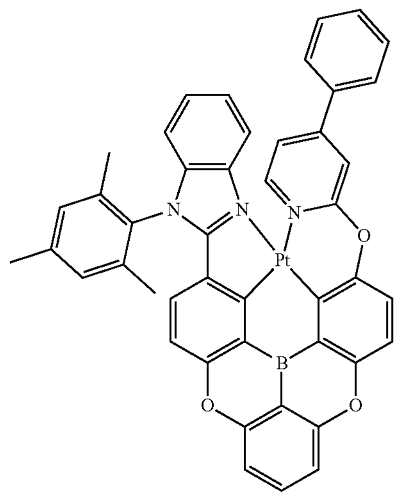
87
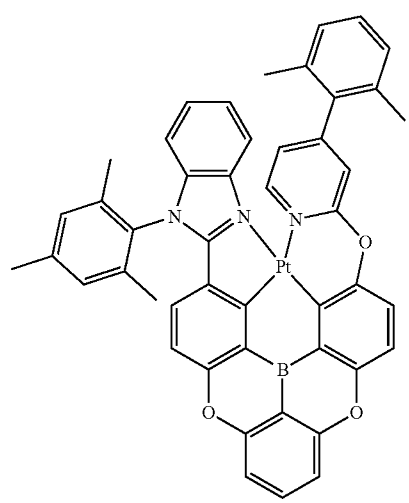

-continued
88
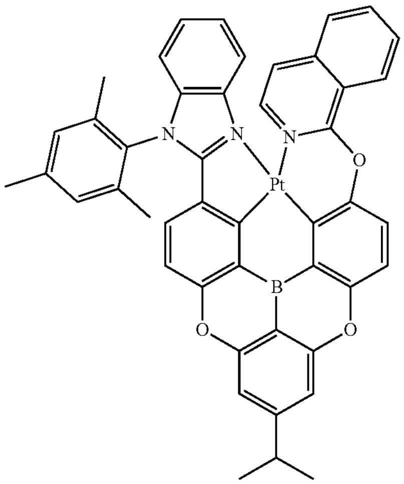
89
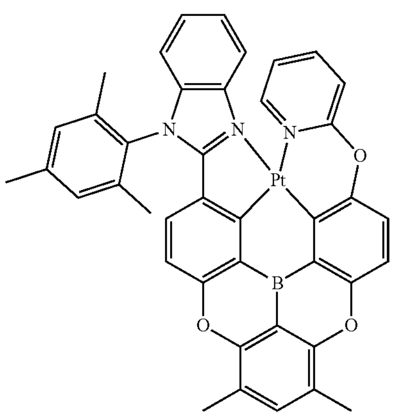
90
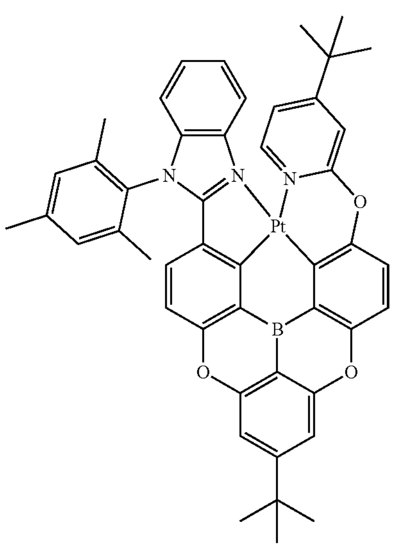
-continued
91
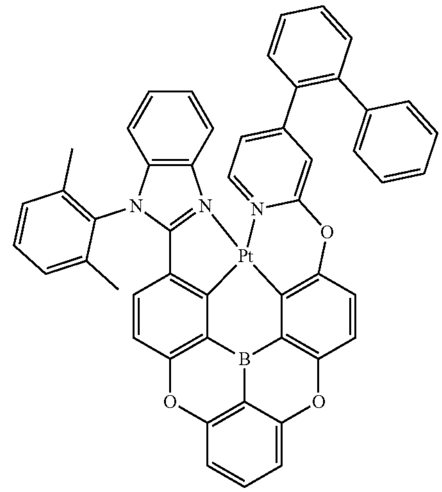
92
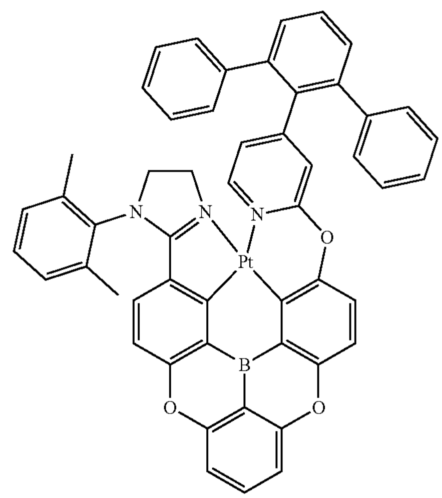
93
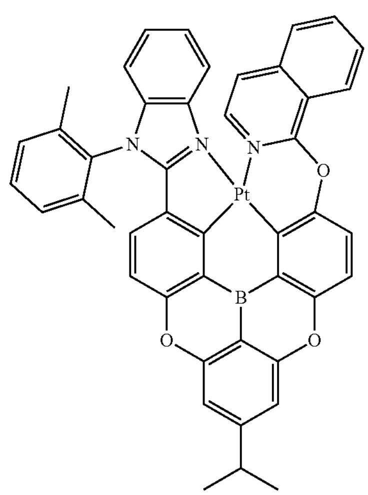

94
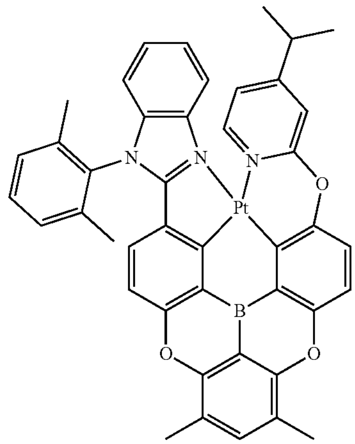
95
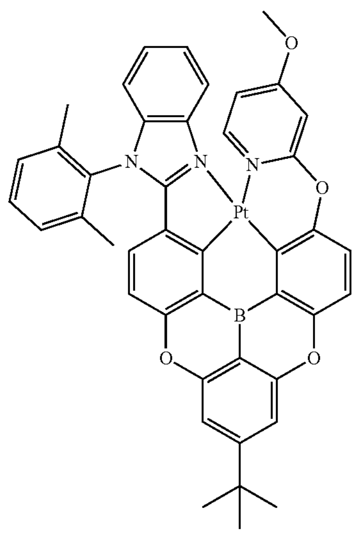
96
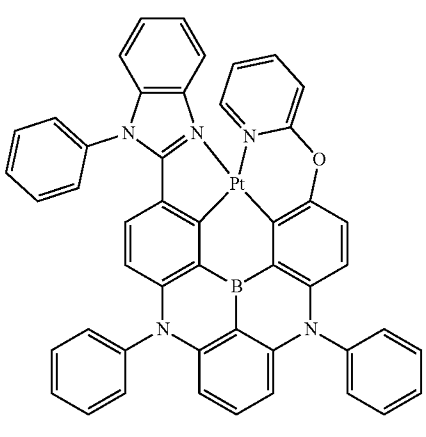
97
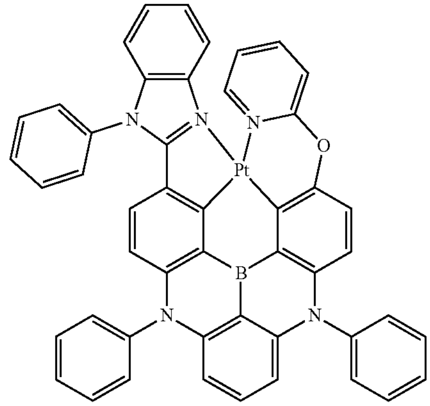
98
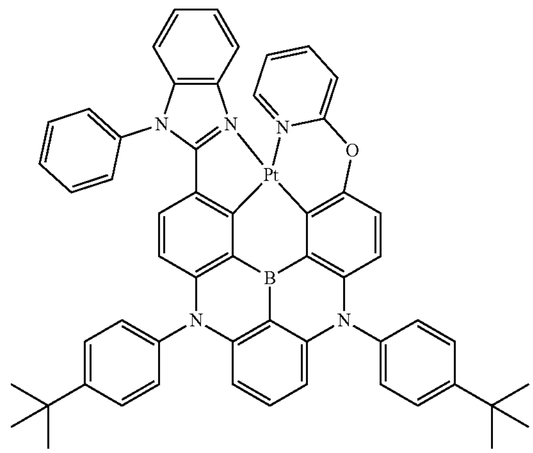
99
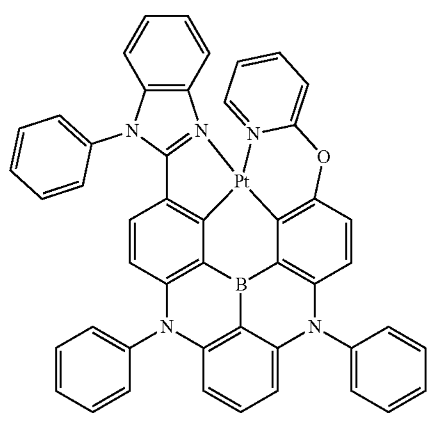

-continued
100
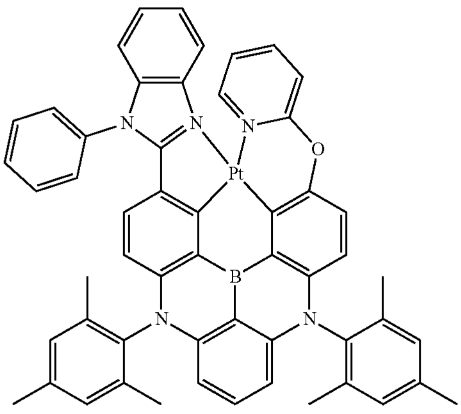
101
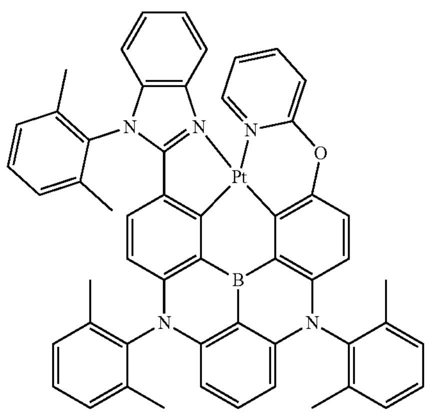
102
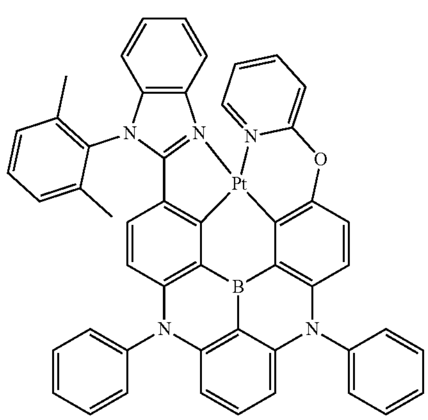
-continued
103
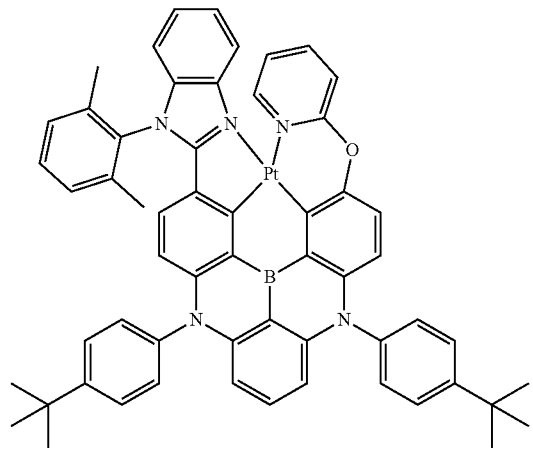
104
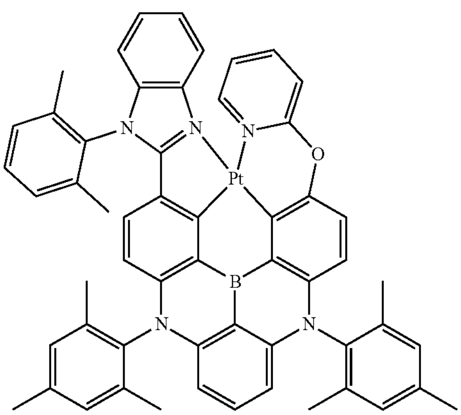
105
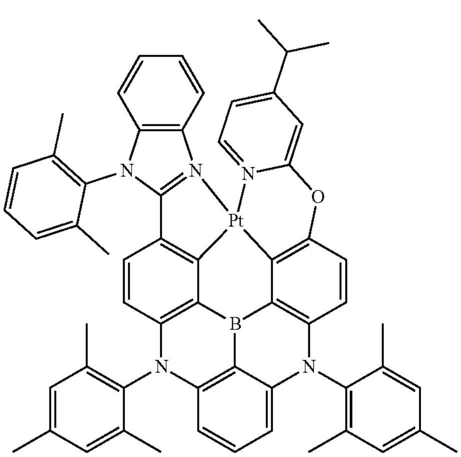

106
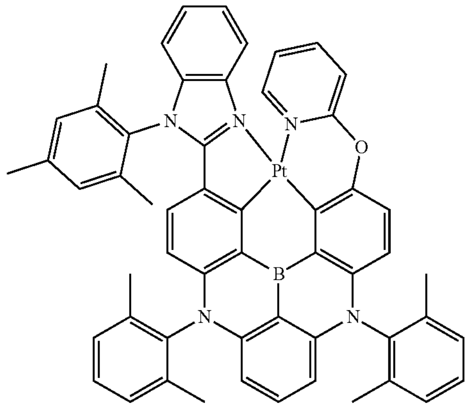
107
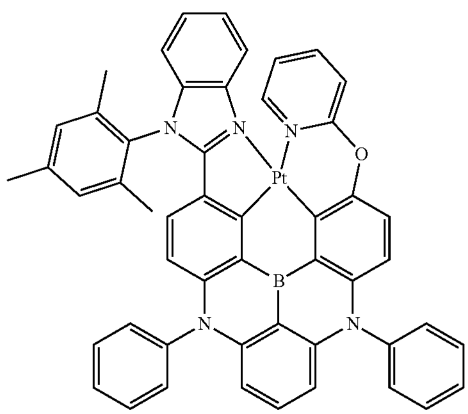
108
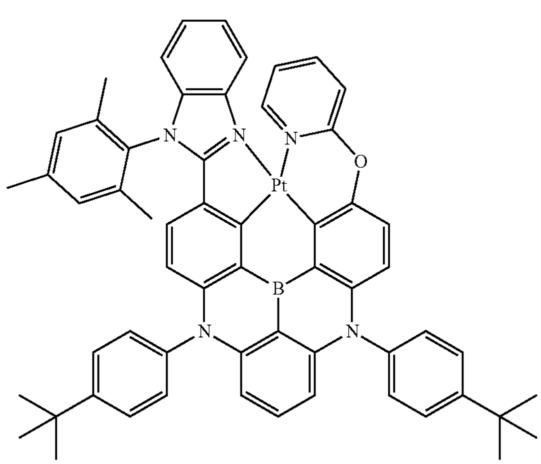
109
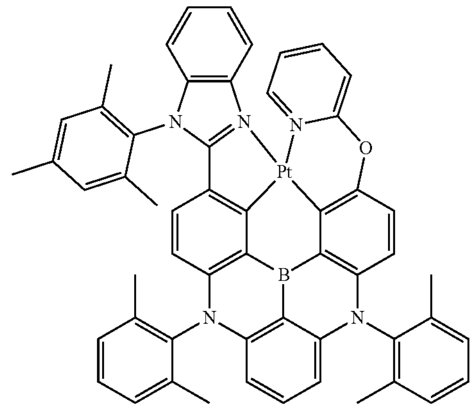
110
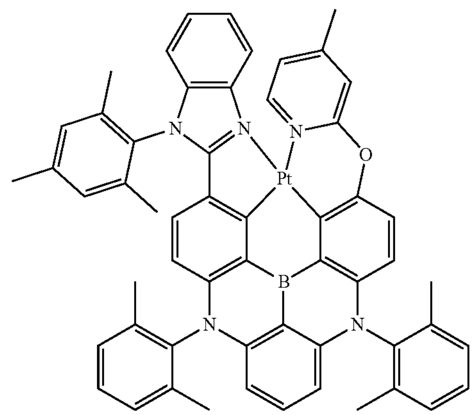
111
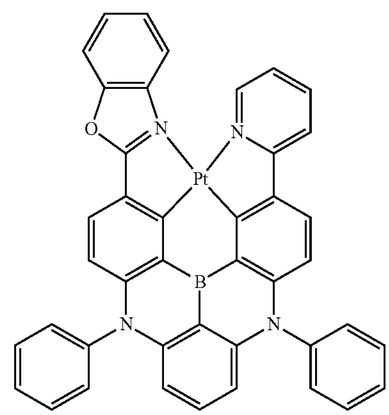
112
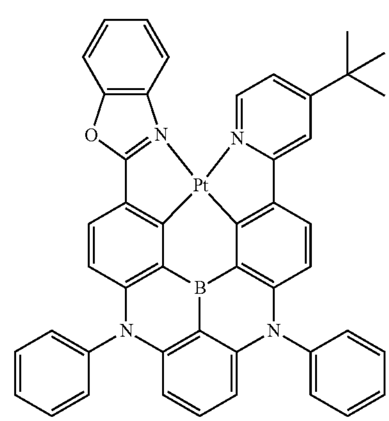

-continued
113
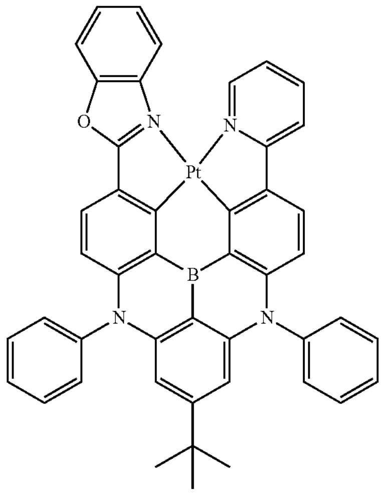
114
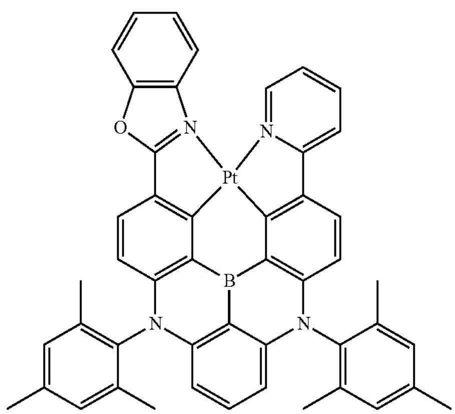
115
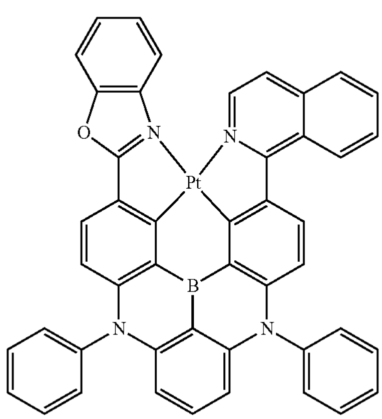
-continued
116
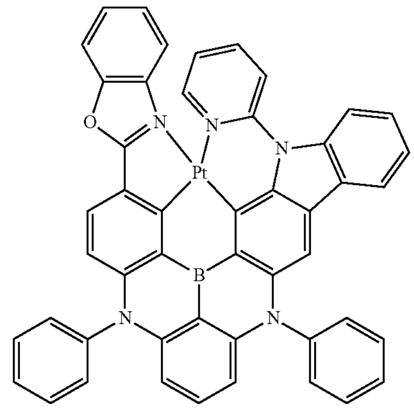
117
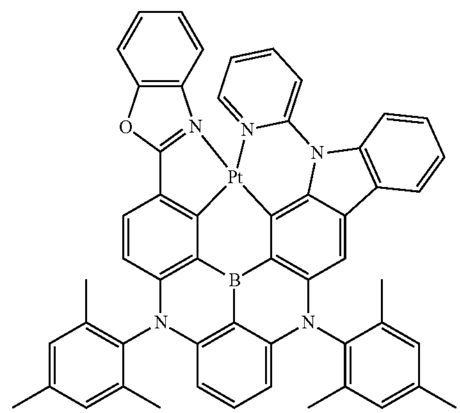
118
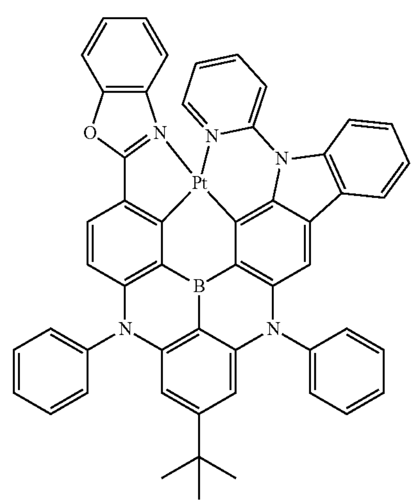

-continued
119
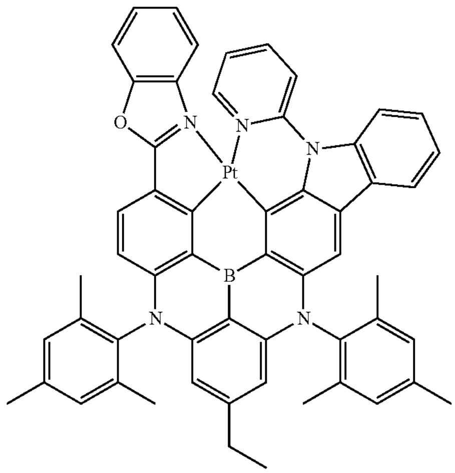
122
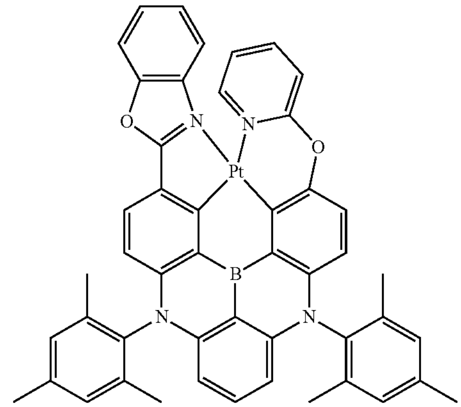
120
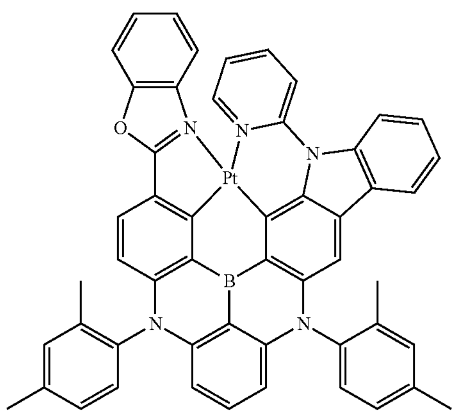
123
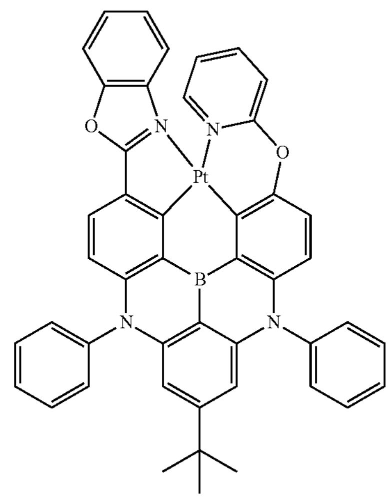
121
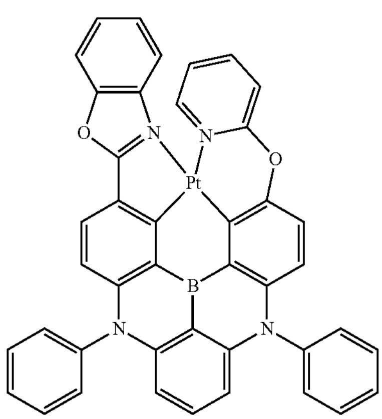
124
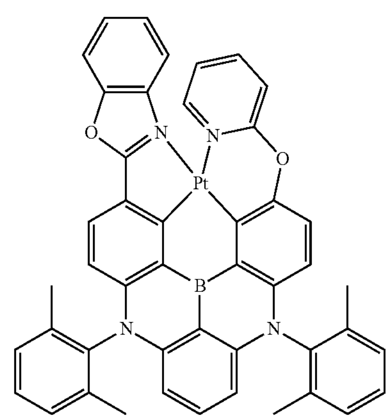

-continued
125
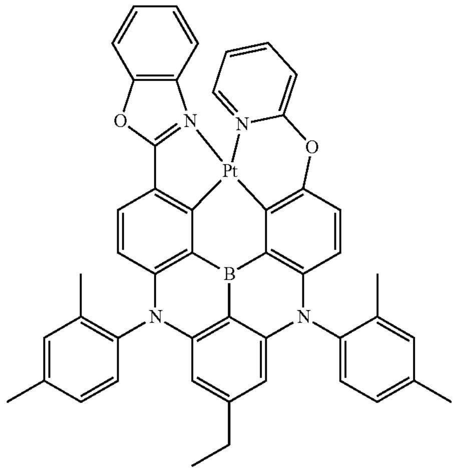
126
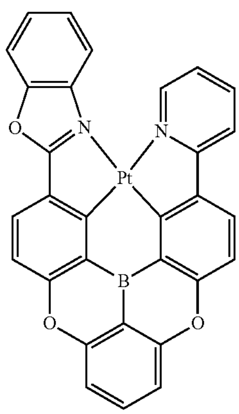
127
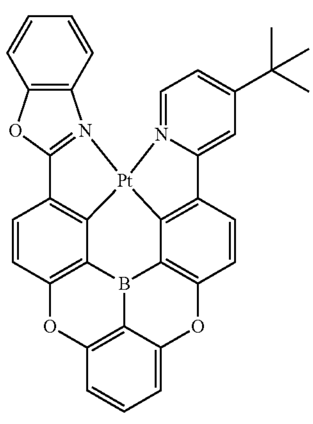
-continued
128
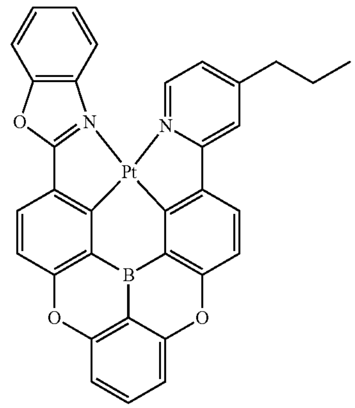
129
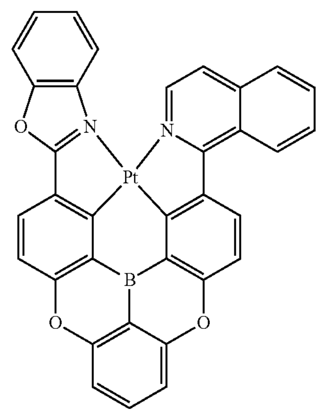
130
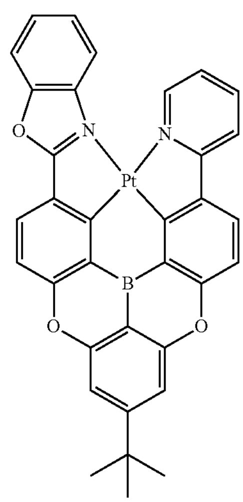

-continued
131
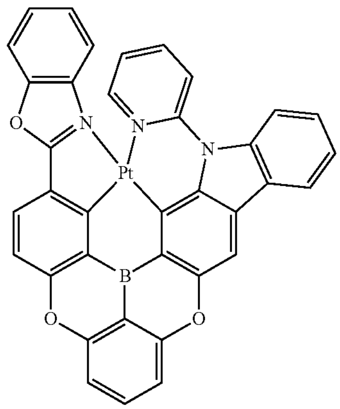
132
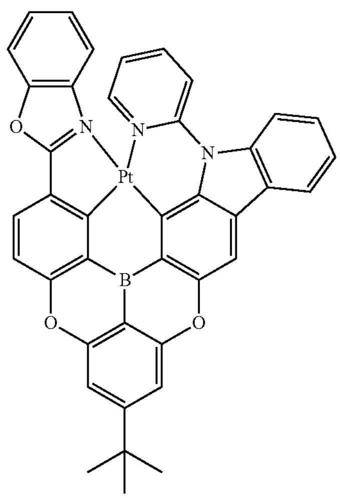
133
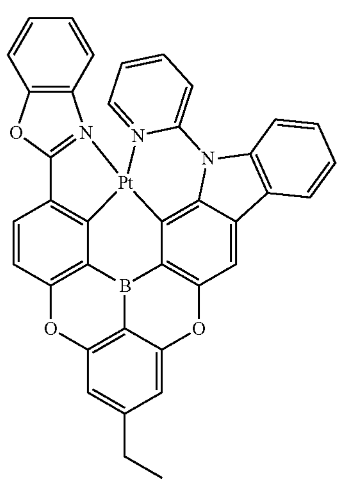
-continued
134
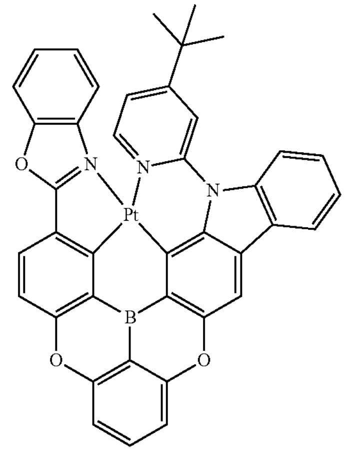
135
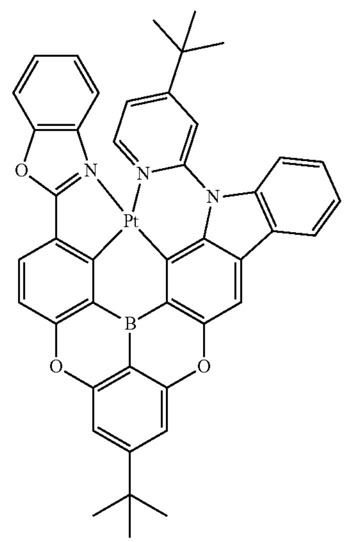
136
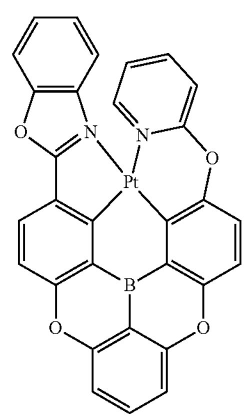

137
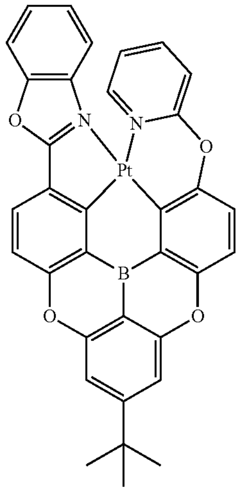
138
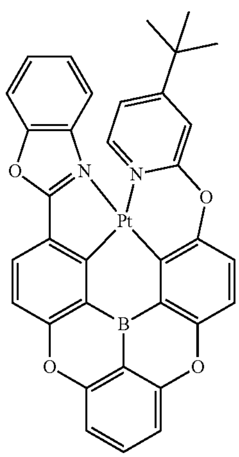
139
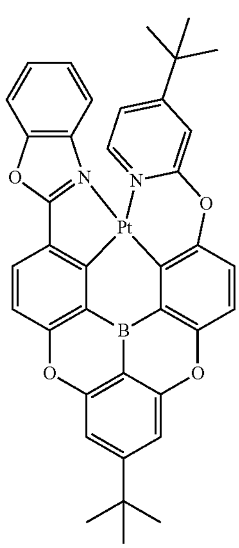
140
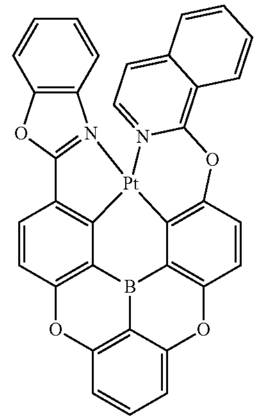
141
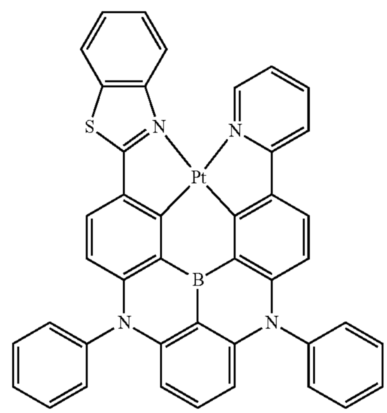
142
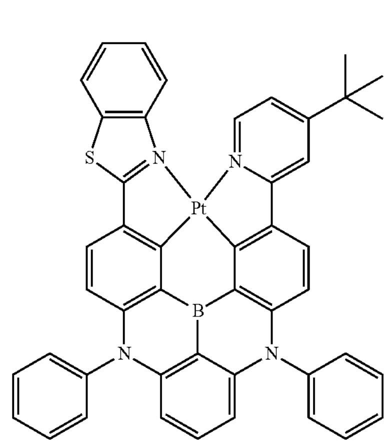

143
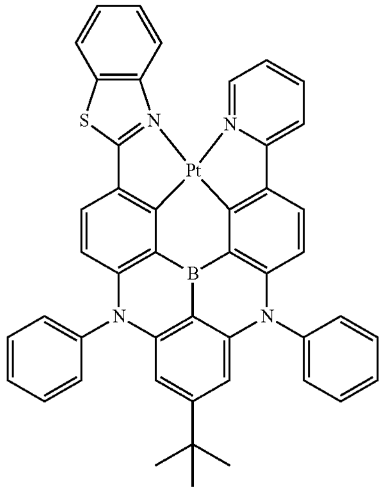
144
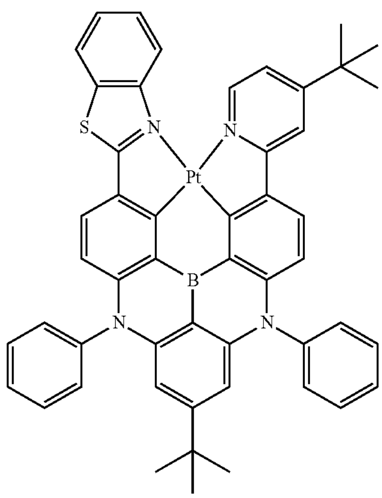
145
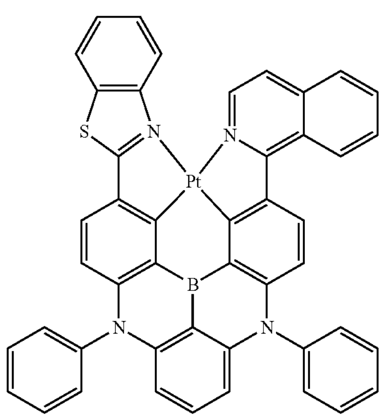
146
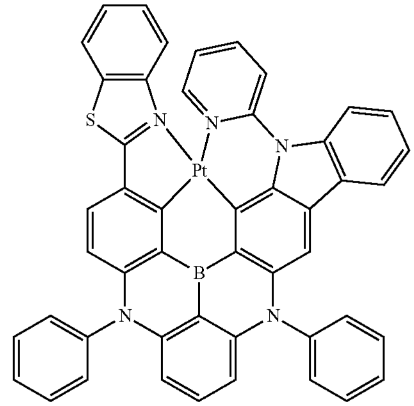
147
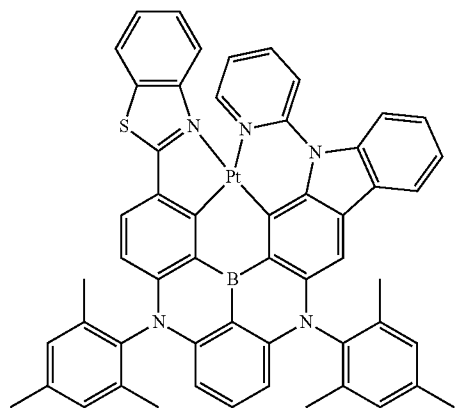
148
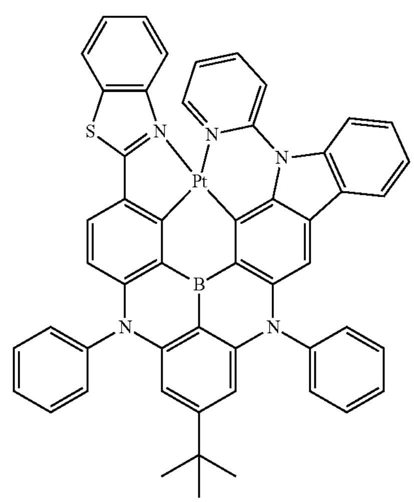

-continued
149
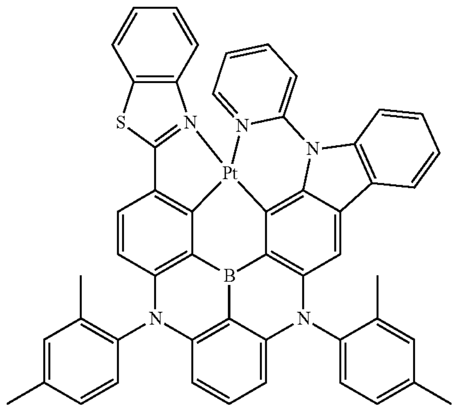
150
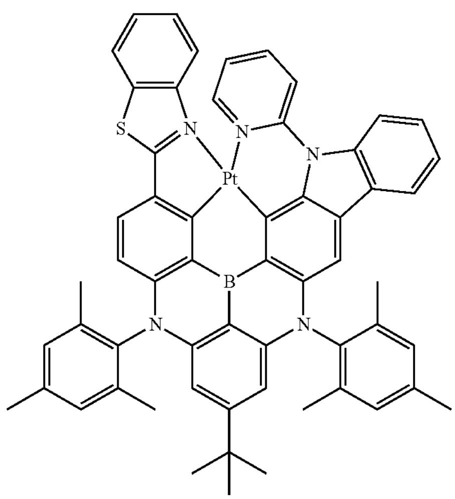
151
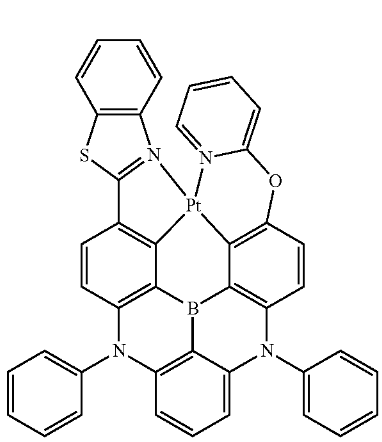
-continued
152
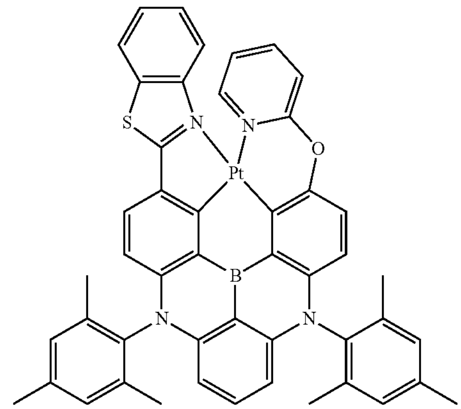
153
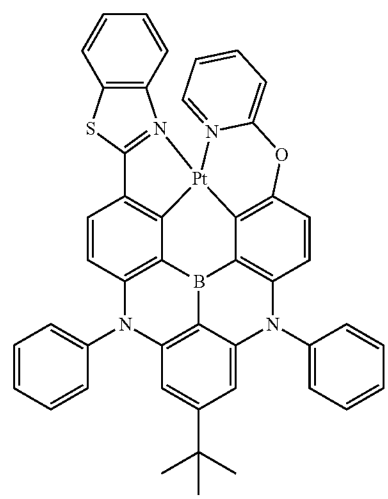
154
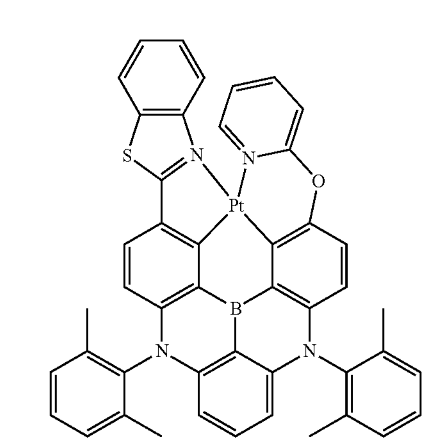

-continued
155
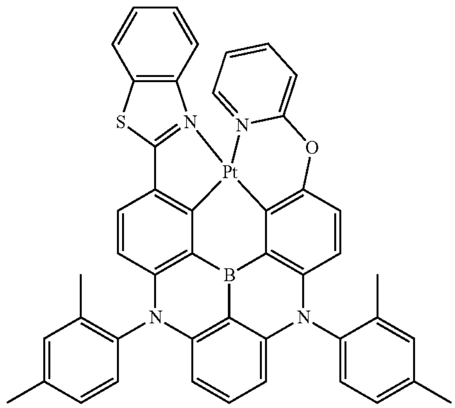
156
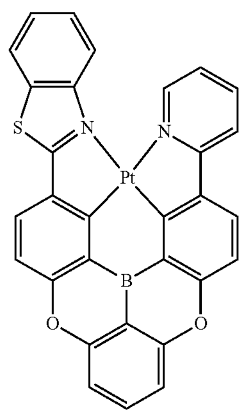
157
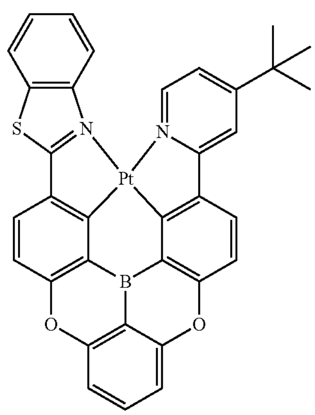
-continued
158
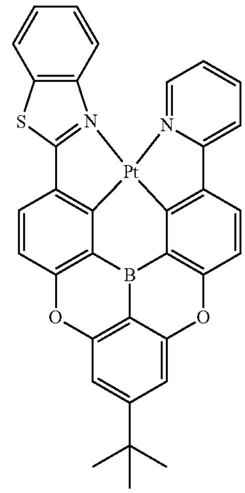
159
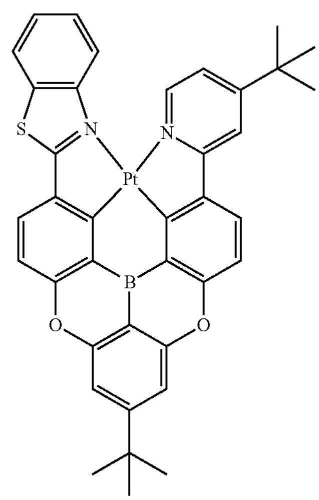
160
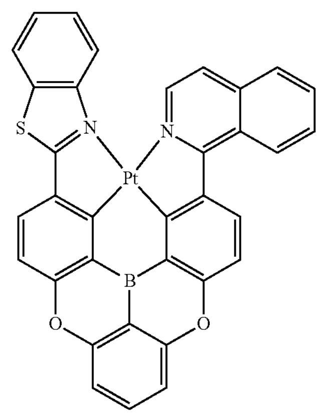

-continued
161
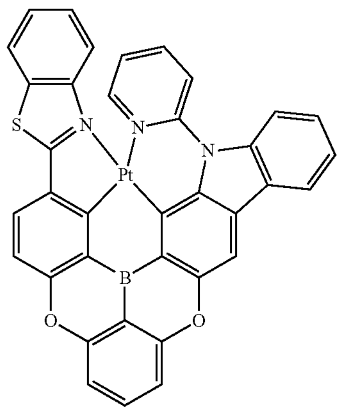
162
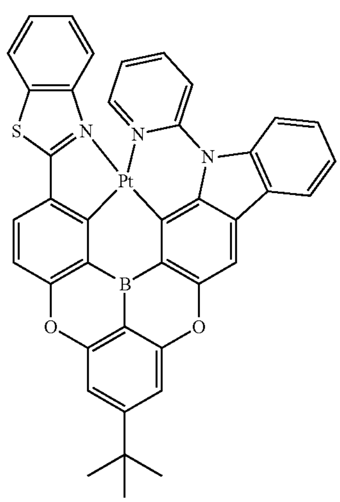
163
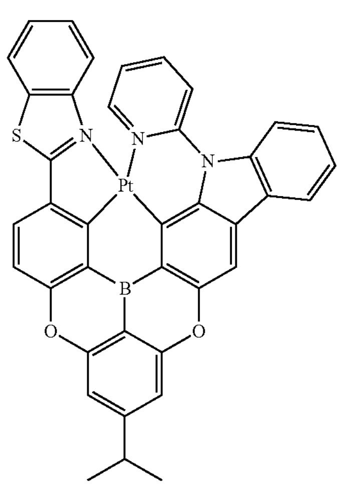
-continued
164
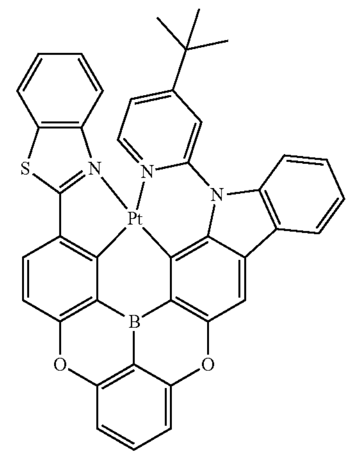
165
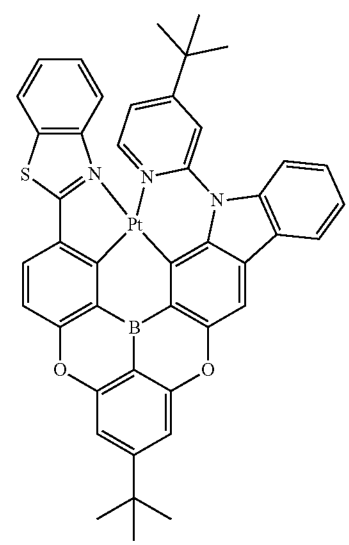
166
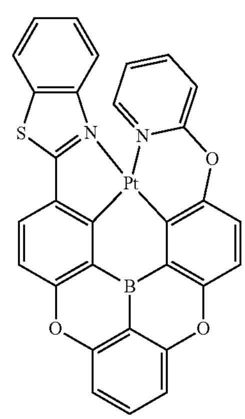

-continued

167

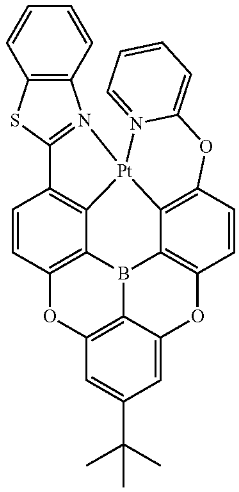

168

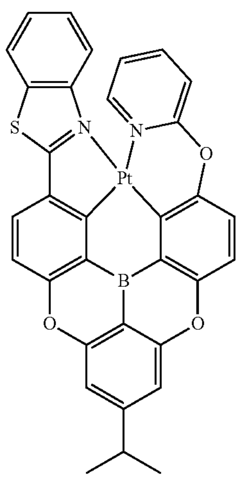

169

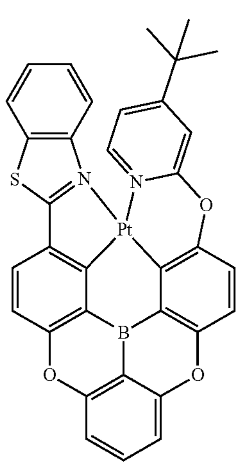

-continued

170

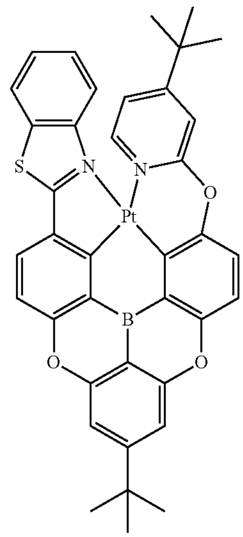

Synthesis of Organometallic Compounds

1. Synthesis of Compound 1

(1) Compound 1-1

[Reaction Formula 1-1]

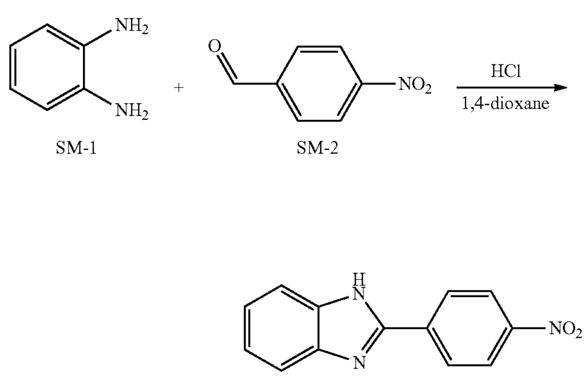

SM-1 SM-2

(1-1)

Under nitrogen condition, the compound SM-1 (4.32 g, 40 mmol), the compound SM-2 (6.04 g, 40 mmol), and HCl (1 ml, 25%) were dissolved by 1,4-dioxane (100 ml) in the rounded-bottom flask (250 ml), and the mixture was stirred under the room temperature for 12 hours. After the reaction was completed, the mixture was neutralized with $NaHCO_3$ aqueous solution, extracted with chloroform and washed with water. The moisture (water) was removed with anhydrous magnesium sulfate and concentrated under reduced pressure. The mixture was columned with methylene chloride and hexane (volume ratio=1:3) to obtain the compound 1-1 (7.65 g, yield: 80%).

(2) Compound 1-2

[Reaction Formula 1-2]

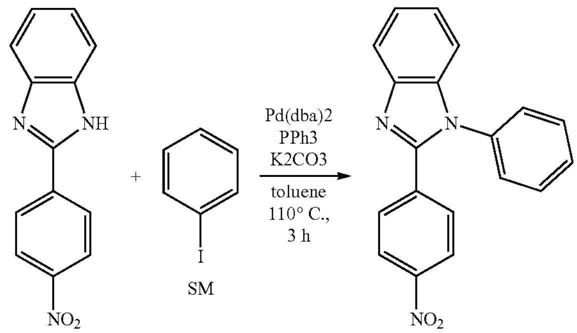

(1-1) (1-2)

Under nitrogen condition, the compound 1-1 (4.78 g, 20 mmol), the compound SM (4.08 g, 20 mmol), $Pd(dba)_2$ (0.58 g, 1.0 mmol), $PPh_3$ (0.26 g, 1.0 mmol), $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-2 (6.18 g, yield: 98%).

(3) Compound 1-3

[Reaction Formula 1-3]

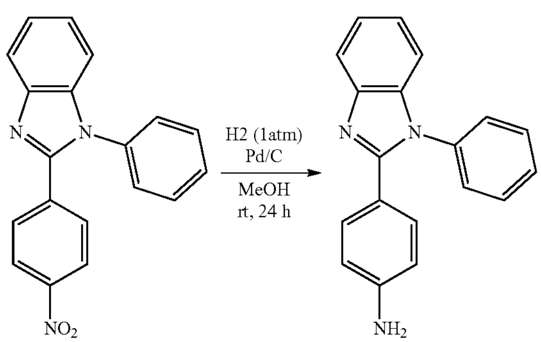

(1-2) (1-3)

Under hydrogen 1 atmosphere condition, the compound 1-2 (3.15 g, 10 mmol) and palladium charcoal (1 g, 10% Pd/C) was dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-3 (2.57 g, yield: 90%).

(4) Compound 1-4

[Reaction Formula 1-4]

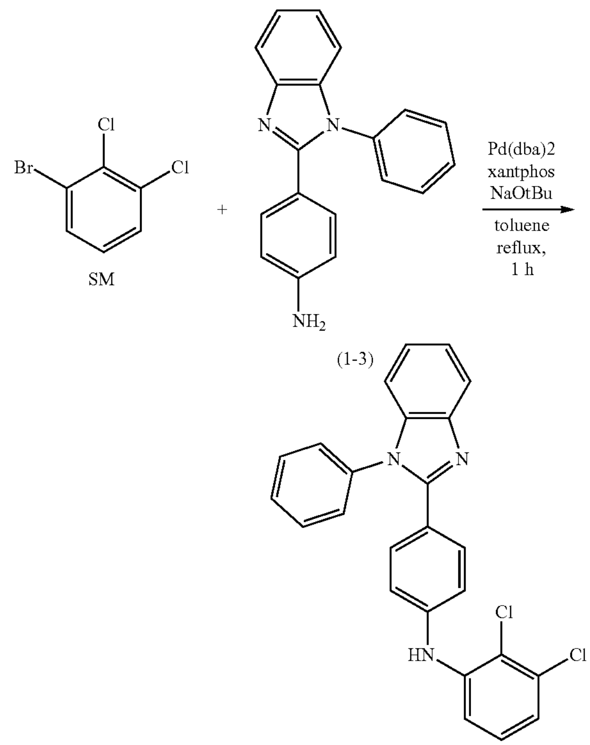

(1-4)

Under nitrogen condition, the compound SM (4.52 g, 20 mmol), the compound 1-3 (5.70 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-4 (7.57 g, yield: 88%).

(5) Compound 1-5

[Reaction Formula 1-5]

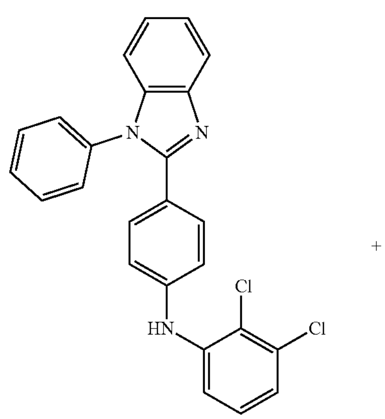

(1-4)

-continued

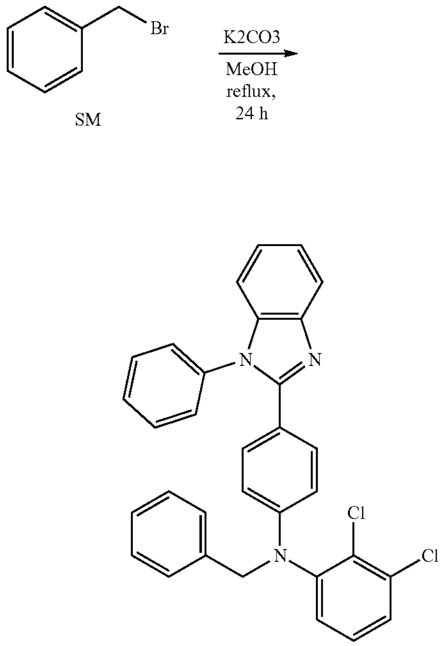

(1-5)

Under nitrogen condition, the compound 1-4 (8.60 g, 20 mmol), the compound SM (3.42 g, 20 mmol) and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-5 (9.47 g, yield: 91%).

(6) Compound 1-6

[Reaction Formula 1-6]

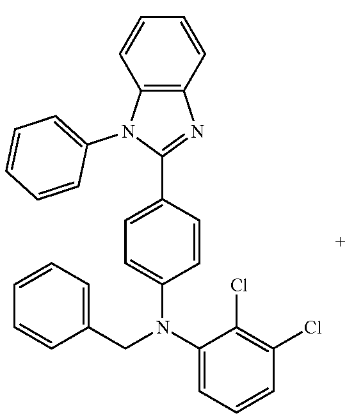

(1-5)

-continued

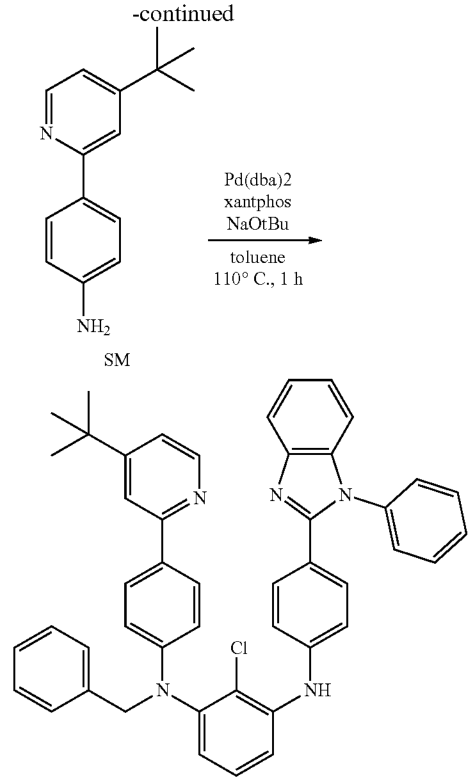

(1-6)

Under nitrogen condition, the compound 1-5 (10.4 g, 20 mmol), the compound SM (4.53 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-6 (12.1 g, yield: 85%).

(7) Compound 1-7

[Reaction Formula 1-7]

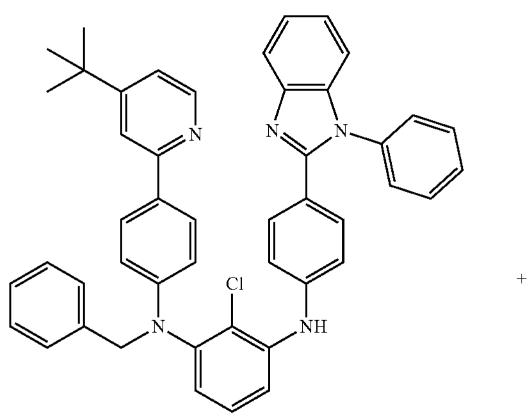

(1-6)

-continued

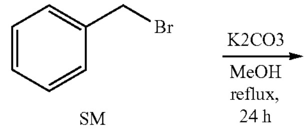

SM

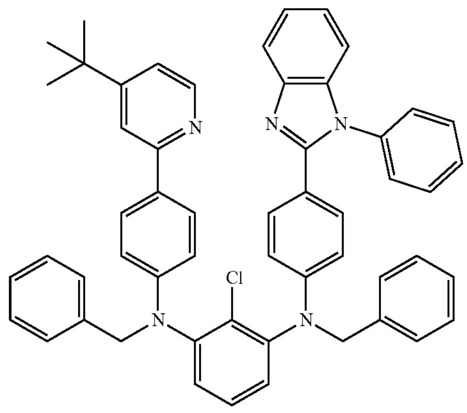

(1-7)

Under nitrogen condition, the compound 1-6 (14.2 g, 20 mmol), the compound SM (3.42 g, 20 mmol) and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 1-7 (14.4 g, yield: 90%).

(8) Compound 1-8

[Reaction Formula 1-8]

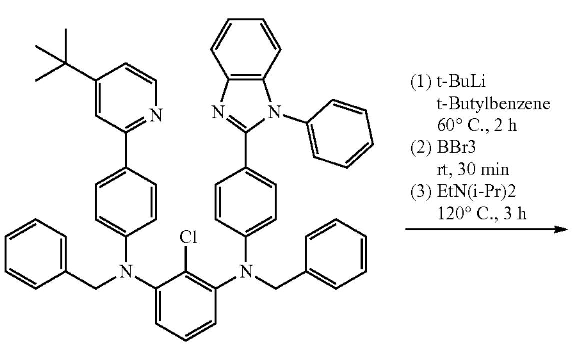

(1-7)

-continued

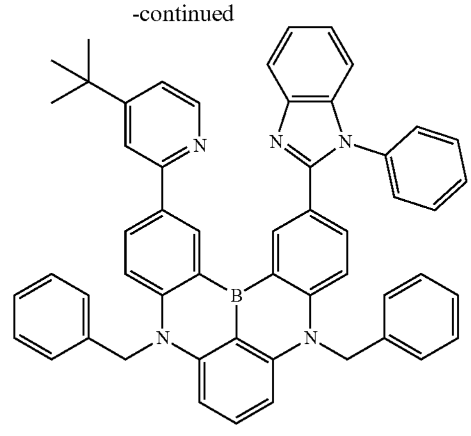

(1-8)

Under nitrogen condition, the compound 1-7 (8.00 g, 10 mmol) was dissolved in t-butylbenzene (100 ml) in the rounded-bottom flask (500 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. Di-iso-propyl-ehtylamine ($EtN(i\text{-}Pr)_2$) (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 1-8 (2.32 g, yield: 30%).

(9) Compound 1-9

[Reaction Formula 1-9]

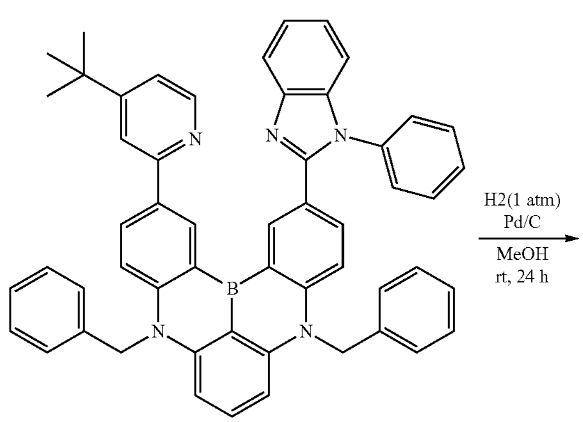

(1-8)

-continued

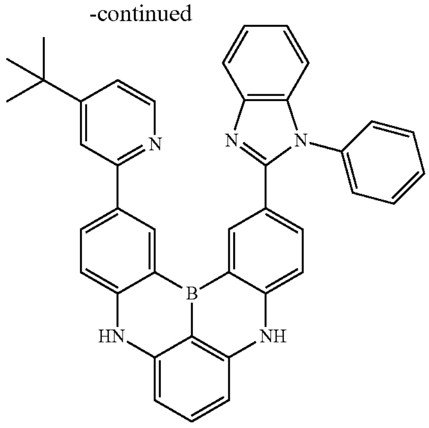

(1-9)

Under hydrogen 1 atmosphere condition, the compound 1-8 (7.74 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-9 (4.57 g, yield: 77%).

(10) Compound 1-10

[Reaction Formula 1-10]

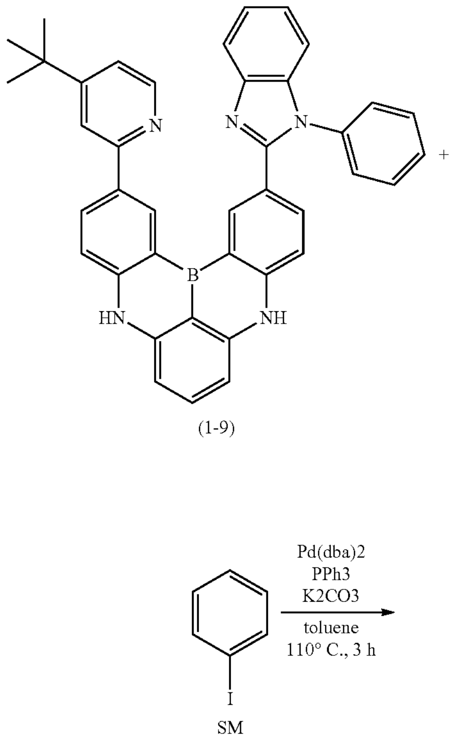

-continued

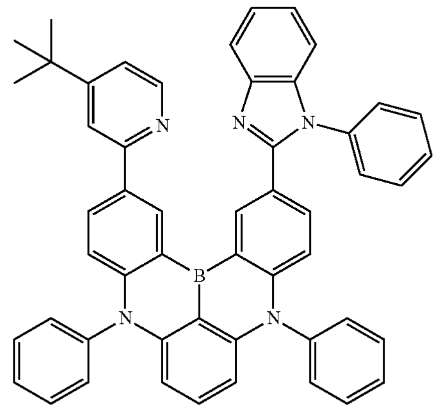

(1-10)

Under nitrogen condition, the compound 1-9 (11.9 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 1-10 (13.4 g, yield: 90%).

(11) Compound 1

[Reaction Formula 1-11]

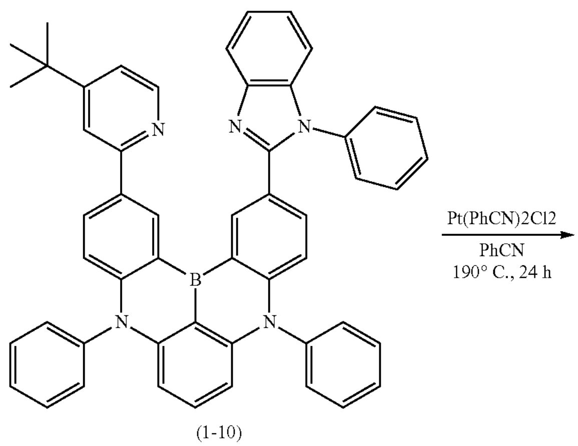

-continued

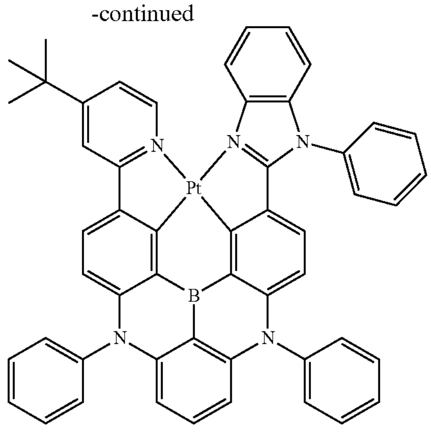

(1)

Under nitrogen condition, the compound 1-10 (7.46 g, 10 mmol) and $Pt(PhCN)_2Cl_2$ (4.72 g, 10 mmol) was dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 1 (2.54 g, yield: 27%).

2. Synthesis of Compound 8

(1) Compound 8-1

[Reaction Formula 2-1]

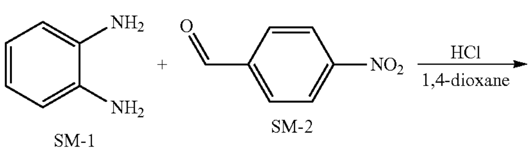

SM-1 SM-2

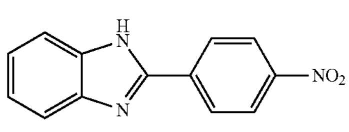

(8-1)

Under nitrogen condition, the compound SM-1 (4.32 g, 40 mmol), the compound SM-2 (6.04 g, 40 mmol), and HCl (1 ml, 25%) were dissolved by 1,4-dioxane (100 ml) in the rounded-bottom flask (250 ml), and the mixture was stirred under the room temperature for 12 hours. After the reaction was completed, the mixture was neutralized with $NaHCO_3$ aqueous solution, extracted with chloroform and washed with water. The moisture was removed with anhydrous magnesium sulfate, concentrated under reduced pressure. The mixture was columned with methylene chloride and hexane (volume ratio=1:3) to obtain the compound 8-1 (7.65 g, yield: 80%).

(2) Compound 8-2

[Reaction Formula 2-2]

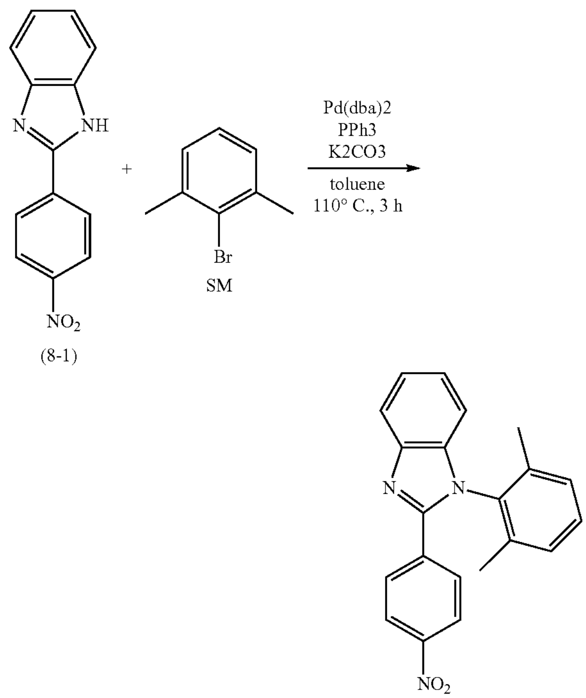

(8-1) (8-2)

Under nitrogen condition, the compound 8-1 (4.78 g, 20 mmol), the compound SM (3.70 g, 20 mmol), $Pd(dba)_2$ (0.58 g, 1.0 mmol), $PPh_3$ (0.26 g, 1.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-2 (5.49 g, yield: 80%).

(3) Compound 8-3

[Reaction Formula 2-3]

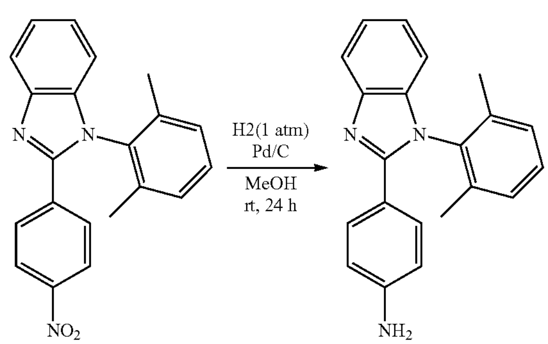

(8-2) (8-3)

Under hydrogen 1 atmosphere condition, the compound 8-2 (3.43 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-3 (2.76 g, yield: 88%).

(4) Compound 8-4

[Reaction Formula 2-4]

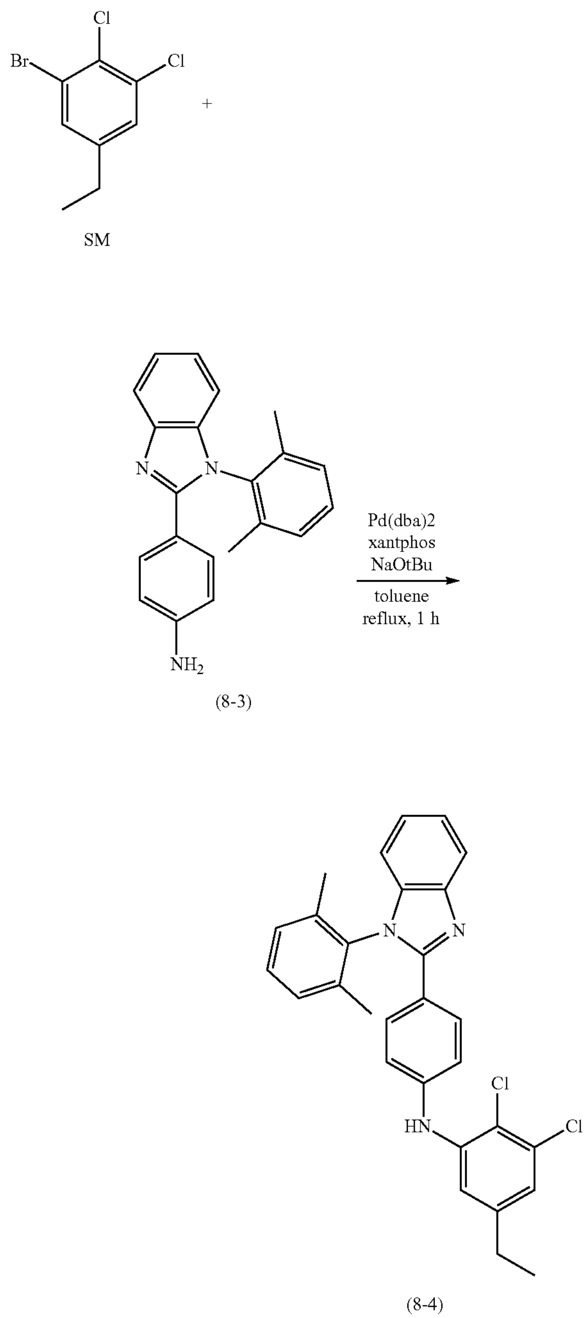

Under nitrogen condition, the compound SM (5.08 g, 20 mmol), the compound 8-3 (6.27 g, 20 mmol), Pd(dba)$_2$ (1.15 g, 2.0 mmol), xantphos (1.16 g, 2.0 mmol), and NaOtBu (0.31 g, 80 mmol)) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-4 (8.17 g, yield: 84%).

(5) Compound 8-5

[Reaction Formula 2-5]

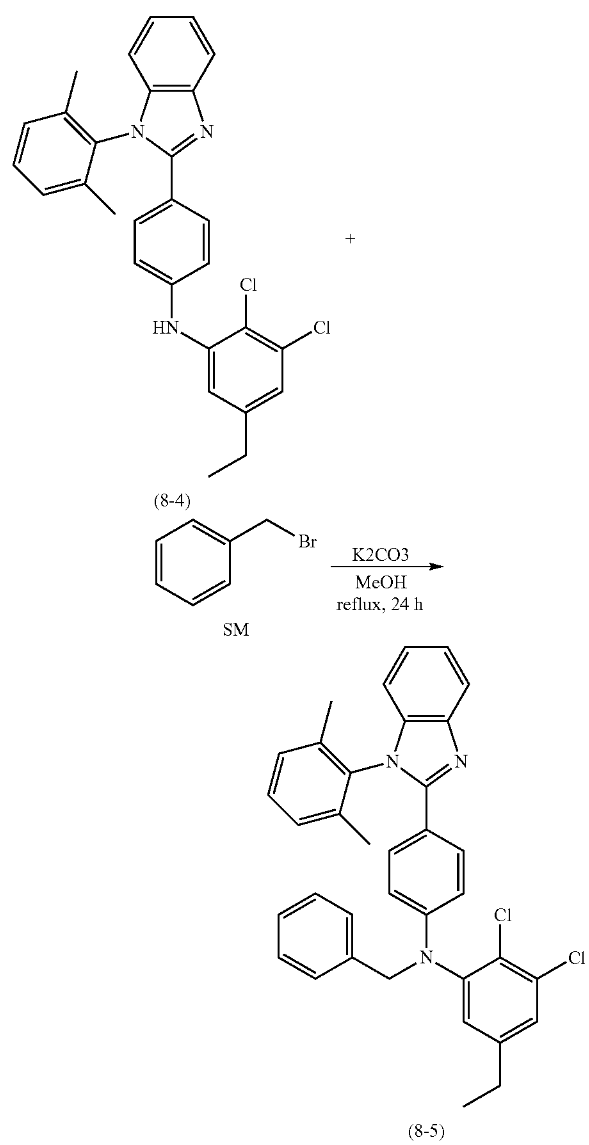

Under nitrogen condition, the compound 8-4 (9.17 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-5 (9.34 g, yield: 81%).

(6) Compound 8-6

[Reaction Formula 2-6]

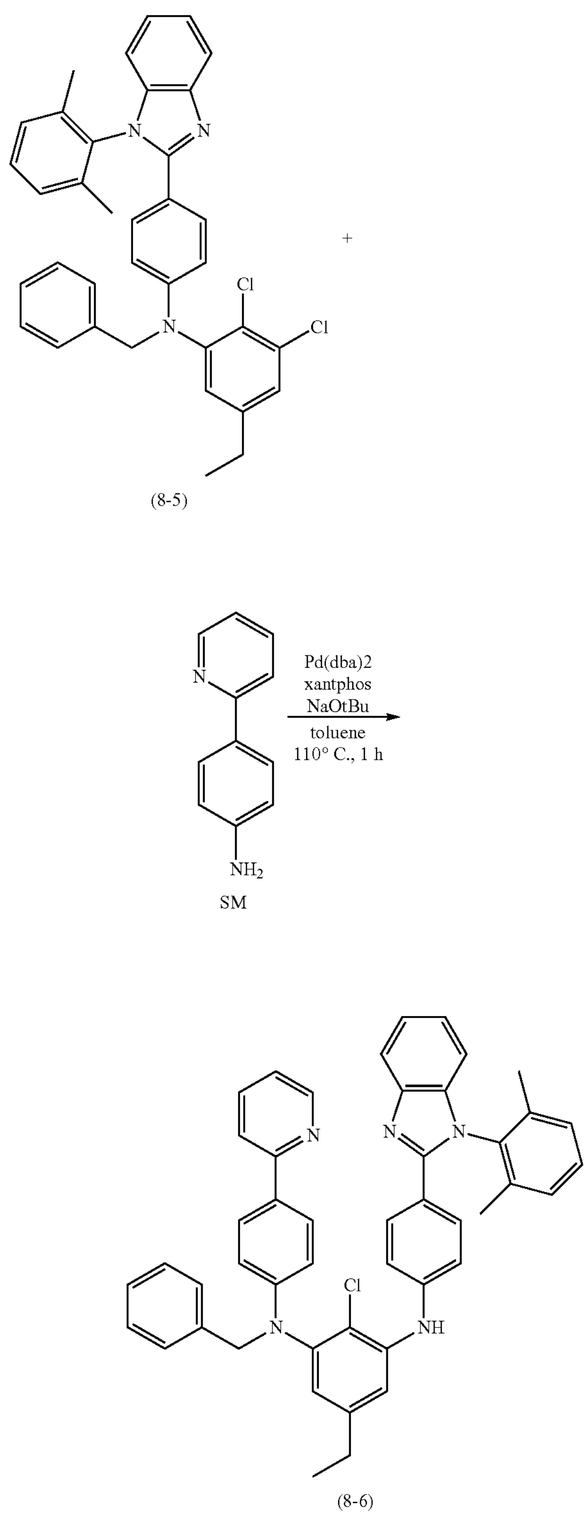

Under nitrogen condition, the compound 8-5 (11.5 g, 20 mmol), the compound SM (3.40 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-6 (11.8 g, yield: 83%).

(7) Compound 8-7

[Reaction Formula 2-7]

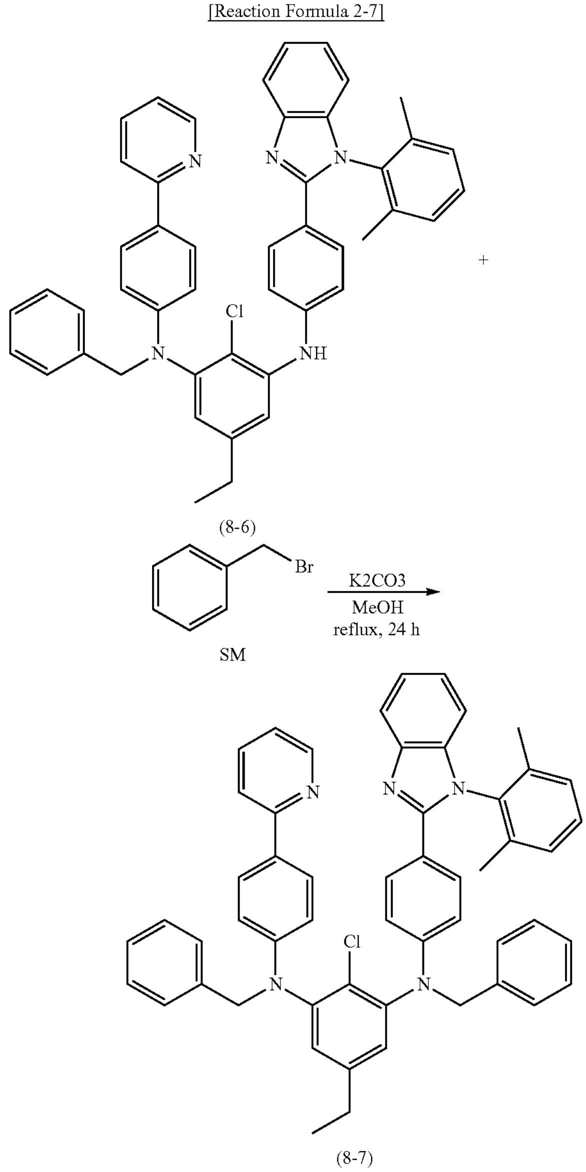

Under nitrogen condition, the compound 8-6 (14.2 g, 20 mmol), the compound SM (3.42 g, 20 mmol) and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 8-7 (14.7 g, yield: 92%).

(8) Compound 8-8

[Reaction Formula 2-8]

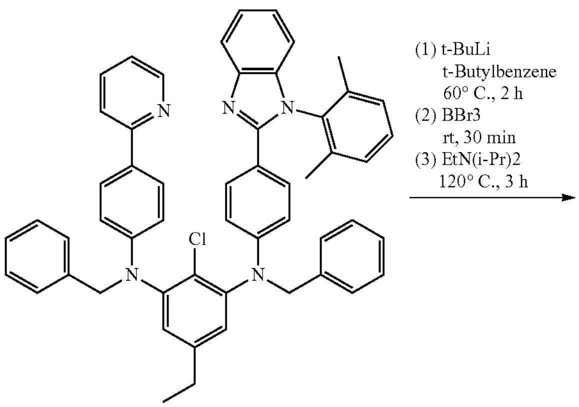

(8-7)

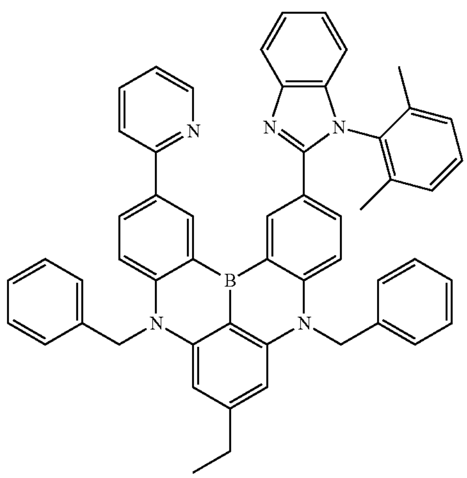

(8-8)

Under nitrogen condition, the compound 8-7 (8.00 g, 10 mmol) was dissolved in t-butylbenzene (100 ml) in the rounded-bottom flask (500 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 8-8 (2.55 g, yield: 33%).

(9) Compound 8-9

[Reaction Formula 2-9]

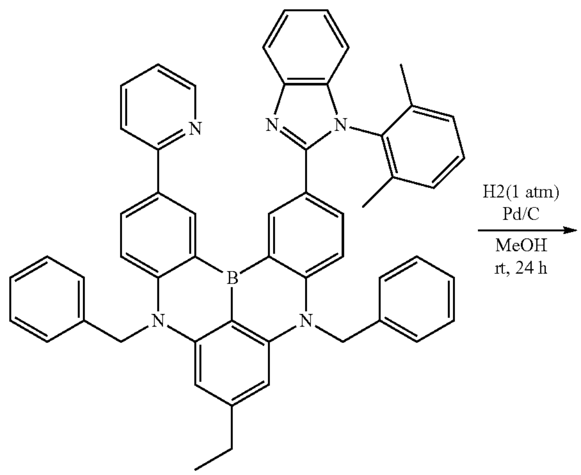

(8-8)

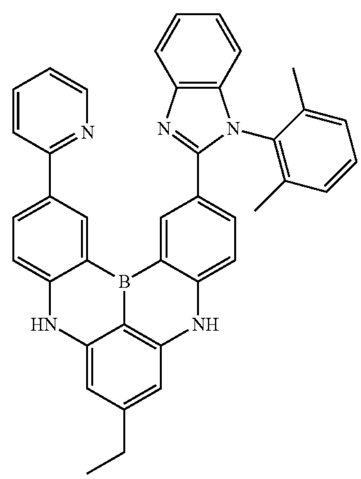

(8-9)

Under hydrogen 1 atmosphere condition, the compound 8-8 (7.74 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-9 (4.75 g, yield: 80%).

(10) Compound 8-10

[Reaction Formula 2-10]

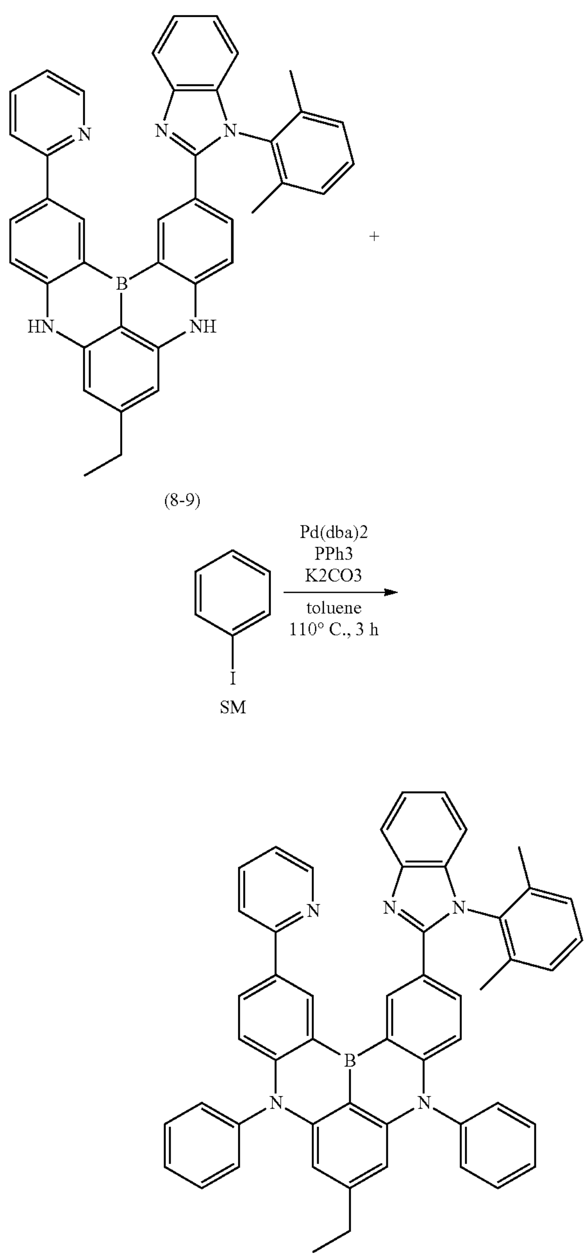

(8-9)

(8-10)

Under nitrogen condition, the compound 8-9 (11.9 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) was dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 8-10 (13.7 g, yield: 92%).

(11) Compound 8

[Reaction Formula 2-11]

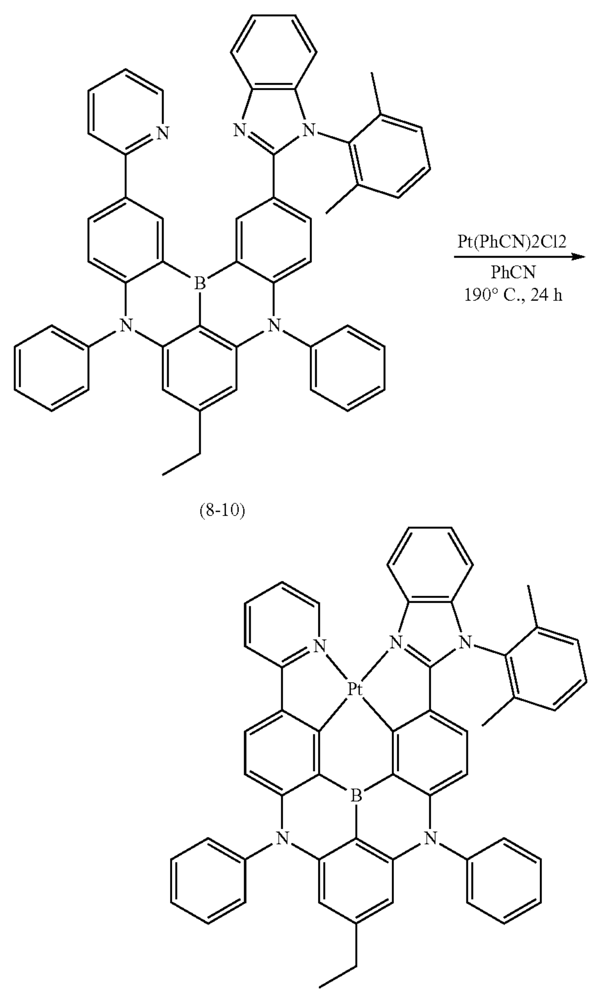

(8-10)

(8)

Under nitrogen condition, the compound 8-10 (7.46 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 8 (2.35 g, yield: 25%).

3. Synthesis of Compound 12

(1) Compound 12-1

[Reaction Formula 3-1]

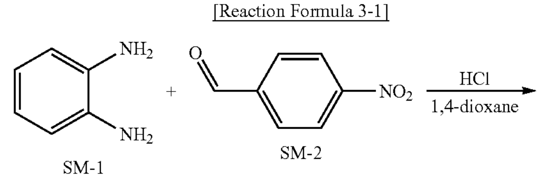

SM-1 SM-2

-continued

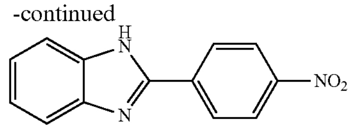

(8-1)

Under nitrogen condition, the compound SM-1 (4.32 g, 40 mmol), the compound SM-2 (6.04 g, 40 mmol) and HCl (1 ml, 25%) were dissolved by 1,4-dioxane (100 ml) in the rounded-bottom flask (250 ml), and the mixture was stirred under the room temperature for 12 hours. After the reaction was completed, the mixture was neutralized with $NaHCO_3$ aqueous solution, extracted with chloroform and washed with water. The moisture was removed with anhydrous magnesium sulfate, concentrated under reduced pressure. The mixture was columned with methylene chloride and hexane (volume ratio=1:3) to obtain the compound 12-1 (7.65 g, yield: 80%).

(2) Compound 12-2

[Reaction Formula 3-2]

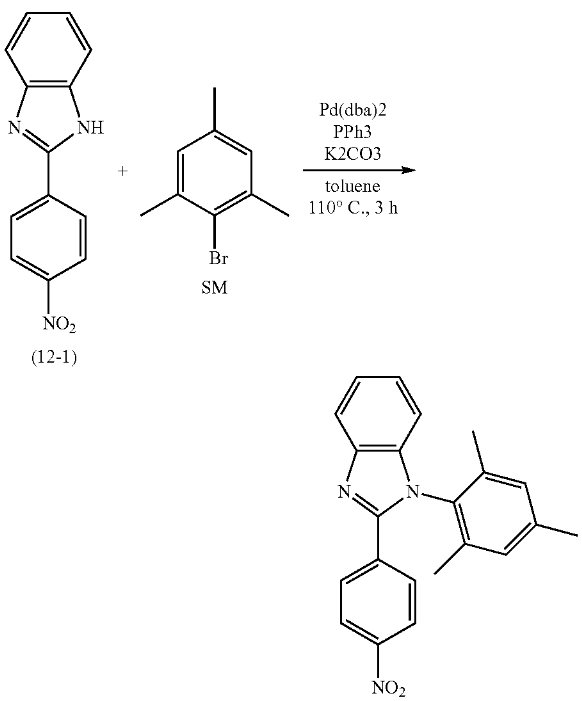

(12-1) SM (12-2)

Under nitrogen condition, the compound 12-1 (4.78 g, 20 mmol), compound SM (3.98 g, 20 mmol), $Pd(dba)_2$ (0.58 g, 1.0 mmol), $PPh_3$ (0.26 g, 1.0 mmol), and $K_2CO_3$ (0.31 g, 80 mmol)) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-2 (6.08 g, yield: 85%).

(3) Compound 12-3

[Reaction Formula 3-3]

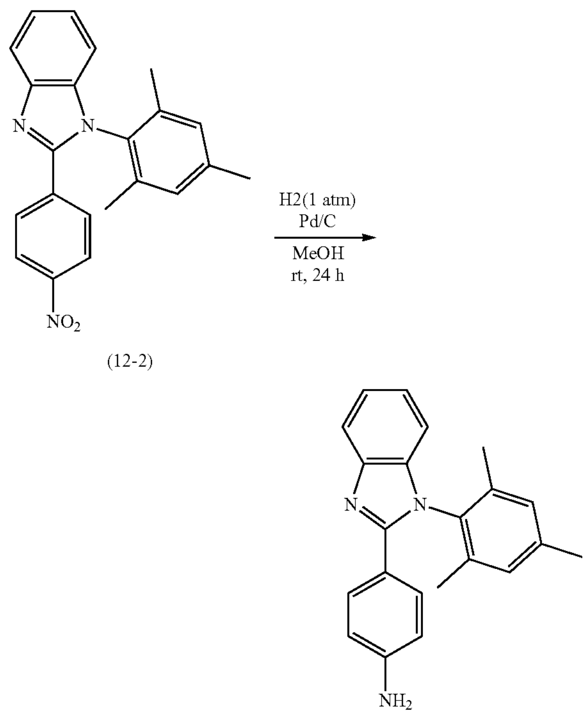

(12-2) (12-3)

Under hydrogen 1 atmosphere condition, the compound 12-2 (3.57 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-3 (2.88 g, yield: 88%).

(4) Compound 12-4

[Reaction Formula 3-4]

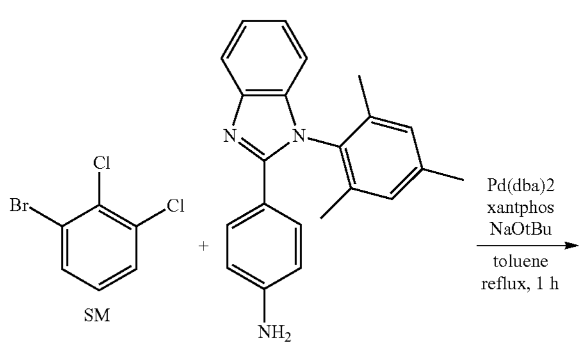

SM (12-3)

-continued

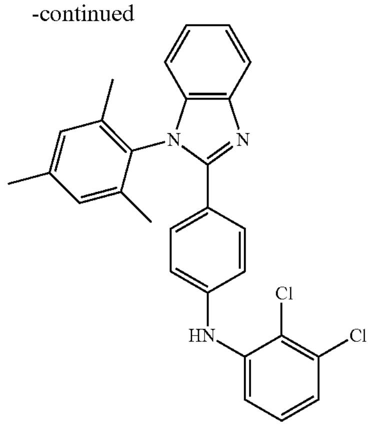

(12-4)

Under nitrogen condition, the compound SM (4.52 g, 20 mmol), the compound 12-3 (6.55 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-4 (7.56 g, yield: 80%).

(5) Compound 12-5

[Reaction Formula 3-5]

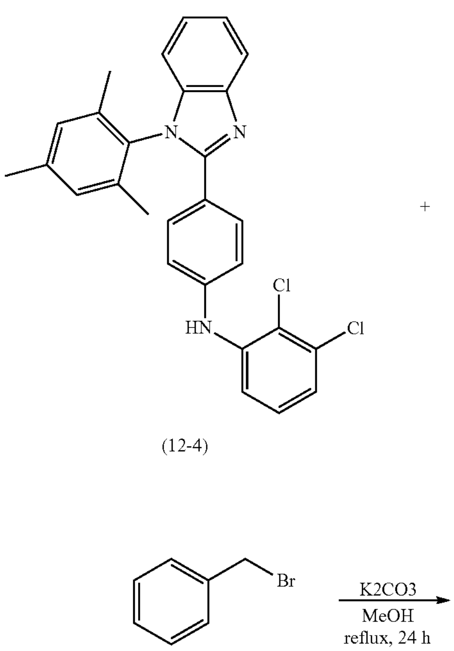

SM

-continued

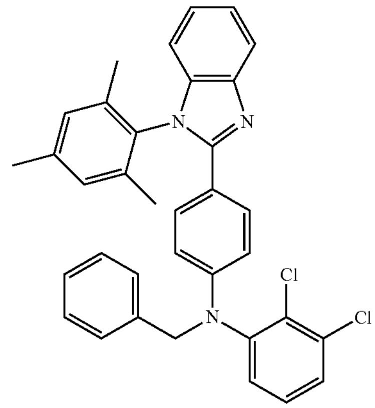

(12-5)

Under nitrogen condition, the compound 12-4 (9.45 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-5 (9.56 g, yield: 85%).

(6) Compound 12-6

[Reaction Formula 3-6]

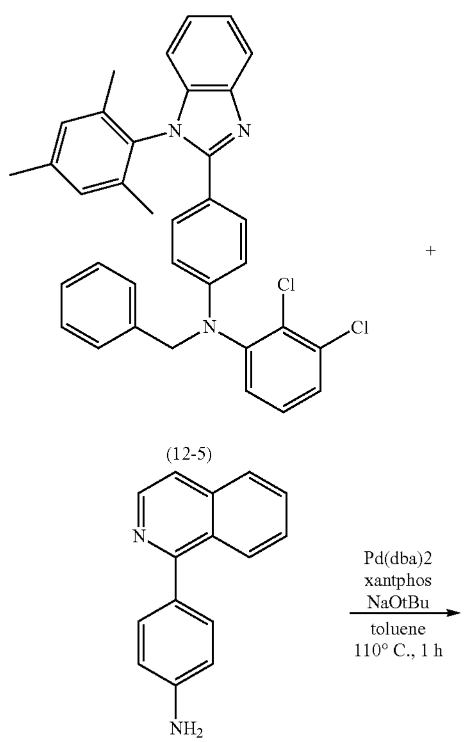

SM

-continued

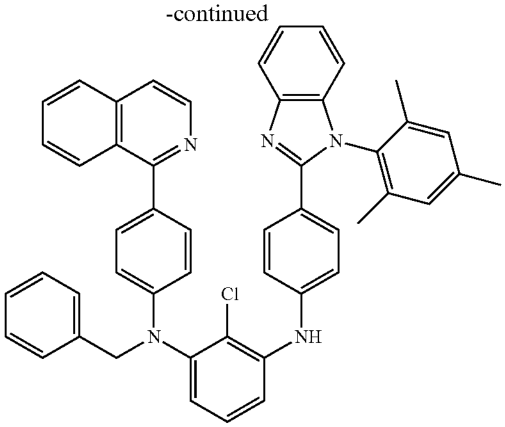

(12-6)

Under nitrogen condition, the compound 12-5 (11.3 g, 20 mmol), the compound SM (4.41 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-6 (11.9 g, yield: 80%).

(7) Compound 12-7

[Reaction Formula 3-7]

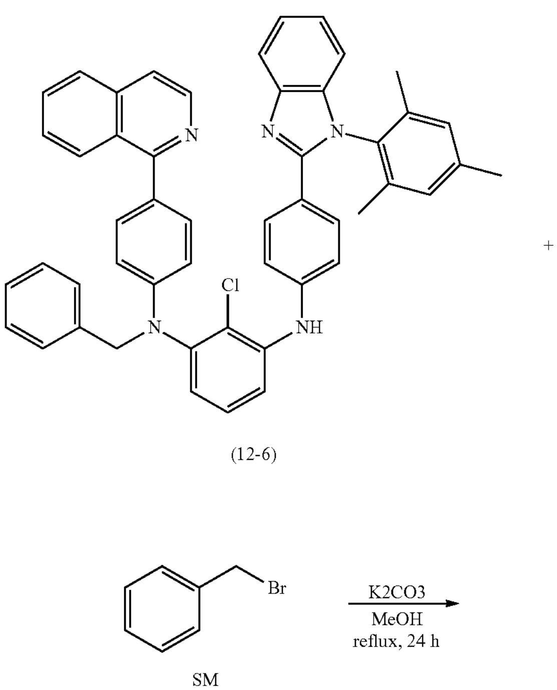

-continued

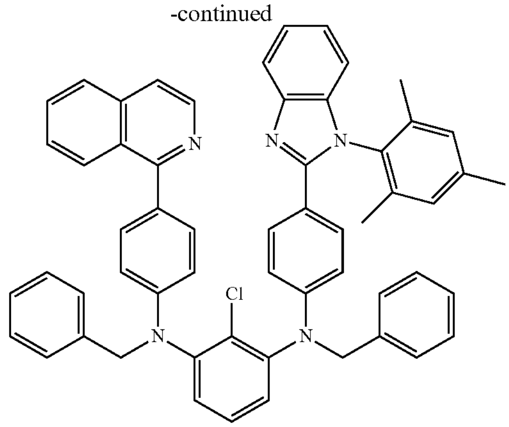

(12-7)

Under nitrogen condition, the compound 12-6 (14.9 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 12-7 (14.7 g, yield: 88%).

(8) Compound 12-8

[Reaction Formula 3-8]

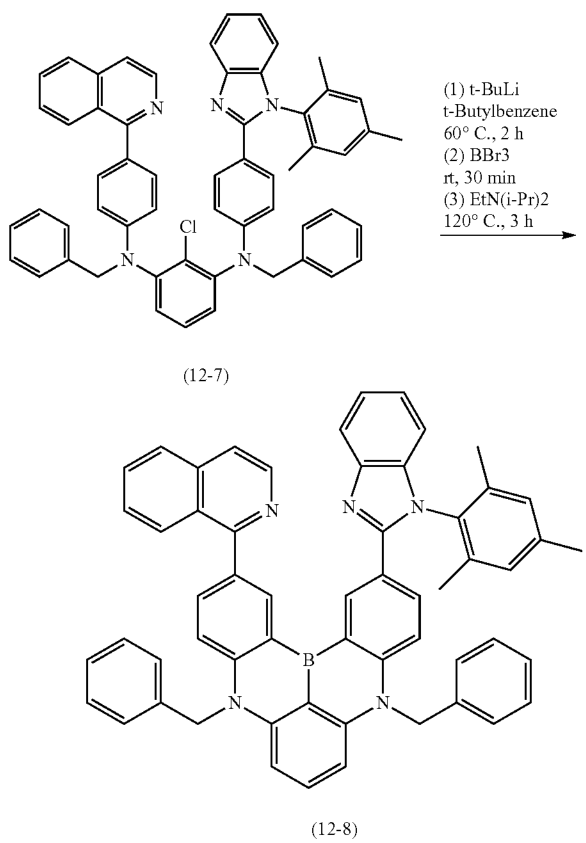

Under nitrogen condition, the compound 12-7 (8.37 g, 10 mmol) was dissolved in t-butylbenzene (100 ml) in the rounded-bottom flask (500 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 12-8 (2.02 g, yield: 25%).

(9) Compound 12-9

[Reaction Formula 3-10]

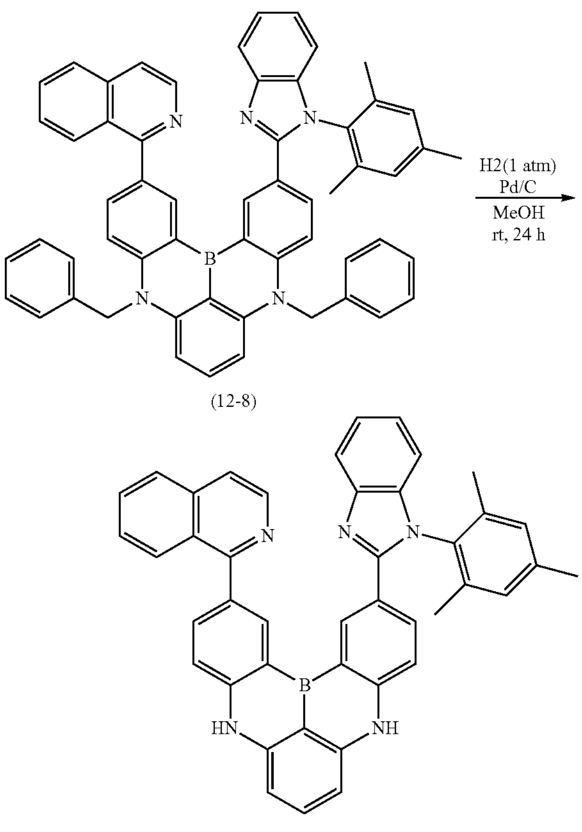

Under hydrogen 1 atmosphere condition, the compound 12-8 (8.10 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-9 (5.35 g, yield: 85%).

(10) Compound 12-10

[Reaction Formula 3-10]

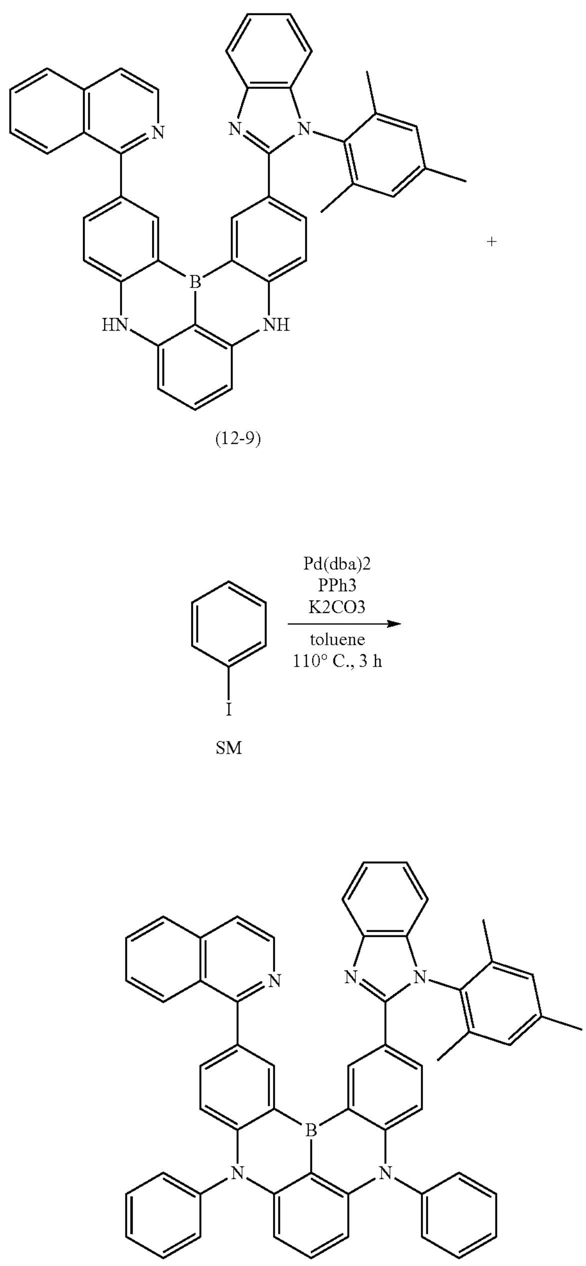

Under nitrogen condition, the compound 12-9 (12.6 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol)) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 12-10 (14.1 g, yield: 90%).

(11) Compound 12

[Reaction Formula 3-11]

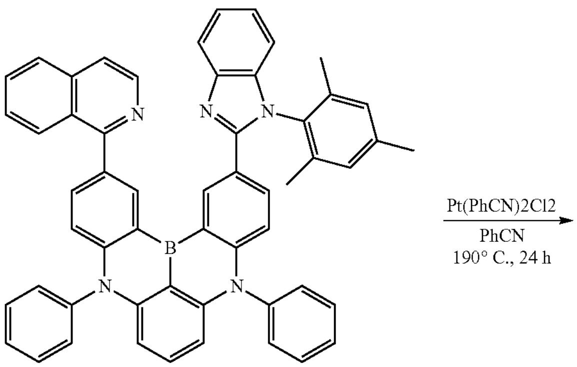

(12-10)

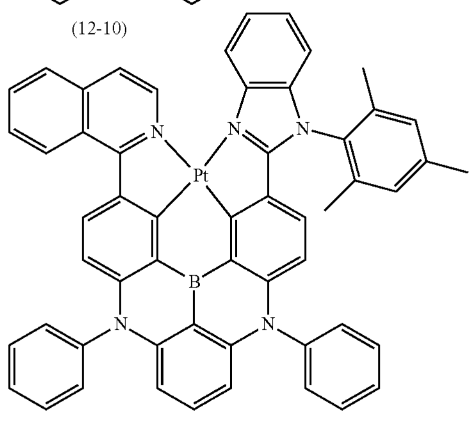

(12)

Under nitrogen condition, the compound 12-10 (7.82 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 12 (2.73 g, yield: 28%).

4. Synthesis of Compound 31

(1) Compound 31-1

[Reaction Formula 4-1]

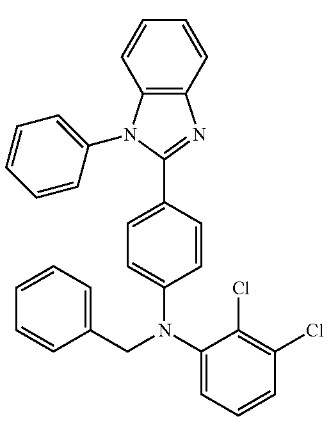

(1-4)

+

-continued

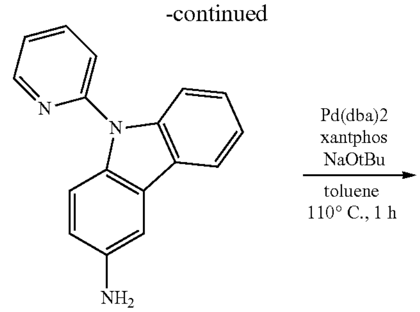

SM

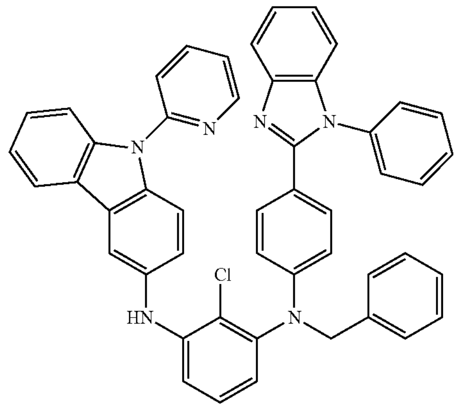

(31-1)

Under nitrogen condition, the compound 1-4 (10.4 g, 20 mmol), the compound SM (5.19 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 31-1 (12.6 g, yield: 85%).

(2) Compound 31-2

[Reaction Formula 4-2]

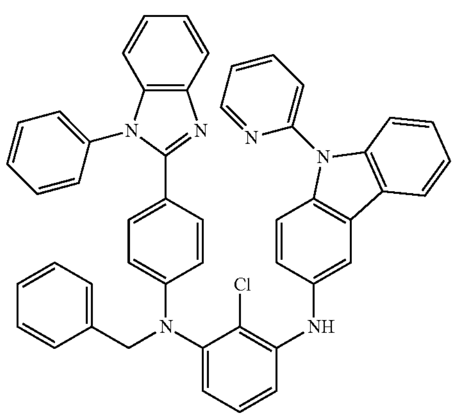

+

(31-1)

-continued

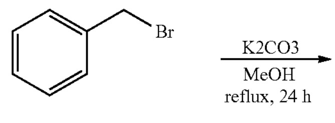

SM

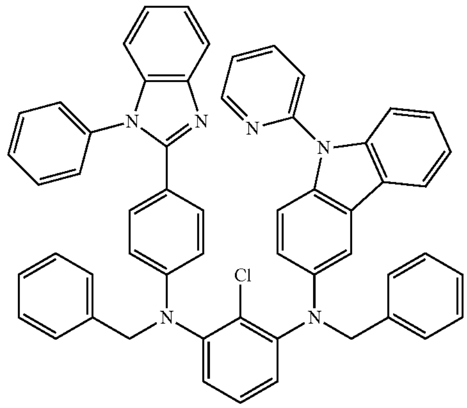

(31-2)

Under nitrogen condition, the compound 31-1 (14.9 g, 20 mmol), the compound SM (3.42 g, 20 mmol) and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 31-2 (14.2 g, yield: 85%).

(3) Compound 31-3

-continued

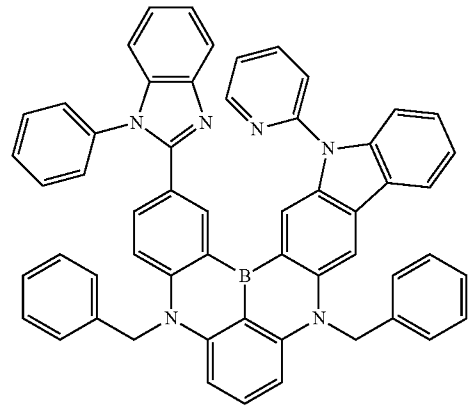

(31-3)

Under nitrogen condition, the compound 31-2 (8.33 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 31-3 (2.42 g, yield: 30%).

(4) Compound 31-4

[Reaction Formula 4-3]

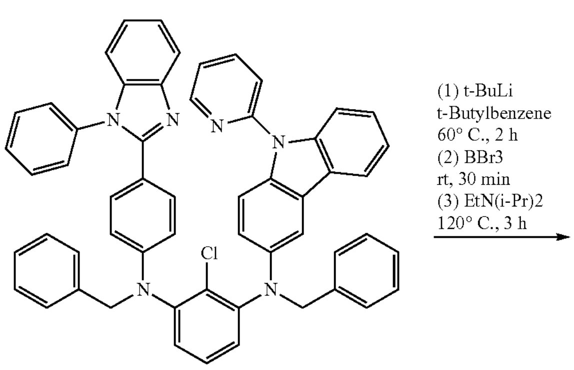

(31-2)

[Reaction Formula 4-4]

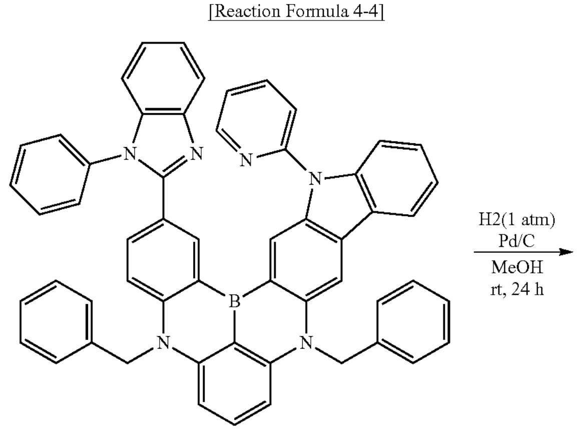

(31-3)

-continued

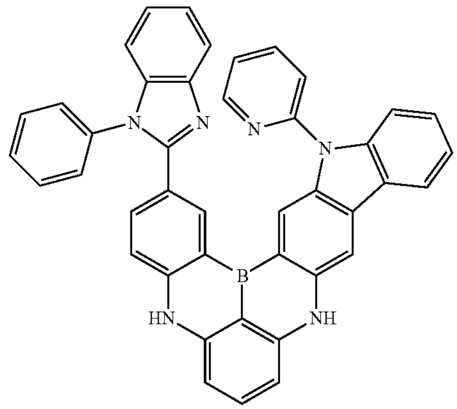

(31-4)

Under hydrogen 1 atmosphere condition, the compound 31-3 (8.07 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 31-4 (5.01 g, yield: 80%).

(5) Compound 31-5

[Reaction Formula 4-5]

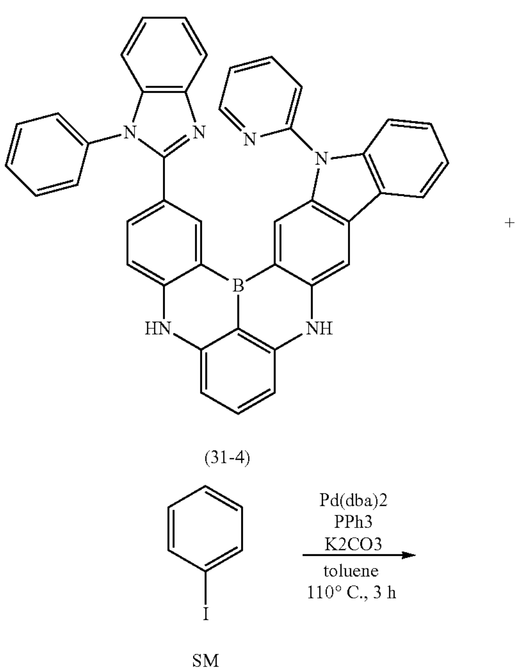

-continued

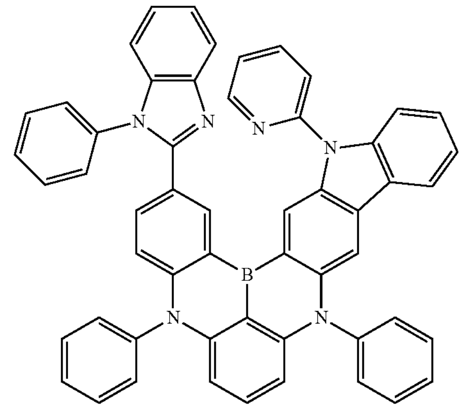

(31-5)

Under nitrogen condition, the compound 31-4 (12.5 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 31-5 (14.0 g, yield: 90%).

(6) Compound 31

[Reaction Formula 4-6]

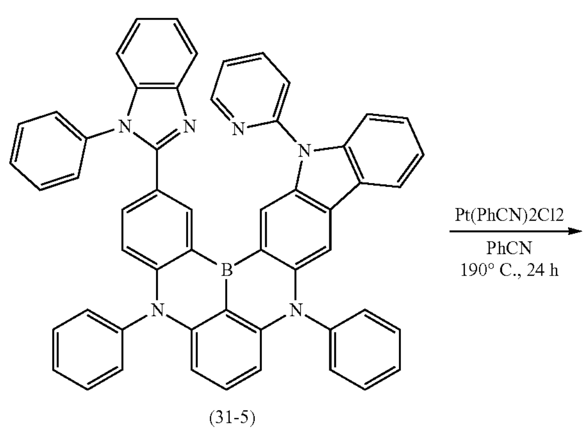

-continued

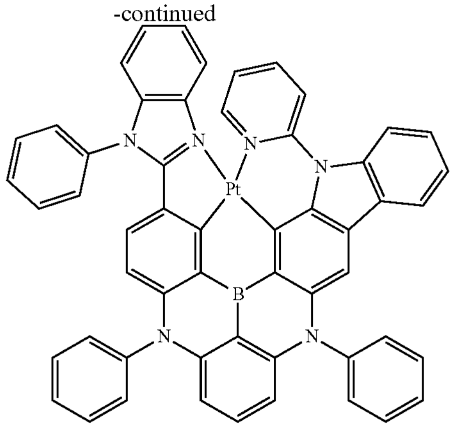

(31)

-continued

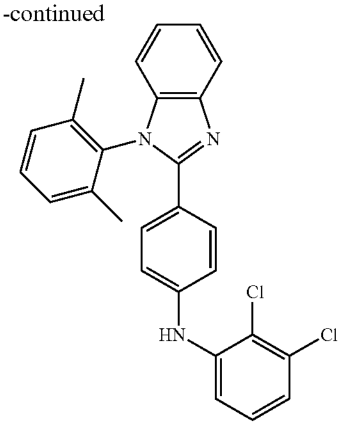

(38-1)

Under nitrogen condition, the compound 31-5 (7.79 g, 10 mmol) and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 31 (2.53 g, yield: 26%).

5. Synthesis of Compound 38

(1) Compound 38-1

[Reaction Formula 5-1]

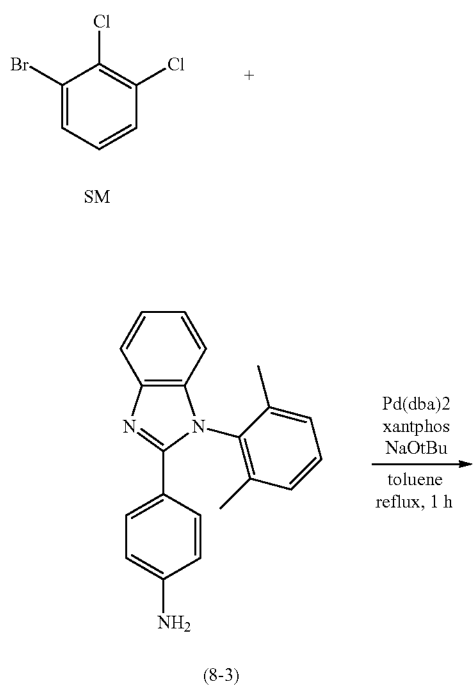

Under nitrogen condition, the compound SM (4.52 g, 20 mmol), the compound 8-3 (6.27 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 38-1 (7.98 g, yield: 87%).

(2) Compound 38-2

[Reaction Formula 5-2]

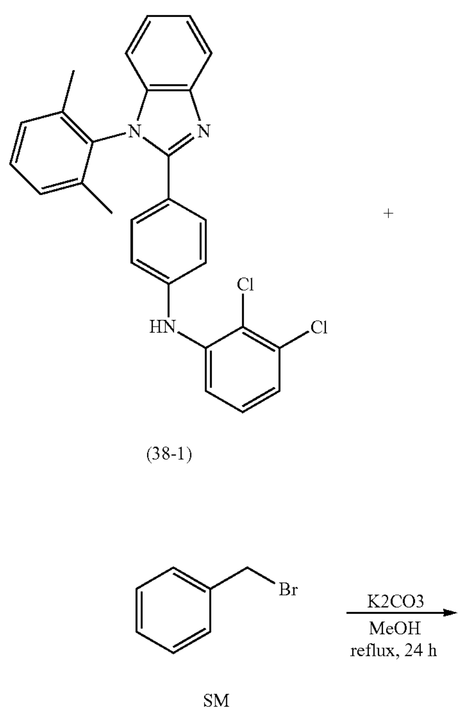

-continued

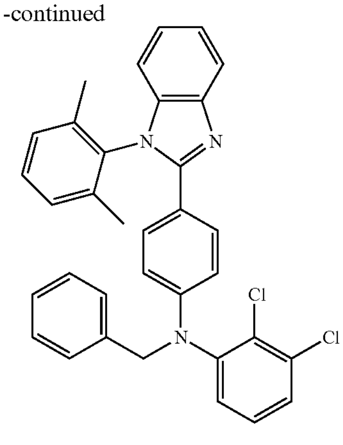

(38-2)

Under nitrogen condition, the compound 38-1 (9.17 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 38-2 (9.87 g, yield: 90%).

(3) Compound 38-3

[Reaction Formula 5-3]

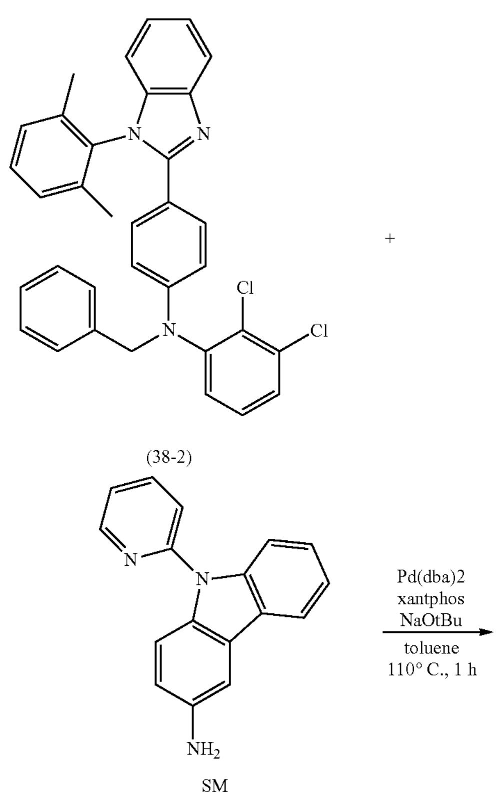

-continued

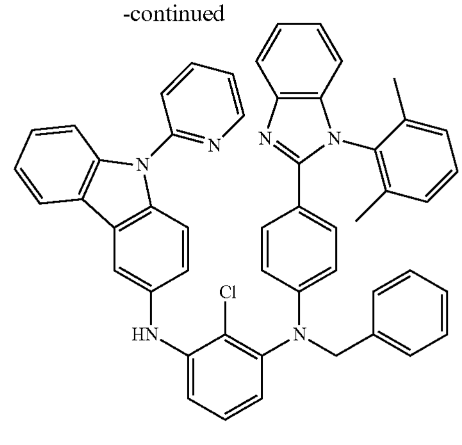

(38-3)

Under nitrogen condition, the compound 38-2 (10.9 g, 20 mmol), the compound SM (5.19 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 38-3 (13.4 g, yield: 87%).

(4) Compound 38-4

[Reaction Formula 5-4]

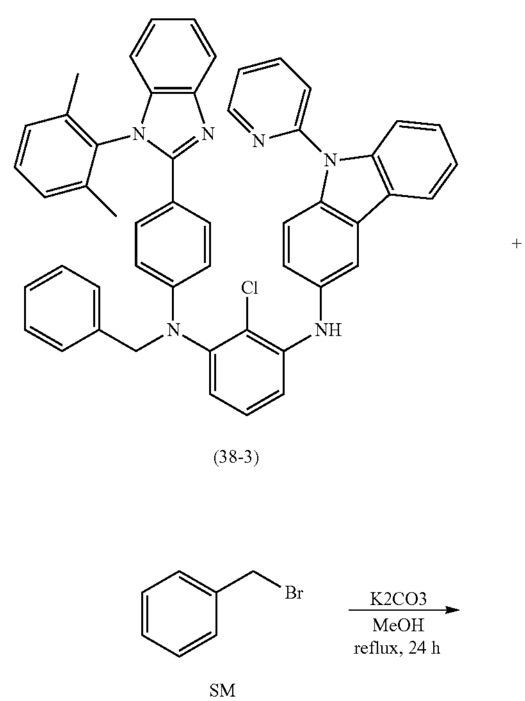

-continued

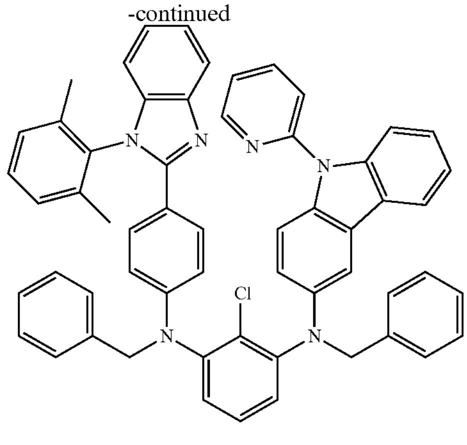

(38-4)

Under nitrogen condition, the compound 38-3 (15.4 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 38-4 (15.5 g, yield: 90%).

(5) Compound 38-5

[Reaction Formula 5-5]

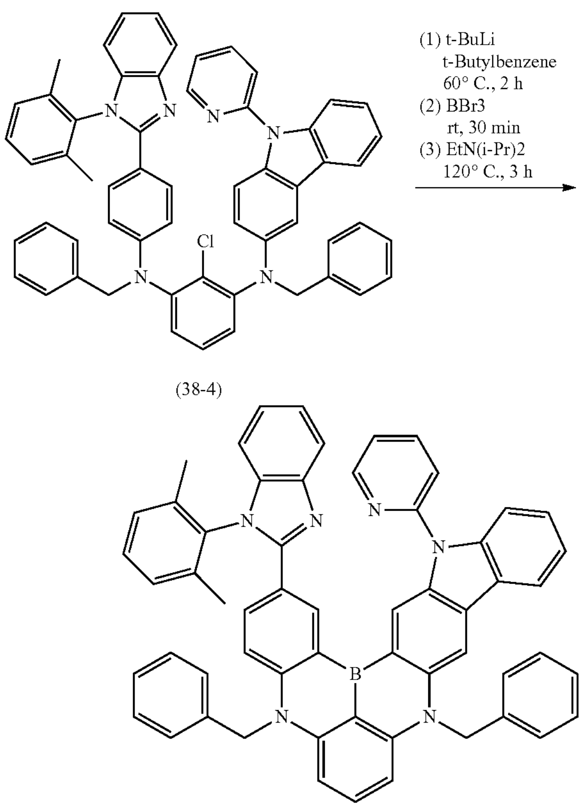

(38-5)

Under nitrogen condition, the compound 38-4 (8.62 g, 10 mmol) was dissolved in t-butylbenzene (100 ml) in the rounded-bottom flask (500 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 38-5 (2.67 g, yield: 32%).

(6) Compound 38-6

[Reaction Formula 5-6]

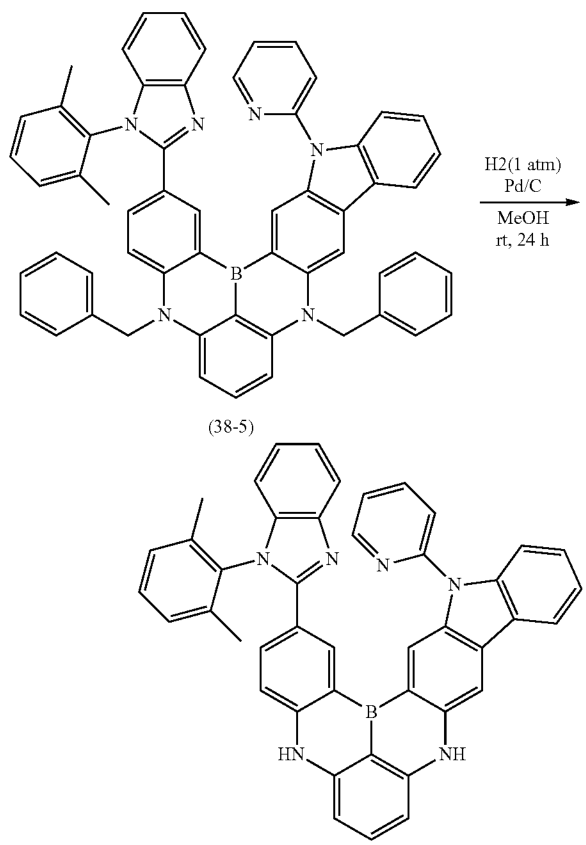

(38-6)

Under hydrogen 1 atmosphere condition, the compound 38-5 (8.35 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 38-6 (5.37 g, yield: 82%).

(7) Compound 38-7

[Reaction Formula 5-7]

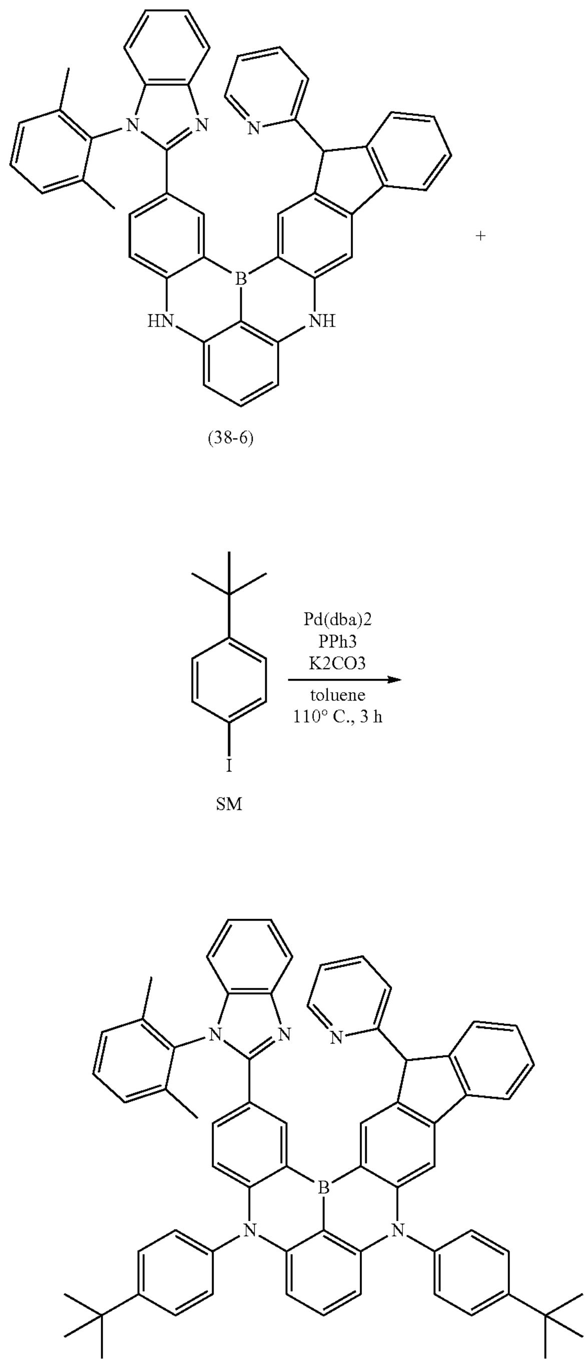

Under nitrogen condition, the compound 38-6 (13.1 g, 20 mmol), the compound SM (10.4 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 38-7 (16.9 g, yield: 92%).

(8) Compound 38

[Reaction Formula 5-8]

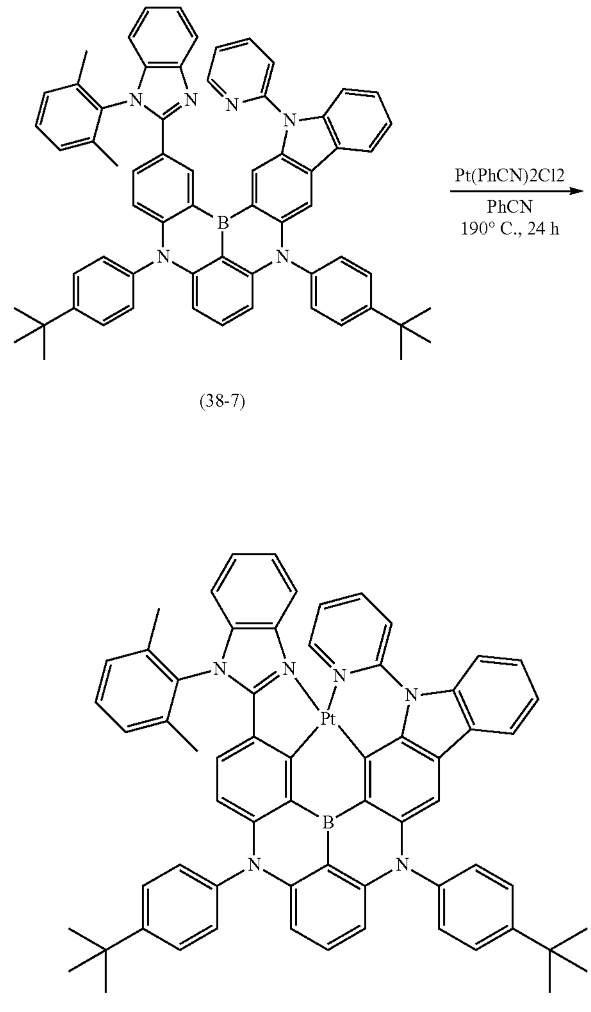

Under nitrogen condition, the compound 38-7 (9.19 g, 10 mmol) and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 38 (3.34 g, yield: 30%).

6. Synthesis of Compound 96

(1) Compound 96-1

[Reaction Formula 6-1]

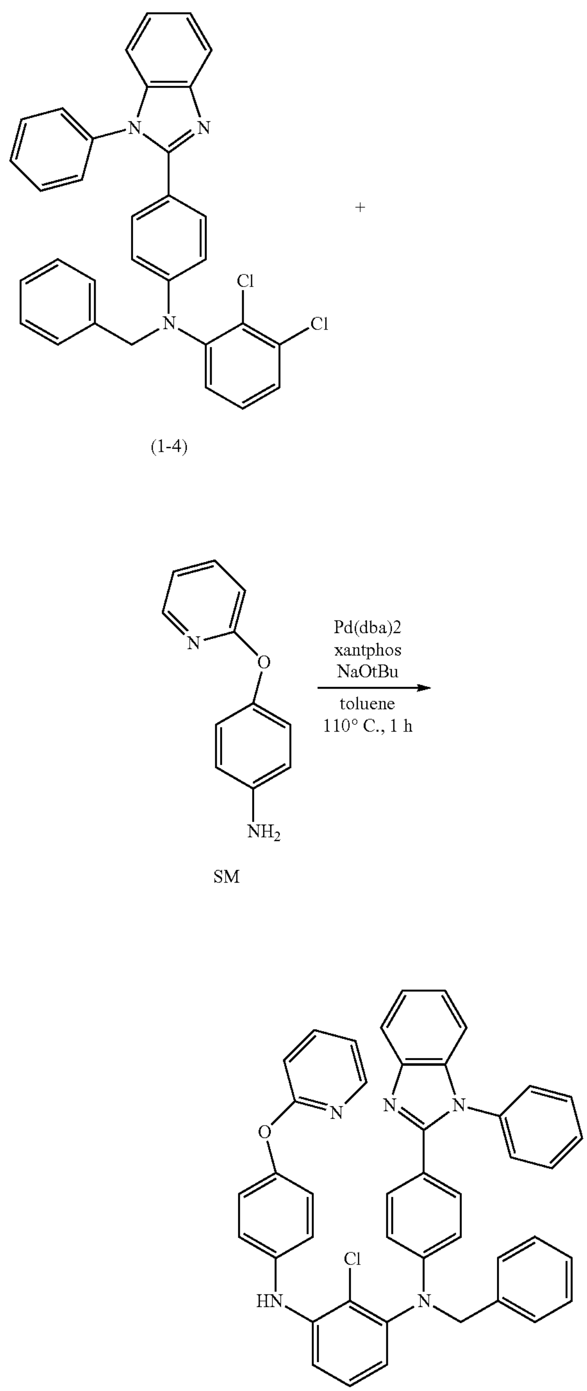

(1-4)

SM (96-1)

Under nitrogen condition, the compound 1-4 (10.4 g, 20 mmol), the compound SM (3.72 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 96-1 (11.1 g, yield: 83%).

(2) Compound 96-2

[Reaction Formula 6-2]

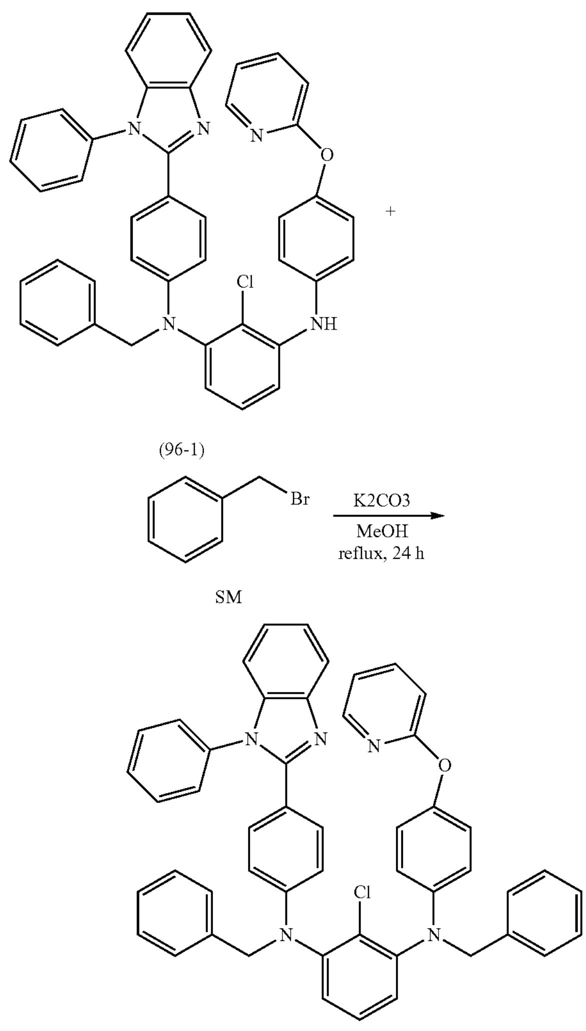

(96-1)

SM (96-2)

Under nitrogen condition, the compound 96-1 (13.4 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 96-2 (13.1 g, yield: 86%).

(3) Compound 96-3

[Reaction Formula 6-3]

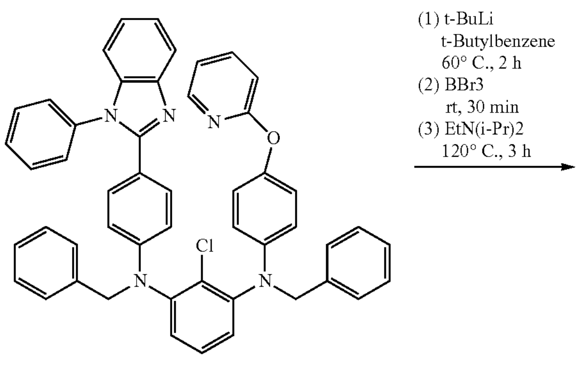

(96-2)

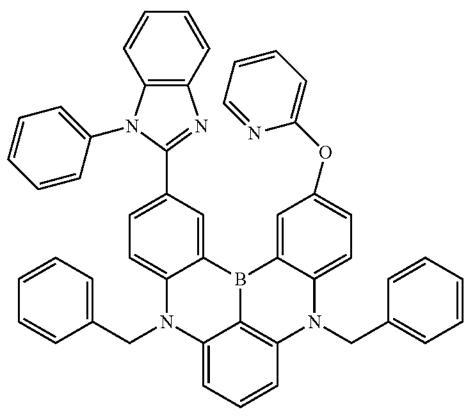

(96-3)

Under nitrogen condition, the compound 96-2 (7.60 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 96-3 (2.20 g, yield: 30%).

(4) Compound 96-4

[Reaction Formula 6-4]

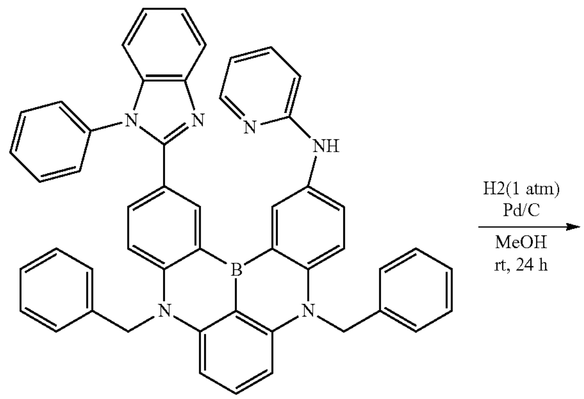

(96-3)

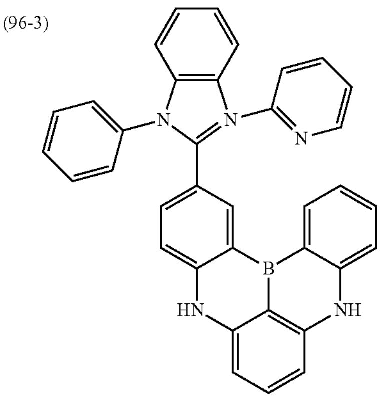

(96-4)

Under hydrogen 1 atmosphere condition, the compound 96-3 (7.34 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 96-4 (4.75 g, yield: 88%).

(5) Compound 96-5

[Reaction Formula 6-5]

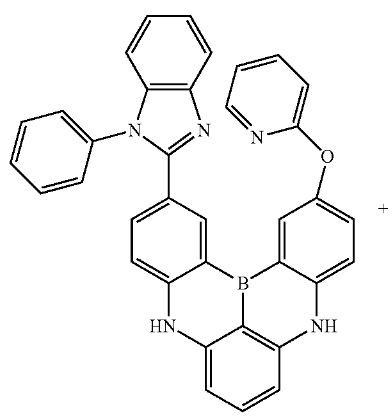

(96-4)

-continued

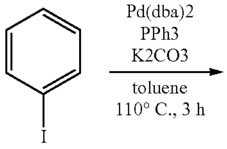

SM

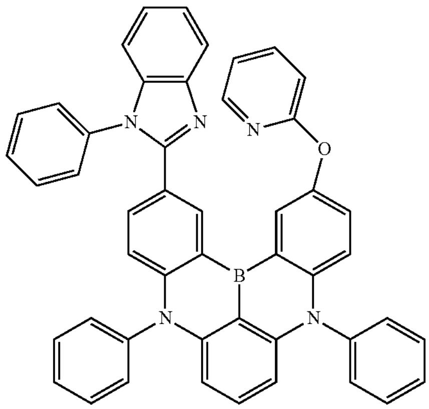

(96-5)

Under nitrogen condition, the compound 96-4 (10.8 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 96-5 (12.4 g, yield: 88%).

(6) Compound 96

[Reaction Formula 6-6]

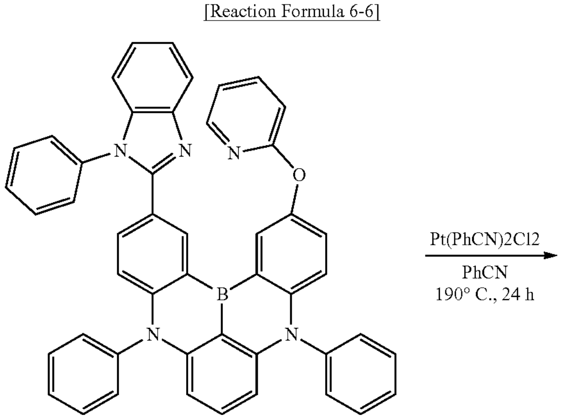

(96-5)

-continued

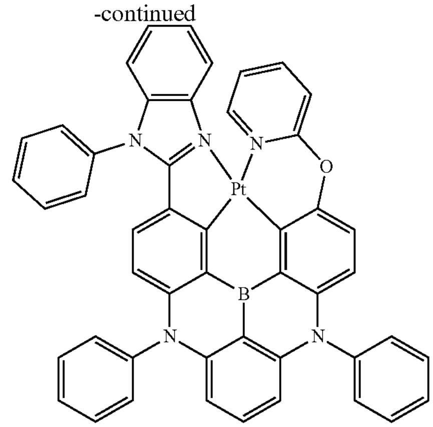

(96)

Under nitrogen condition, the compound 96-5 (7.06 g, 10 mmol) and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 96 (2.70 g, yield: 30%).

7. Synthesis of Compound 102

(1) Compound 102-1

[Reaction Formula 7-1]

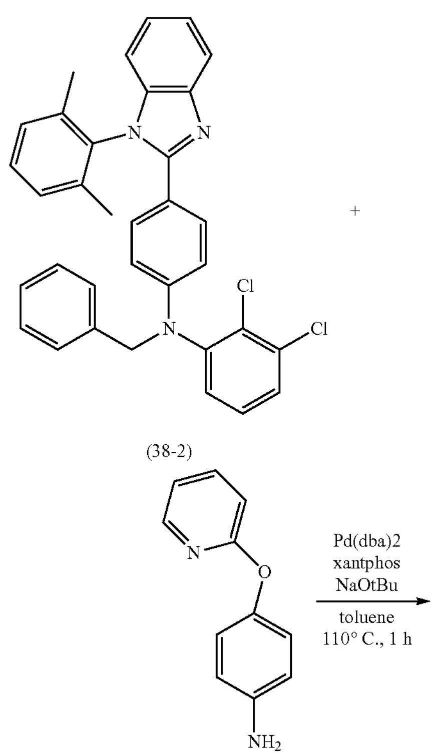

(38-2)

SM

-continued

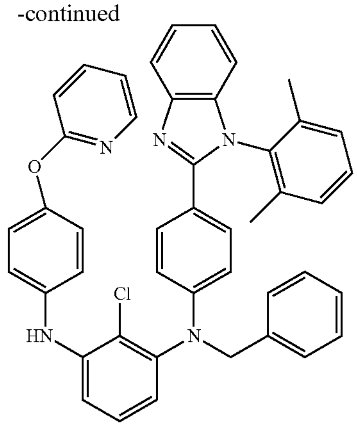

(102-1)

Under nitrogen condition, the compound 38-2 (10.9 g, 20 mmol), the compound SM (3.72 g, 20 mmol), Pd(dba)$_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 102-1 (11.9 g, yield: 85%).

(2) Compound 102-2

[Reaction Formula 7-2]

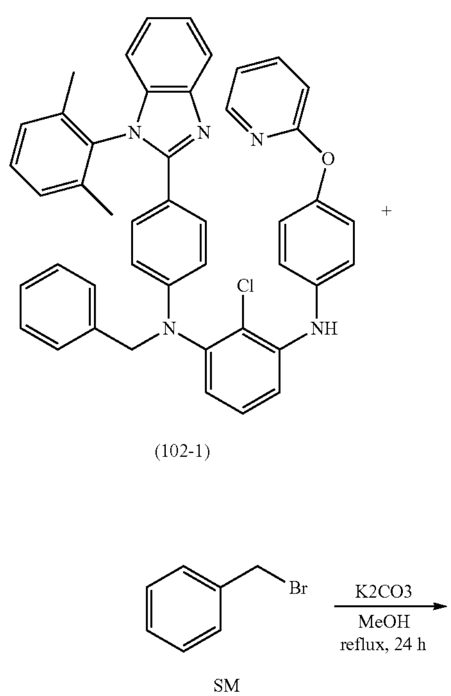

-continued

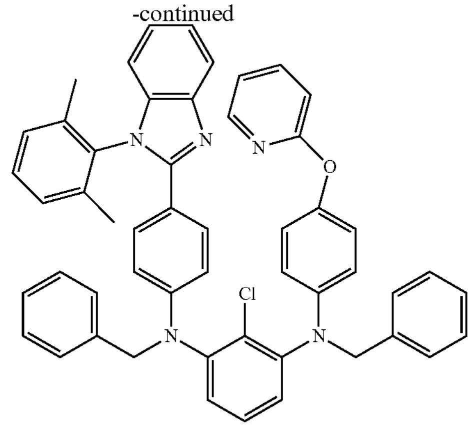

(102-2)

Under nitrogen condition, the compound 102-1 (14.0 g, 20 mmol), the compound SM (3.42 g, 20 mmol) and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 102-2 (14.7 g, yield: 93%).

(3) Compound 102-3

[Reaction Formula 7-3]

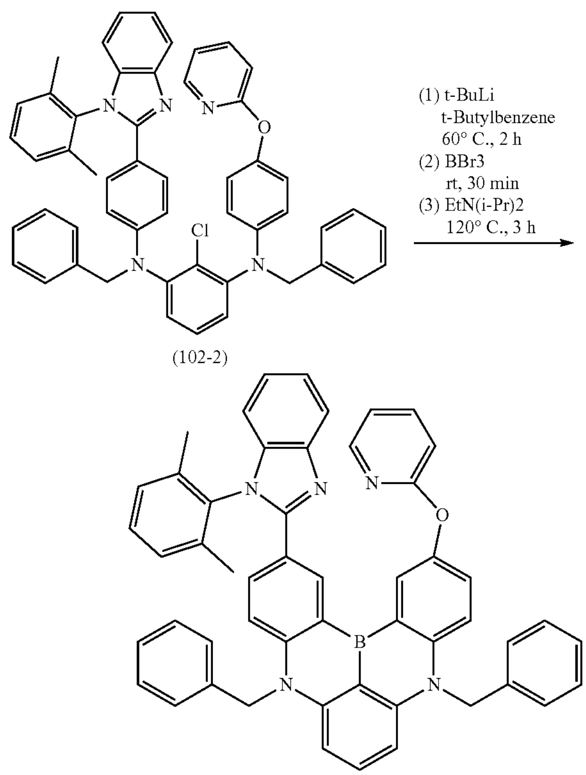

(102-3)

Under nitrogen condition, the compound 102-2 (7.88 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 102-3 (2.29 g, yield: 30%).

(4) Compound 102-4

[Reaction Formula 7-4]

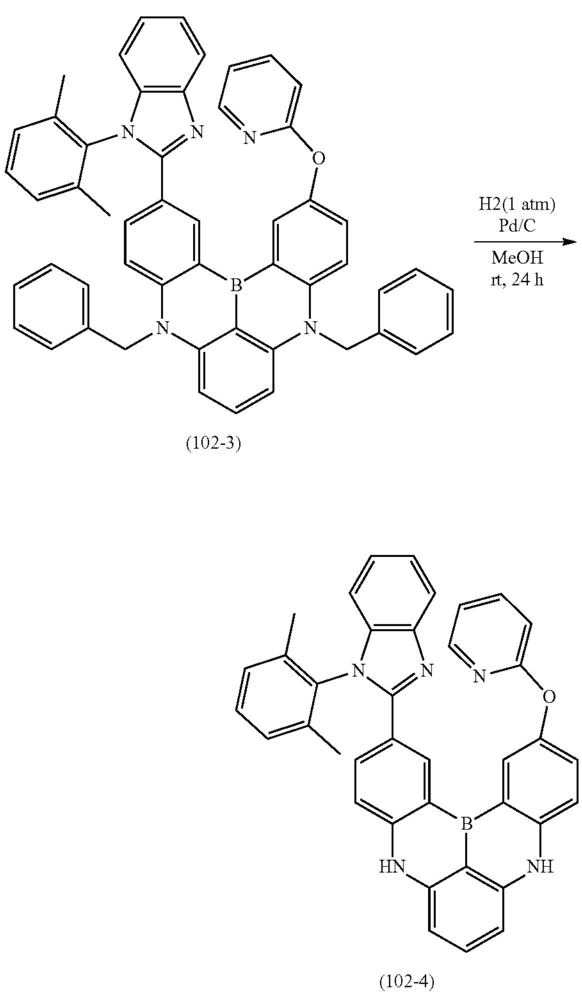

Under hydrogen 1 atmosphere condition, the compound 102-3 (7.62 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 102-4 (4.94 g, yield: 85%).

(5) Compound 102-5

[Reaction Formula 7-5]

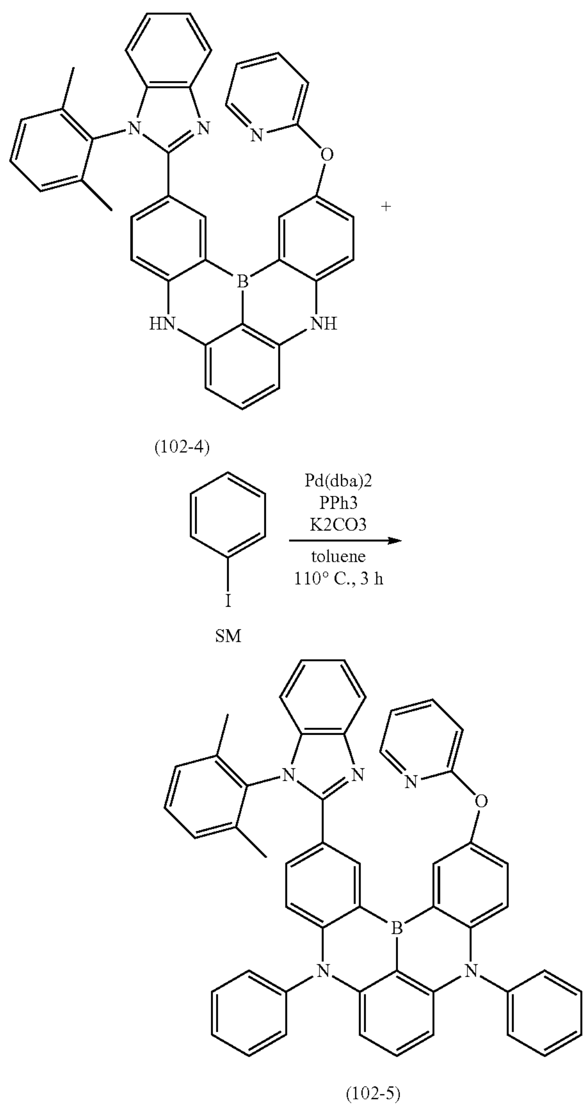

Under nitrogen condition, the compound 102-4 (11.6 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 102-5 (13.2 g, yield: 90%).

(6) Compound 102

[Reaction Formula 7-6]

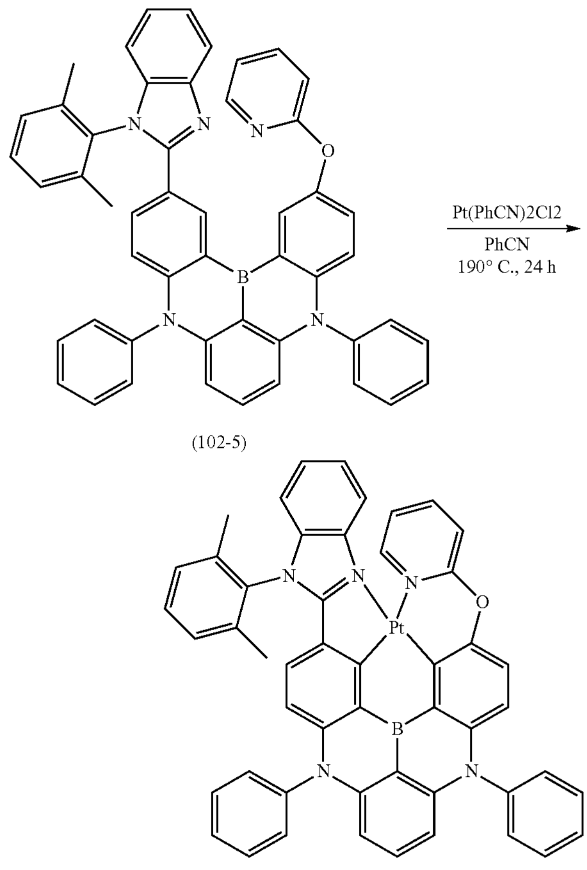

(102-5)

(102)

Under nitrogen condition, the compound 102-5 (7.34 g, 10 mmol) and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 102 (2.97 g, yield: 32%).

8. Synthesis of Compound 41

(1) Compound 41-1

[Reaction Formula 8-1]

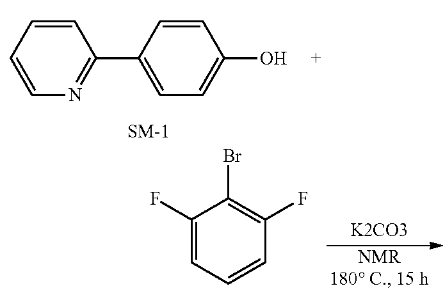

SM-1

SM-2

-continued

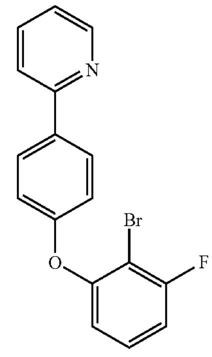

(41-1)

Under nitrogen condition, the compound SM-1 (3.42 g, 20 mmol), the compound SM-2 (3.86 g, 20 mmol), and $K_2CO_3$ (4.14 g, 30 mmol) were dissolved by N-methyl-2-pyrrolidone (NMP, 100 ml) in the rounded-bottom flask (250 ml), and the mixture was heated and stirred at 180° C. for 15 hours. After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 41-1 (5.51 g, yield: 80%).

(2) Compound 41-2

[Reaction Formula 8-2]

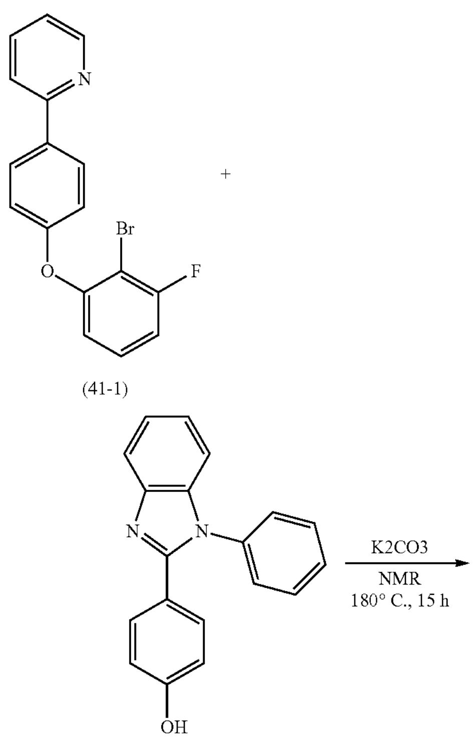

(41-1)

SM

-continued

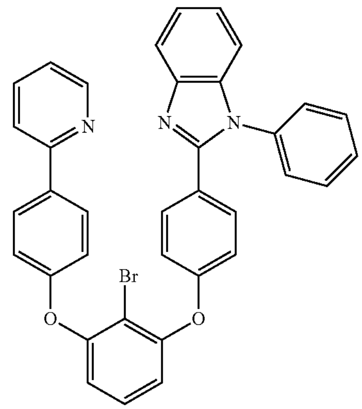

(41-2)

-continued

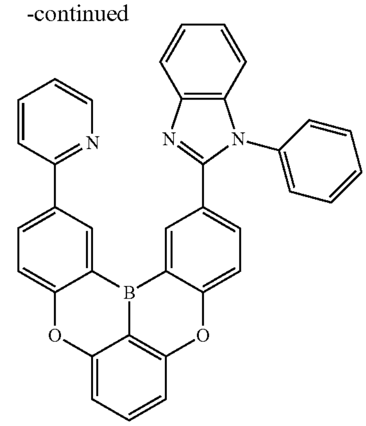

(41-3)

Under nitrogen condition, the compound 41-1 (6.88 g, 20 mmol), the compound SM (5.73 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 41-2 (10.1 g, yield: 82%).

(3) Compound 41-3

Under nitrogen condition, the compound 41-2 (6.11 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 41-3 (1.73 g, yield: 32%).

(4) Compound 41

[Reaction Formula 8-3]

[Reaction Formula 8-4]

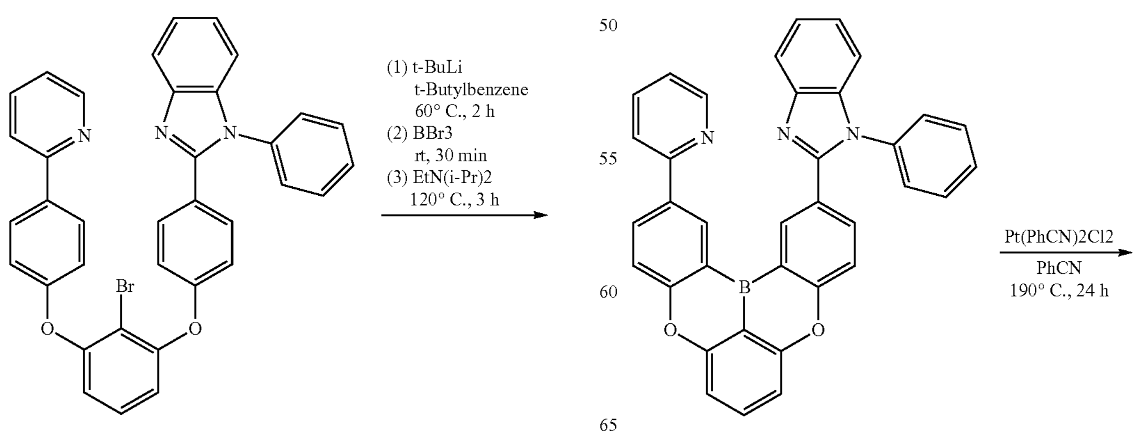

(41-2) (41-3)

-continued

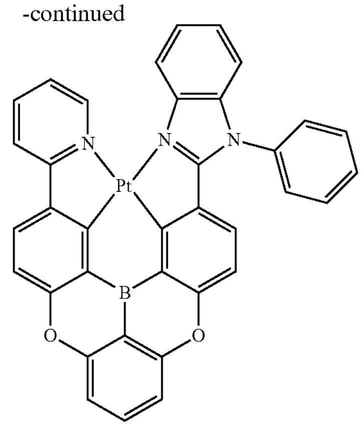

(41)

Under nitrogen condition, the compound 41-3 (5.40 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 41 (2.56 g, yield: 35%).

9. Synthesis of Compound 42

(1) Compound 42-1

[Reaction Formula 9-1]

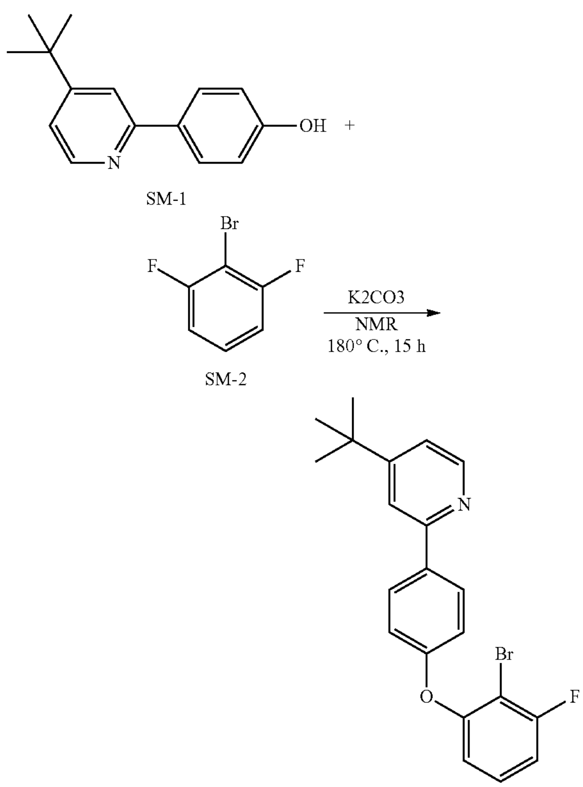

Under nitrogen condition, the compound SM-1 (4.55 g, 20 mmol), the compound SM-2 (3.86 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 42-1 (6.81 g, yield: 85%).

(2) Compound 42-2

[Reaction Formula 9-2]

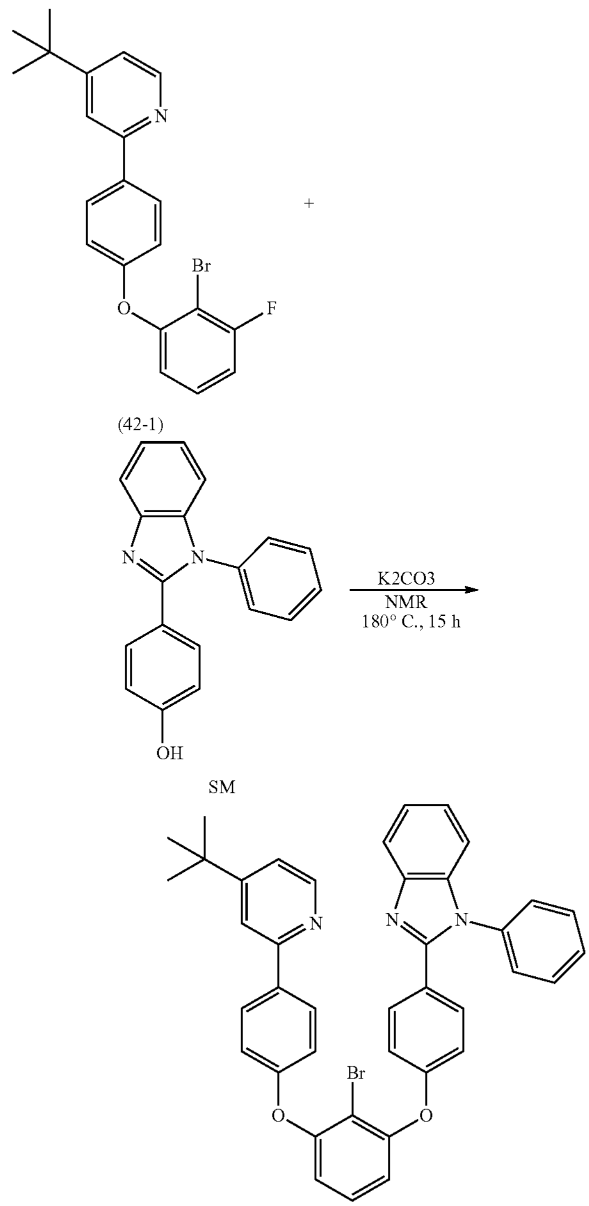

Under nitrogen condition, the compound 42-1 (8.00 g, 20 mmol), the compound SM (5.73 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 42-2 (11.3 g, yield: 85%).

(3) Compound 42-3

[Reaction Formula 9-3]

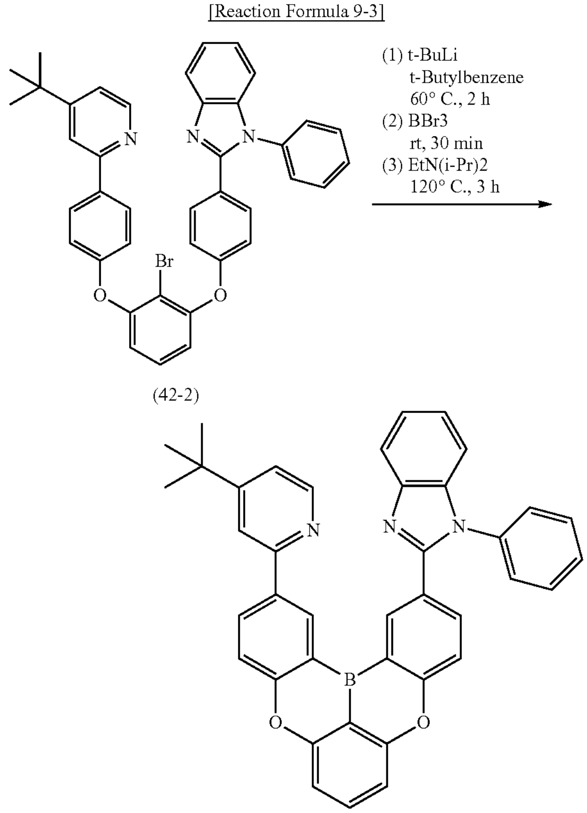

(42-2)

(42-3)

Under nitrogen condition, the compound 42-2 (6.67 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 42-3 (1.79 g, yield: 30%).

(4) Compound 42

[Reaction Formula 9-4]

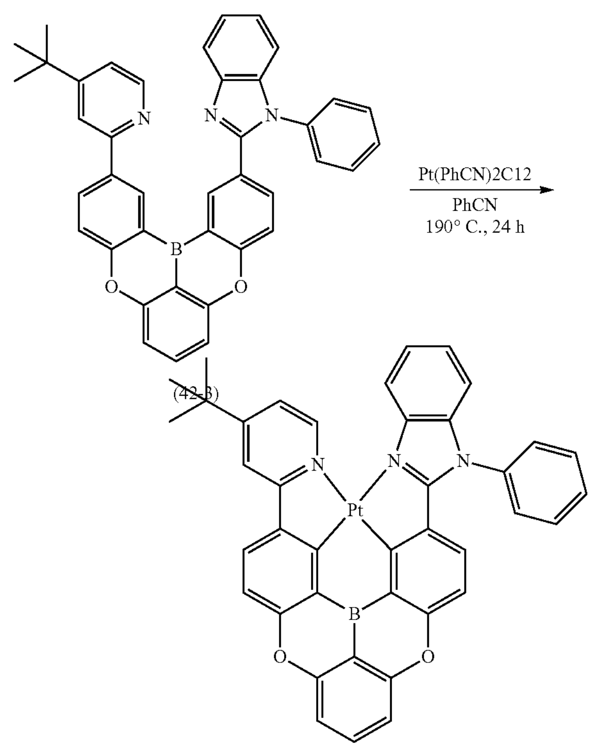

(42)

Under nitrogen condition, the compound 42-3 (5.96 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 42 (2.76 g, yield: 35%).

10. Synthesis of Compound 52

(1) Compound 52-1

[Reaction Formula 10-1]

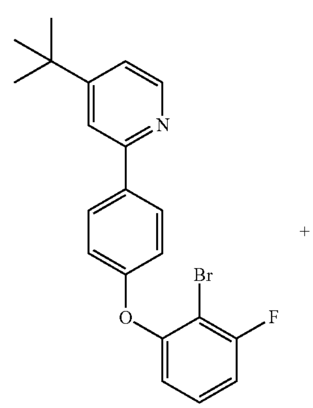

(42-1)

-continued

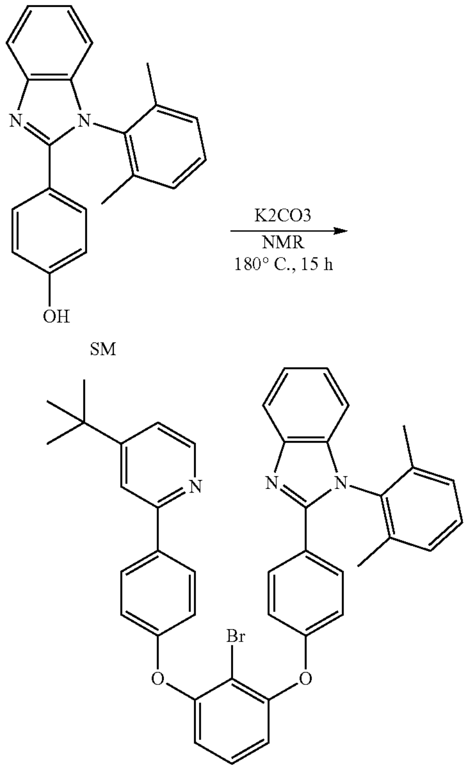

(52-1)

Under nitrogen condition, the compound 42-1 (8.00 g, 20 mmol), the compound SM (6.29 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 52-1 (11.5 g, yield: 83%).

(2) Compound 52-2

[Reaction Formula 10-2]

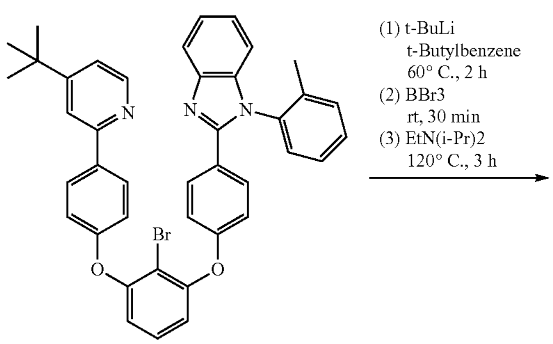

(52-1)

-continued

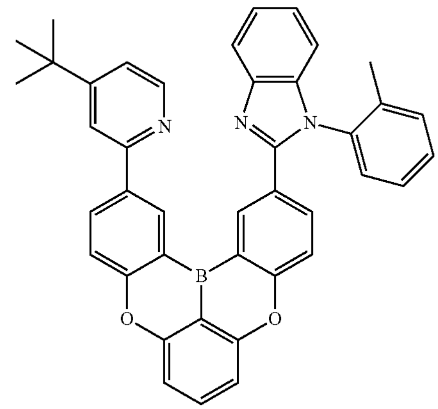

(52-2)

Under nitrogen condition, the compound 52-1 (6.95 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 52-2 (2.18 g, yield: 35%).

(3) Compound 52

[Reaction Formula 10-3]

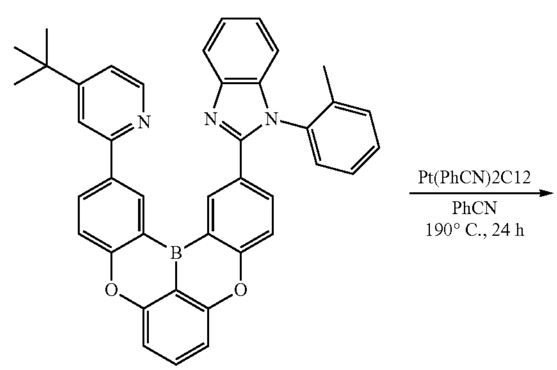

(52-2)

-continued

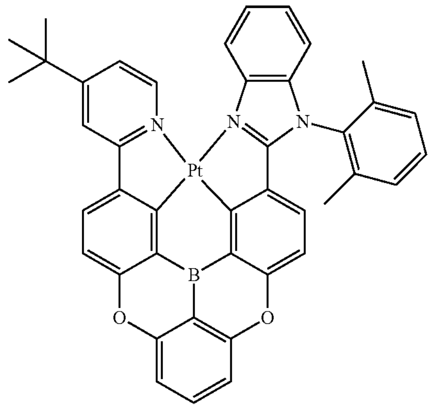

(52)

Under nitrogen condition, the compound 52-2 (6.24 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 52 (3.02 g, yield: 37%).

11. Synthesis of Compound 71

(1) Compound 71-1

[Reaction Formula 11-1]

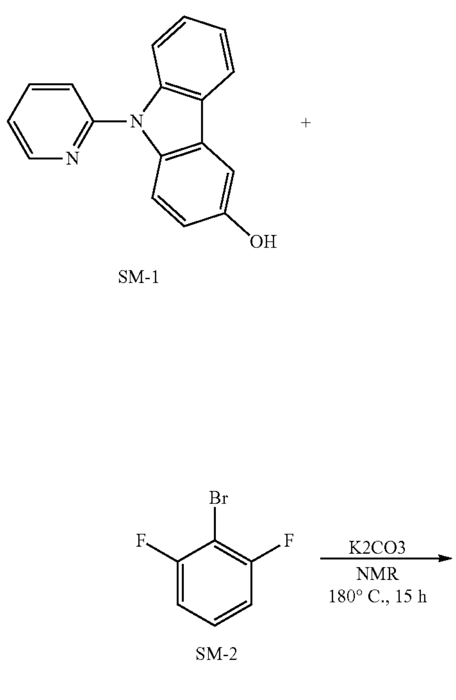

-continued

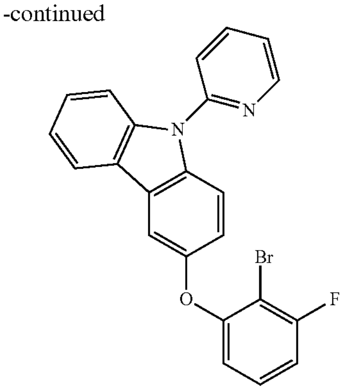

(71-1)

Under nitrogen condition, the compound SM-1 (5.21 g, 20 mmol), the compound SM-2 (3.86 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 71-1 (7.37 g, yield: 85%).

(2) Compound 71-2

[Reaction Formula 11-2]

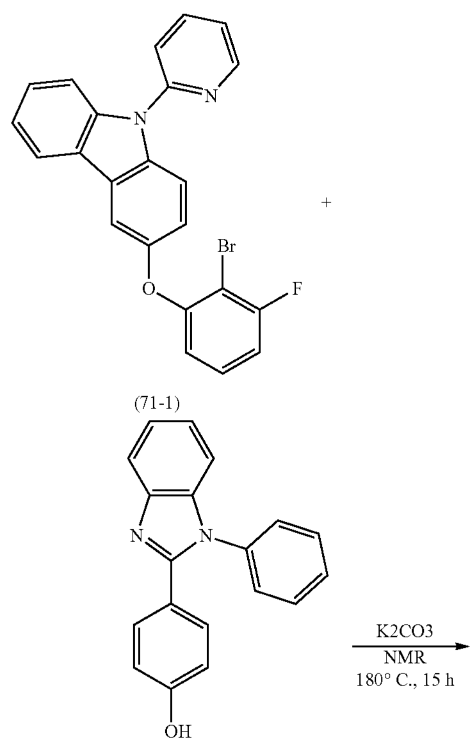

-continued

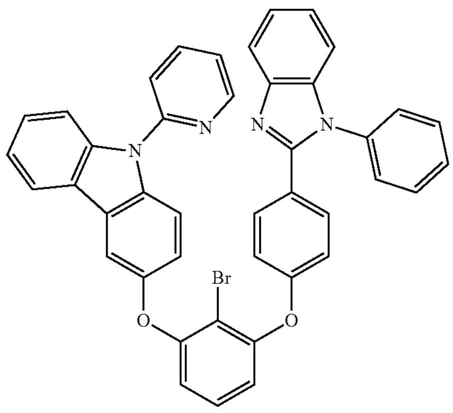

(71-2)

Under nitrogen condition, the compound 71-1 (8.67 g, 20 mmol), the compound SM (5.73 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 71-2 (11.2 g, yield: 80%).

(3) Compound 71-3

[Reaction Formula 11-3]

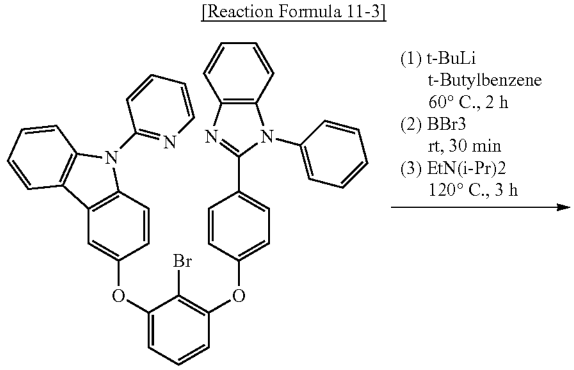

(71-2)

-continued

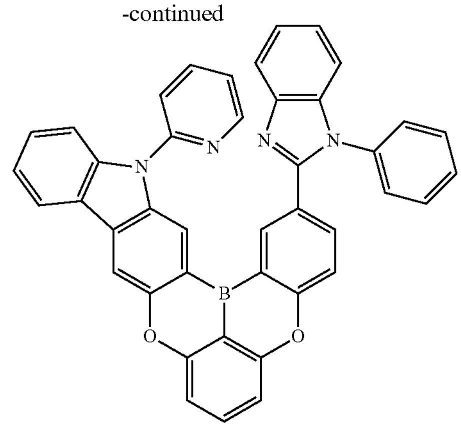

(71-3)

Under nitrogen condition, the compound 71-2 (7.00 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 71-3 (1.95 g, yield: 31%).

(4) Compound 71

[Reaction Formula 11-4]

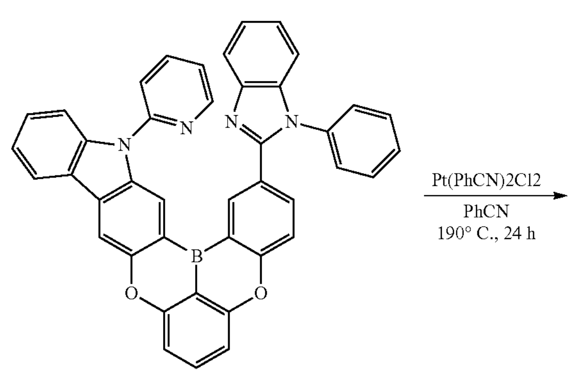

(71-3)

-continued

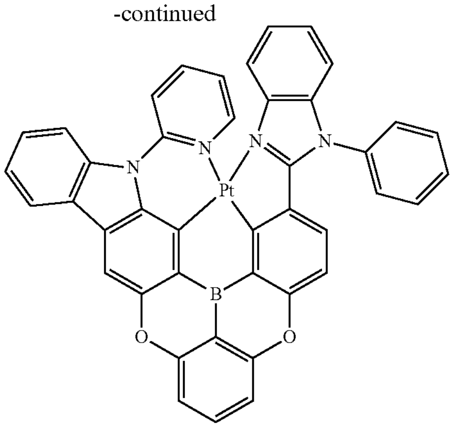

(71)

Under nitrogen condition, the compound 71-3 (6.29 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 71 (2.71 g, yield: 33%).

12. Synthesis of Compound 72

(1) Compound 72-1

[Reaction Formula 12-1]

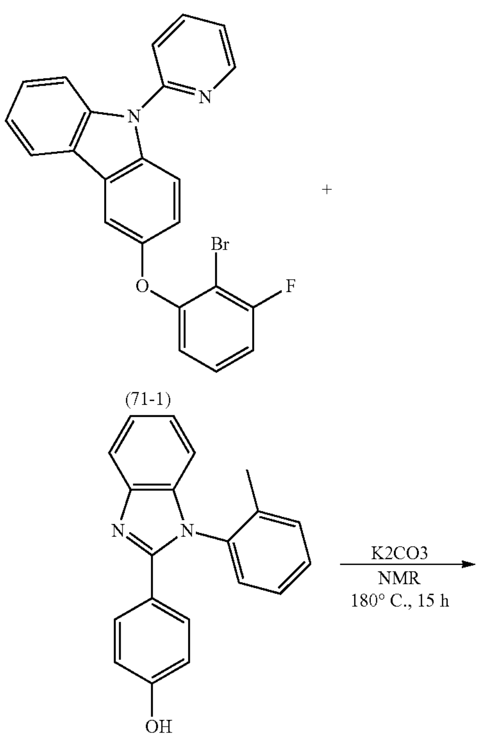

(71-1)

SM

-continued

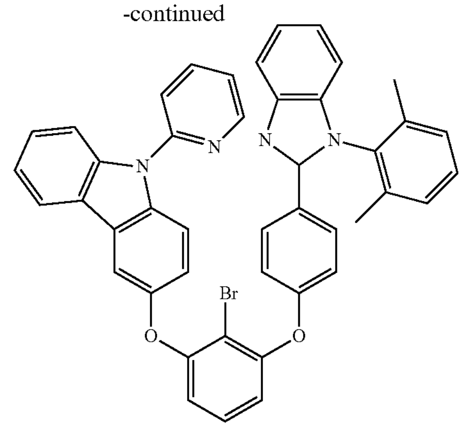

(72-1)

Under nitrogen condition, the compound 71-1 (8.67 g, 20 mmol), the compound SM (6.29 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 72-1 (12.4 g, yield: 85%).

(2) Compound 72-2

[Reaction Formula 12-2]

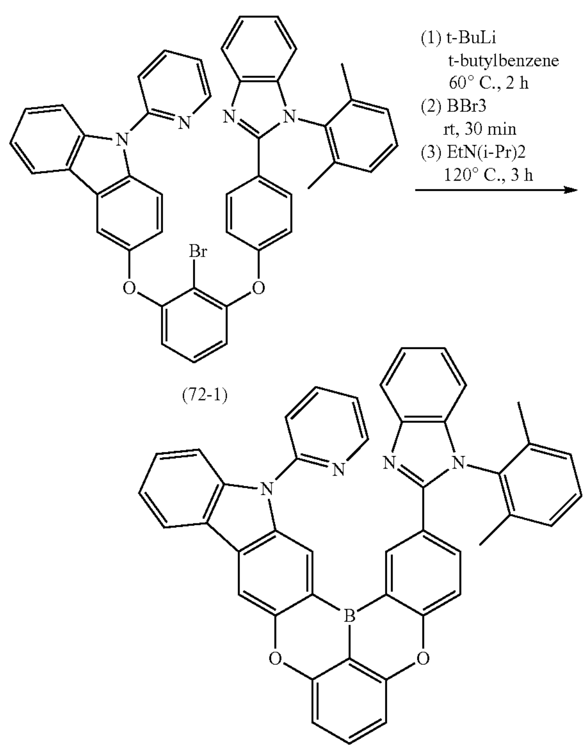

(72-2)

Under nitrogen condition, the compound 72-1 (7.28 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 72-2 (1.90 g, yield: 29%).

(3) Compound 72

[Reaction Formula 12-3]

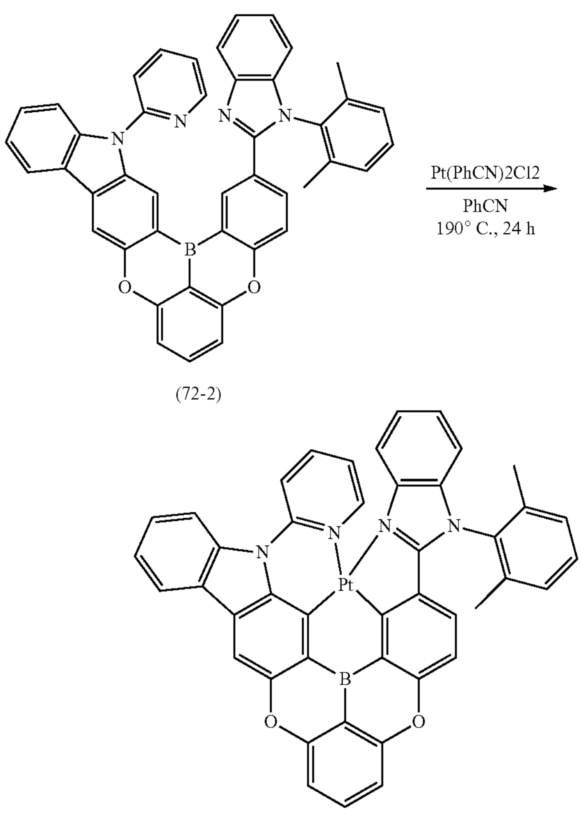

(72-2)

(72)

Under nitrogen condition, the compound 72-2 (6.57 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 72 (3.06 g, yield: 36%).

13. Synthesis of Compound 82

(1) Compound 82-1

[Reaction Formula 13-1]

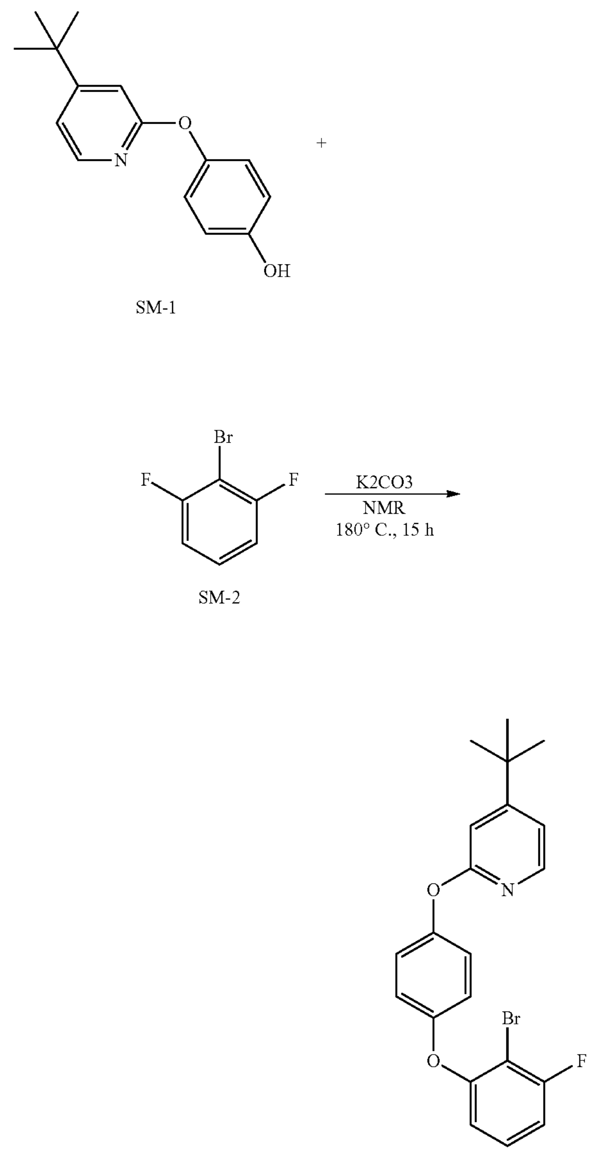

SM-1

SM-2

(82-1)

Under nitrogen condition, the compound SM-1 (4.87 g, 20 mmol), the compound SM-2 (3.86 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 82-1 (7.33 g, yield: 88%).

(2) Compound 82-2

[Reaction Formula 13-2]

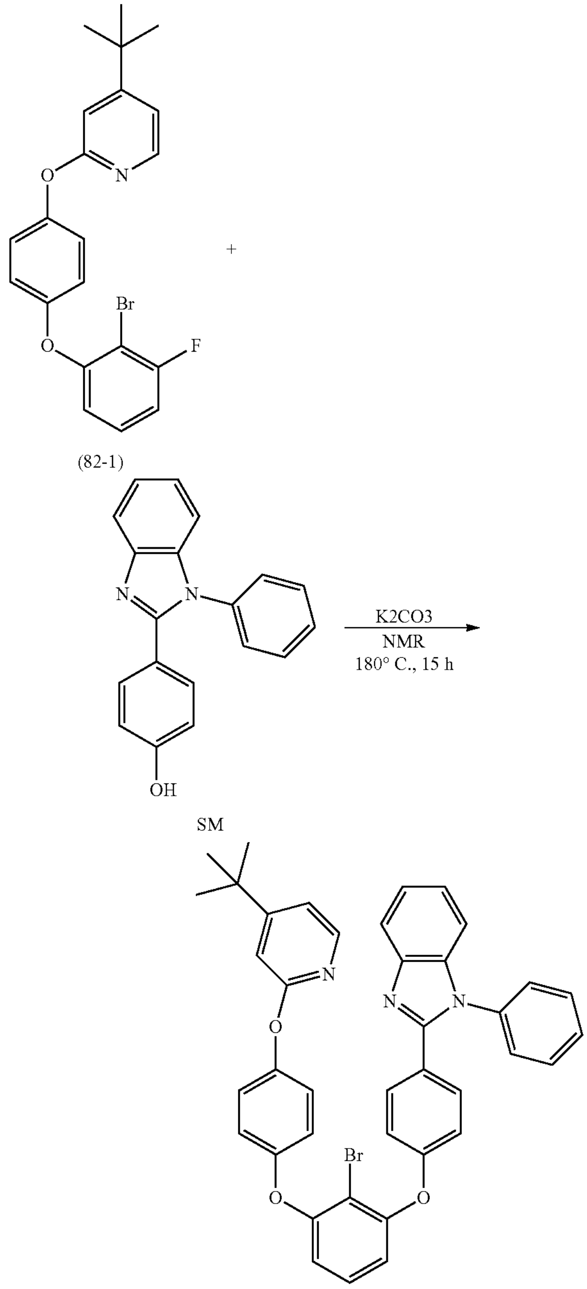

(82-1)

SM (82-2)

Under nitrogen condition, the compound 82-1 (8.33 g, 20 mmol), the compound SM (5.73 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 82-2 (11.2 g, yield: 82%).

(3) Compound 82-3

[Reaction Formu;a 13-3]

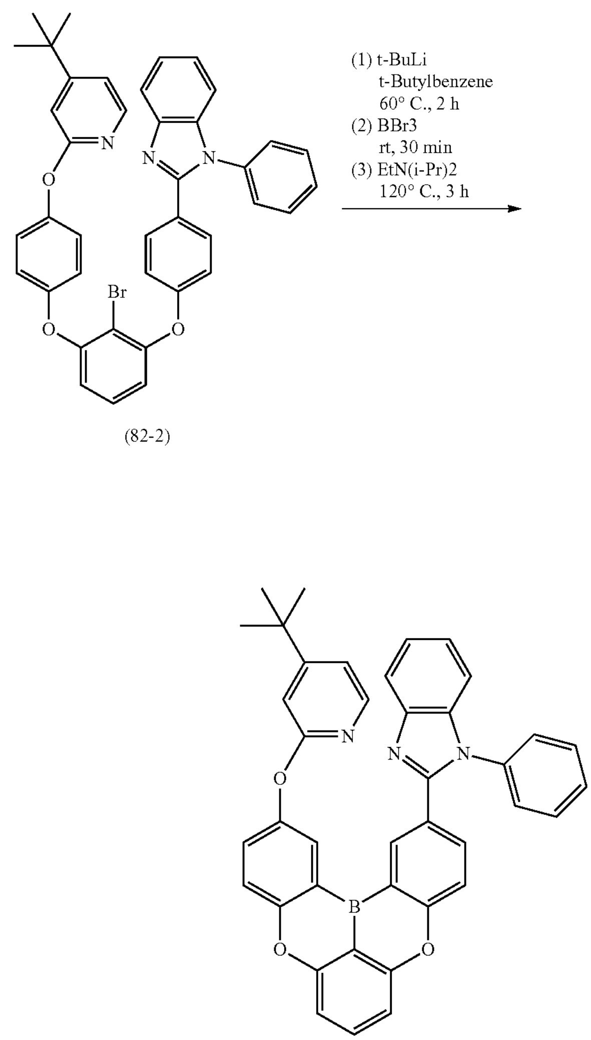

(82-2)

(82-3)

Under nitrogen condition, the compound 82-2 (6.83 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 82-3 (2.26 g, yield: 37%).

(4) Compound 82

[Reaction Formula 13-4]

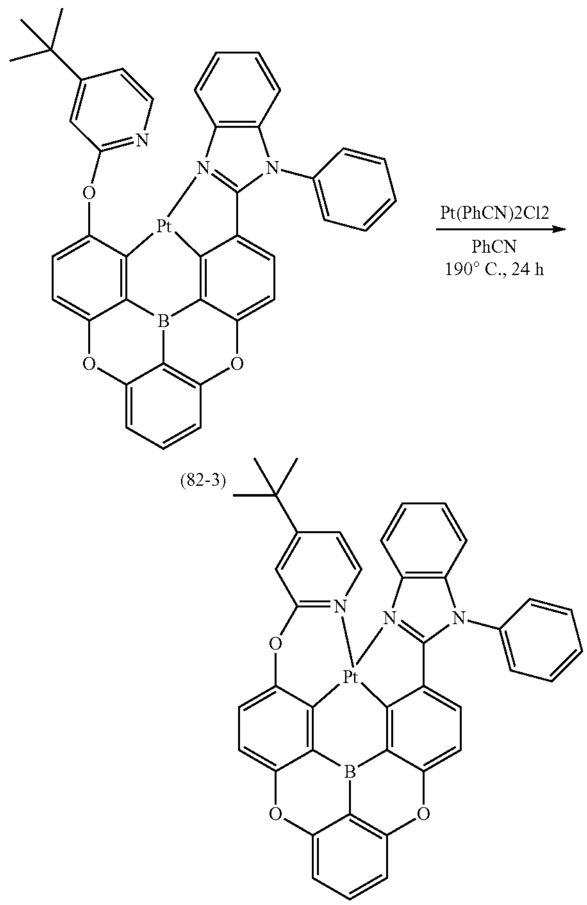

(82-3)

(82)

Under nitrogen condition, the compound 82-3 (6.12 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 82 (2.41 g, yield: 30%).

14. Synthesis of Compound 86

(1) Compound 86-1

[Reaction Formula 14-1]

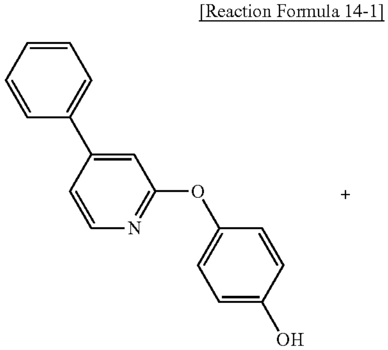

SM-1

-continued

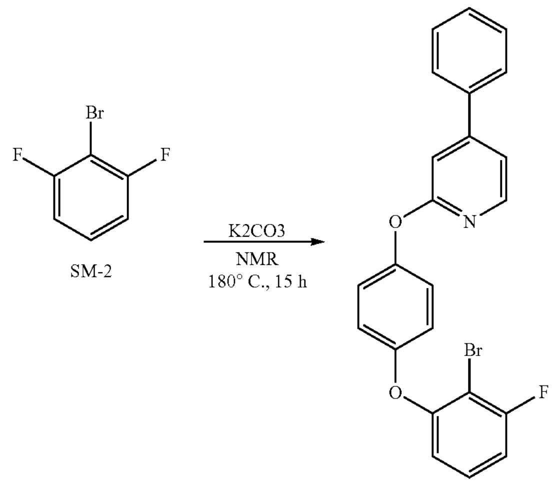

SM-2

(86-1)

Under nitrogen condition, the compound SM-1 (5.27 g, 20 mmol), the compound SM-2 (3.86 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 86-1 (7.42 g, yield: 85%).

(2) Compound 86-2

[Reaction Formula 14-2]

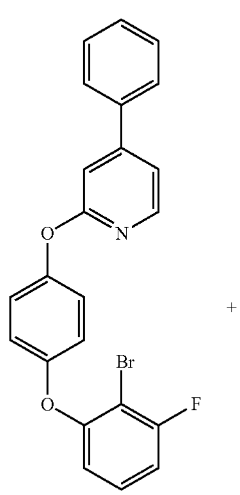

(86-1)

-continued

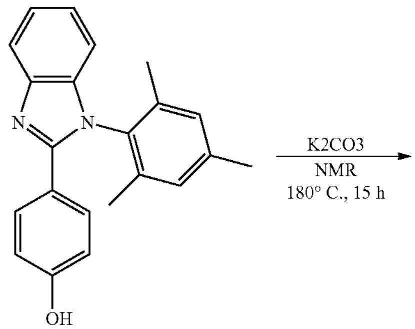

SM

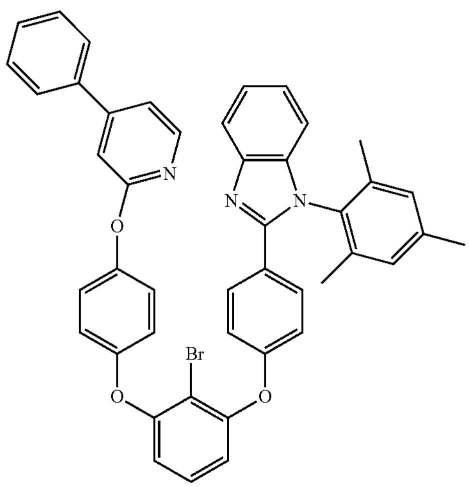

(86-2)

Under nitrogen condition, the compound 86-1 (8.73 g, 20 mmol), the compound SM (6.57 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 86-2 (11.9 g, yield: 80%).

(3) Compound 86-3

[Reaction Formula 14-3]

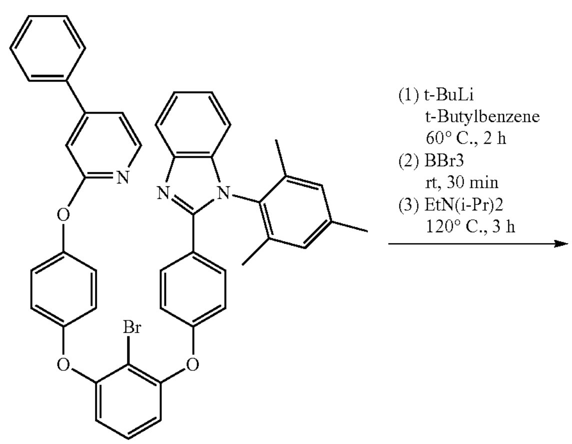

(86-2)

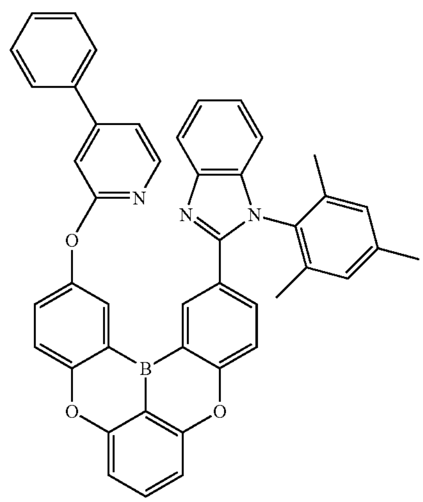

(86-3)

Under nitrogen condition, the compound 86-2 (7.45 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 86-3 (2.22 g, yield: 33%).

(4) Compound 86

[Reaction Formula 14-4]

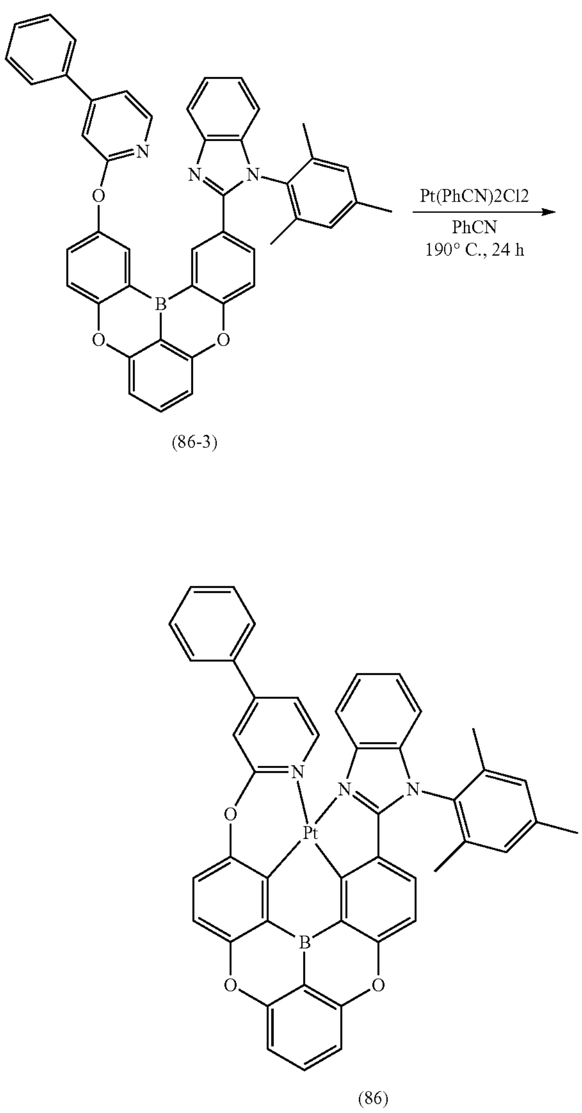

(86-3)

(86)

Under nitrogen condition, the compound 86-3 (6.74 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 86 (2.69 g, yield: 31%).

15. Synthesis of Compound 113

(1) Compound 113-1

[Reaction Formula 15-1]

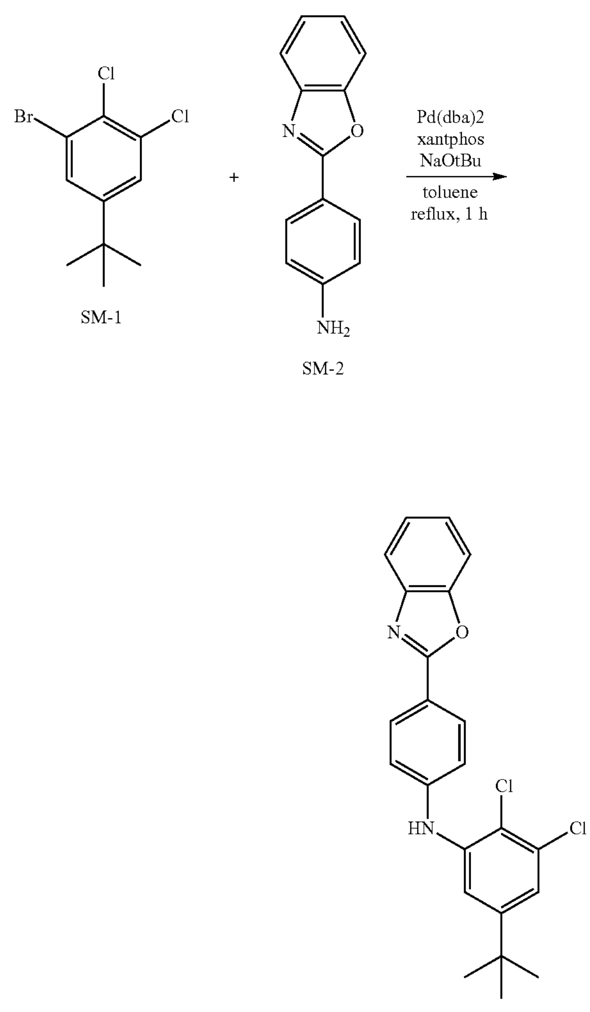

SM-1

SM-2

(113-1)

Under nitrogen condition, the compound SM-1 (5.64 g, 20 mmol), the compound SM-2 (4.20 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-1 (6.58 g, yield: 80%).

(2) Compound 113-2

[Reaction Formula 15-2]

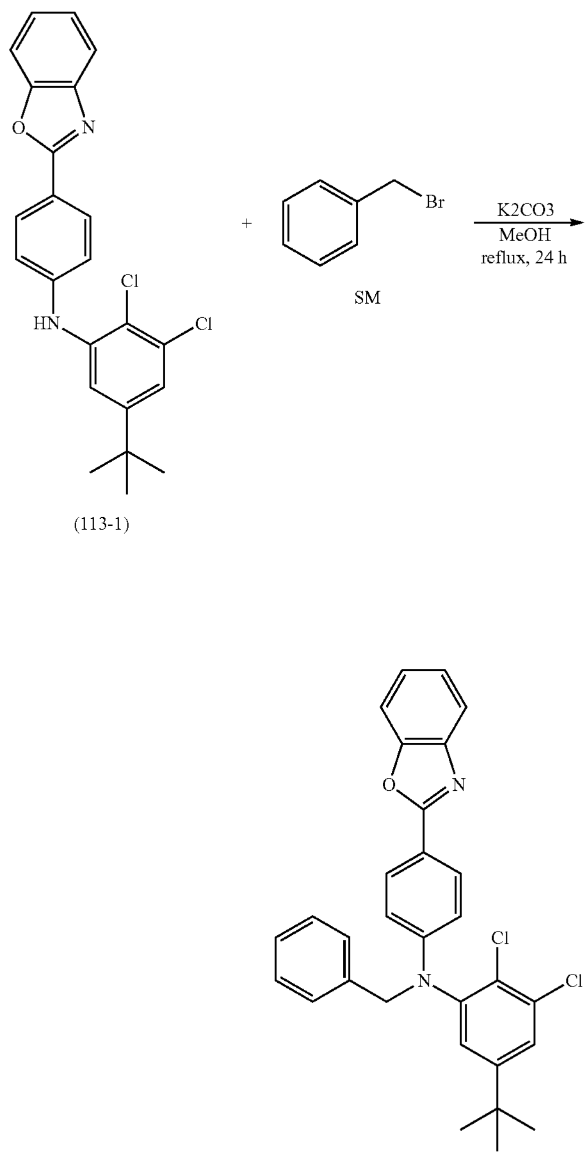

(113-1)

(113-2)

Under nitrogen condition, the compound 113-1 (8.22 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-2 (8.22 g, yield: 82%).

(3) Compound 113-3

[Reaction Formula 15-3]

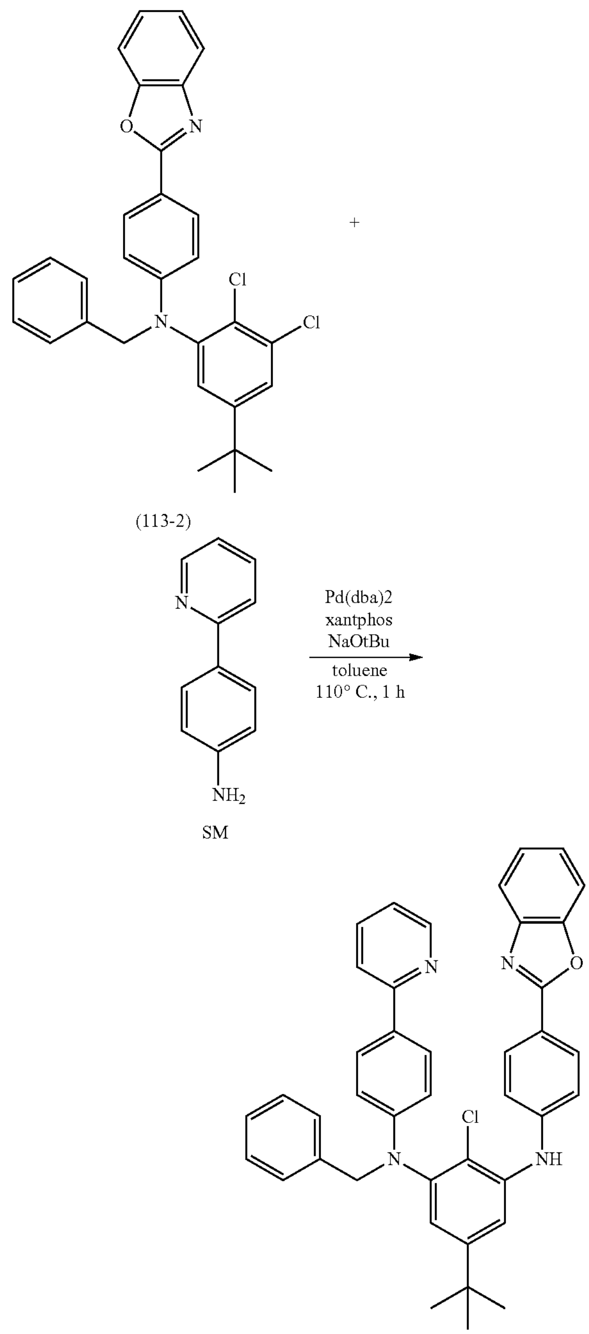

(113-2)

(113-3)

Under nitrogen condition, the compound 113-2 (10.0 g, 20 mmol), the compound SM (3.40 g, 20 mmol), $Pd(dba)_2$ (1.15 g, 2.0 mmol), xantphos (1.16 g, 2.0 mmol), NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-3 (10.7 g, yield: 84%).

(4) Compound 113-4

[Reaction Formula 15-4]

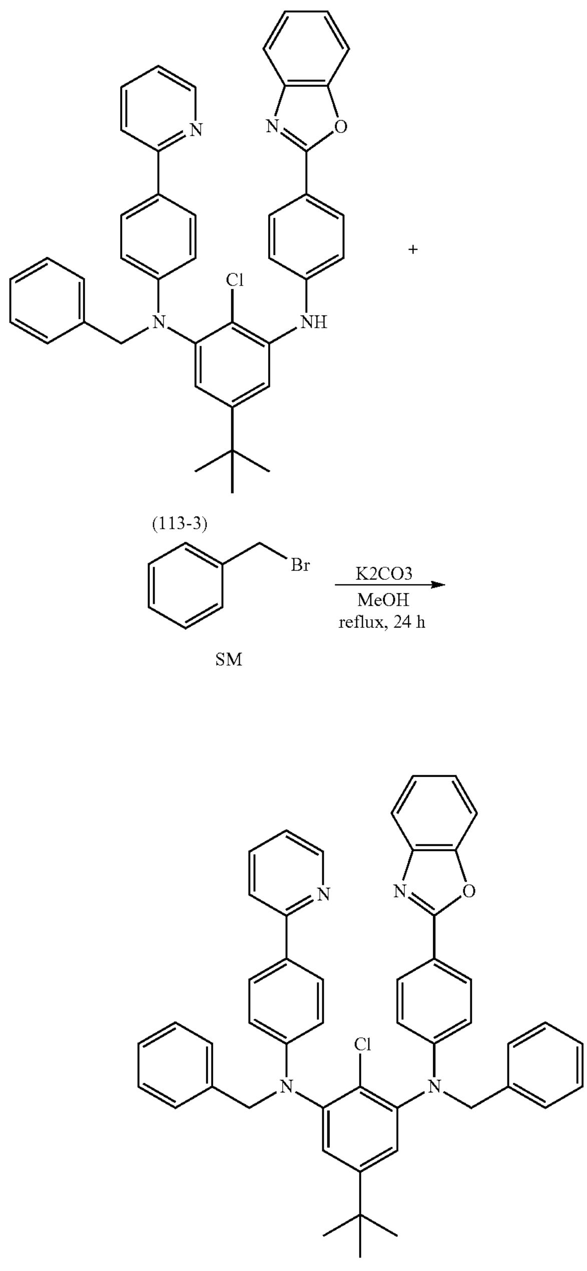

(113-3)

SM (113-4)

Under nitrogen condition, the compound 113-3 (12.7 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-4 (12.5 g, yield: 86%).

(5) Compound 113-5

[Reaction Formula 15-5]

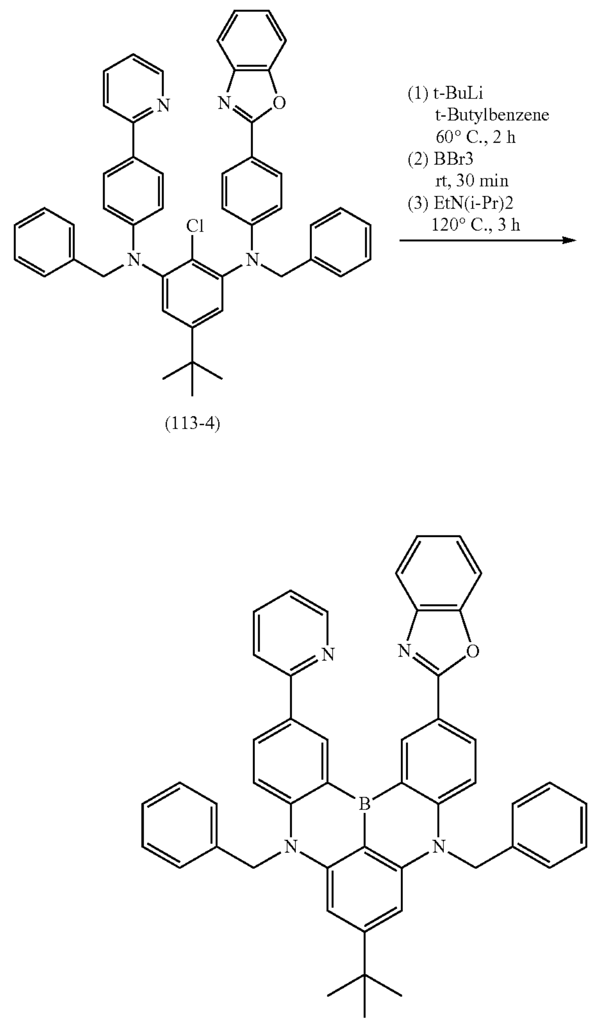

(113-4)

(113-5)

Under nitrogen condition, the compound 113-4 (7.25 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 113-5 (2.10 g, yield: 30%).

(6) Compound 113-6

[Reaction Formula 15-6]

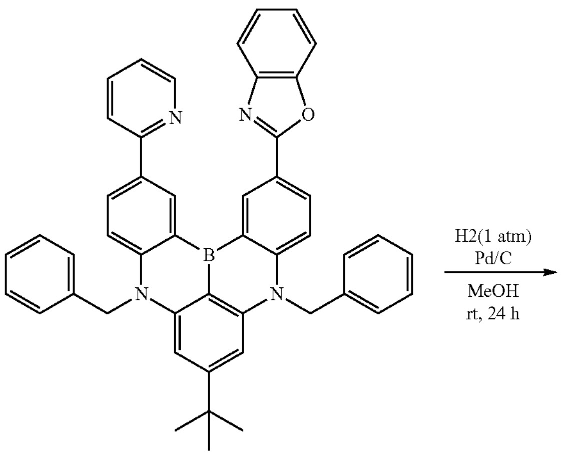

(113-5)

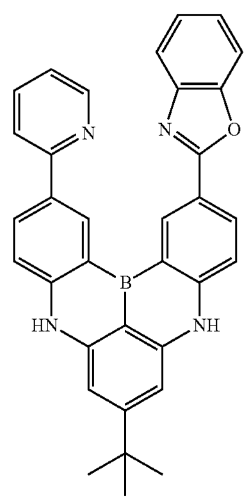

(113-6)

Under hydrogen 1 atmosphere condition, the compound 113-5 (6.99 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-6 (4.35 g, yield: 84%).

(7) Compound 113-7

[Reaction Formula 15-7]

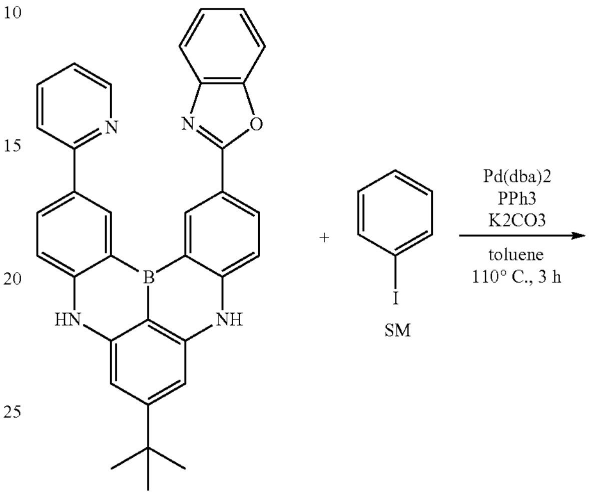

(113-6)

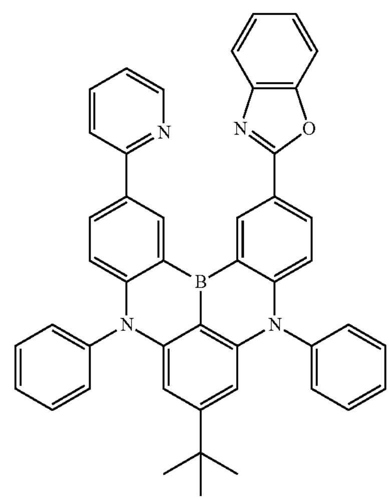

(113-7)

Under nitrogen condition, the compound 113-6 (10.4 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 113-7 (12.1 g, yield: 90%).

(8) Compound 113

[Reaction Formula 15-8]

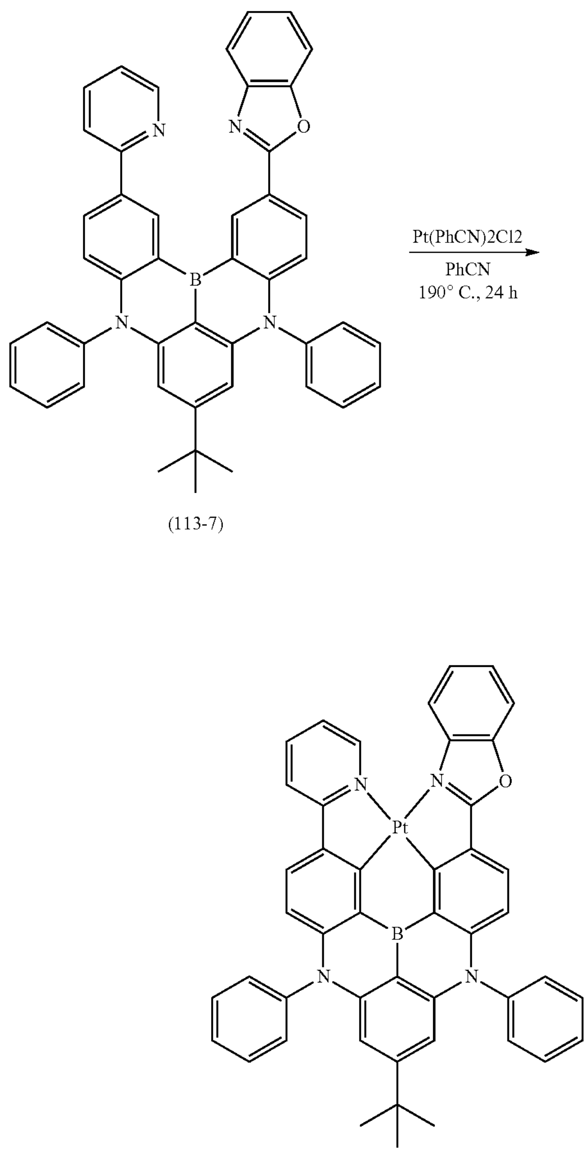

(113-7)

(113)

Under nitrogen condition, the compound 113-7 (6.71 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 113 (2.50 g, yield: 29%).

16. Synthesis of Compound 118

(1) Compound 118-1

[Reaction Formula 16-1]

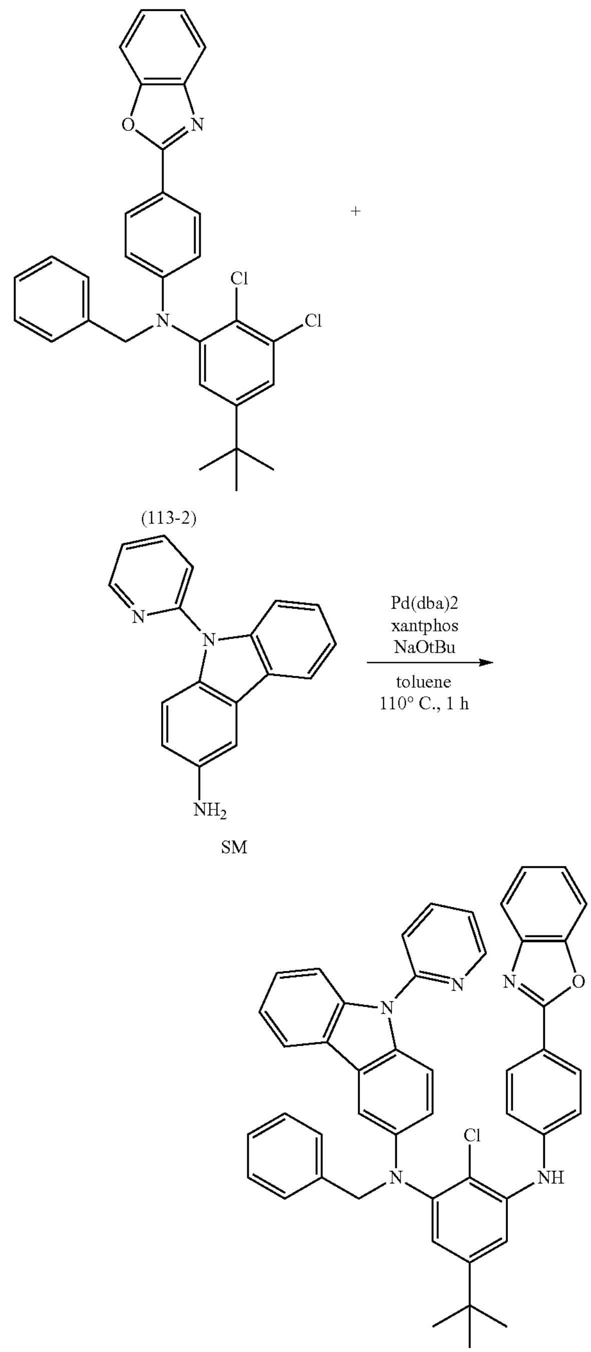

(113-2)

SM (118-1)

Under nitrogen condition, the compound 113-2 (10.0 g, 20 mmol), the compound SM (5.19 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 118-1 (12.2 g, yield: 84%).

(2) Compound 118-2

[Reaction Formula 16-2]

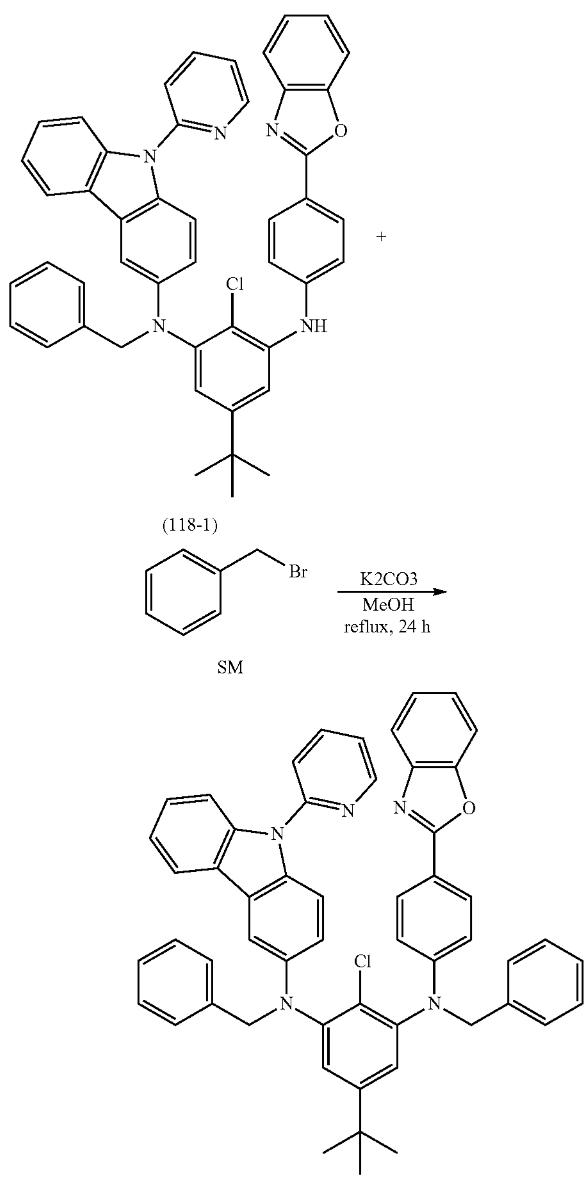

(118-1)

SM (118-2)

Under nitrogen condition, the compound 118-1 (14.5 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 118-2 (13.5 g, yield: 83%).

(3) Compound 118-3

[Reaction Formula 16-3]

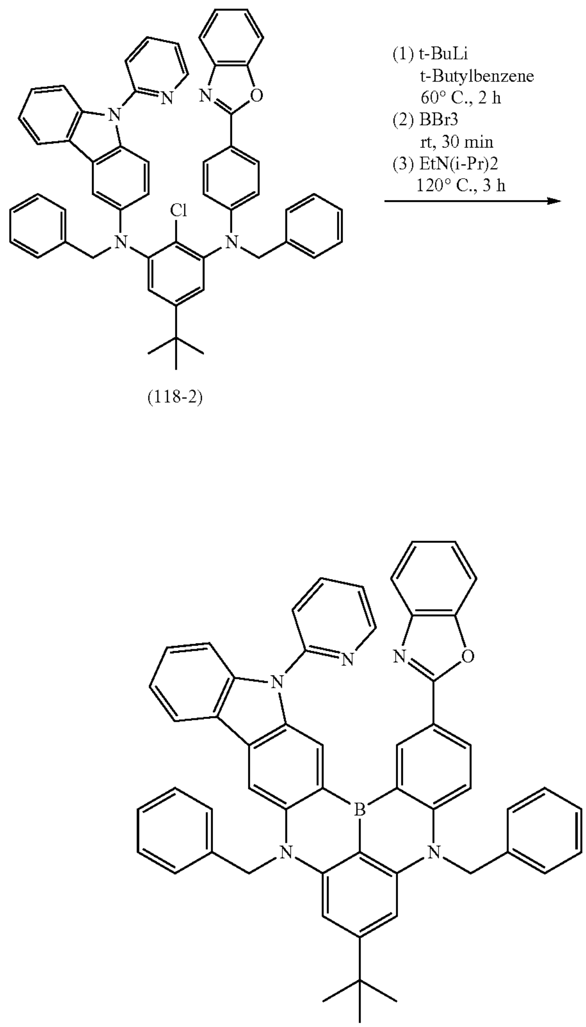

(118-2)

(118-3)

Under nitrogen condition, the compound 118-2 (8.14 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 118-3 (2.60 g, yield: 33%).

(4) Compound 118-4

[Reaction Formula 16-4]

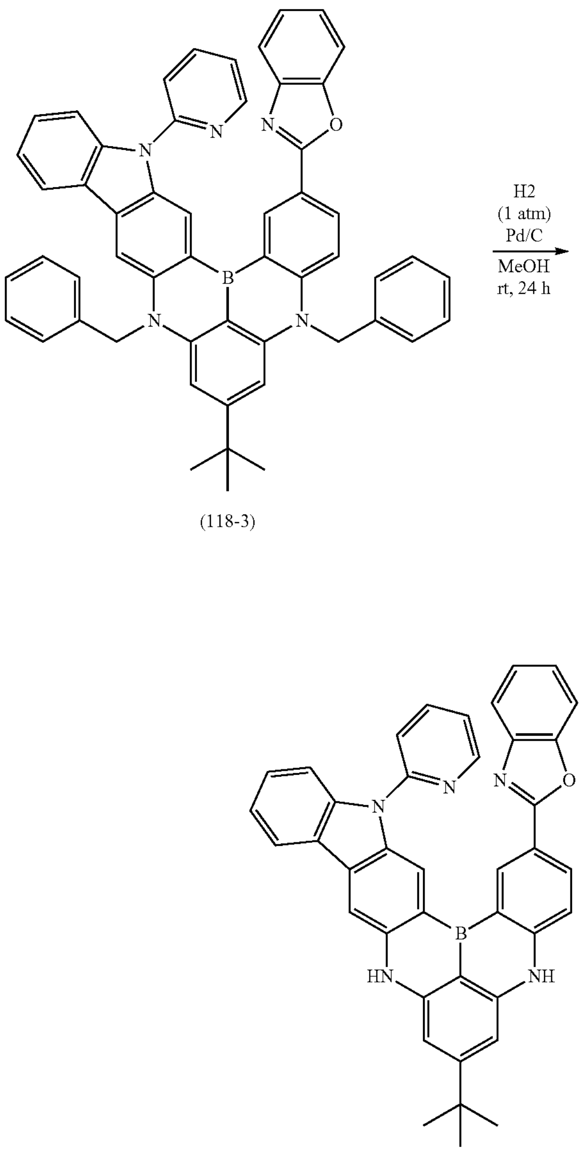

(118-4)

Under hydrogen 1 atmosphere condition, the compound 118-3 (7.88 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 118-4 (5.16 g, yield: 85%).

(5) Compound 118-5

[Reaction Formula 16-5]

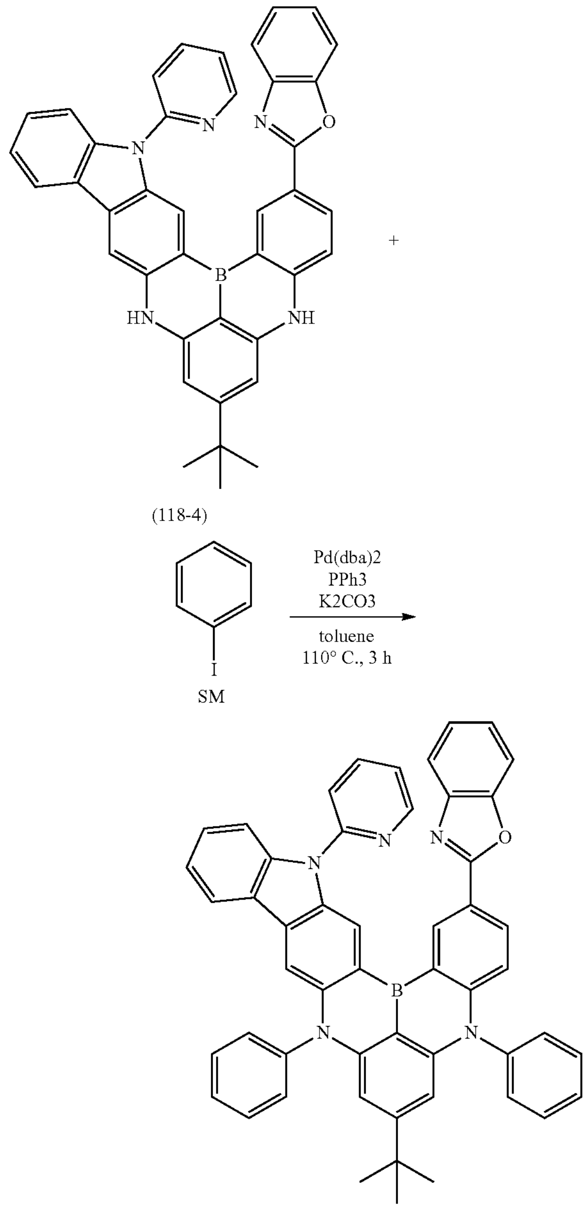

(118-5)

Under nitrogen condition, the compound 118-4 (12.2 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 118-5 (13.5 g, yield: 89%).

(6) Compound 118

[Reaction Formula 16-6]

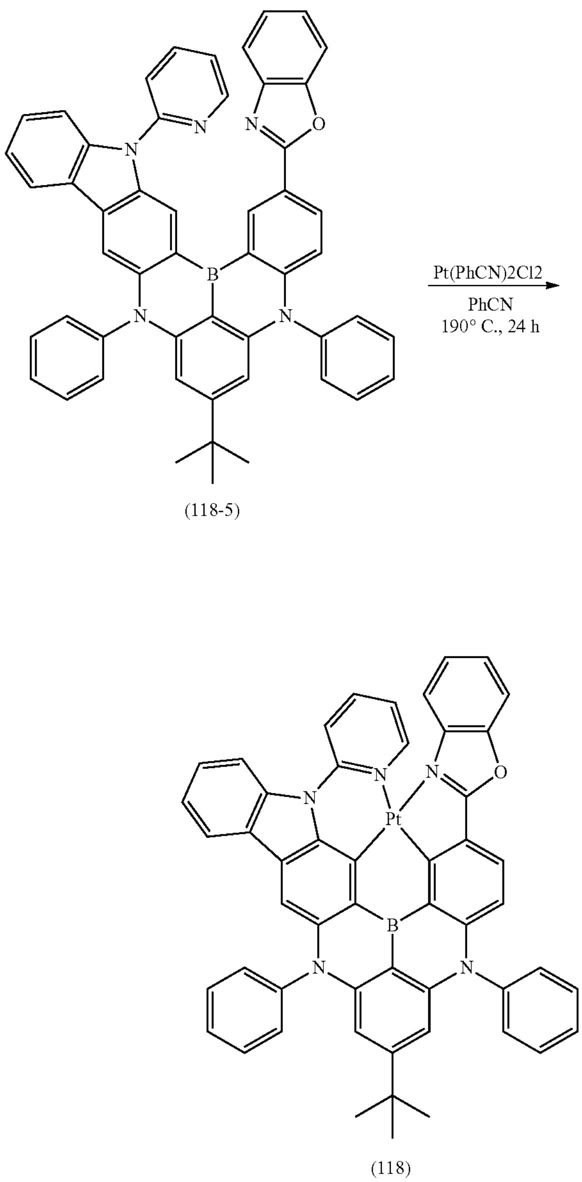

(118-5)

(118)

Under nitrogen condition, the compound 118-5 (7.60 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 118 (2.95 g, yield: 31%).

17. Synthesis of Compound 123

(1) Compound 123-1

[Reaction Formula 17-1]

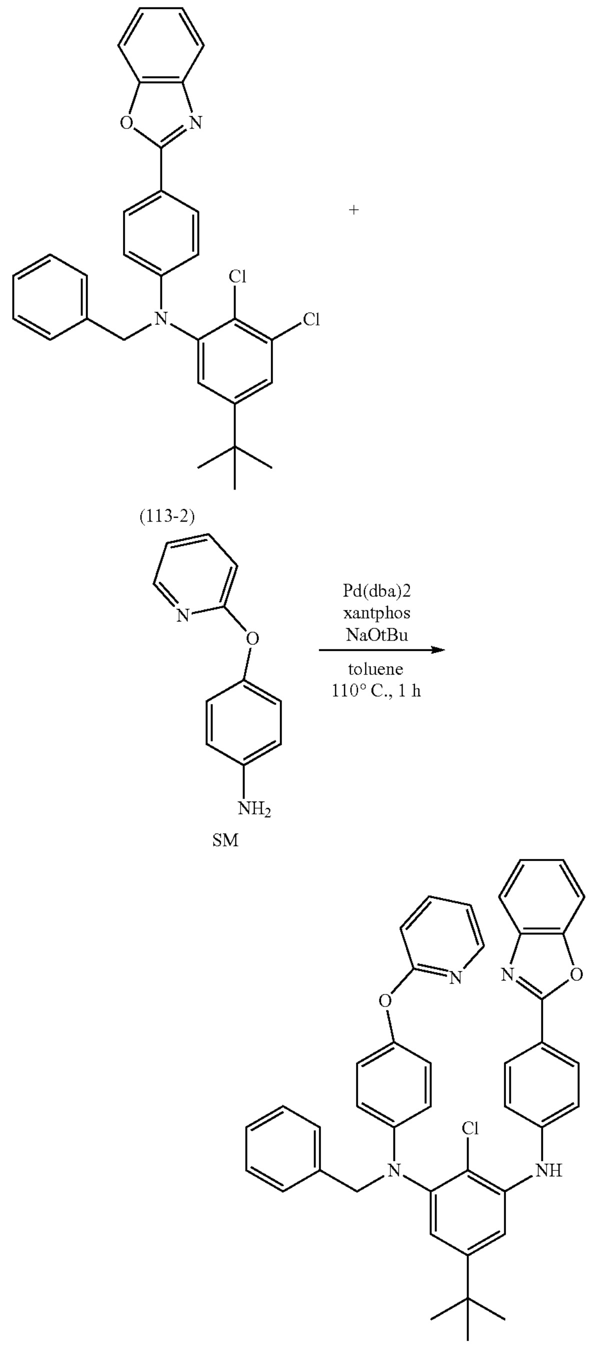

(113-2)

SM (123-1)

Under nitrogen condition, the compound 113-2 (10.0 g, 20 mmol), the compound SM (3.72 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 123-1 (11.7 g, yield: 90%).

(2) Compound 123-2

[Reaction Formula 17-2]

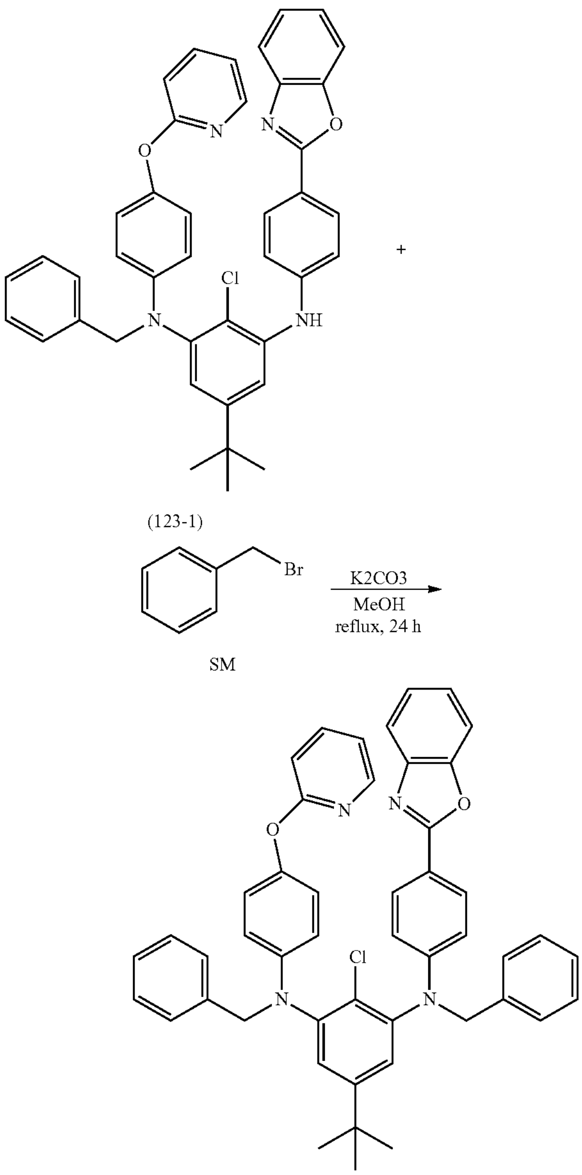

Under nitrogen condition, the compound 123-1 (13.0 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 123-2 (12.6 g, yield: 85%).

(3) Compound 123-3

[Reaction Formula 17-3]

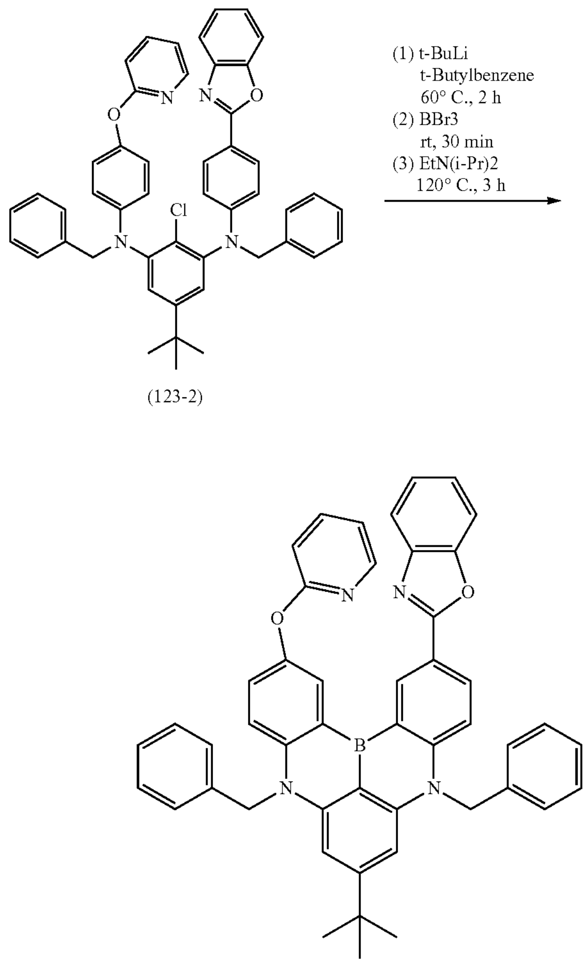

(123-3)

Under nitrogen condition, the compound 123-2 (7.41 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 123-3 (2.14 g, yield: 30%).

(4) Compound 123-4

[Reaction Formula 17-4]

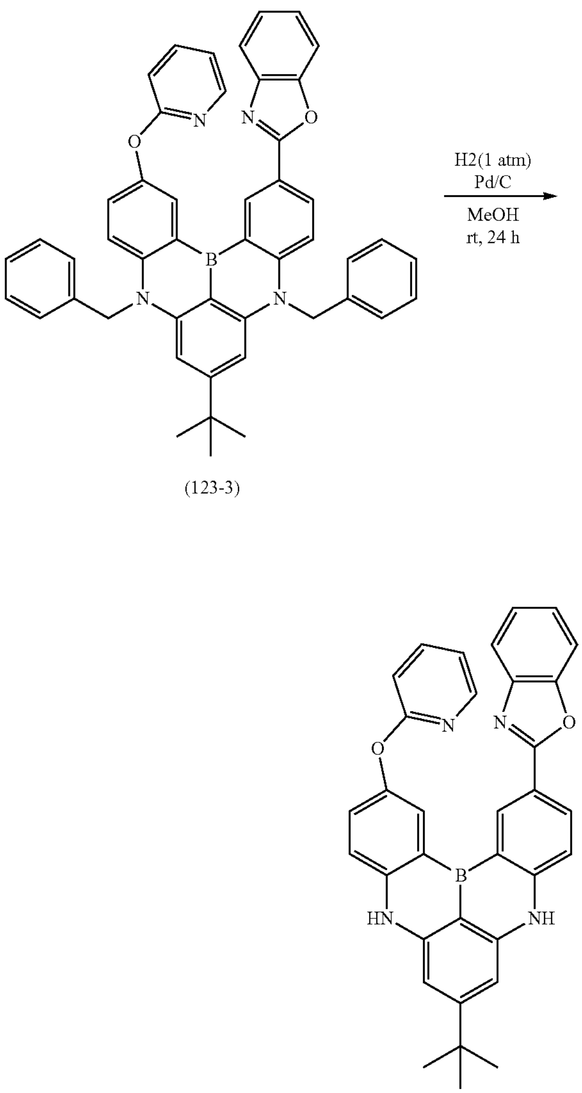

(123-3)

(123-4)

Under hydrogen 1 atmosphere condition, the compound 123-3 (7.15 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 123-4 (4.28 g, yield: 80%).

(5) Compound 123-5

[Reaction Formula 17-5]

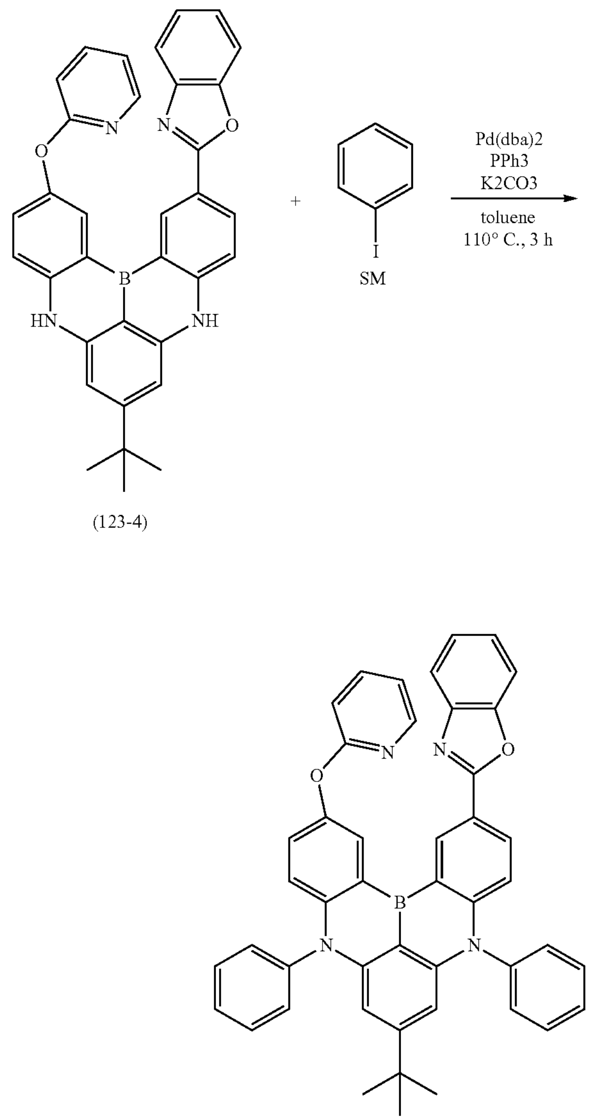

(123-4)

(123-5)

Under nitrogen condition, the compound 123-4 (10.7 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 123-5 (11.7 g, yield: 85%).

(6) Compound 123

[Reaction Formula 17-6]

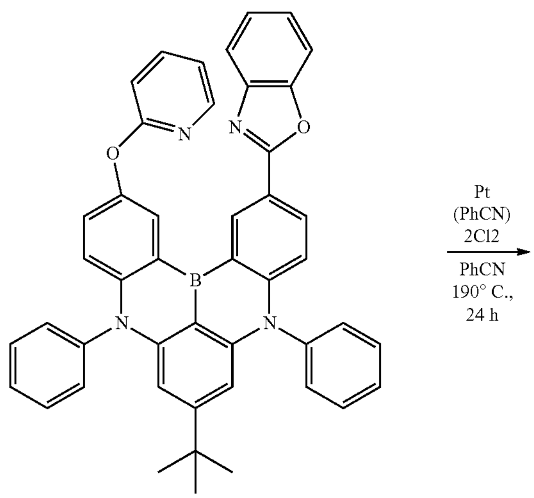

(123-5)

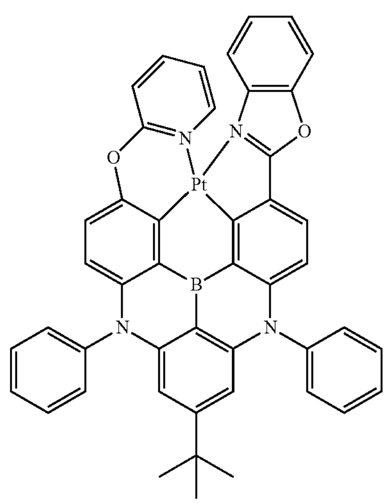

(123)

Under nitrogen condition, the compound 123-5 (6.97 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 123 (2.64 g, yield: 30%).

18. Synthesis of Compound 130

(1) Compound 130-1

[Reaction Formula 18-1]

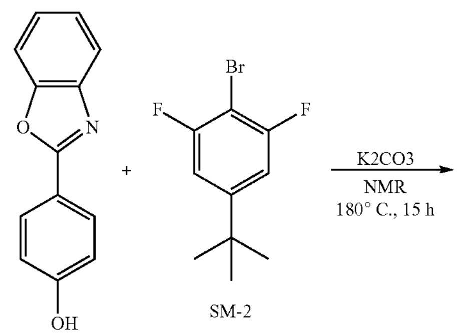

SM-1 SM-2

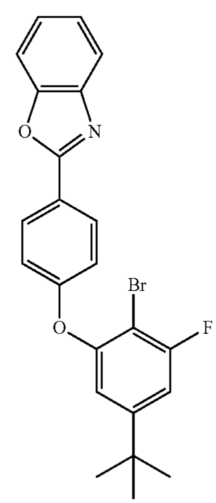

(130-1)

Under nitrogen condition, the compound SM-1 (4.22 g, 20 mmol), the compound SM-2 (4.98 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 130-1 (7.93 g, yield: 90%).

(2) Compound 130-2

[Reaction Formula 18-2]

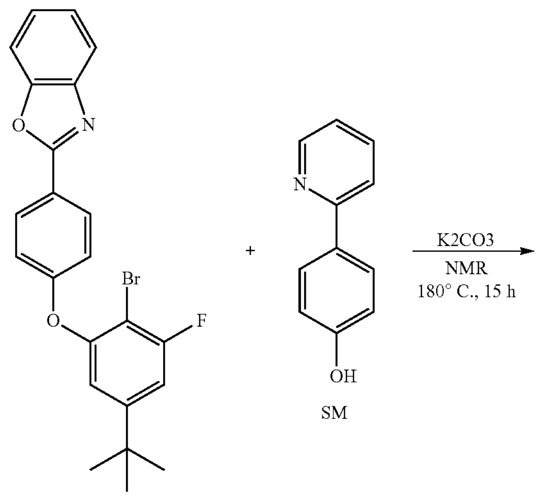

(130-1) SM

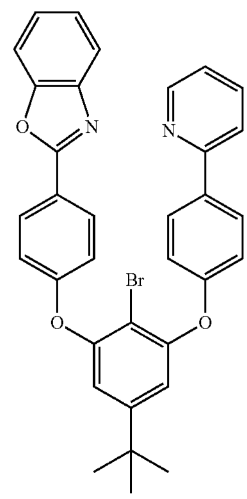

(130-2)

Under nitrogen condition, the compound 130-1 (8.81 g, 20 mmol), the compound SM (3.42 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 130-2 (9.82 g, yield: 83%).

(3) Compound 130-3

[Reaction Formula 18-3]

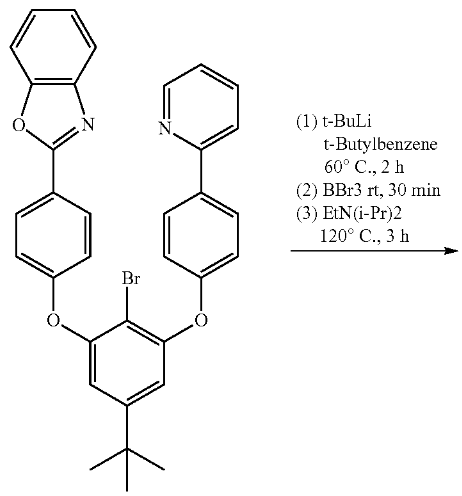

(130-2)

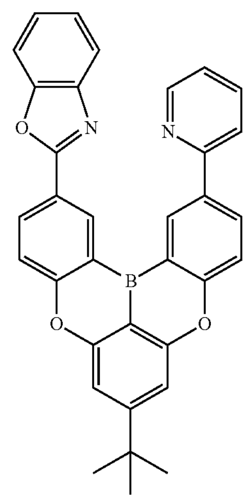

(130-3)

Under nitrogen condition, the compound 130-2 (5.92 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 130-3 (1.56 g, yield: 30%).

(4) Compound 130

[Reaction Formula 18-4]

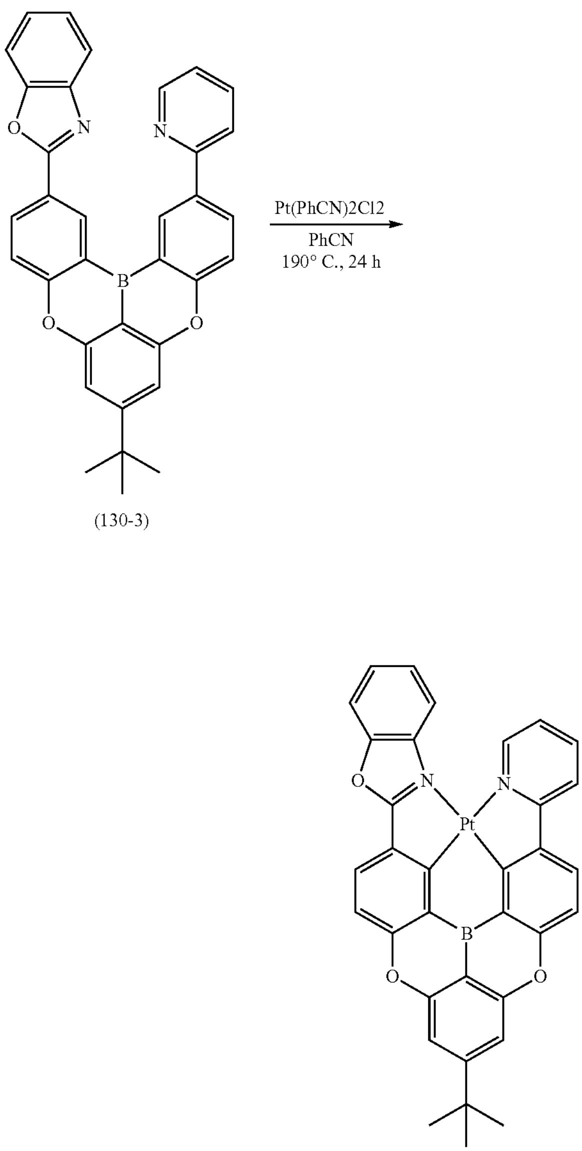

(130-3)

(130)

Under nitrogen condition, the compound 130-3 (5.20 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 130 (2.64 g, yield: 37%).

19. Synthesis of Compound 132

(1) Compound 132-1

[Reaction Formula 19-1]

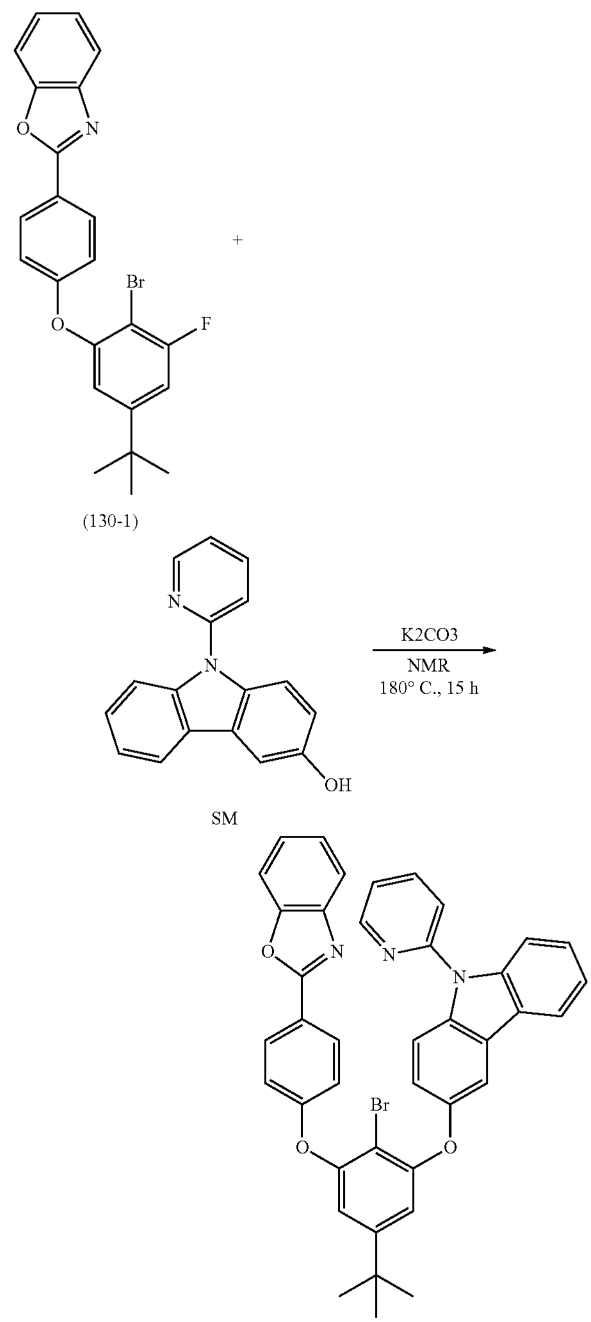

(130-1)

SM (132-1)

Under nitrogen condition, the compound 130-1 (8.81 g, 20 mmol), the compound SM (5.21 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 132-1 (11.2 g, yield: 82%).

(2) Compound 132-2

[Reaction Formula 19-2]

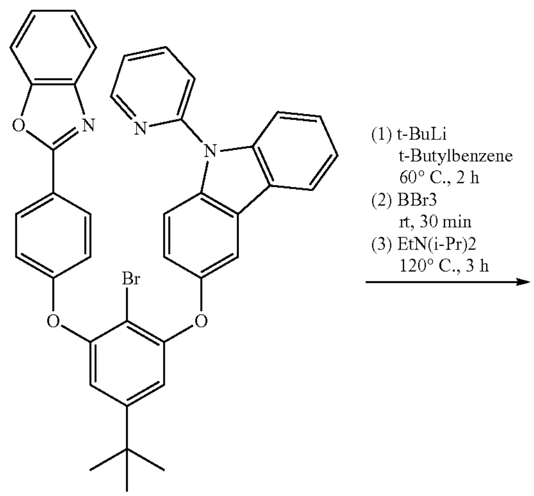

(132-1)

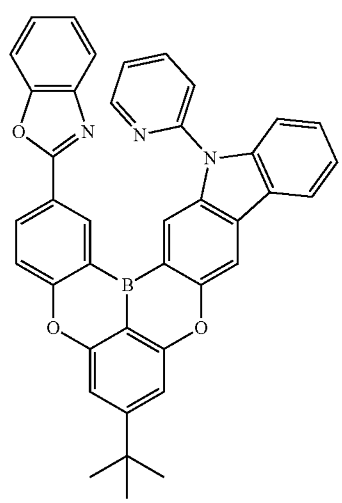

(132-2)

Under nitrogen condition, the compound 132-1 (6.81 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes.

$EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 132-2 (2.01 g, yield: 33%).

(3) Compound 132

[Reaction Formula 19-3]

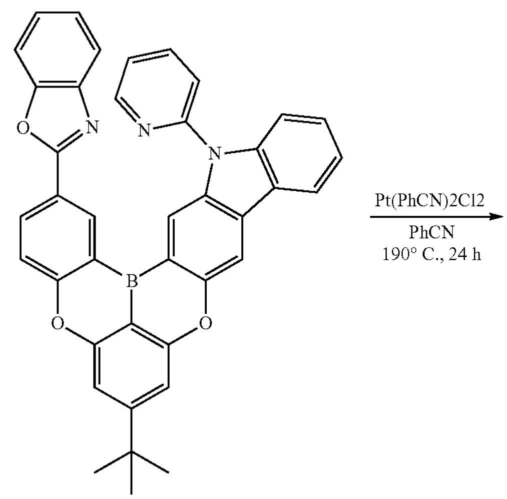

(132-2)

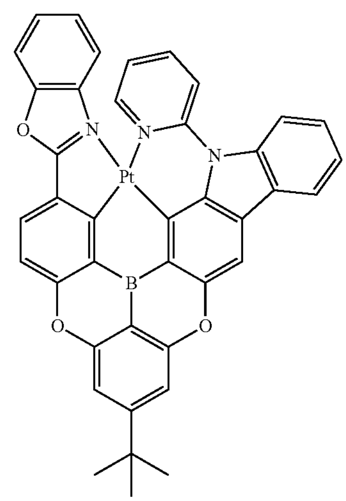

(132)

Under nitrogen condition, the compound 132-2 (6.10 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 132 (2.65 g, yield: 33%).

20. Synthesis of Compound 137

(1) Compound 137-1

[Reaction Formula 20-1]

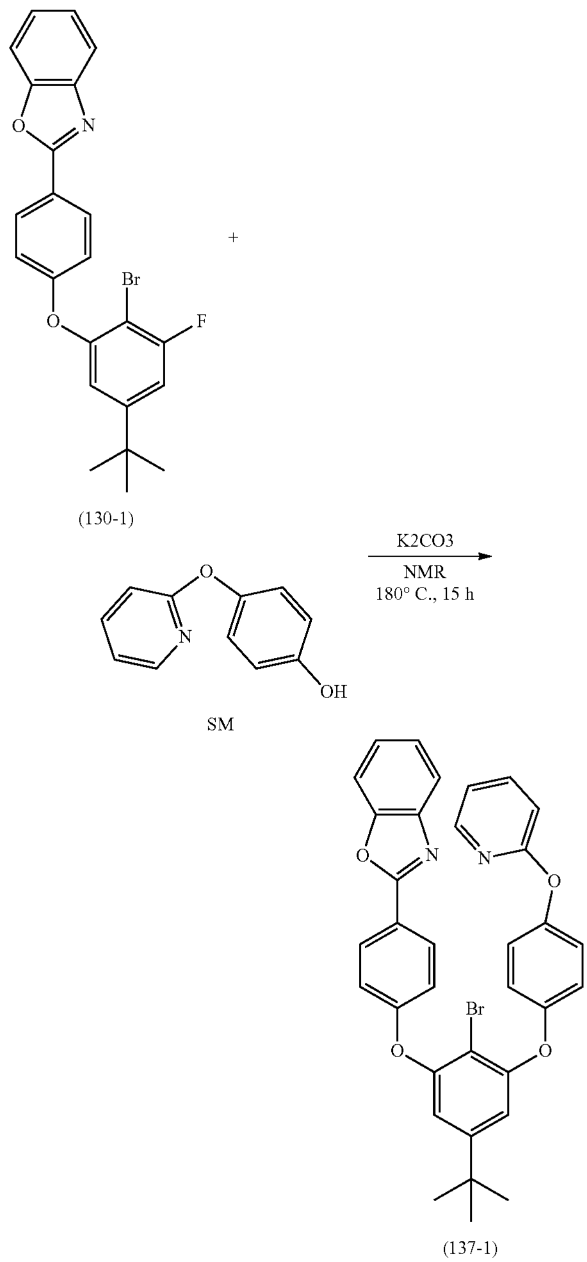

Under nitrogen condition, the compound 130-1 (8.81 g, 20 mmol), the compound SM (3.74 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 137-1 (9.72 g, yield: 80%).

(2) Compound 137-2

[Reaction Formula 20-2]

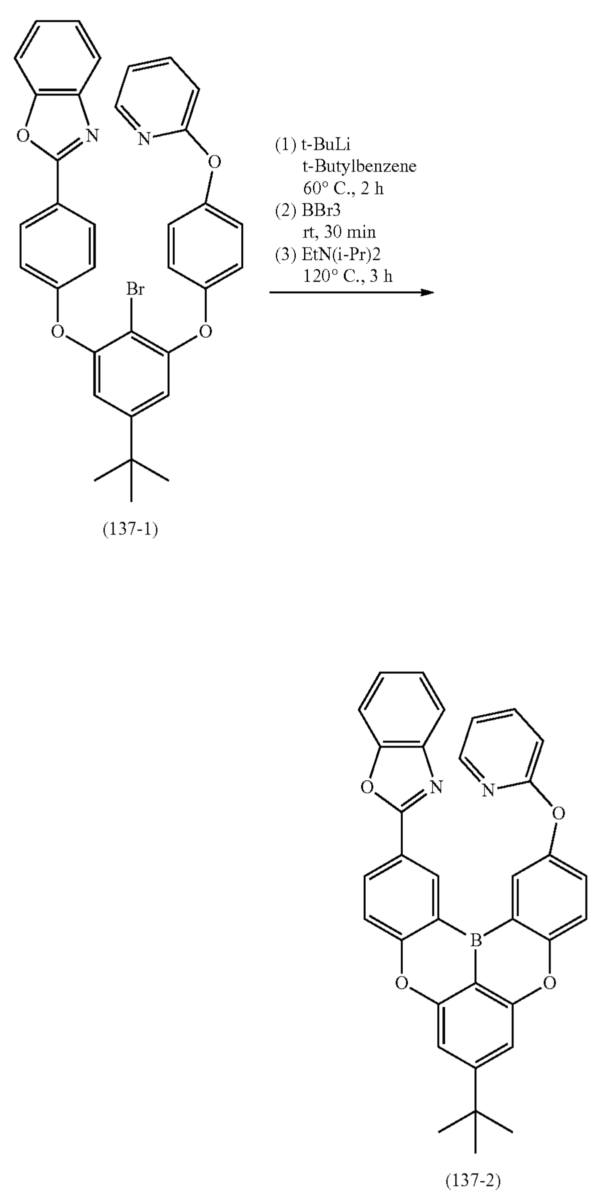

Under nitrogen condition, the compound 137-1 (6.08 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 137-2 (1.61 g, yield: 30%).

(3) Compound 137

[Reaction Formula 20-3]

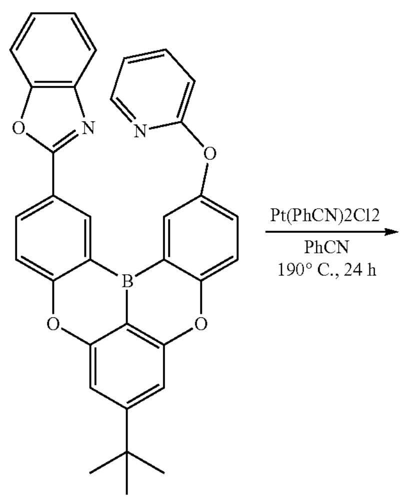

(137-2)

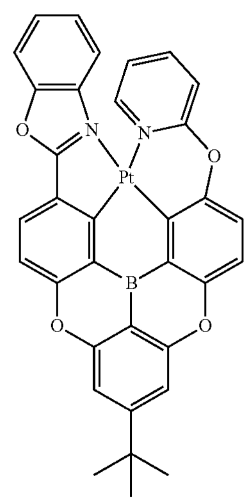

(137)

Under nitrogen condition, the compound 137-2 (5.36 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 137 (2.48 g, yield: 34%).

21. Synthesis of Compound 143

(1) Compound 143-1

[Reaction Formula 21-1]

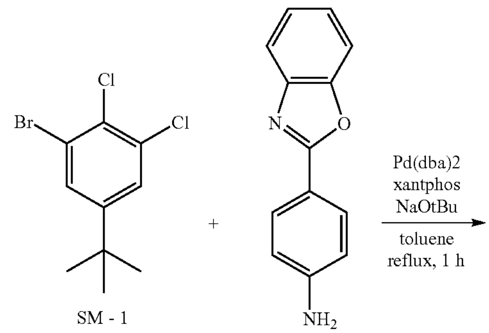

SM - 1

SM-2

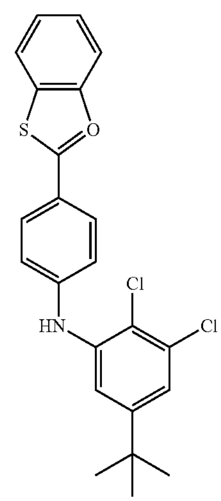

(143-1)

Under nitrogen condition, the compound SM-1 (5.64 g, 20 mmol), the compound SM-2 (4.20 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-1 (6.83 g, yield: 80%).

(2) Compound 143-2

[Reaction Formula 21-2]

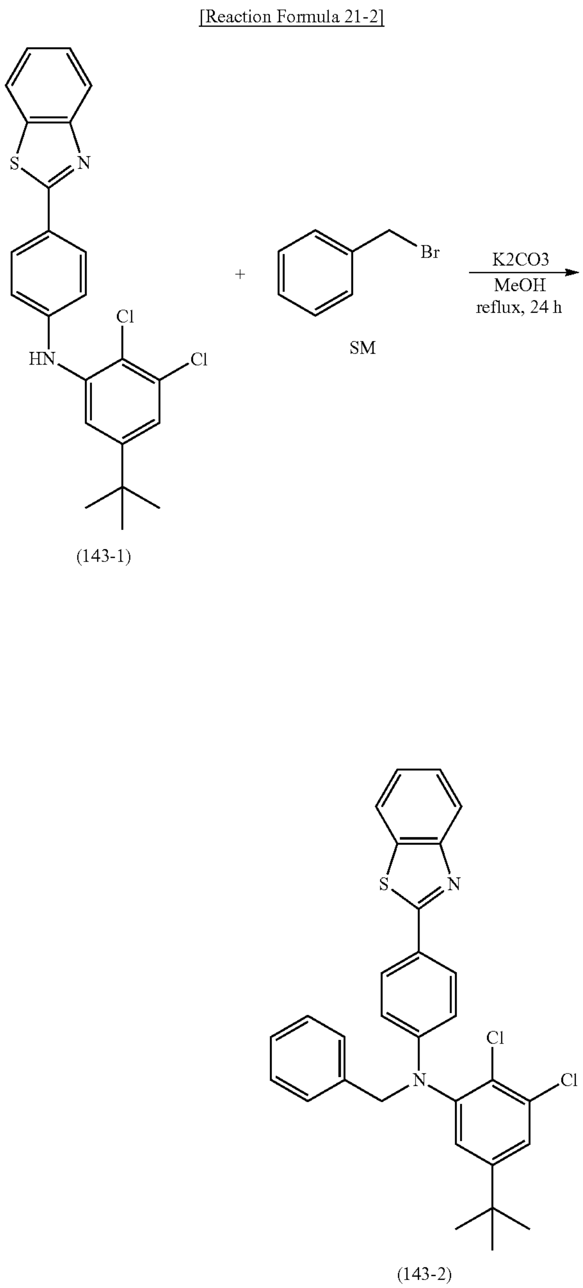

Under nitrogen condition, the compound 143-1 (8.22 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-2 (8.80 g, yield: 85%).

(3) Compound 143-3

[Reaction Formula 21-3]

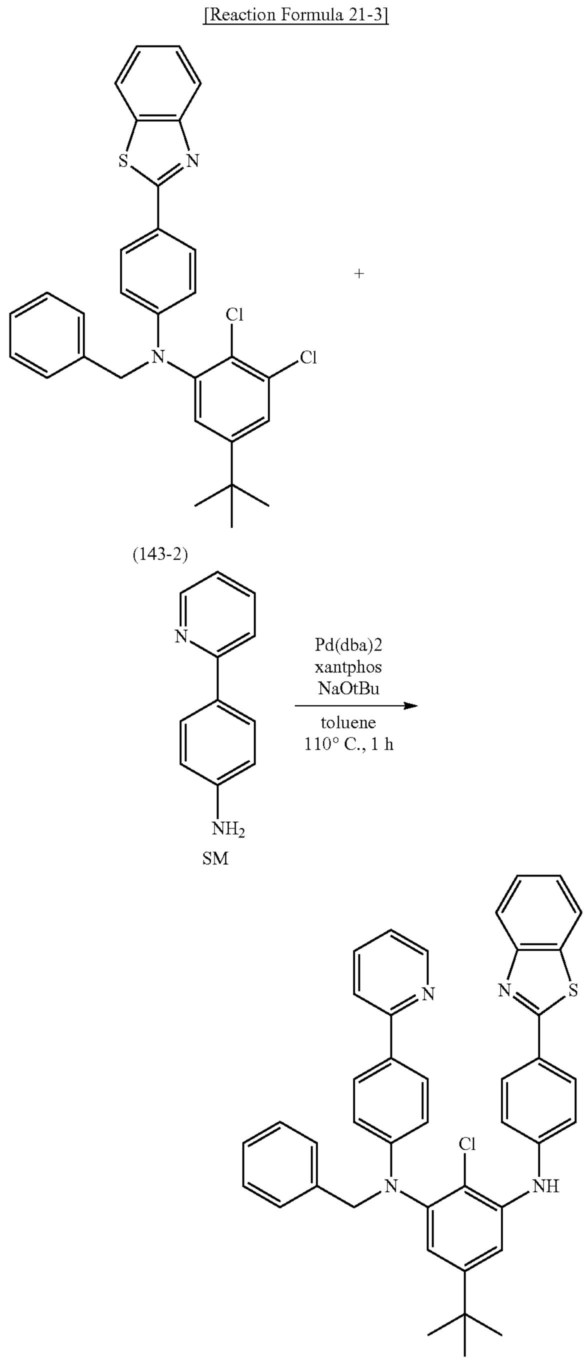

Under nitrogen condition, the compound 143-2 (10.0 g, 20 mmol), the compound SM (3.40 g, 20 mmol), $Pd(dba)_2$ (1.15 g, 2.0 mmol), xantphos (1.16 g, 2.0 mmol), NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-3 (10.5 g, yield: 81%).

(4) Compound 143-4

[Reaction Formula 21-4]

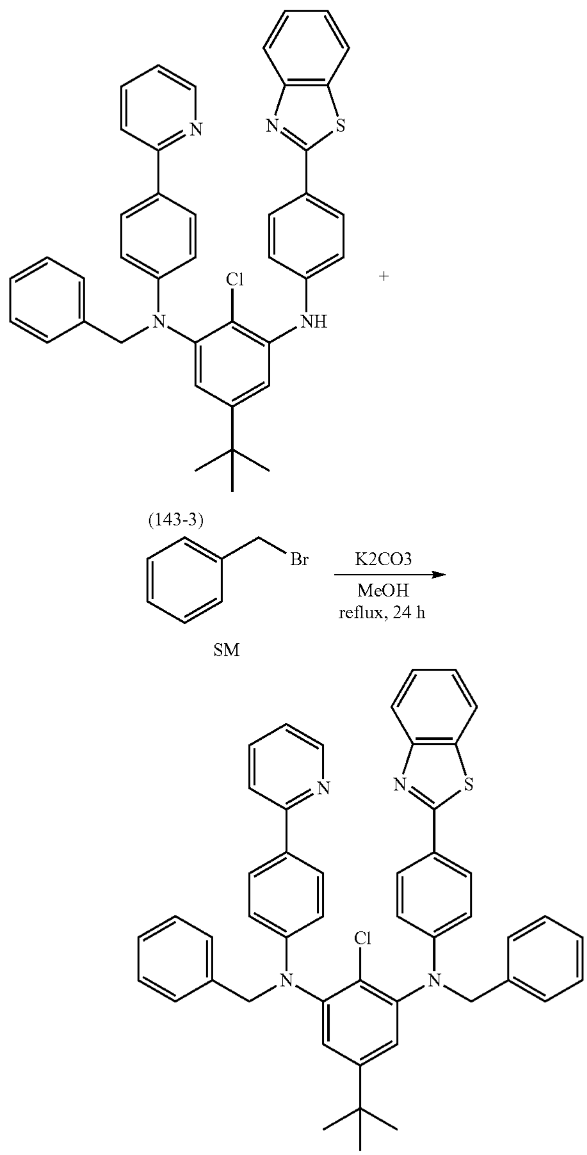

(143-3)

SM (143-4)

Under nitrogen condition, the compound 143-3 (12.7 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-4 (12.2 g, yield: 82%).

(5) Compound 143-5

[Reaction Formula 21-5]

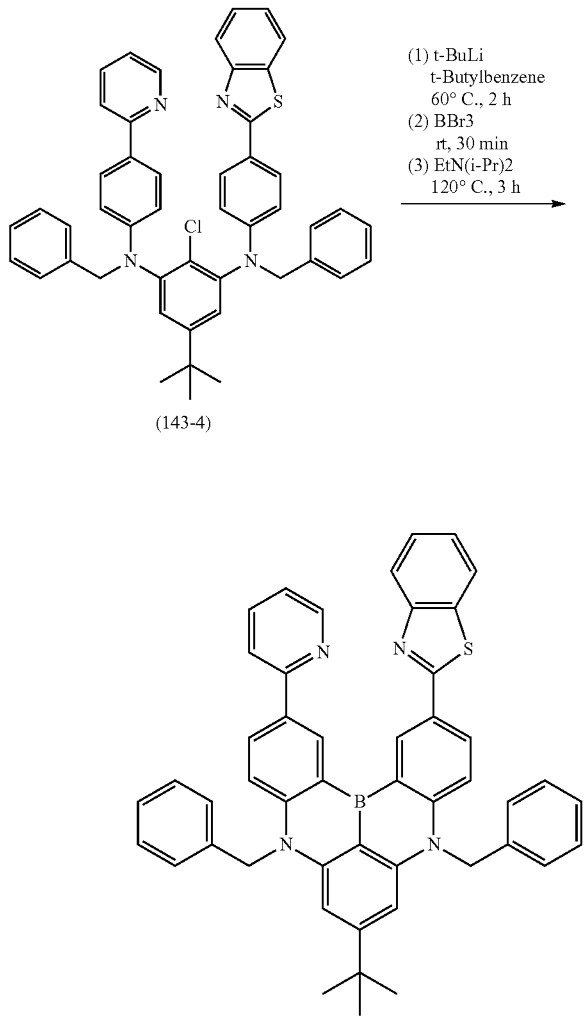

(143-4)

(143-5)

Under nitrogen condition, the compound 143-4 (7.25 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 143-5 (2.36 g, yield: 33%).

(6) Compound 143-6

[Reaction Formula 21-6]

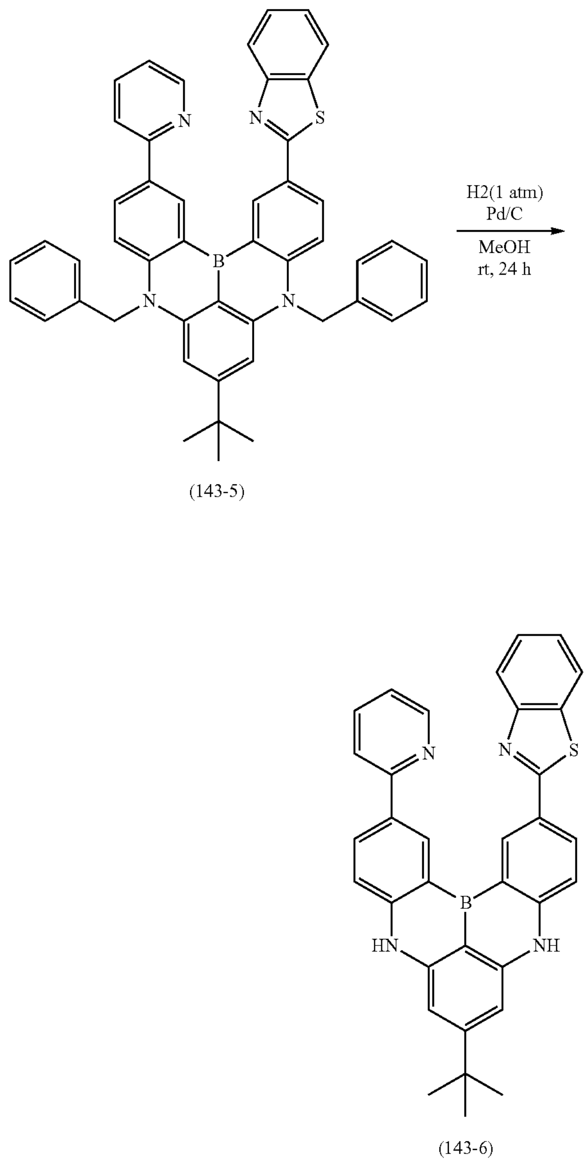

Under hydrogen 1 atmosphere condition, the compound 143-5 (6.99 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-6 (4.60 g, yield: 86%).

(7) Compound 143-7

[Reaction Formula 21-7]

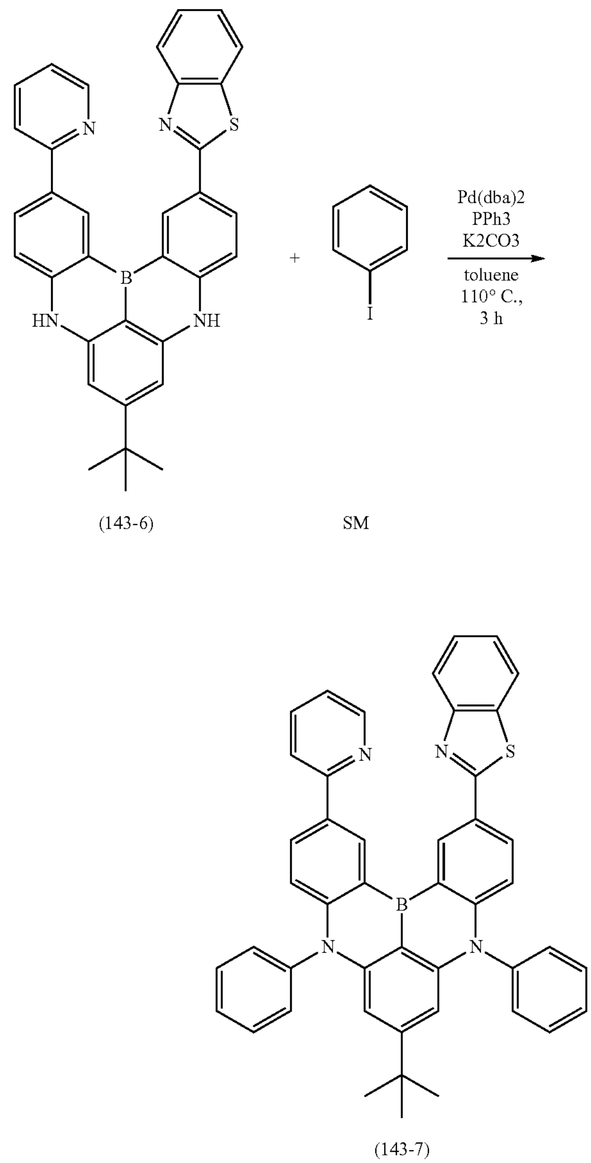

Under nitrogen condition, the compound 143-6 (10.4 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 143-7 (12.1 g, yield: 88%).

(8) Compound 143

[Reaction Formula 21-8]

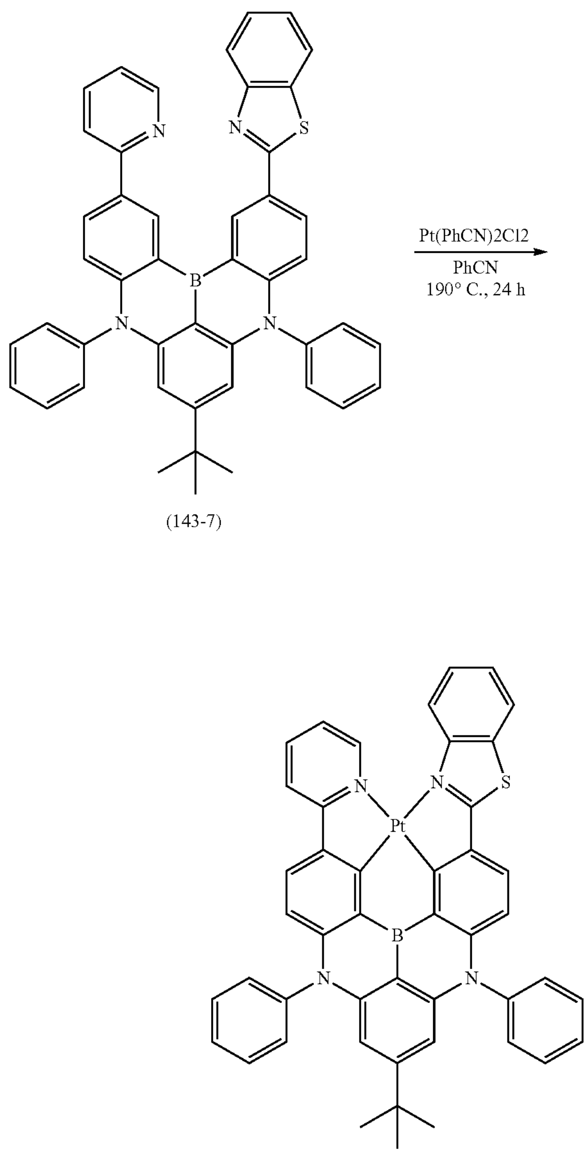

Under nitrogen condition, the compound 143-7 (6.71 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 143 (2.90 g, yield: 33%).

22. Synthesis of Compound 148

(1) Compound 148-1

[Reaction Formula 22-1]

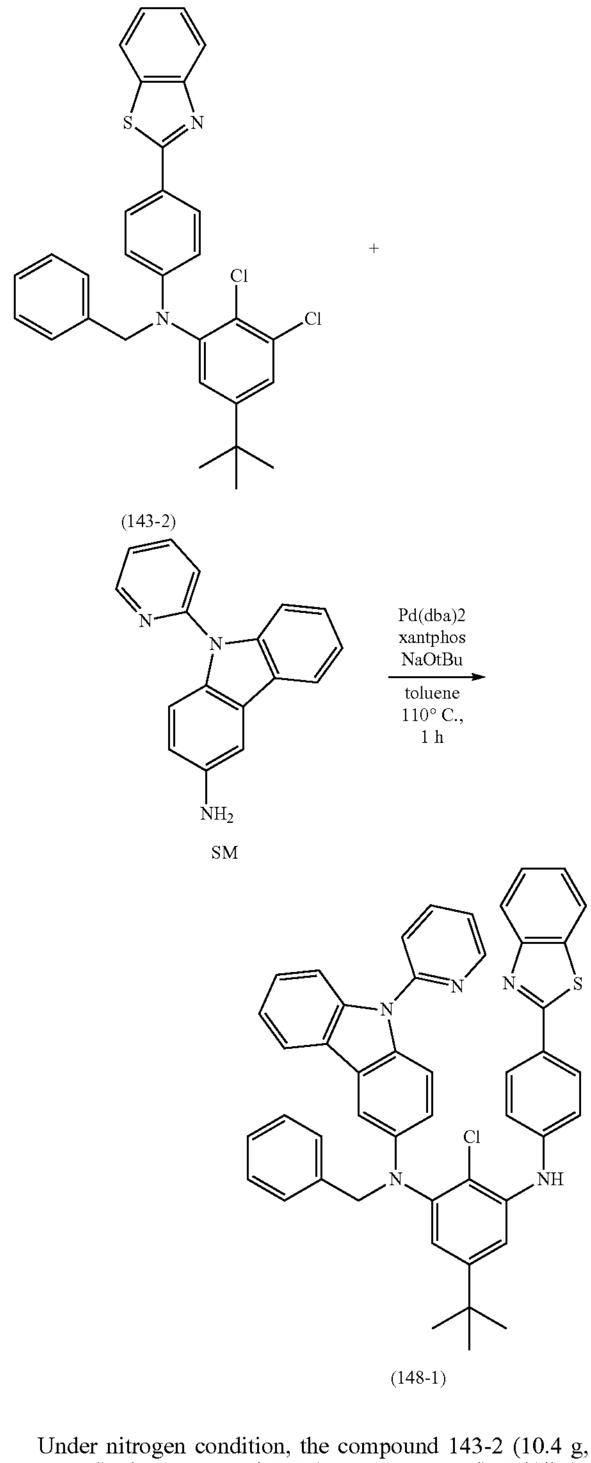

Under nitrogen condition, the compound 143-2 (10.4 g, 20 mmol), the compound SM (5.19 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 148-1 (11.4 g, yield: 80%).

(2) Compound 148-2

[Reaction Formula 22-2]

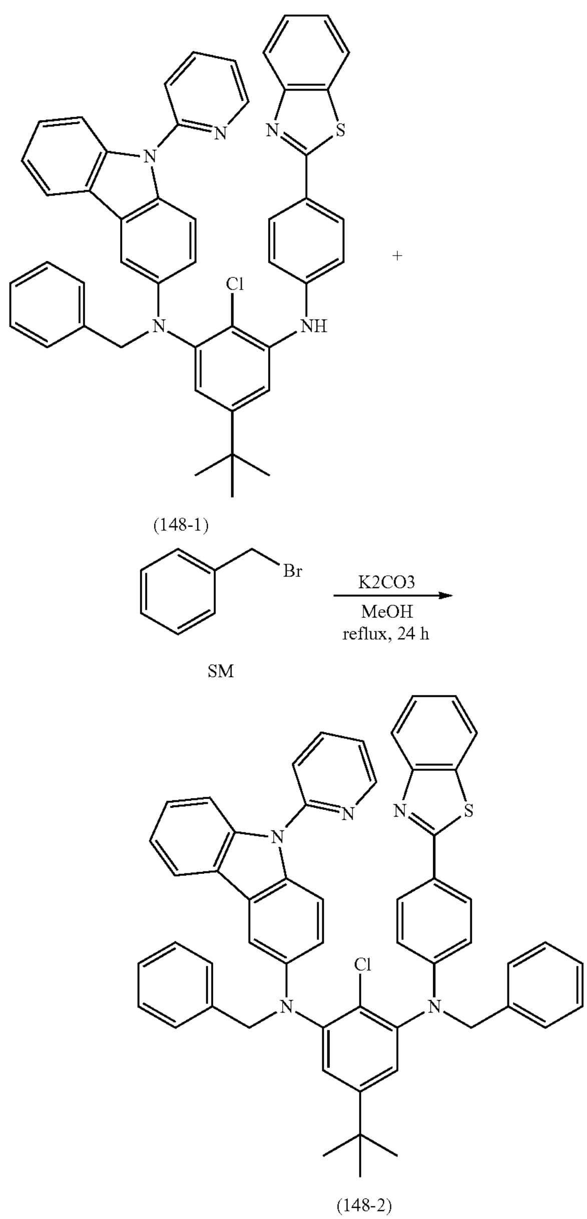

Under nitrogen condition, the compound 148-1 (14.8 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 148-2 (14.9 g, yield: 80%).

(3) Compound 148-3

[Reaction Formula 22-3]

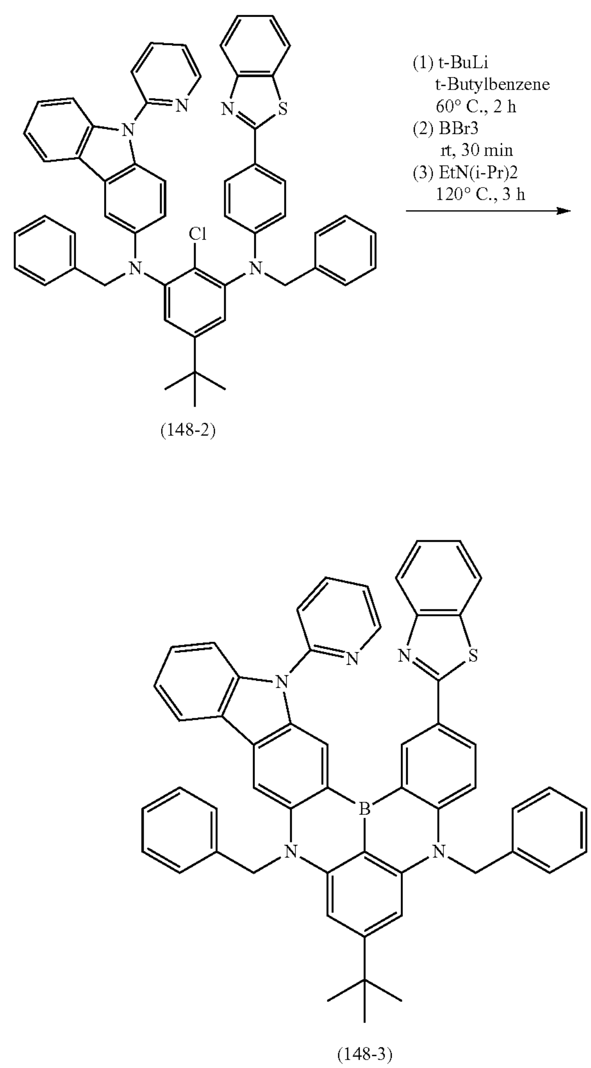

Under nitrogen condition, the compound 148-2 (8.31 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i-Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 148-3 (2.41 g, yield: 30%).

(4) Compound 148-4

[Reaction Formula 22-4]

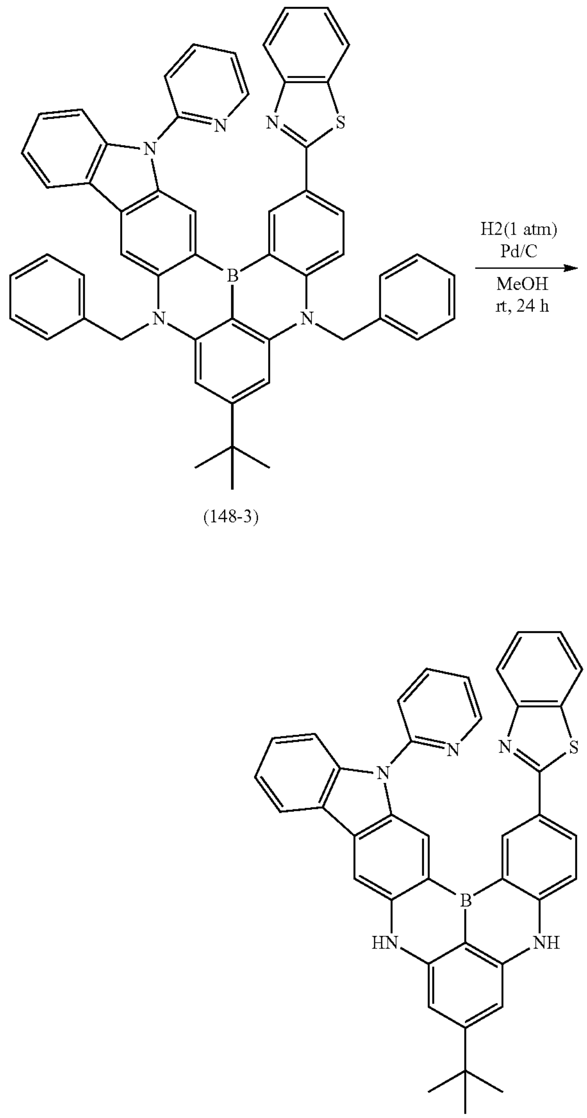

(148-3)

(148-4)

Under hydrogen 1 atmosphere condition, the compound 148-3 (8.04 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 148-4 (5.11 g, yield: 82%).

(5) Compound 148-5

[Reaction Formula 22-5]

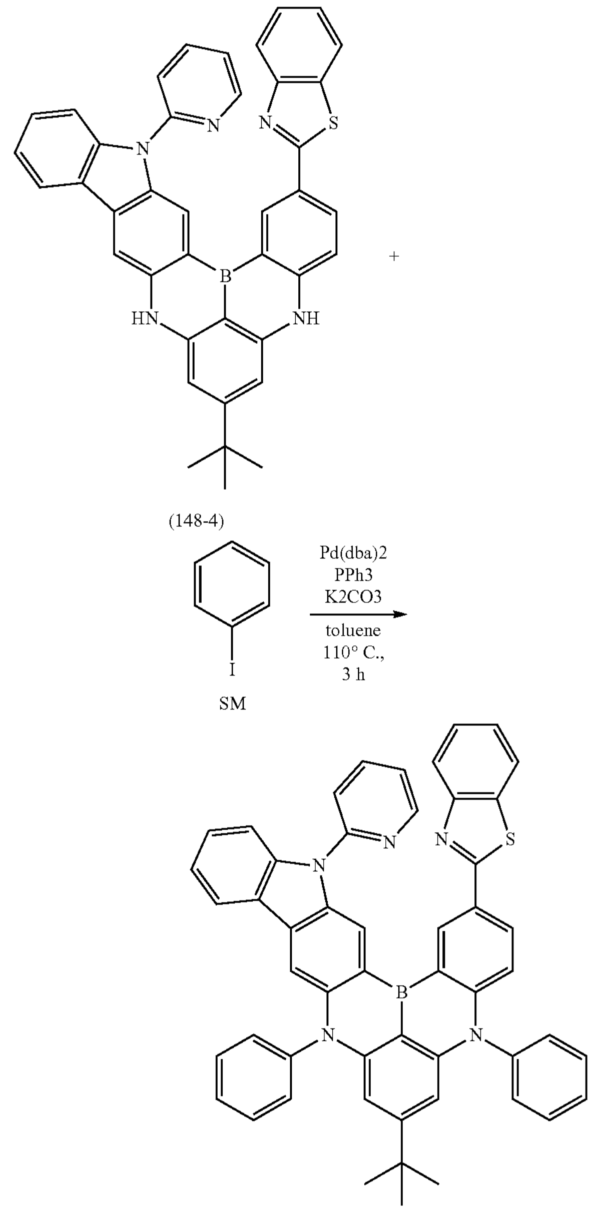

(148-4)

SM (148-5)

Under nitrogen condition, the compound 148-4 (12.5 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 148-5 (14.0 g, yield: 90%).

(6) Compound 148

[Reaction Formula 22-6]

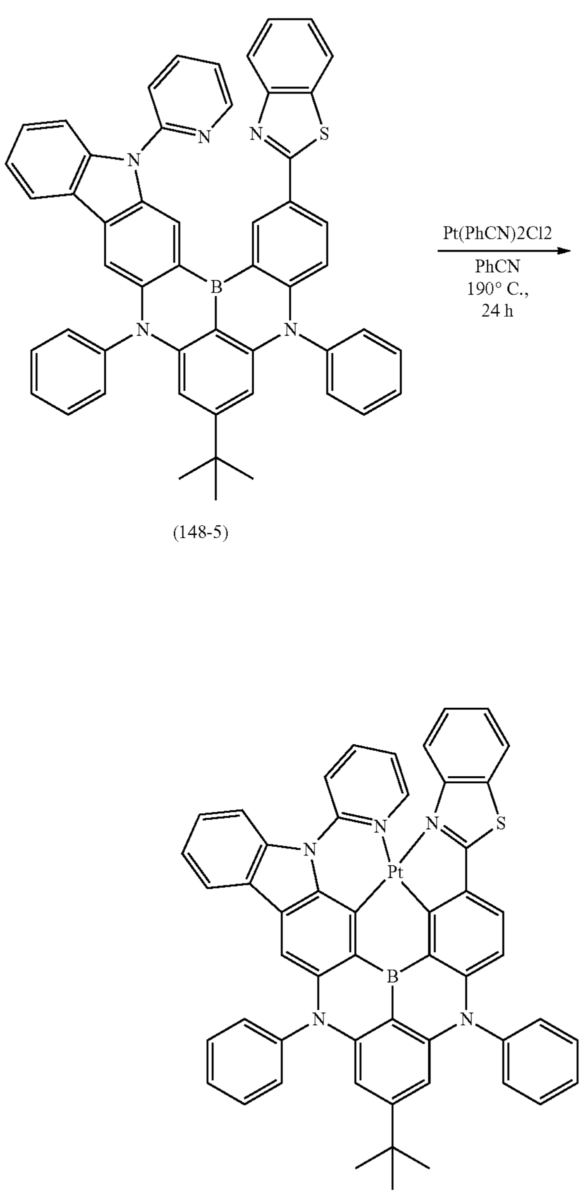

(148-5)

(148)

Under nitrogen condition, the compound 148-5 (7.76 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 148 (3.39 g, yield: 35%).

23. Synthesis of Compound 153

(1) Compound 153-1

[Reaction Formula 23-1]

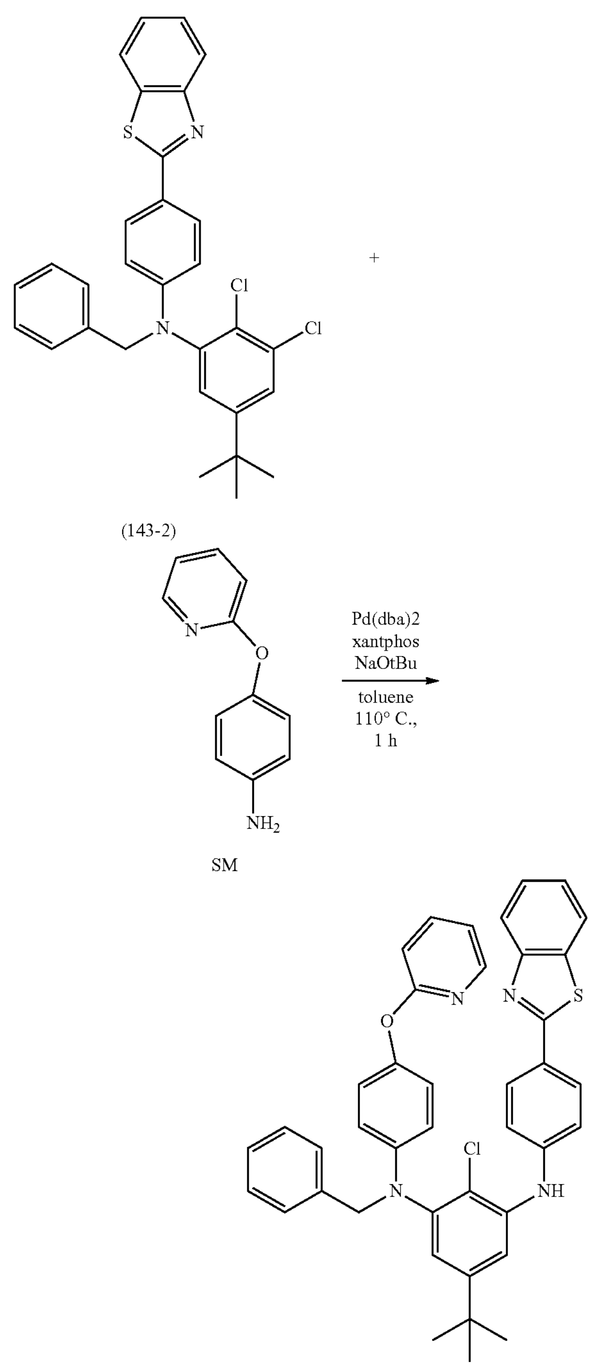

(143-2)

SM (153-1)

Under nitrogen condition, the compound 143-2 (10.4 g, 20 mmol), the compound SM (3.72 g, 20 mmol), $Pd(dba)_2$ (1.15 g, 2.0 mmol), xantphos (1.16 g, 2.0 mmol), and NaOtBu (0.31 g, 80 mmol) were dissolved by toluene (200 ml) in the rounded-bottom flask (500 ml), and the mixture was heated and stirred at 110° C. for 1 hour. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 153-1 (12.7 g, yield: 95%).

(2) Compound 153-2

[Reaction Formula 23-2]

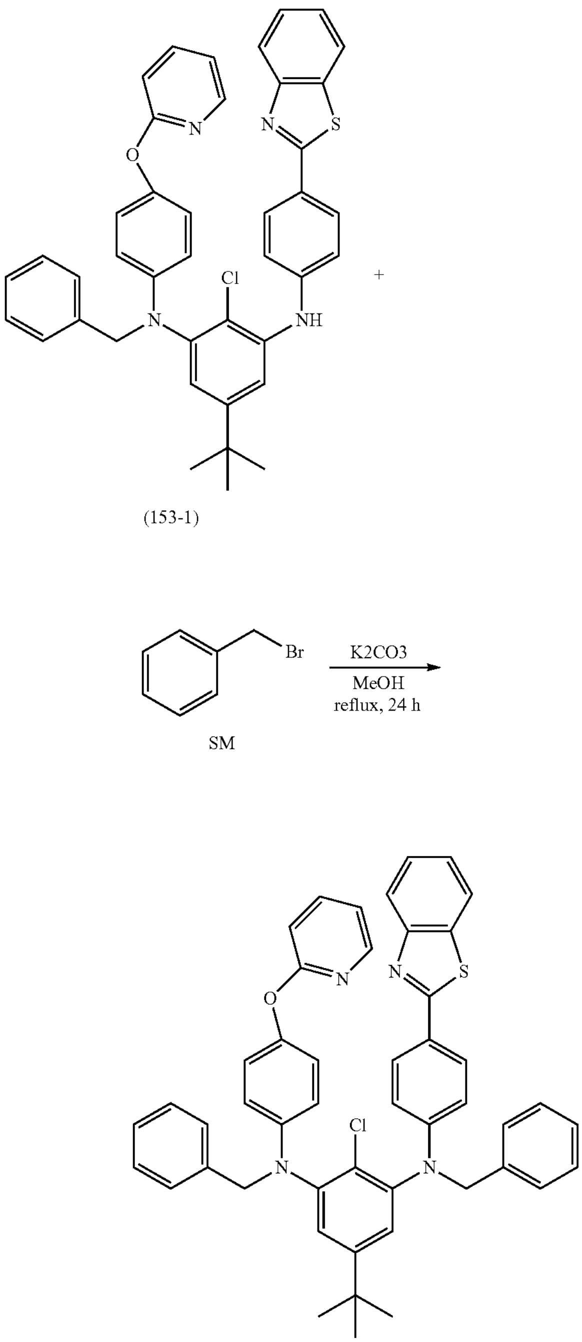

(153-1) SM (153-2)

Under nitrogen condition, the compound 153-1 (13.3 g, 20 mmol), the compound SM (3.42 g, 20 mmol), and $K_2CO_3$ (4.14 g, 30 mmol) were dissolved by methanol (200 ml) in the rounded-bottom flask (500 ml), and the mixture was refluxed and stirred for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 153-2 (13.2 g, yield: 87%).

(3) Compound 153-3

[Reaction Formula 23-3]

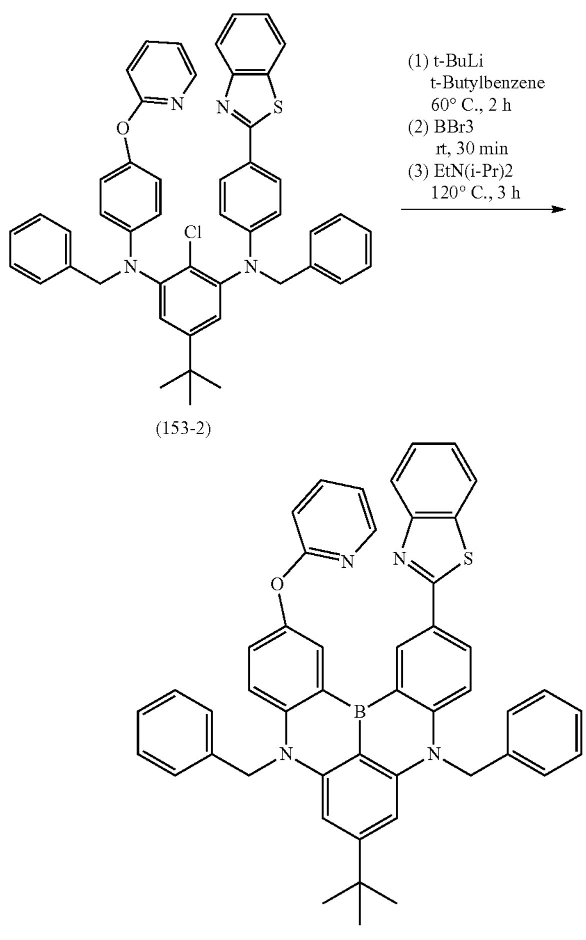

(153-2) (153-3)

Under nitrogen condition, the compound 153-2 (7.57 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 153-3 (2.34 g, yield: 32%).

(4) Compound 153-4

[Reaction Formula 23-4]

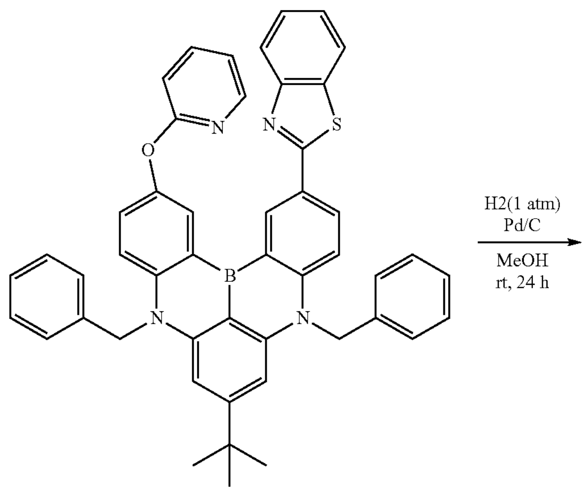

(153-3)

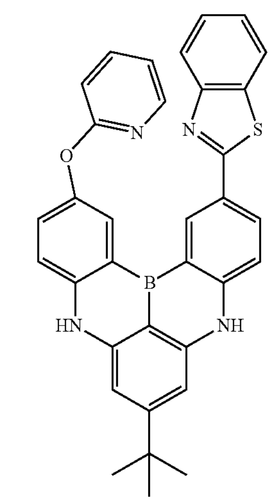

(153-4)

Under hydrogen 1 atmosphere condition, the compound 153-3 (7.31 g, 10 mmol) and palladium charcoal (1 g, 10% Pd/C) were dissolved by methanol (100 ml) in the rounded-bottom flask (250 ml), and the mixture was stirred under the room temperature for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 153-4 (4.73 g, yield: 86%).

(5) Compound 153-5

[Reaction Formula 23-5]

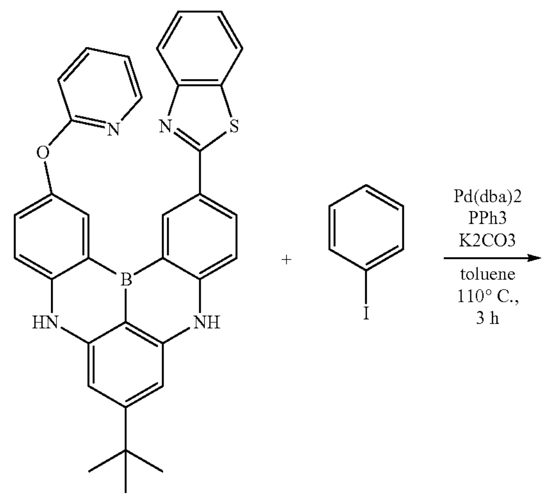

(153-4) SM

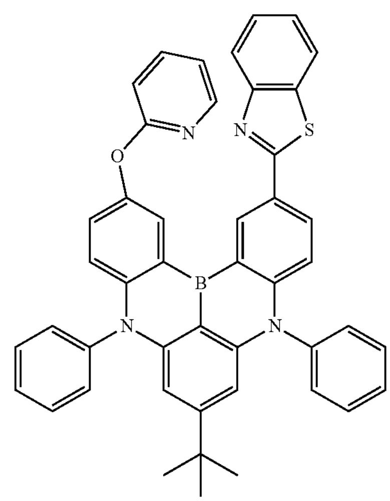

(153-5)

Under nitrogen condition, the compound 153-4 (11.0 g, 20 mmol), the compound SM (8.16 g, 40 mmol), $Pd(dba)_2$ (1.15 g, 2.0 mmol), $PPh_3$ (0.52 g, 2.0 mmol), and $K_2CO_3$ (0.31 g, 80 mmol) were dissolved by toluene (200 ml) in the rounded-bottom flask (500 ml), and the mixture was heated and stirred at 110° C. for 3 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=1:3) to obtain the compound 153-5 (12.4 g, yield: 88%).

(6) Compound 153

[Reaction Formula 23-6]

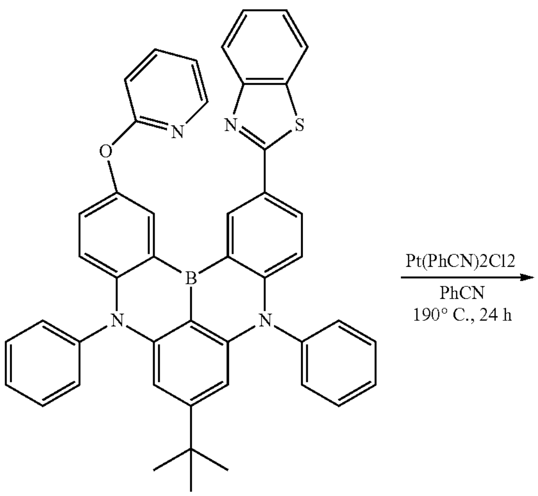

(153-5)

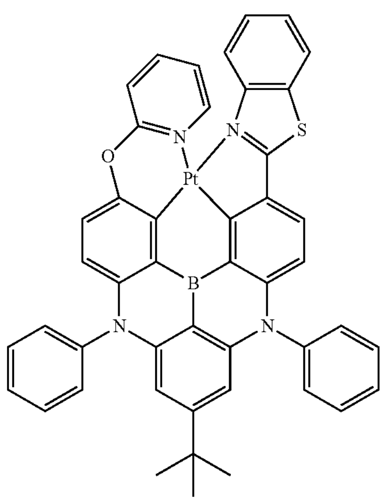

(153)

Under nitrogen condition, the compound 153-5 (7.03 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 153 (2.78 g, yield: 31%).

24. Synthesis of Compound 158

(1) Compound 158-1

[Reaction Formula 24-1]

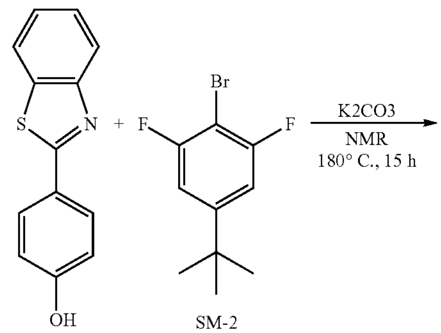

SM-1

SM-2

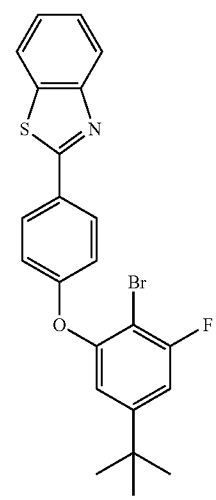

(158-1)

Under nitrogen condition, the compound SM-1 (4.55 g, 20 mmol), the compound SM-2 (4.98 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 158-1 (8.03 g, yield: 88%).

(2) Compound 158-2

[Reaction Formula 24-2]

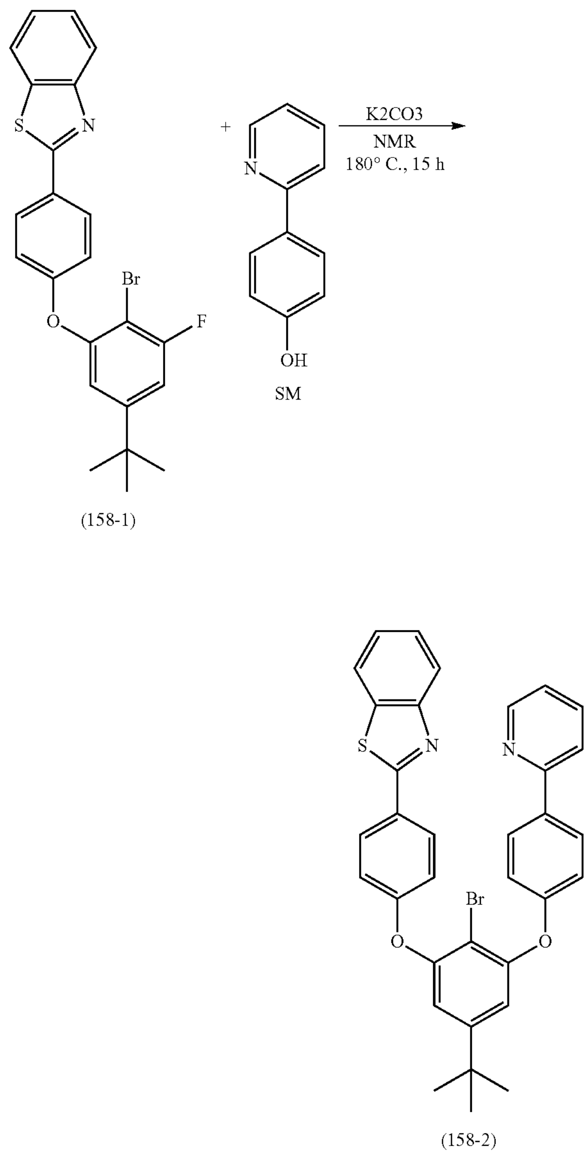

Under nitrogen condition, the compound 158-1 (9.13 g, 20 mmol), the compound SM (3.42 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 158-2 (10.3 g, yield: 85%).

(3) Compound 158-3

[Reaction Formula 24-3]

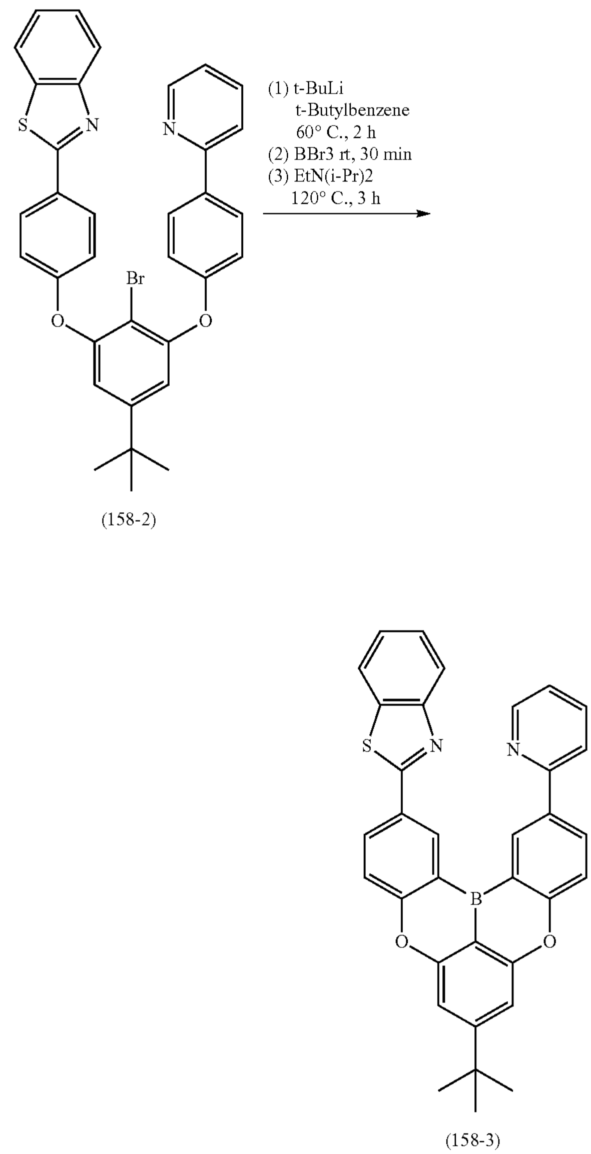

Under nitrogen condition, the compound 158-2 (6.08 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 158-3 (1.88 g, yield: 35%).

(4) Compound 158

[Reaction Formula 24-4]

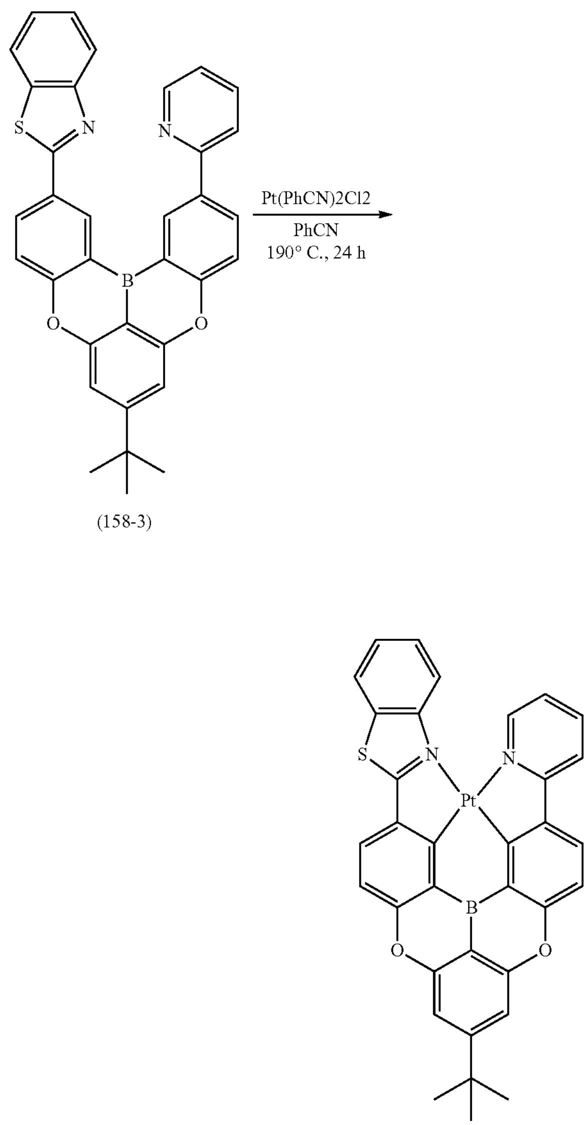

(158-3)

(158)

Under nitrogen condition, the compound 158-3 (5.37 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 158 (2.92 g, yield: 40%).

25. Synthesis of Compound 162

(1) Compound 162-1

[Reaction Formula 25-1]

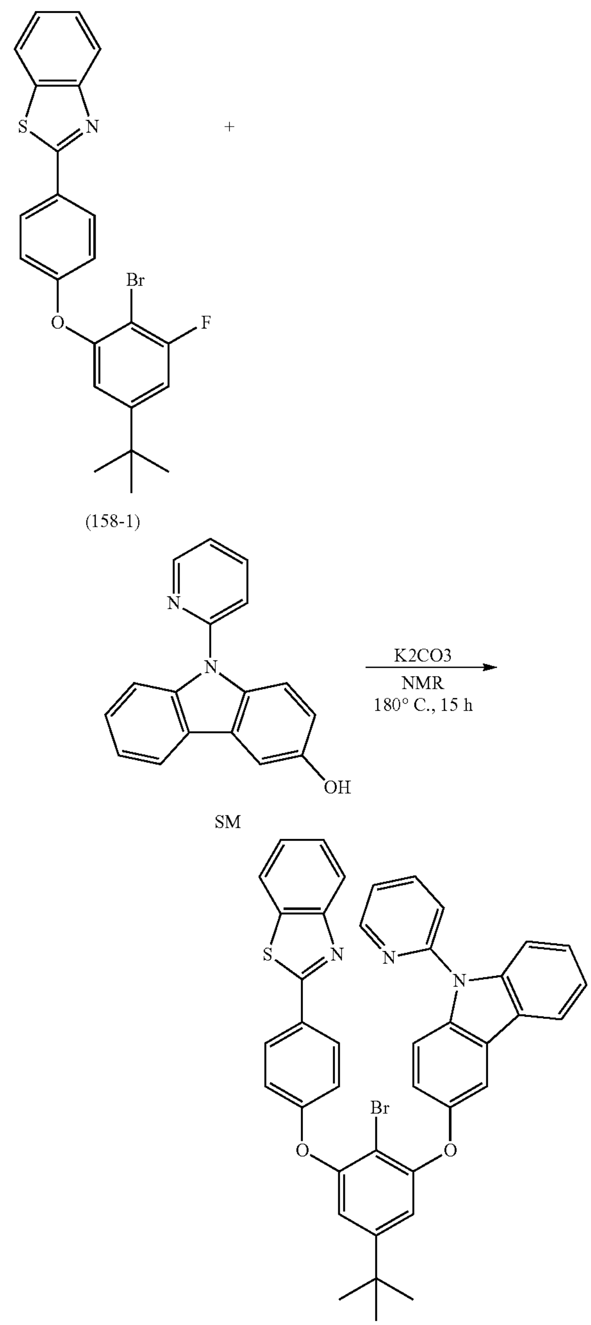

(158-1)

(162-1)

Under nitrogen condition, the compound 158-1 (9.13 g, 20 mmol), the compound SM (5.21 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours.

After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 162-1 (11.8 g, yield: 85%).

(2) Compound 162-2

[Reaction Formula 25-2]

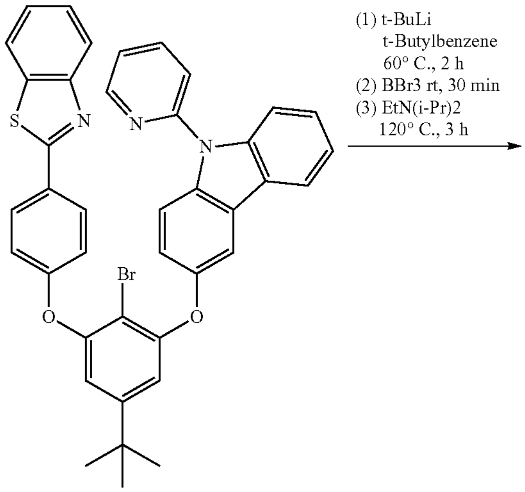

(162-1)

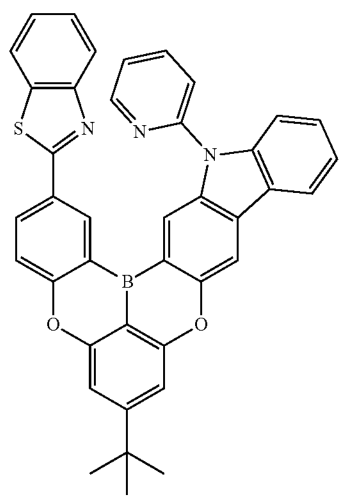

(162-2)

Under nitrogen condition, the compound 162-1 (6.97 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 162-2 (1.94 g, yield: 31%).

(3) Compound 162

[Reaction Formula 25-3]

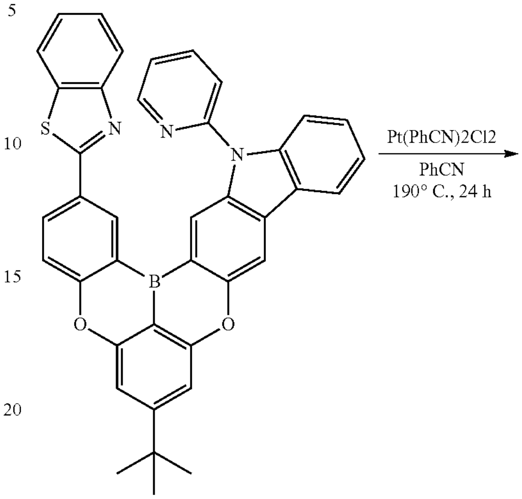

(162-2)

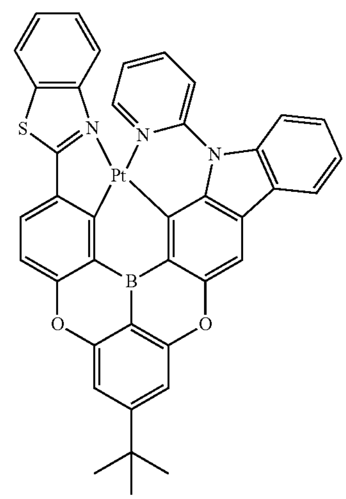

(162)

Under nitrogen condition, the compound 162-2 (6.26 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 162 (2.21 g, yield: 39%).

26. Synthesis of Compound 167

(1) Compound 167-1

[Reaction Formula 26-1]

Lack of Reaction Formula 26-1

Under nitrogen condition, the compound 158-1 (9.13 g, 20 mmol), the compound SM (3.74 g, 20 mmol), and $K_2CO_3$ (4.14 g, 30 mmol) were dissolved by NMP (100 ml) in the rounded-bottom flask (250 ml), and the mixture was heated and stirred at 180° C. for 15 hours. After the reaction was completed, the mixture was cooled into the room temperature, and NMP was removed under reduced pressure. The mixture was extracted with chloroform, and washed with water. The moisture was removed with anhydrous magnesium sulfate and concentrated under reduced pressure. The mixture was columned with methylene chloride and hexane (volume ratio=1:3) to obtain the compound 167-1 (9.85 g, yield: 79%).

(2) Compound 167-2

[Reaction Formula 26-2]

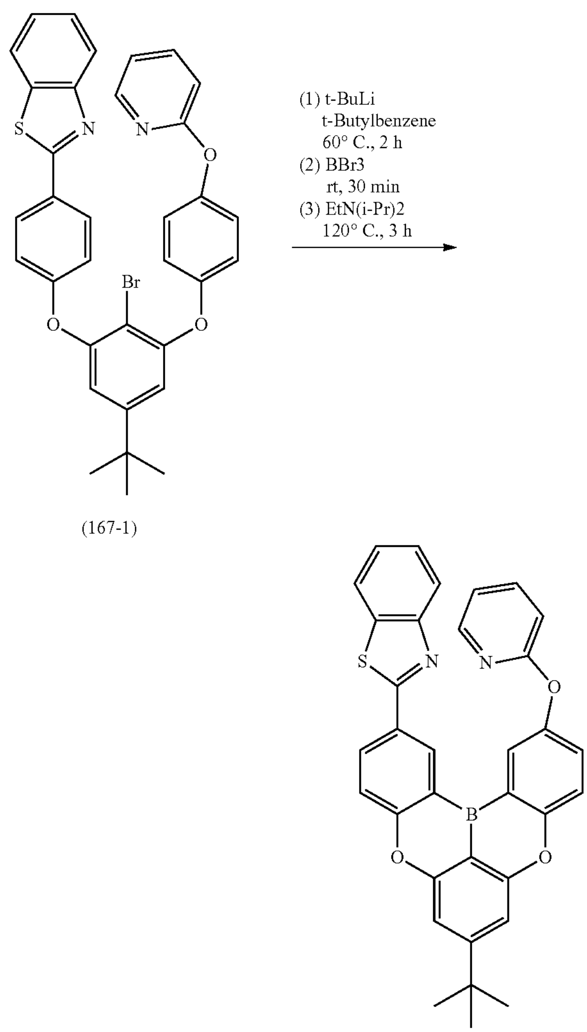

(167-1)

(167-2)

Under nitrogen condition, the compound 167-1 (6.24 g, 10 mmol) was dissolved in t-butylbenzene (100 ml) in the rounded-bottom flask (250 ml), and then the temperature was set to 60° C. After t-BuLi (1.7 M in pentane, 7 ml, 12 mmol) was drowisely added, the mixture was stirred for 2 hours. Then, after cooling the mixture into the room temperature, $BBr_3$ (3.00 g, 12 mmol) was slowly and drowisely added and stirred at the room temperature for 30 minutes. $EtN(i\text{-}Pr)_2$ (2.58 g, 20 mmol) was dropwisely added into the mixture, and the mixture was stirred at 120° C. for 3 hours. After the reaction was completed, the mixture was cooled into the room temperature, extracted with chloroform, and washed with water. The moisture was removed with anhydrous magnesium sulfate, concentrated under reduced pressure. The mixture was columned with methylene chloride and hexane (volume ratio=1:3) to obtain the compound 167-2 (1.82 g, yield: 33%).

(3) Compound 167

[Reaction Formula 26-3]

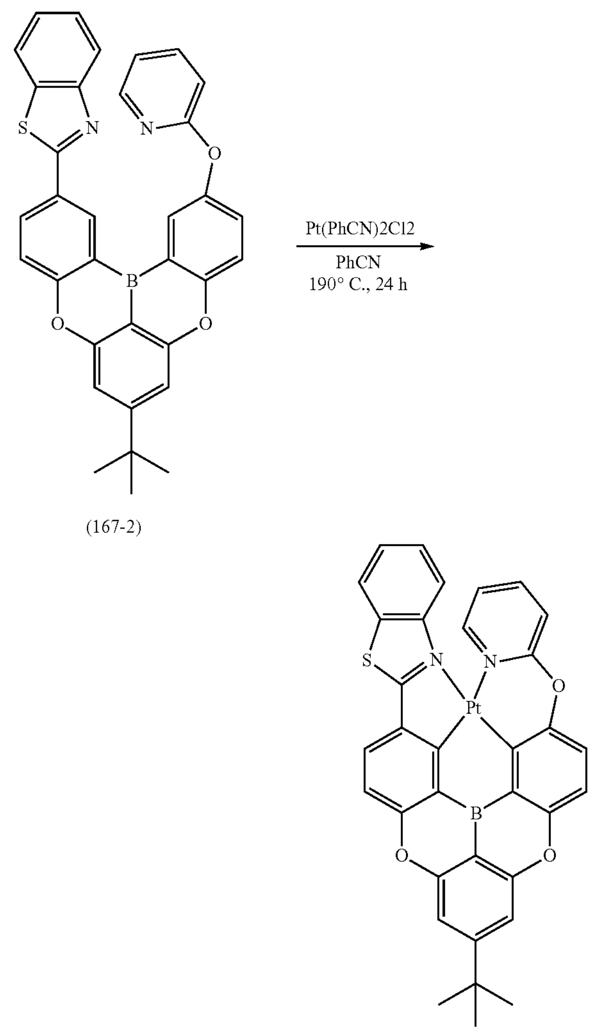

(167-2)

(167)

Under nitrogen condition, the compound 167-2 (5.52 g, 10 mmol), and $Pt(PhCN)_2Cl_2$ (4.72 g, 10 mmol) were dissolved by PhCN (100 ml) in the rounded-bottom flask (250 ml), and the mixture was stirred at 190° C. for 24 hours. After the reaction was completed, the mixture was cooled into the room temperature, extracted with chloroform, and washed with water. The moisture was removed with anhydrous magnesium sulfate and concentrated under reduced pressure. The mixture was columned with methylene chloride and hexane (volume ratio=5:1) to obtain the compound 167 (2.68 g, yield: 36%).

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region may include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
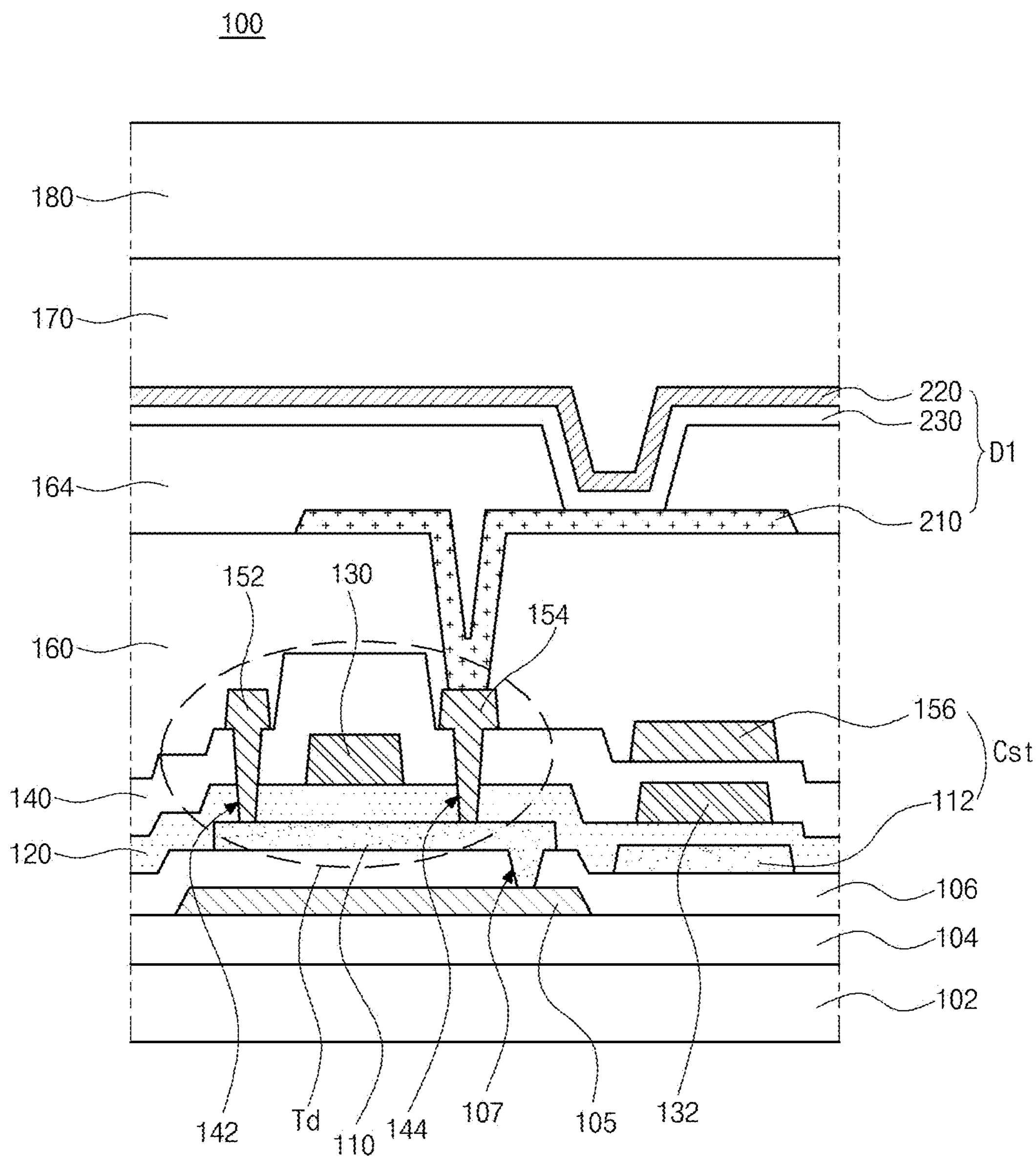
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 102, a driving TFT Td on or over the substrate 102 and an OLED D1 connected to the driving TFT Td.

For example, a red pixel region, a green pixel region and a blue pixel region may be defined on the substrate 102, and the OLED D1 may be positioned in each of the red, green and blue pixel regions. Namely, the OLEDs D1 emitting red, green and blue light may be positioned in the red, green and blue pixel regions, respectively.

The substrate 102 may be a glass substrate or a plastic substrate. For example, the substrate 110 may be a polyimide (PI) substrate, a polyethersulfone (PES) substrate, a polyethylenenaphthalate (PEN) substrate, a polyethylene terephthalate (PET) substrate, or a polycarbonate (PC) substrate.

A first buffer layer 104 is formed on the substrate, and a light shielding pattern 105 corresponding to the driving TFT Td is formed on the first buffer layer 104. In addition, a second buffer layer 106 is formed on the light shielding pattern 105, and a buffer contact hole 107 exposing the light shielding pattern 105 is formed through the second buffer layer 106.

For example, each of the first and second buffer layers 104 and 106 may be formed of an inorganic insulating material such as silicon oxide or silicon nitride. The light shielding pattern 105 may be formed of an opaque metallic material. The first and second buffer layers 104 and 106 and the light shielding pattern 105 may be omitted.

The driving TFT Td including a semiconductor layer 110, a gate electrode 130, a source electrode 152 and a drain electrode 154 and the storage capacitor Cst including first to third storage electrodes 112, 132 and 156 are formed on the second buffer layer 106.

The semiconductor layer 110 and the first storage electrode 112 are formed on the second buffer layer 106. For example, the semiconductor layer 110 may include polycrystalline silicon, and an impurity may be doped into both sides of the semiconductor layer 110. An end of the semiconductor layer 110 at the drain electrode 154 side is connected to the light shielding pattern 105 through the buffer contact hole 107. In addition, the first storage electrode 112 is formed by doping the impurity into polycrystalline silicon to act as an electrode of the storage capacitor Cst. Alternatively, the semiconductor layer 110 may include an oxide semiconductor material.

A gate insulating layer 120 is formed over an entire surface of the substrate 102 and on the semiconductor layer 110 and the first storage electrode 112. The gate insulating layer 120 may be formed of an inorganic insulating material such as silicon oxide or silicon nitride.

A gate electrode 130, which is formed of a conductive material, e.g., metal, is formed on the gate insulating layer 120 to correspond to a center of the semiconductor layer 110. In FIG. 2, the gate insulating layer 120 is formed on an entire surface of the substrate 102. Alternatively, the gate insulating layer 120 may be patterned to have the same shape as the gate electrode 130.

In addition, the second storage electrode 132 corresponding to (overlapping) the first storage electrode 112 is formed on the same layer and of the same material as the gate electrode 132.

An interlayer insulating layer 140, which is formed of an insulating material, is formed on the gate electrode 130 and the second storage electrode 132. The interlayer insulating layer 140 may be formed of an inorganic insulating material, e.g., silicon oxide or silicon nitride, or an organic insulating material, e.g., benzocyclobutene or photo-acryl.

The interlayer insulating layer 140 includes first and second contact the semiconductor holes 142 and 144 exposing both sides of the semiconductor layer 110. The first and second the semiconductor contact holes 142 and 144 are positioned at both sides of the gate electrode 130 to be spaced apart from the gate electrode 130. The first and second the semiconductor contact holes 142 and 144 are formed through the gate insulating layer 120. Alternatively, when the gate insulating layer 120 is patterned to have the same shape as the gate electrode 130, the first and second the semiconductor contact holes 142 and 144 is formed only through the interlayer insulating layer 140.

A source electrode 152 and a drain electrode 154, which are formed of a conductive material, e.g., metal, are formed on the interlayer insulating layer 140. The source electrode 152 and the drain electrode 154 are spaced apart from each other with respect to the gate electrode 130 and respectively contact both sides of the semiconductor layer 110 through the first and second the semiconductor contact holes 142 and 144.

In addition, the third storage electrode 156 corresponding to (overlapping) the second storage electrode 132 is formed on the interlayer insulating layer 140.

The semiconductor layer 110, the gate electrode 130, the source electrode 152 and the drain electrode 154 constitute the driving TFT Td, and the first to third storage electrodes 112, 132 and 156, the gate insulating layer 120 as a first dielectric layer, and the interlayer insulating layer 140 as a second dielectric layer constitute the storage capacitor Cst.

In FIG. 2, the gate electrode 130, the source electrode 152, and the drain electrode 154 are positioned over the semiconductor layer 110. Namely, the driving TFT Td has a coplanar structure. Alternatively, in the driving TFT Td, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

Although not shown, the gate line GL (of FIG. 1) and the data line DL (of FIG. 1) cross each other to define the pixel region, and the switching TFT Ts (of FIG. 1) is formed to be connected to the gate and data lines GL and DL. The switching TFT Ts is connected to the driving TFT Td. In addition, the power line PL (of FIG. 1), which may be formed to be parallel to and spaced apart from one of the gate and data lines GL and DL.

A passivation layer (or planarization layer) 160 is formed on an entire surface of the substrate 110 to cover the source electrode 152, the drain electrode 154 and the third storage electrode 156. The passivation layer 160 provides a flat top surface and has a drain contact hole 162 exposing the drain electrode 154 of the driving TFT Td.

The OLED D1 is disposed on the passivation layer 160 and includes a first electrode 210, which is connected to the drain electrode 154 of the driving TFT Td, an organic emitting layer 230 and a second electrode 220. The organic emitting layer 230 and the second electrode 220 are sequentially stacked on the first electrode 210.

The first electrode 210 is separately formed in each pixel region. The first electrode 210 may be an anode and may be formed of a conductive material, e.g., a transparent conductive oxide (TCO), having a relatively high work function. For example, the first electrode 210 may be formed of indium-tin-oxide (ITO), indium-zinc-oxide (IZO), indium-tin-zinc-oxide (ITZO), thin oxide (SnO), zinc oxide (ZnO), indium-copper-oxide (ICO) or aluminum-zinc-oxide (Al:ZnO, AZO).

When the organic light emitting display device 100 of the present disclosure is operated in a top-emission type, a reflection electrode or a reflection layer may be formed under the first electrode 210. For example, the reflection electrode or the reflection layer may be formed of aluminum-palladium-copper (APC) alloy.

In addition, a bank layer 164 is formed on the passivation layer 160 to cover an edge of the first electrode 210. Namely, the bank layer 164 is positioned at a boundary of the pixel region and exposes a center of the first electrode 210 in the pixel region.

The organic emitting layer 230 is formed on the first electrode 210. The organic emitting layer 230 may have a single-layered structure of an emitting material layer (EML) including an emitting material. Alternatively, the organic emitting layer 230 may have a multi-layered structure. For example, the organic emitting layer 230 may further include at least one of a hole injection layer (HIL), a hole transporting layer (HTL), an electron blocking layer (EBL), a hole blocking layer (HBL), an electron transporting layer (ETL) and an electron injection layer (EIL). The HIL, the HTL and the EBL are sequentially disposed between the first electrode 210 and the EML, and the HBL, the ETL and the EIL are sequentially disposed between the EML and the second electrode 220. In addition, the EML may has a single-layered structure or a multi-layered structure. Moreover, two or more light emitting layers may be disposed to be spaced apart from each other such that the OLED D1 may have a tandem structure.

The organic emitting layer 230 includes the organometallic compound of the present disclosure such that the emitting efficiency and the emitting lifespan of the OLED D1 and the organic light emitting display device 100 are significantly improved.

The second electrode 220 is formed over the substrate 102 where the organic emitting layer 230 is formed. The second electrode 220 covers an entire surface of the display area and may be formed of a conductive material having a relatively low work function to serve as a cathode injecting an electron. For example, the second electrode 220 may be formed of aluminum (Al), magnesium (Mg), calcium (Ca), silver (Ag) or their alloy, e.g., Al—Mg ally (AlMg) or combination.

An encapsulation layer 170 and a barrier layer (or a barrier substrate) 180 are sequentially formed on the second electrode 220 to prevent a moisture penetration into the OLED D1.

Although not shown, a polarization plate for reducing an ambient light reflection may be disposed on the barrier layer 180 in the top-emission type OLED D1. For example, the polarization plate may be a circular polarization plate.

Figure 3:
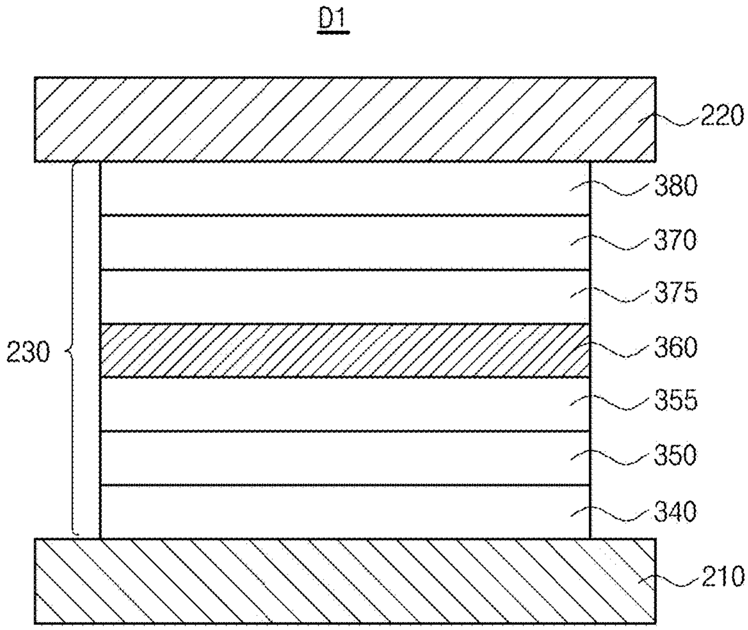
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first and second electrodes 210 and 220, which face each other, and the organic emitting layer 230 therebetween. The OLED D1 in FIG. 3 is disposed in the green pixel region.

The first electrode 210 may be anode, and the second electrode 220 may be a cathode. For example, each of the first and second electrodes 210 and 220 may have a thickness of about 30 to 300 nm.

The organic emitting layer 230 includes an emitting material layer (EML) 360.

The organic emitting layer 230 may further include at least one of a hole transporting layer (HTL) 350 between the first electrode 210 and the EML 360 and an electron transporting layer (ETL) 370 between the second electrode 220 and the EML 360.

In addition, the organic emitting layer 230 may further include at least one of a hole injection layer (HIL) 340 between the first electrode 210 and the HTL 350 and an electron injection layer (EIL) 380 between the second electrode 220 and the ETL 370.

Moreover, the organic emitting layer 230 may further include at least one of an electron blocking layer (EBL) 355 between the HTL 350 and the EML 360 and a hole blocking layer (HBL) 375 between the EML 360 and the ETL 370.

Namely, the OLED D1 has a single emitting unit.

The HIL 340 is positioned between the first electrode 210 and HTL 350, and the interface properties between the first electrode 210 of an inorganic material and the HTL 350 of an organic material may be improved by the HIL 340. For example, the HIL 340 may include a hole injection material being at least one of 4,4',4"-tris(3-methylphenylamino)triphenyl amine (MTDATA), 4,4',4"-tris(N,N-diphenyl-amino)triphenylamine (NATA), 4,4',4"-tris(N-(naphthalene-1-yl)-N-phenyl-amino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile, dipyrazino[2,3-f:2'3'-h]quinoxaline-2,3,6,7,10,11-hexacarbonitrile, 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, and N,N'-diphenyl-N,N'-di[4-(N,N-diphenyl-amino)phenyl]benzidine (NPNPB), but it is not limited thereto.

The HTL 350 is positioned between the HIL 340 and the EML 360. For example, the HTL 350 may include a hole transporting material being at least one of N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), poly[N,N'-bis(4-butylpnehyl)-N,N'-bis(phenyl)-benzidine] (poly-TPD), poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and N-([1,1'-Biphenyl]-4-yl)-9,9-dimethyl-N-(4-(9-phenl-9H-carbazol-3-yl)phenyl)-9H-fluoren-2-amine, but it is not limited thereto.

For example, each of the HIL 340 and the HTL 350 may have a thickness of about 5 to 200 nm, and preferably 5 to 100 nm, but it is not limited thereto.

The EML 360 includes a host and a dopant. The dopant is an emitter. The dopant of the EML 360 is the organometallic compound of FIG. 1. The EML 360 may have a thickness of 10 to 200 nm, preferably 20 to 100 nm, and more preferably 20 to 50 nm. The dopant may have a weight % of about 1 to 30, preferably about 1 to 10 in the EML 360.

For example, the host of the EML 360 may be one of 9-(3-(9H-carbazol-9-yl)phenyl)-9H-carbazole-3-carbonitrile (mCP—CN), CBP, 3,3'-bis(N-carbazolyl)-1,1'-biphenyl (mCBP), 1,3-bis(carbazol-9-yl)benzene (mCP), DPEPO, 2,8-bis(diphenylphosphoryl)dibenzothiophene (PPT), 1,3,5-tri[(3-pyridyl)-phen-3-yl]benzene (TmPyPB), 2,6-di(9H-carbazol-9-yl)pyridine (PYD-2Cz), 2,8-di(9H-carbazol-9-yl)dibenzothiophene (DCzDBT), 3',5'-di(carbazol-9-yl)-[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, 9,9'-diphenyl-9H,9'H-3,3'-bicarbazole (BCzPh), 1,3,5-tris(carbazole-9-yl)benzene (TCP), TCTA, 4,4'-bis(carbazole-9-yl)-2,2'-dimethylbipheyl (CDBP), 2,7-Bis(carbazole-9-yl)-9,9-dimethylfluorene (DMFL-CBP), 2,2',7,7'-tetrakis(carbazole-9-yl)-9,9-spiorofluorene (Spiro-CBP), and 3,6-bis(carbazole-9-yl)-9-(2-ethyl-hexyl)-9H-carbazole (TCz1), but it is not limited thereto.

The ETL 370 between the EML 360 and the second electrode 220 may include an electron injection material being at least one of tris-(8-hydroxyquinoline aluminum (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), poly[9,9-bis(3'4N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenylsilyl-phenylphosphine oxide (TSPO1), and 2-[4-(9,10-di-2-naphthalen-2-yl-2-anthracen-2-yl)phenyl]-1-phenyl-1H-benzimidazole (ZADN), but it is not limited thereto.

The EIL 380 between the ETL 370 and the second electrode 220 may include alkali metal halides or alkaline earth metal halides such as LiF, CsF, NaF, and BaF2 and/or organometallic materials such as lithium quinolate (Liq), lithium benzoate, and sodium stearate, but it is not limited thereto.

For example, each of the ETL 360 and the EIL 370 may have a thickness of about 10 to 200 nm, preferably about 10 to 100 nm.

Alternatively, when an electron injection material is doped into the HTL 370, the HIL 380 may be omitted.

In the organometallic compound of the present disclosure, the number of d orbitals involved in the bond between a metal and a ligand is reduced such that the organometallic compound provides narrow full-width at half maximum (FWHM) in the emission spectrum. In addition, since the organometallic compound has a rigid chemical structure, a stable chemical structure is maintained during the luminescence such that the color purity and the emitting lifespan are improved. Accordingly, the emitting efficiency and the emitting lifespan of the OLED D1 are improved.

[OLED]

On a substrate, on which an anode (ITO, 100 nm) is coated, an HIL (Formula 6, 60 nm), an HTL (Formula 7, 80 nm), an EML (30 nm), an ETL (Formula 9:Liq (weight ratio=1:1), 30 nm), and a cathode (Al, 100 nm) are sequentially deposited to form an OLED. The EML includes a host of Formula 9 and a dopant, and the dopant has a wt % of 5 in the EML.

[Formula 6]

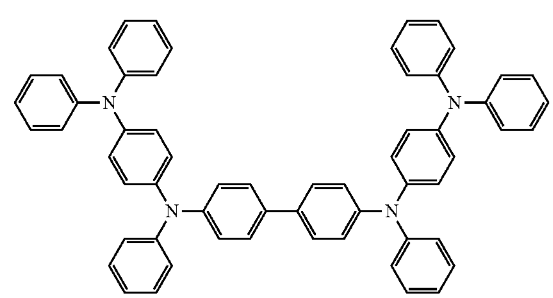

[Formula 7]

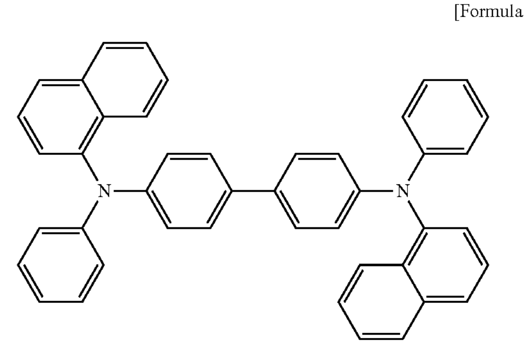

-continued

[Formula 8]

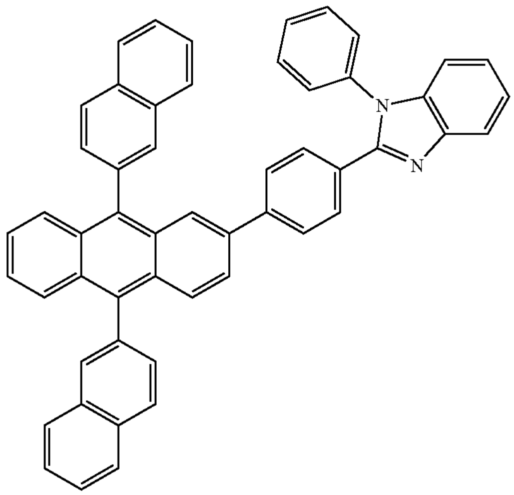

[Formula 9]

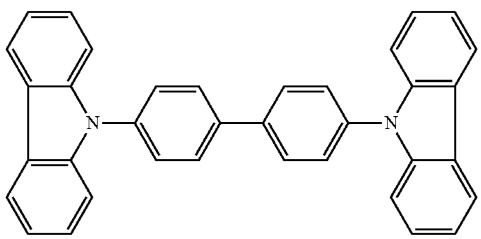

(1) Comparative Example 1 (Ref1)

The compound A of Formula 10 is used as the dopant.

(2) Examples 1 to 14 (Ex1 to Ex14)

The compounds 1, 8, 12, 31, 38, 96, 102, 41, 42, 52, 71, 72, 82 and 86 of Formula 5 are respectively used as the dopant.

[Formula 10]

A

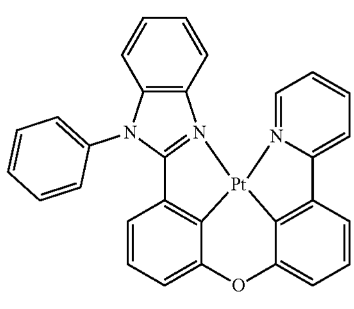

The emitting properties, e.g., a driving voltage, a maximum emission quantum efficiency (Emax), an external quantum efficiency (EQE), and a lifespan (LT95), of the OLED in Comparative Example 1 and Examples 1 to 14 are measured and listed in Table 1. The maximum emission quantum efficiency, the external quantum efficiency, and the lifespan of Examples 1 to 14 are relative value with respect to those of Comparative Example 1.

TABLE 1

| | Dopant | voltage [V] | Emax [%] | EQD [%] | LT95 [%] |
|---|---|---|---|---|---|
| Ref1 | Compound A | 4.25 | 100 | 100 | 100 |
| Ex1 | Compound 1 | 4.33 | 143 | 125 | 121 |
| Ex2 | Compound 8 | 4.31 | 144 | 121 | 120 |
| Ex3 | Compound 12 | 4.26 | 148 | 125 | 122 |
| Ex4 | Compound 31 | 4.31 | 139 | 119 | 119 |
| Ex5 | Compound 38 | 4.32 | 135 | 122 | 125 |
| Ex6 | Compound 96 | 4.30 | 133 | 121 | 126 |
| Ex7 | Compound 102 | 4.29 | 151 | 138 | 120 |
| Ex8 | Compound 41 | 4.23 | 152 | 136 | 119 |
| Ex9 | Compound 42 | 4.22 | 155 | 133 | 121 |
| Ex10 | Compound 52 | 4.22 | 162 | 140 | 125 |
| Ex11 | Compound 71 | 4.26 | 159 | 136 | 118 |
| Ex12 | Compound 72 | 4.23 | 161 | 139 | 117 |
| Ex13 | Compound 82 | 4.19 | 158 | 140 | 119 |
| Ex14 | Compound 86 | 4.20 | 155 | 141 | 120 |

As shown in Table 1, the emitting efficiency and the lifespan of the OLED in Examples 1 to 14 including the organometallic compound of the present disclosure are significantly increased.

(1) Comparative Example 2 (Ref2)

The compound B of Formula 11 is used as the dopant.

(2) Examples 15 to 20 (Ex15 to Ex20)

The compounds 113, 118, 123, 130, 132 and 137 of Formula 5 are respectively used as the dopant.

[Formula 11]

B

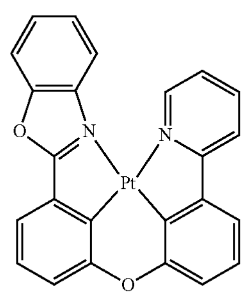

The emitting properties, e.g., a driving voltage, a maximum emission quantum efficiency (Emax), an external quantum efficiency (EQE), and a lifespan (LT95), of the OLED in Comparative Example 2 and Examples 15 to 20 are measured and listed in Table 2. The maximum emission quantum efficiency, the external quantum efficiency, and the lifespan of Examples 15 to 20 are relative value with respect to those of Comparative Example 2.

TABLE 2

| | Dopant | voltage [V] | Emax [%] | EQD [%] | LT95 [%] |
|---|---|---|---|---|---|
| Ref2 | Compound B | 4.23 | 100 | 100 | 100 |
| Ex15 | Compound 113 | 4.24 | 108 | 105 | 106 |
| Ex16 | Compound 118 | 4.21 | 111 | 110 | 110 |
| Ex17 | Compound 123 | 4.22 | 109 | 106 | 111 |
| Ex18 | Compound 130 | 4.22 | 116 | 116 | 110 |
| Ex19 | Compound 132 | 4.25 | 121 | 118 | 115 |
| Ex20 | Compound 137 | 4.24 | 125 | 120 | 116 |

As shown in Table 2, the emitting efficiency and the lifespan of the OLED in Examples 15 to 20 including the organometallic compound of the present disclosure are significantly increased.

(1) Comparative Example 3 (Ref3)

The compound C of Formula 12 is used as the dopant.

(2) Examples 21 to 26 (Ex21 to Ex26)

The compounds 143, 148, 153, 158, 162 and 167 of Formula 5 are respectively used as the dopant.

[Formula 12]

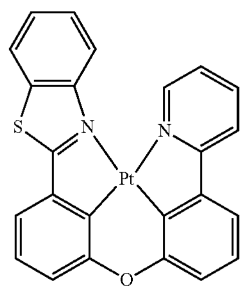

C

The emitting properties, e.g., a driving voltage, a maximum emission quantum efficiency (Emax), an external quantum efficiency (EQE), and a lifespan (LT95), of the OLED in Comparative Example 3 and Examples 21 to 26 are measured and listed in Table 3. The maximum emission quantum efficiency, the external quantum efficiency, and the lifespan of Examples 21 to 26 are relative value with respect to those of Comparative Example 3.

TABLE 3

| | Dopant | voltage [V] | Emax [%] | EQD [%] | LT95 [%] |
|---|---|---|---|---|---|
| Ref3 | Compound C | 4.24 | 100 | 100 | 100 |
| Ex21 | Compound 143 | 4.22 | 110 | 105 | 105 |
| Ex22 | Compound 148 | 4.19 | 115 | 108 | 109 |
| Ex23 | Compound 153 | 4.26 | 109 | 110 | 109 |
| Ex24 | Compound 158 | 4.25 | 119 | 116 | 114 |
| Ex25 | Compound 162 | 4.23 | 124 | 118 | 112 |
| Ex26 | Compound 167 | 4.24 | 122 | 114 | 116 |

As shown in Table 3, the emitting efficiency and the lifespan of the OLED in Examples 21 to 26 including the organometallic compound of the present disclosure are significantly increased.

Figure 4:
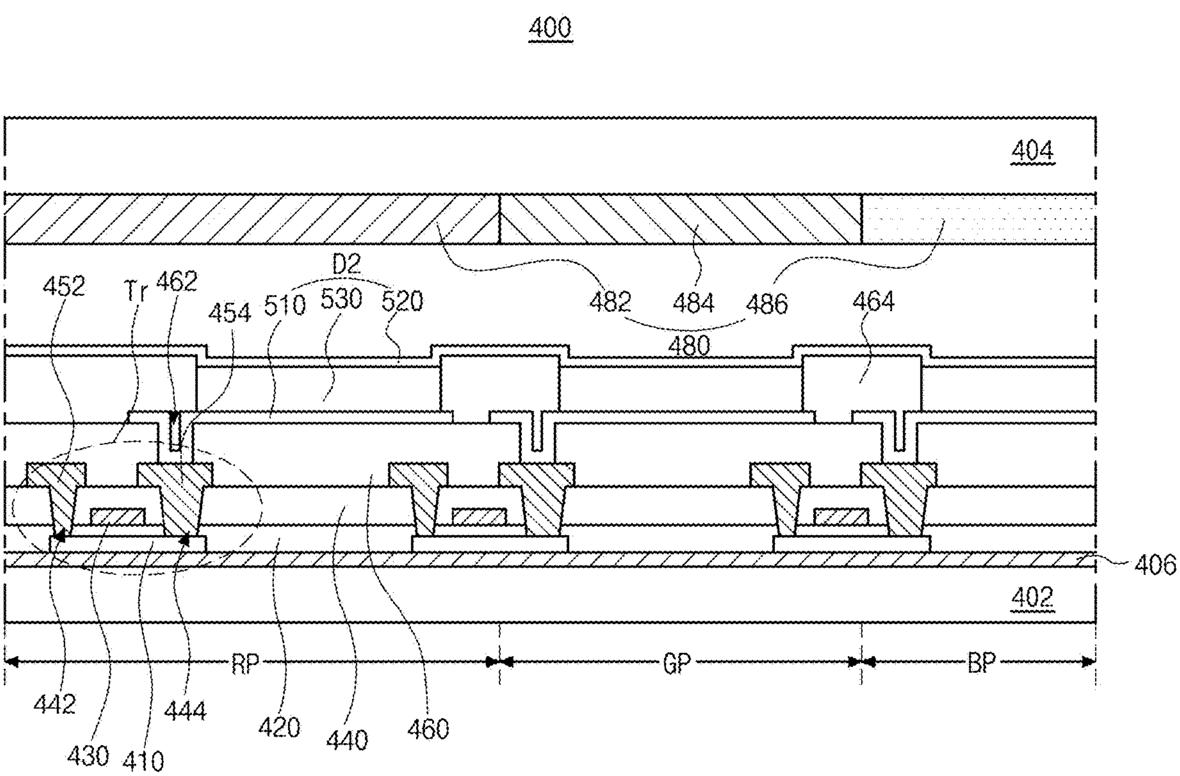
FIG. 4 is a schematic cross-sectional view of an organic light emitting display device according to a third embodiment of the present disclosure.

FIG. 4 is a schematic cross-sectional view of an organic light emitting display device according to a third embodiment of the present disclosure.

As shown in FIG. 4, the organic light emitting display device 400 includes a first substrate 402, where a red pixel RP, a green pixel GP and a blue pixel BP are defined, a second substrate 404 facing the first substrate 402, an OLED D2, which is positioned between the first and second substrates 402 and 404 and providing white emission, and a color filter layer 480 between the OLED D2 and the second substrate 404.

Each of the first and second substrates 402 and 404 may be a glass substrate or a plastic substrate. For example, each of the first and second substrates 402 and 404 may be a PI substrate, a PES substrate, PEN substrate, PET substrate or a PC substrate.

A buffer layer 406 is formed on the first substrate 402, and the TFT Tr corresponding to each of the red, green and blue pixels RP, GP and BP is formed on the buffer layer 406. The buffer layer 406 may be omitted. The TFT Tr may be the driving TFT.

A semiconductor layer 410 is formed on the buffer layer 406. The semiconductor layer 410 may include an oxide semiconductor material or polycrystalline silicon.

A gate insulating layer 420 is formed on the semiconductor layer 410. The gate insulating layer 420 may be formed of an inorganic insulating material such as silicon oxide or silicon nitride.

A gate electrode 430, which is formed of a conductive material, e.g., metal, is formed on the gate insulating layer 420 to correspond to a center of the semiconductor layer 410.

An interlayer insulating layer 440, which is formed of an insulating material, is formed on the gate electrode 430. The interlayer insulating layer 440 may be formed of an inorganic insulating material, e.g., silicon oxide or silicon nitride, or an organic insulating material, e.g., benzocyclobutene or photo-acryl.

The interlayer insulating layer 440 includes first and second semiconductor contact holes 442 and 444 exposing both sides of the semiconductor layer 410. The first and second semiconductor contact holes 442 and 444 are positioned at both sides of the gate electrode 430 to be spaced apart from the gate electrode 430.

A source electrode 452 and a drain electrode 454, which are formed of a conductive material, e.g., metal, are formed on the interlayer insulating layer 440. The source electrode 452 and the drain electrode 454 are spaced apart from each other with respect to the gate electrode 430 and respectively contact both sides of the semiconductor layer 410 through the first and second semiconductor contact holes 442 and 444.

The semiconductor layer 410, the gate electrode 430, the source electrode 452 and the drain electrode 454 constitute the TFT Tr.

A passivation layer 460 is formed over an entire surface of the substrate 402 and on the source and drain electrodes 452 and 454 to cover the TFT Tr. The passivation layer 460 includes a drain contact hole 462 exposing the drain electrode 454 of the TFT Tr.

The OLED D2 is disposed on the passivation layer 460. The OLED D2 includes a first electrode 510, which is connected to the drain electrode 454 of the TFT Tr, a second electrode 520 facing the first electrode 510, and an organic emitting layer 530 between the first and second electrodes 510 and 520.

The first electrode 510, which is connected to the drain electrode 454 of the TFT Tr through the drain contact hole 462, is separately formed in each pixel region. The first electrode 510 may be an anode.

A bank layer 464 is formed on the passivation layer 460 to cover an edge of the first electrode 510. Namely, the bank layer 464 is positioned at a boundary of the pixel region and exposes a center of the first electrode 510 in the red, green and blue pixels RP, GP and BP. The bank layer 464 may be omitted.

The organic emitting layer 530 is formed on the first electrode 510 and has a plurality of emitting units. Namely, the OLED D2 has a tandem structure. For example, as shown in FIGS. 5 to 8, the organic emitting layer 530 includes a plurality of emitting units 630, 630A, 730, 730A, 830, 830A, 930, 930A, 1030 and 1030A and at least one charge generation layer (CGL) 690, 890 and 990. Each of the emitting units includes the EML, and the CGL is positioned between adjacent emitting units.

The second electrode 520 is formed over the first substrate 402 including the organic emitting layer 530. The second electrode 520 may cover an entire surface of a display region and may be a cathode.

In the organic light emitting display device 400, since the light emitted from the organic emitting layer 530 is incident to the color filter layer 480 through the second electrode 520, the second electrode 520 has a thin profile for transmitting the light.

The color filter layer 480 is positioned over the OLED D2 and includes a red color filter 482, a green color filter 484 and a blue color filter 486 respectively corresponding to the red, green and blue pixels RP, GP and BP. Although not shown, the color filter layer 480 may be attached to the OLED D2 by using an adhesive layer. Alternatively, the color filter layer 480 may be formed directly on the OLED D2.

In FIG. 4, the light from the organic emitting layer 530 passes through the second electrode 520, and the color filter layer 480 is disposed on or over the OLED D2. Alternatively, when the light from the organic emitting layer 530 passes through the first electrode 510, the color filter layer 480 may be disposed between the OLED D2 and the first substrate 402.

A color conversion layer (not shown) may be formed between the OLED D2 and the color filter layer 480. The color conversion layer may include a red color conversion layer, a green color conversion layer and a blue color conversion layer respectively corresponding to the red, green and blue pixels RP, GP and BP. The white light from the OLED D2 is converted into the red light, the green light and the blue light by the red, green and blue color conversion layer, respectively.

As described above, the white light from the organic light emitting diode D2 passes through the red color filter 482, the green color filter 484 and the blue color filter 486 in the red pixel RP, the green pixel GP and the blue pixel BP such that the red light, the green light and the blue light are provided from the red pixel RP, the green pixel GP and the blue pixel BP, respectively.

Figure 5:
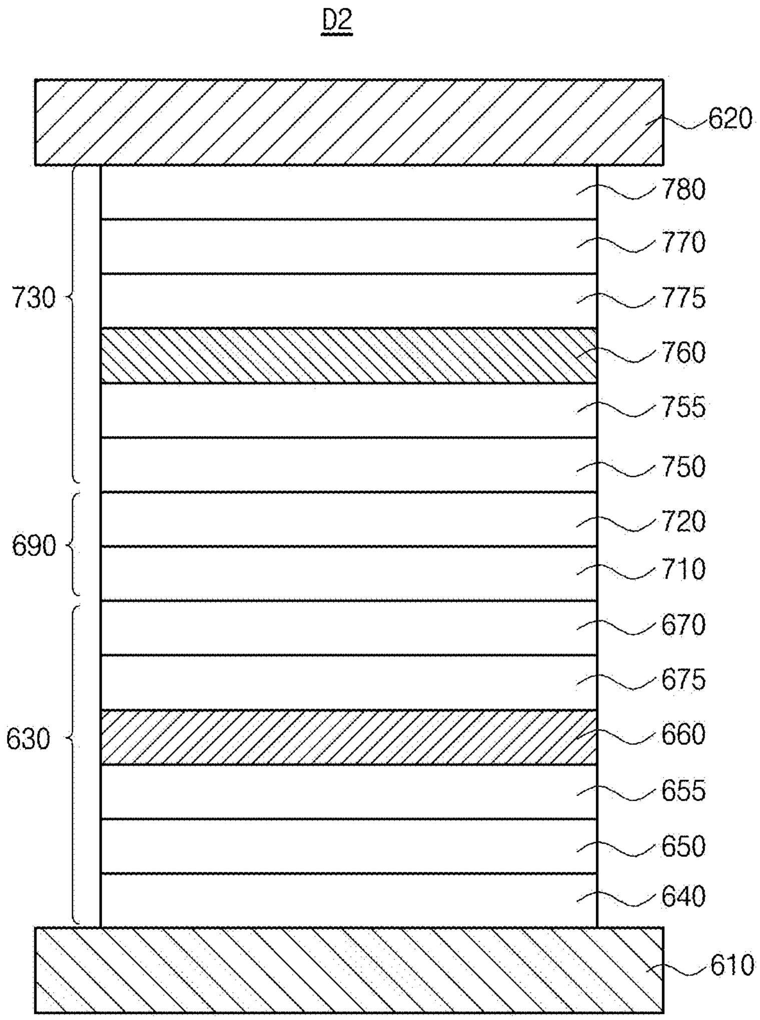
FIG. 5 is a schematic cross-sectional view of an OLED according to a fourth embodiment of the present disclosure.

FIG. 5 is a schematic cross-sectional view of an OLED according to a fourth embodiment of the present disclosure.

As shown in FIG. 5, the OLED D2 includes the first and second electrodes 610 and 620 facing each other, a first emitting unit 630 between the first and second electrodes 610 and 620, a second emitting unit 730 between the first emitting unit 630 and the second electrode 620, and the CGL 690 between the first and second emitting units 630 and 730.

The first electrode 610 may be an anode, and the second electrode 620 may be a cathode.

The first emitting unit 630 includes a first EML 660. The first emitting unit 630 may further include an HIL 640, a first HTL (a lower HTL) 650, and a first ETL (a lower ETL) 670. In addition, the first emitting unit 630 may further include at least one of a first EBL (a lower EBL) 655 between the first HTL 650 and the first EML 660 and a first HBL (a lower HBL) 675 between the first EML 660 and the first ETL 670.

The second emitting unit 730 includes a second EML 760. The second emitting unit 730 may further include a second HTL (an upper HTL) 750, a second ETL (an upper ETL) 770 and an EIL 780. In addition, the second emitting unit 730 may further include at least one of a second EBL (an upper EBL) 755 between the second HTL 750 and the second EML 760 and a second HBL (an upper HBL) 775 between the second EML 760 and the second ETL 770.

In this instance, at least one of the first and second EMLs 660 and 760 includes the organometallic compound of the present disclosure and emits green light or yellow-green light. When one of the first and second EMLs 660 and 760 includes the organometallic compound of the present disclosure, the other one of the first and second EMLs 660 and 760 may emit red light and/or blue light such that the OLED D2 may emit white light. The OLED D2, where the second EML 760 includes the organometallic compound of the present disclosure, will be explained.

The CGL 690 is positioned between the first and second emitting units 630 and 730. The CGL 690 includes an N-type CGL 710 adjacent to the first emitting unit 630 and a P-type CGL 720 adjacent to the second emitting unit 730. The N-type CGL 710 provides an electron into the first emitting unit 630, and the P-type CGL 720 provides a hole into the second emitting unit 730.

The second EML 760 includes a first host and a first dopant, and the first dopant is the organometallic compound of the present disclosure. For example, the first host may be one of mCP—CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1.

The first dopant may be doped by about 1 to 50 wt %, preferably about 1 to 30 wt % with respect to the second EML 760. For example, the second EML 760 may have a thickness of about 10 to 200 nm, preferably about 20 to 100 nm, and more preferably about 20 to 50 nm.

The first EML 660 may be a blue EML and/or a red EML. For example, the first EML 660 may have a double-layered structure including a blue EML and a red EML. In this instance, the first EML 660 may include a lower EML (not shown) between the first EBL 655 and the first HBL 675 and an upper EML (not shown) between the lower EML and the first HBL 675. One of the lower and upper EMLs is the red EML, and the other one of the lower and upper EMLs is the blue EML.

For example, when the lower EML is the red EML, the lower EML includes a second host as a red host and a second dopant as a red dopant.

The second host as the red host may be one of the first host, bis(2-hydroxylphenyl)-pyridine)beryllium (Bepp2), bis(10-hydroxylbenzo[h]quinolinato)beryllium (Bebq2), and 1,3,5-tris(1-pyrenyl)benzene (TPB3), but it is not limited thereto.

The second dopant as the red dopant may be an organometallic compound of Formula 13 or Formula 14, but it is not limited thereto.

[Formula 13]

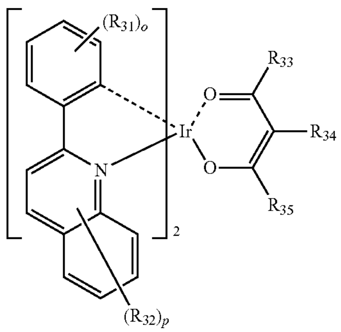

[Formula 14]

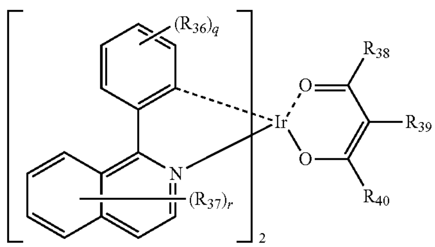

In Formulas 13 and 14, each of $R_{31}$, $R_{32}$, $R_{36}$ and $R_{37}$ is independently selected from the group consisting of deuterium, halogen atom, C1 to C6 alkyl, C3 to C6 cycloalkyl, C6 to C10 aryl or C4 to C10 heteroaryl. Each of $R_{33}$ to $R_{35}$ and $R_{38}$ to $R_{40}$ is independently selected from the group consisting of hydrogen, deuterium and C1 to C6 alkyl. Each of "o" and "q" is independently an integer of 0 to 4, and each of "p" and "r" is independently an integer of 0 to 6.

The upper EML include a third host and a third dopant as a blue dopant.

For example, the third host may be one of mCP, mCP—CN, mCBP, CBP-CN, CBP, 9-(3-(9H-carbazol-9-yl)phenyl)-3-(diphenylphosphoryl)-9H-carbazole (mCPPO1), 3,5-di(9H-carb azol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), bis(2-methylphenyl)diphenylsilane (UGH-1), 1,4-bis(triphenylsilyl)benzene (UGH-2), 1,3-bis(triphenylsilyl)benzene (UGH-3), 9,9-spiorobifluoren-2-yl-diphenyl-phosphine oxide (SPPO1), and 9,9'-(5-(triphenylsilyl)-1,3-phenylene)bis(9H-carbazole) (SimCP), but it is not limited thereto.

The third dopant as the blue dopant may be one of perylene, 4,4'-bis[4-(di-p-tolylamino)styryl]biphenyl (DPAVBi), 4-(di-p-tolylamino)-4-4'-[(di-p-tolylamino)styryl]stilbene (DPAVB), 4,4'-bis[4-(diphenylamino)styryl]biphenyl (BDAVBi), 2,5,8,11-tetra-tetr-butylperylene (TBPe), Bepp2, 9-(9-phenylcarbazole-3-yl)-10-(naphthalene-1-yl)anthracene (PCAN), mer-tris(1-phenyl-3-methylimidazolin-2-ylidene-C, C(2)'iridium(III) (mer-Ir(pmi)3), fac-tri s(1,3-diphenyl-benzimidazolin-2-ylidene-C,C(2)'iridium(ifi) (fac-Ir(dpbic)3), bis(3,4,5-trifluoro-2-(2-pyridyl)phenyl-(2-carboxypyridyl)iridium(III) (Ir(tfpd)2pic), Ir(Fppy)3), and bis[2-(4,6-difluorophenyl)pyridinato-C2,N](picolinato)iridium(III) (Flrpic), but it is not limited thereto.

For example, in each of the red and blue EMLs of the first EML 660, the second dopant and the third dopant may be doped by about 1 to 30 wt %.

The OLED D2 has a tandem structure, and one of the EMLs 660 and 760 includes the organometallic compound of the present disclosure. Accordingly, the OLED D2 provides white light with high emitting efficiency, high color purity and high emitting lifespan.

The OLED D2 is included in the organic light emitting display device 400 including the color filter layer 480 such that the organic light emitting display device 400 provides a full color image.

Figure 6:
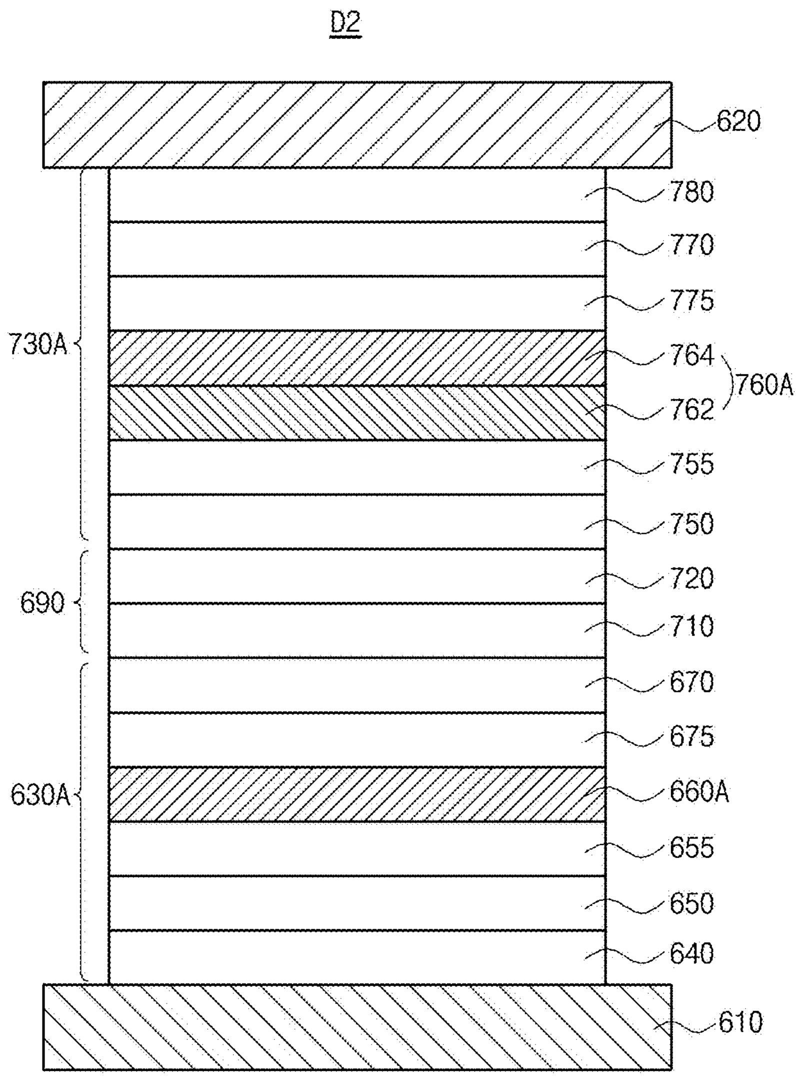
FIG. 6 is a schematic cross-sectional view of an OLED according to a fifth embodiment of the present disclosure.

FIG. 6 is a schematic cross-sectional view of an OLED according to a fifth embodiment of the present disclosure.

As shown in FIG. 6, the OLED D2 includes the first and second electrodes 610 and 620 facing each other, a first emitting unit 630A between the first and second electrodes 610 and 620, a second emitting unit 730A between the first emitting unit 630A and the second electrode 620, and the CGL 690 between the first and second emitting units 630A and 730A.

The first electrode 610 may be an anode, and the second electrode 620 may be a cathode.

The first emitting unit 630A includes a first EML 660A. The first emitting unit 630A may further include an HIL 640, a first HTL (a lower HTL) 650, and a first ETL (a lower ETL) 670. In addition, the first emitting unit 630A may further include at least one of a first EBL (a lower EBL) 655 between the first HTL 650 and the first EML 660A and a first HBL (a lower HBL) 675 between the first EML 660A and the first ETL 670.

The second emitting unit 730A includes a second EML 760A. The second emitting unit 730A may further include a second HTL (an upper HTL) 750, a second ETL (an upper ETL) 770 and an EIL 780. In addition, the second emitting unit 730A may further include at least one of a second EBL (an upper EBL) 755 between the second HTL 750 and the second EML 760A and a second HBL (an upper HBL) 775 between the second EBL 760A and the second ETL 770.

The CGL 690 is positioned between the first and second emitting units 630A and 730A. The CGL 690 includes an N-type CGL 710 adjacent to the first emitting unit 630A and a P-type CGL 720 adjacent to the second emitting unit 730A.

The OLED D2 of FIG. 6 has a difference in the first EML 660A and the second EML 760A from the OLED D2 of FIG. 5. Accordingly, the explanation is focused on the first EML 660A and the second EML 760A.

The second EML 760A includes a lower EML 762 between the second EBL 755 and the second HBL 775 and an upper EML 764 between the lower EML 762 and the second HBL 775. One of the lower and upper EMLs 762 and 764 includes the organometallic compound of the present disclosure to emit green or yellow-green light, and the other one of the lower and upper EMLs 762 and 764 emits red light. The OLED D2, where the lower EML 762 includes the organometallic compound of the present disclosure, will be explained.

The lower EML 762 of the second EML 760A includes a first host and a first dopant. The first host may be one of mCP—CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1. The first dopant is the organometallic compound of the present disclosure.

The upper EML 764 of the second EML 760A includes a second host and a second dopant as a red dopant. For example, the second dopant may be an organometallic compound of Formula 13 or Formula 14.

The first and second dopants may be doped by about 1 to 50 wt %, preferably about 1 to 30 wt % in the lower and upper EMLs 762 and 764, respectively. Each of the lower and upper EMLs 762 and 764 may have a thickness of about 10 to 100 nm, preferably about 10 to 50 nm, but it is not limited thereto.

The first EML 660A may be a blue EML. The first EML 660A includes a third host and a third dopant as a blue dopant. The third dopant may be doped by about 1 to 50 wt %, preferably about 1 to 30 wt % in the first EML 660A. The first EML 660A may have a thickness of about 10 to 200 nm, preferably about 20 to 100 nm, and more preferably about 20 to 50 nm, but it is not limited thereto.

The OLED D2 has a tandem structure, and one of the EMLs 660A and 760A includes the organometallic compound of the present disclosure. Accordingly, the OLED D2 provides white light with high emitting efficiency, high color purity and high emitting lifespan.

The OLED D2 is included in the organic light emitting display device 400 including the color filter layer 480 such that the organic light emitting display device 400 provides a full color image.

Figure 7:
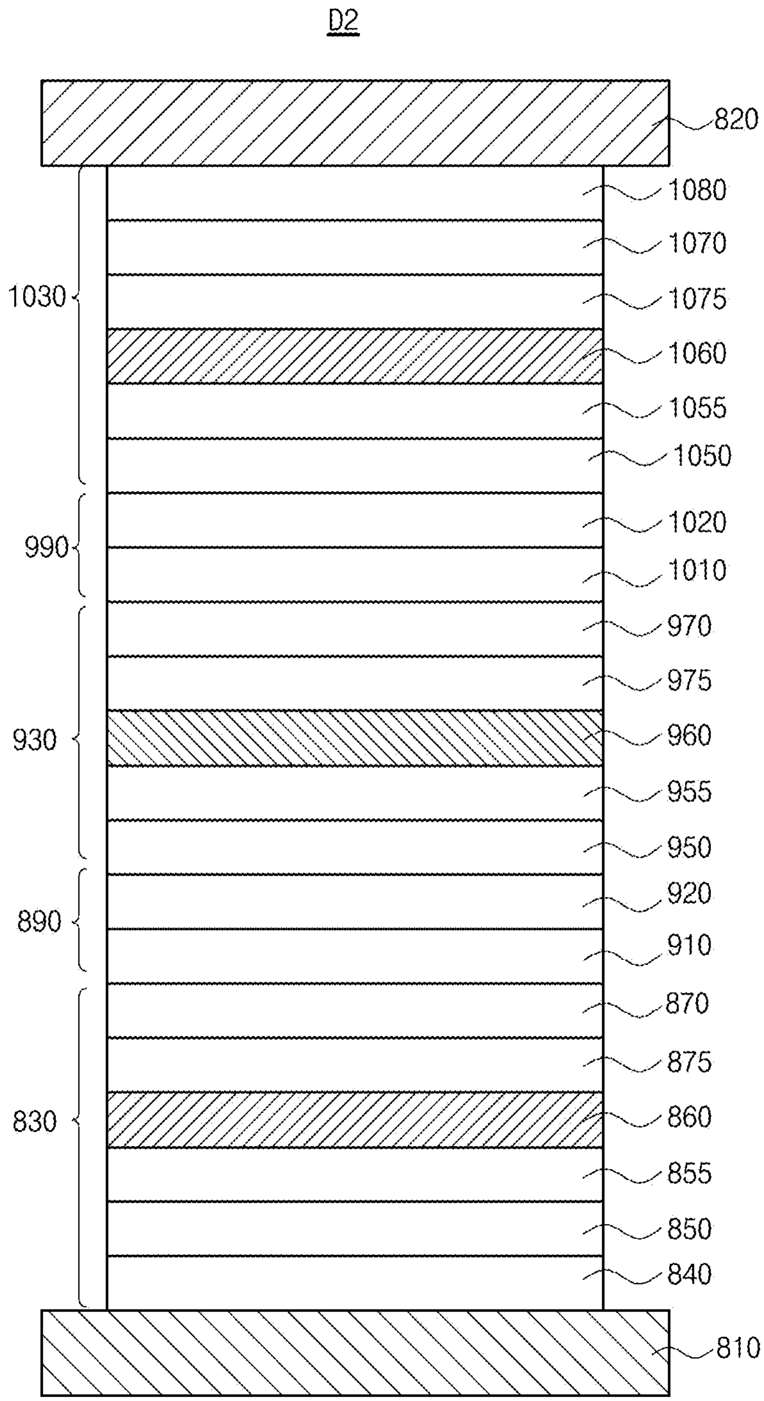
FIG. 7 is a schematic cross-sectional view of an OLED according to a sixth embodiment of the present disclosure.

FIG. 7 is a schematic cross-sectional view of an OLED according to a sixth embodiment of the present disclosure.

As shown in FIG. 7, the OLED 2 includes the first and second electrodes 810 and 820 facing each other, a first emitting unit 830 between the first and second electrodes 810 and 820, a second emitting unit 930 between the first emitting unit 830 and the second electrode 820, a third emitting unit 1030 between the second emitting unit 930 and the second electrode 820, a first CGL 890 between the first and second emitting units 830 and 930, and a second CGL 990 between the second and third emitting units 930 and 1030.

The first electrode 810 may be an anode, and the second electrode 820 may be a cathode.

The first emitting unit 830 includes a first EML 860. The first emitting unit 830 may further include an HIL 840, a first HTL 850, and a first ETL 870. In addition, the first emitting unit 830 may further include at least one of a first EBL 855 between the first HTL 850 and the first EML 860 and a first HBL 875 between the first EML 860 and the first ETL 870.

The second emitting unit 930 includes a second EML 960. The second emitting unit 930 may further include a second HTL 950 and a second ETL 970. In addition, the second emitting unit 930 may further include at least one of a second EBL 955 between the second HTL 950 and the second EML 960 and a second HBL 975 between the second EML 960 and the second ETL 970.

The third emitting unit 1030 includes a third EML 1060. The third emitting part 1030 may further include a third HTL 1050, a third ETL 1070 and an EIL 1080. In addition, the third emitting unit 1030 may further include at least one of a third EBL 1055 between the third HTL 1050 and the third EML 1060 and a third HBL 1075 between the third EML 1060 and the third ETL 1070.

In this instance, at least one of the first to third EMLs 860, 960 and 1030 includes the organometallic compound of the present disclosure and emits green light or yellow-green light. For example, one of the first to third EMLs 860, 960 and 1030 may include the organometallic compound of the present disclosure and emits green light or yellow-green light. Another one of the first to third EMLs 860, 960 and 1030 may emit red light, and the other one of the first to third EMLs 860, 960 and 1030 may emit blue light. Accordingly, the OLED D2 provides white emission.

The OLED D2, where the second EML 960 includes the organometallic compound of the present disclosure to emit green light or yellow-green light, and the first and third EMLs 860 and 1030 respectively emit red light and blue light, will be explained.

The first CGL 890 is positioned between the first and second emitting units 830 and 930, and the second CGL 990 is positioned between the second and third emitting units 930 and 1030. The first CGL 890 may include a first N-type CGL 910 adjacent to the first emitting unit 830 and a first P-type CGL 920 adjacent to the second emitting unit 930. The second CGL 890 may include a second N-type CGL 1010 adjacent to the second emitting unit 930 and a second P-type CGL 1020 adjacent to the third emitting unit 1030. The first and second N-type CGLs 910 and 1010 respectively provide an electron into the first and second emitting units 830 and 930, and the first and second P-type CGLs 920 and 1020 respectively provide a hole into the second and third emitting units 930 and 1030.

The second EML 960 includes a first host and a first dopant, and the first dopant is the organometallic compound of the present disclosure. Green light or yellow-green light is provided from the second EML 960. For example, the first host may be one of mCP—CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1, but it is not limited thereto.

The first dopant may be doped by about 1 to 50 wt %, preferably about 1 to 30 wt % with respect to the second EML 960. For example, the second EML 960 may have a thickness of about 10 to 200 nm, preferably about 20 to 100 nm, and more preferably about 20 to 50 nm.

The first EML 860 may be a red EML. The first EML 860 includes a second host and a second dopant as a red dopant. The third EML 1060 may be a blue EML. The third EML 1060 includes a third host and a third dopant as a blue dopant.

The second and third dopant may be doped by about 1 to 50 wt %, preferably about 1 to 30 wt % with respect to the first and third EMLs 860 and 1060. For example, each of the first and third EMLs 860 and 1060 may have a thickness of about 10 to 200 nm, preferably about 20 to 100 nm, and more preferably about 20 to 50 nm.

The OLED D2 has a tandem structure including the first emitting unit 830, which includes the first EML 860 emitting red light, the second emitting unit 930, which includes the second EML 960 emitting green light or yellow-green light, and the third emitting unit 1030, which includes the third EML 1060 emitting blue light, such that the white emission is provided from the OLED 2.

In addition, since one of the first to third EMLs 860, 960 and 1060 includes the organometallic compound of the present disclosure, the emitting efficiency, the color purity and the lifespan of the OLED D2 and the organic light emitting display device 400 are improved.

The OLED D2 is included in the organic light emitting display device 400 including the color filter layer 480 such that the organic light emitting display device 400 provides a full color image.

Figure 8:
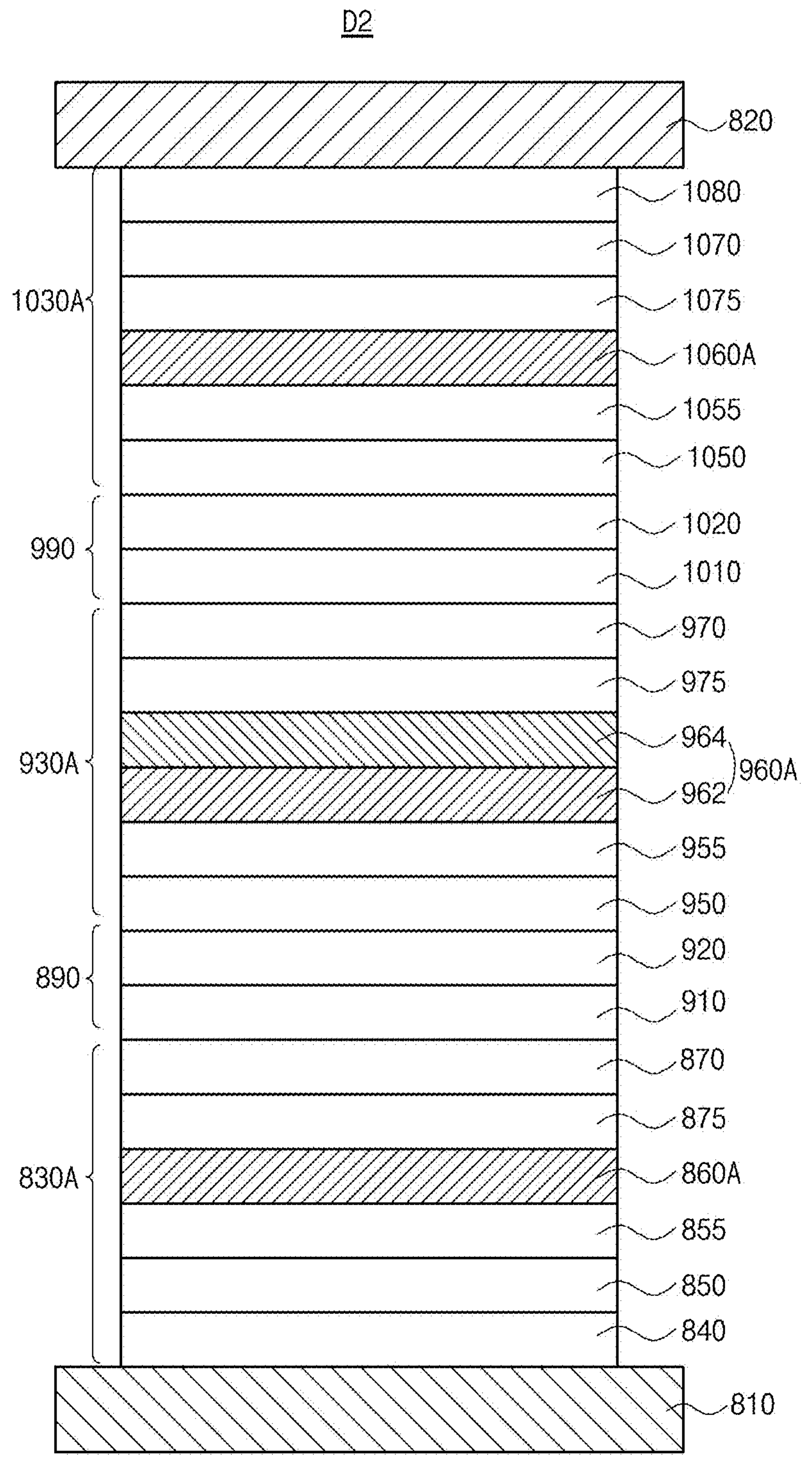
FIG. 8 is a schematic cross-sectional view of an OLED according to an seventh embodiment of the present disclosure.

FIG. 8 is a schematic cross-sectional view of an OLED according to an seventh embodiment of the present disclosure.

As shown in FIG. 8, the OLED 2 includes the first and second electrodes 810 and 820 facing each other, a first emitting unit 830A between the first and second electrodes 810 and 820, a second emitting unit 930A between the first emitting unit 830A and the second electrode 820, a third emitting unit 1030A between the second emitting unit 930A and the second electrode 820, a first CGL 890 between the first and second emitting units 830A and 930A, and a second CGL 990 between the second and third emitting units 930A and 1030A.

The first electrode 810 may be an anode, and the second electrode 820 may be a cathode.

The first emitting unit 830A includes a first EML 860A. The first emitting unit 830A may further include an HIL 840, a first HTL 850, and a first ETL 870. In addition, the first emitting unit 830A may further include at least one of a first EBL 855 between the first HTL 850 and the first EML 860A and a first HBL 875 between the first EML 860A and the first ETL 870.

The second emitting unit 930A includes a second EML 960A. The second emitting unit 930A may further include a second HTL 950 and a second ETL 970. In addition, the second emitting unit 930A may further include at least one of a second EBL 955 between the second HTL 950 and the second EML 960A and a second HBL 975 between the second EML 960A and the second ETL 970.

The third emitting unit 1030A includes a third EML 1060A. The third emitting part 1030A may further include a third HTL 1050, a third ETL 1070 and an EIL 1080. In addition, the third emitting unit 1030A may further include at least one of a third EBL 1055 between the third HTL 1050 and the third EML 1060A and a third HBL 1075 between the third EML 1060A and the third ETL 1070.

The first CGL 890 between the first and second emitting units 830A and 930A may include a first N-type CGL 910 adjacent to the first emitting unit 830A and a first P-type CGL 920 adjacent to the second emitting unit 930A. The second CGL 890 between the second and third emitting units 930A and 1030A may include a second N-type CGL 1010 adjacent to the second emitting unit 930A and a second P-type CGL 1020 adjacent to the third emitting unit 1030A.

The OLED D2 of FIG. 8 has a difference in the first to third EMLs 860A, 960A and 1060A from the OLED D2 of FIG. 7. Accordingly, the explanation is focused on the first to third EMLs 860A, 960A and 1060A.

At least one of the first to third EMLs 860A, 960A and 1030A includes the organometallic compound of the present disclosure. The OLED D2, where the second EML 960A includes the organometallic compound of the present disclosure, is explained.

The second EML 960A includes a lower EML 962 and an upper EML 964 between the lower EML 962 and the second CGL 990. The lower EML 962 may be positioned between the second EBL 955 and the second HBL 975, and the upper EML 964 may be positioned between the lower EML 962 and the second HBL 975. One of the lower and upper EMLs 962 and 964 includes the organometallic compound of the present disclosure to emit green light or yellow-green light, and the other one of the lower and upper EMLs 962 and 964 may emit red light. The OLED D2, where the lower EML 962 includes the organometallic compound of the present disclosure, is explained.

The lower EML 962 of the second EML 960A includes a first host and a first dopant. The first host may be one of mCP—CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP and TCz1. The first dopant is the organometallic compound of the present disclosure.

The upper EML 964 of the second EML 960A includes a second host and a second dopant as a red dopant. For example, the second dopant may be an organometallic compound of Formula 13 or Formula 14.

The first and second dopants may be doped by about 1 to 50 wt %, preferably about 1 to 30 wt % in the lower and upper EMLs 962 and 964, respectively. Each of the lower and upper EMLs 962 and 964 may have a thickness of about 10 to 100 nm, preferably about 10 to 50 nm, but it is not limited thereto.

Each of the first and third EMLs 860A and 1060A may be a blue EML. Each of the first and third EMLs 860A and 1060A may include a third host and a third dopant as a blue dopant. The third host of the first EML 860A may be the same as or different from the third host of the third EML 1060A. The third dopant of the first EML 860A may be the same as or different from the third dopant of the third EML 1060A.

The third dopant may be doped by about 1 to 50 wt %, preferably about 1 to 30 wt % in the first and third EML 860A and 1060A. Each of the first and third EMLs 860A and 1060A may have a thickness of about 10 to 200 nm, preferably about 20 to 100 nm, and more preferably about 20 to 50 nm, but it is not limited thereto.

The OLED D2 has a tandem structure, and one of the EMLs 860A, 960A and 1030A includes the organometallic compound of the present disclosure. Accordingly, the OLED D2 provides white light with high emitting efficiency, high color purity and high emitting lifespan.

The OLED D2 is included in the organic light emitting display device 400 including the color filter layer 480 such that the organic light emitting display device 400 provides a full color image.

It will be apparent to those skilled in the art that various modifications and variations can be made in the present disclosure without departing from the spirit or scope of the invention. Thus, it is intended that the present disclosure cover the modifications and variations of this invention provided they come within the scope of the appended claims and their equivalents.

What is claimed is:

1. An organometallic compound of Formula 1:

[Formula 1]

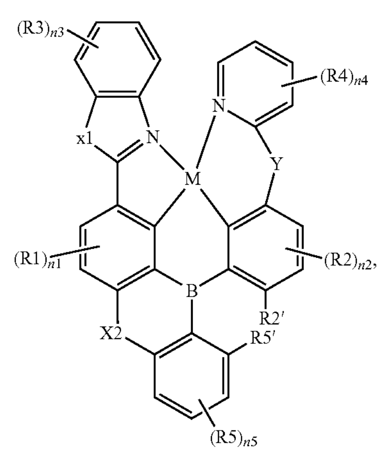

wherein M is platinum (Pt) or palladium (Pd), and X1 is selected from the group consisting of oxygen (O), sulfur (S), and $NR_6$, wherein X2 is $NR_6$, wherein Y is selected from the group consisting of a single bond, *—O—*, *—S—*, *—Se—* *—CR7R8-*, *—CR7═CR8-*, *—NR9-*, *—C(═O)—*, *—S(═O)—*, *—S(═O)$_2$—*, and *—SiR7R8-*, wherein each of R1 to R9 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic, C3 to C20 heteroalicyclic, C6 to C30 aromatic, and C3 to C30 heteroaromatic, or adjacent two of R1 to R9 are combined with each other to form a fused ring, R2' and R5' are combined with each other to form a fused ring, and wherein each of n1, n2, and n5 is independently an integer of 0 to 2, and each of n3 and n4 is independently an integer of 0 to 4.

2. The organometallic compound according to claim 1, wherein the Formula 1 is represented by Formula 2:

[Formula 2]

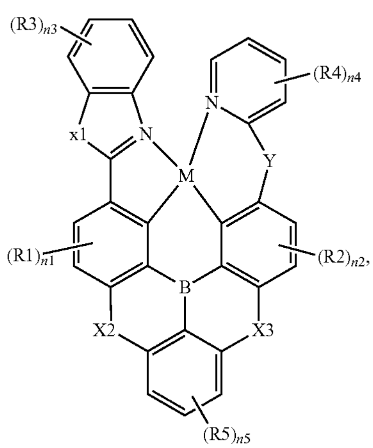

wherein X3 is NR10, O, S, or CR11R12, and wherein each of R10 to R12 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 cycloaliphatic group, C3 to C20 heteroalicyclic group, C6 to C30 aromatic group, and C3 to C30 heteroaromatic group.

3. The organometallic compound according to claim 1, wherein the Formula 1 is represented by one of Formulas 3-1 to 3-3:

[Formula 3-1]

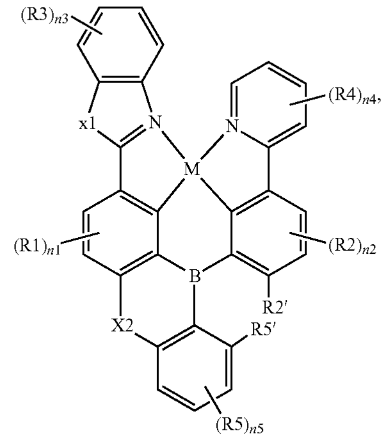

[Formula 3-2]

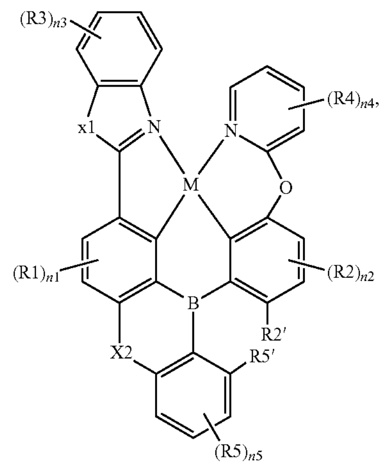

and

[Formula 3-3]

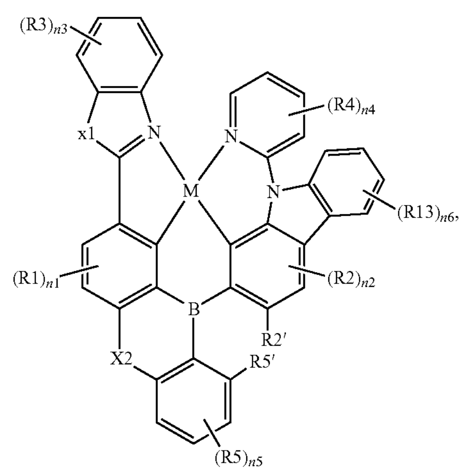

wherein R13 is selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic group, C3 to C20 heteroalicyclic group, C6 to C30 aromatic, and C3 to C30 heteroaromatic group, and n6 is an integer of 0 to 4.

4. The organometallic compound according to claim 1, wherein the Formula 1 is represented by one of Formulas 4-1 to 4-3:

[Formula 4-1]

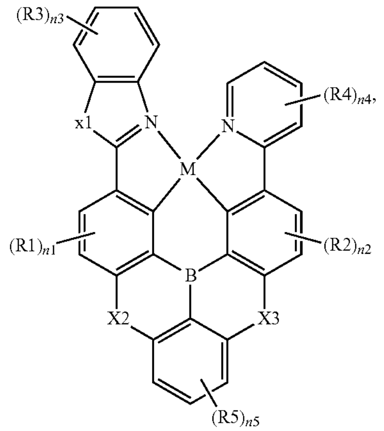

[Formula 4-2]

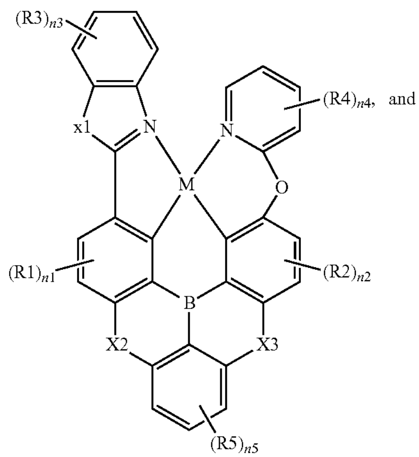

[Formula 4-3]

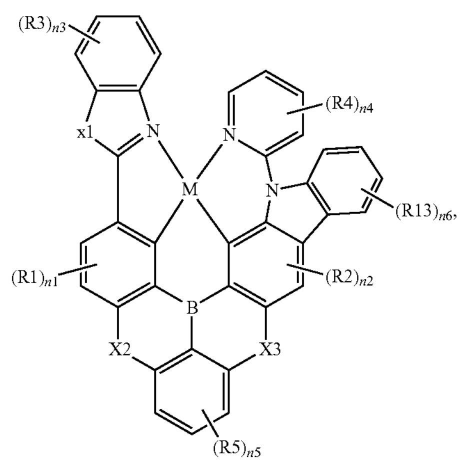

wherein X3 is NR10, O, S or CR11R12, and each of R10 to R12 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic group, C3 to C20 heteroalicyclic group, C6 to C30 aromatic group, and C3 to C30 heteroaromatic group, and wherein R13 is selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic group, C3 to C20 heteroalicyclic group, C6 to C30 aromatic, and C3 to C30 heteroaromatic group, and n6 is an integer of 0 to 4.

5. The organometallic compound according to claim 1, wherein the organometallic compound is selected from:

1

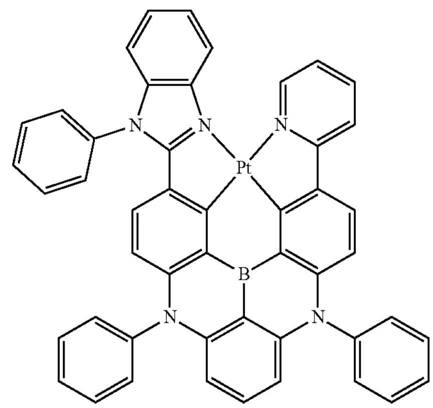

8

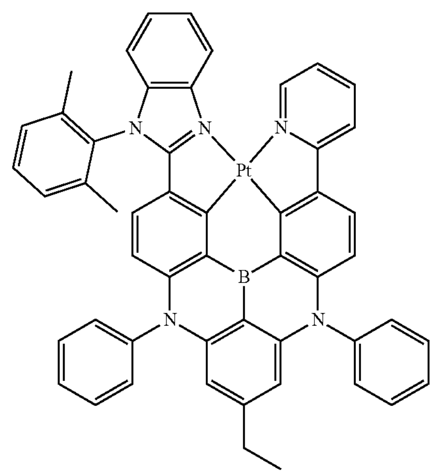

12

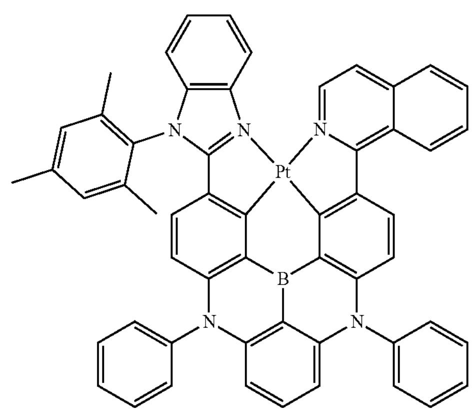

31
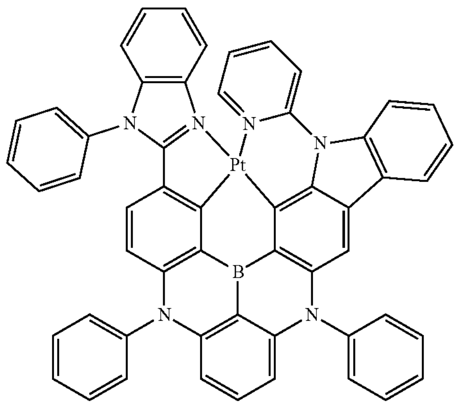
38
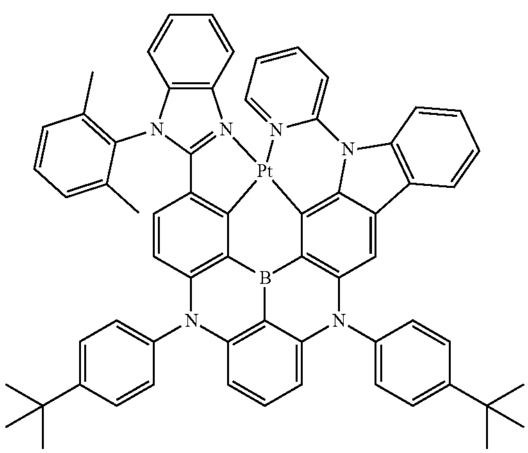
96
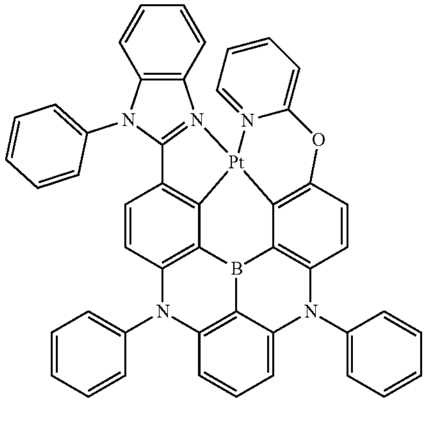
102
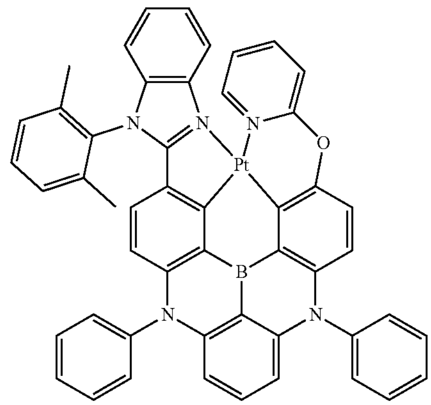
113
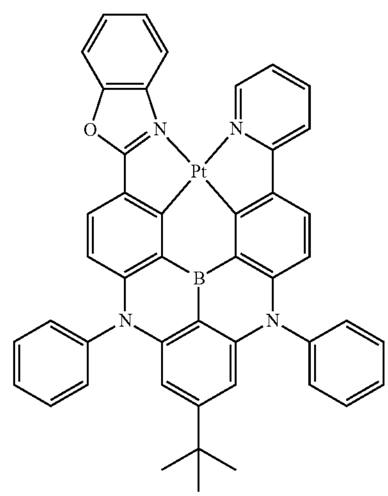
118
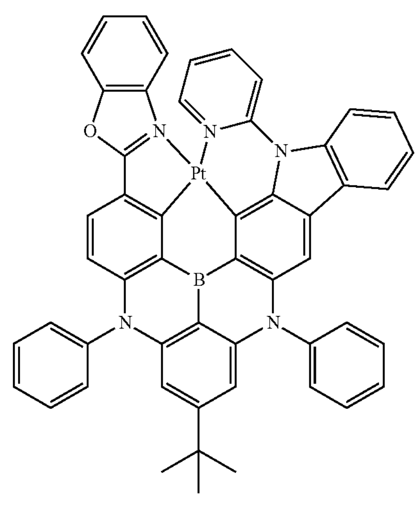

-continued

123

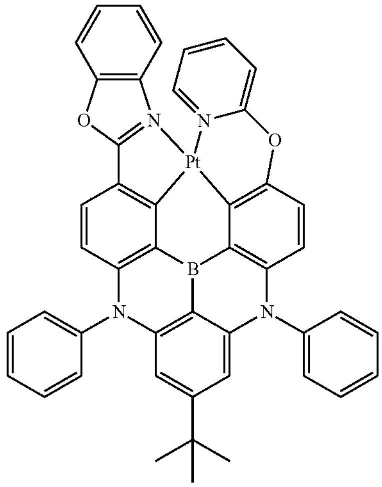

143

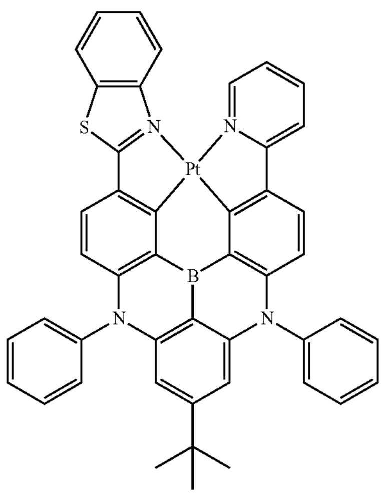

148

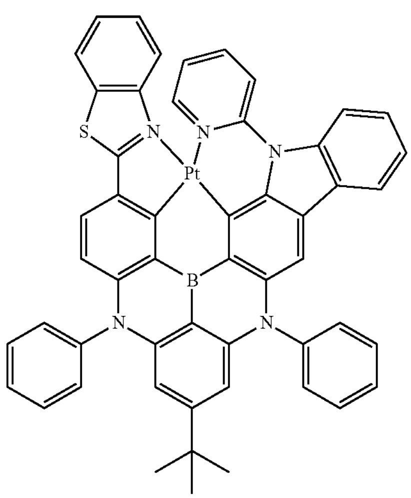

-continued

153

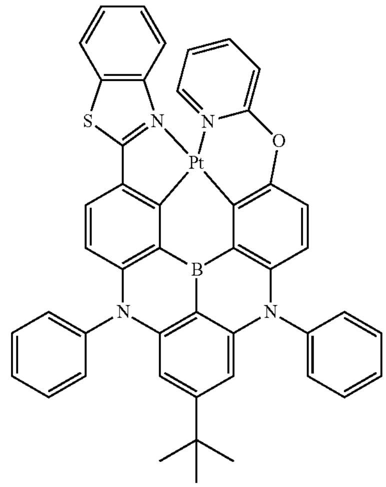

6. An organic light emitting diode, comprising:

a first electrode;

a second electrode facing the first electrode; and a first emitting unit positioned between the first and second electrodes and including a first emitting material layer, wherein the first emitting material layer includes an organometallic compound of Formula 1:

[Formula 1]

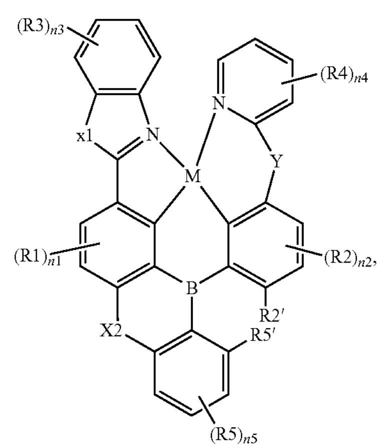

wherein M is platinum (Pt) or palladium (Pd), and X1 is selected from the group consisting of oxygen (O), sulfur (S) and $NR_6$, wherein X2 is $NR_6$, wherein Y is selected from the group consisting of a single bond, *—O—*, *—S—*, *—Se—* *—CR7R8-*, *—CR7-CR8-*, *—NR9-*, *—C(═O)—*, *—S(═O)—*, *—S(═O)$_2$—*, and *—SiR7R8-*, wherein each of R1 to R9 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic, C3 to C20 heteroalicyclic, C6 to C30 aromatic, and C3 to C30 heteroaromatic, or adjacent two of R1 to R9 are combined with each other to form a fused ring, R2' and R5' are combined with each other to form a fused ring, and wherein each of n1, n2, and n5 is independently an integer of 0 to 2, and each of n3 and n4 is independently an integer of 0 to 4.

7. The organic light emitting diode according to claim 6, wherein the first emitting material layer includes a first host and a first dopant, and the first dopant is the organometallic compound.

8. The organic light emitting diode according to claim 6, further comprising:

a second emitting unit including a second emitting material layer and positioned between the first emitting unit and the first electrode; and a first charge generation layer positioned between the first and second emitting units, wherein the second emitting material layer includes a blue dopant.

9. The organic light emitting diode according to claim 8, wherein the first emitting unit further includes a third emitting material layer on or under the first emitting material layer, and wherein the third emitting material layer includes a red dopant.

10. The organic light emitting diode according to claim 8, further comprising:

a third emitting unit positioned between the first emitting unit and the second electrode and including a third emitting material layer; and a second charge generation layer positioned between the first and third emitting units, wherein the third emitting material layer includes a green dopant.

11. The organic light emitting diode according to claim 8, further comprising:

a third emitting unit positioned between the first emitting unit and the second electrode and including a third emitting material layer; and a second charge generation layer positioned between the first and third emitting units, wherein the first emitting unit further includes a fourth emitting material layer on or under the first emitting material layer, and wherein the third emitting material layer includes a blue dopant, and the fourth emitting material layer includes a red dopant.

12. The organic light emitting diode according to claim 6, wherein the Formula 1 is represented by Formula 2:

[Formula 2]

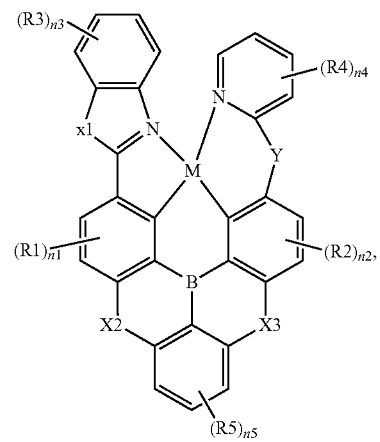

wherein X3 is NR10, O, S, or CR11R12, and wherein each of R10 to R12 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 cycloaliphatic group, C3 to C20 heteroalicyclic group, C6 to C30 aromatic group, and C3 to C30 heteroaromatic group.

13. The organic light emitting diode according to claim 6, wherein the organometallic compound is selected from:

1

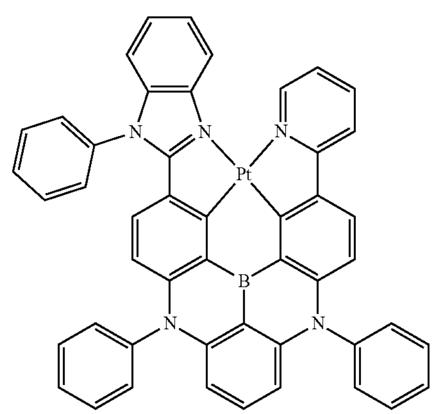

-continued
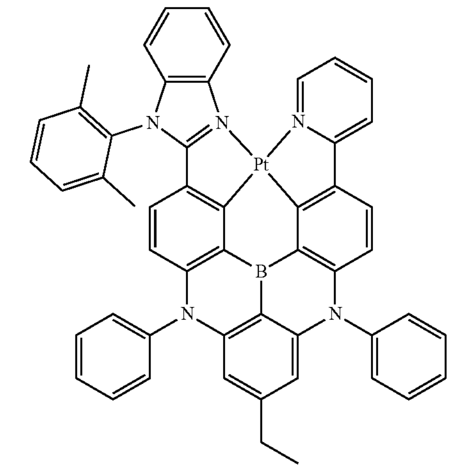
8
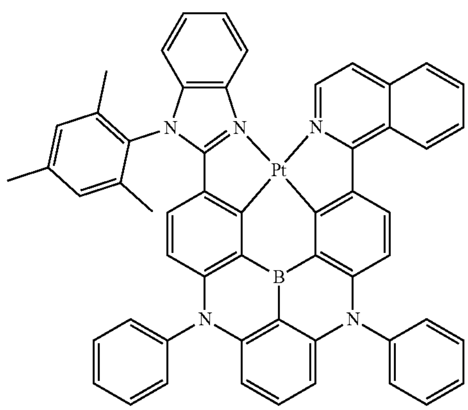
12
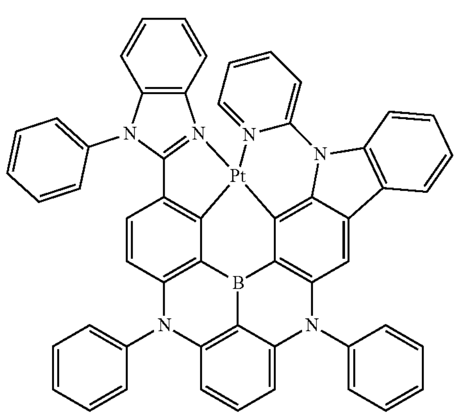
31
-continued
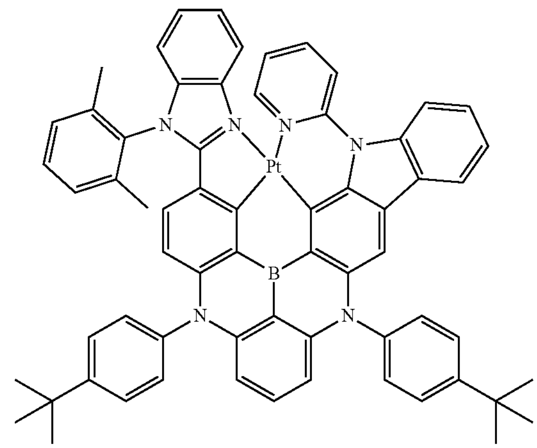
38
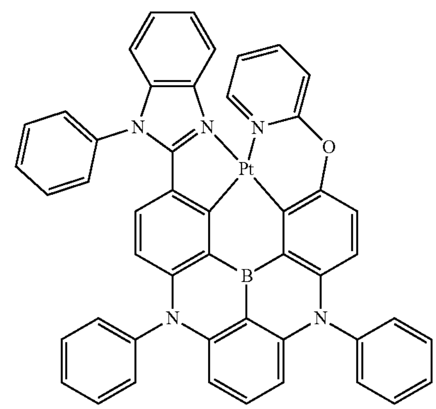
96
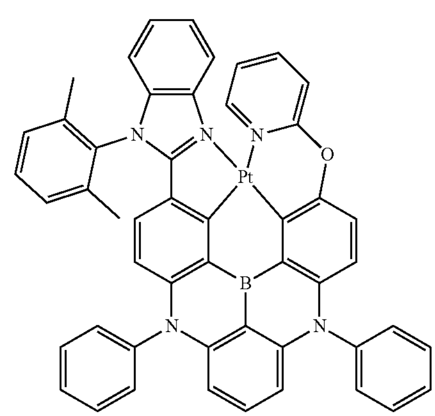
102

-continued
113
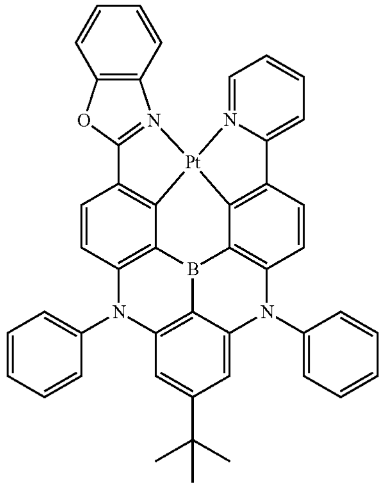
118
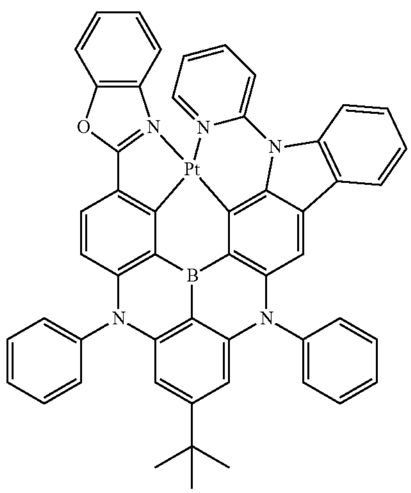
123
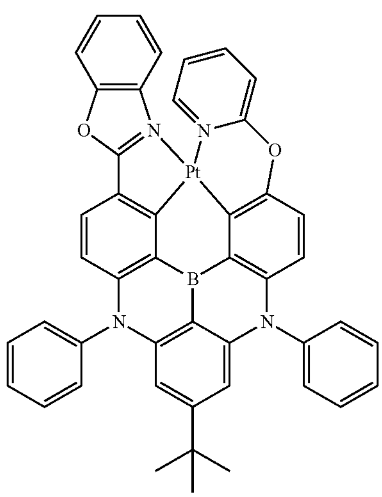
-continued
143
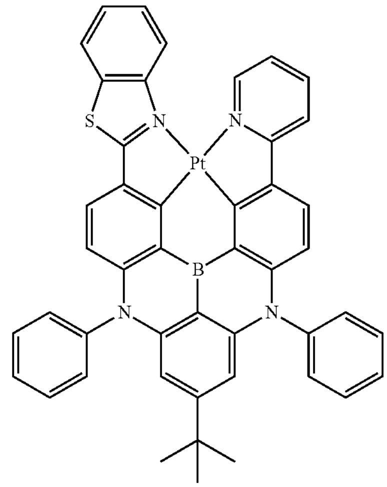
148
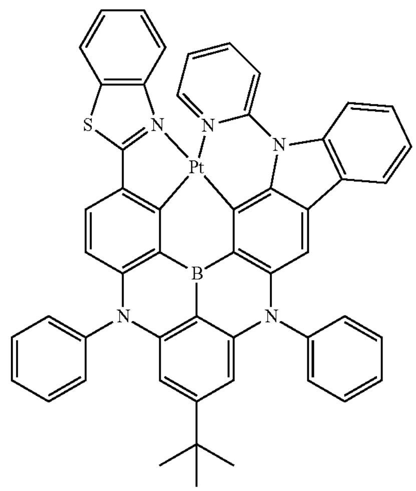
153
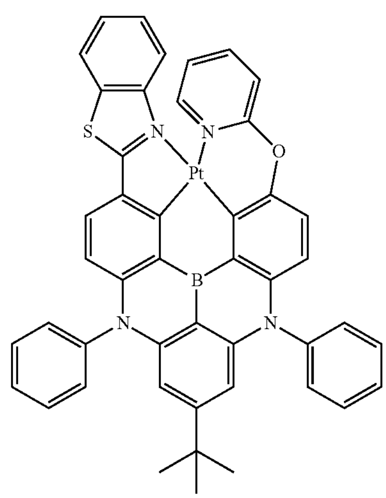
14. An organic light emitting display device, comprising:
a substrate;
an organic light emitting diode disposed on or over the substrate, the organic light emitting diode including:
a first electrode;
a second electrode facing the first electrode;

a first emitting unit positioned between the first and second electrodes and including a first emitting material layer; and a thin film transistor positioned between the substrate and the organic light emitting diode and connected to the organic light emitting diode, wherein the first emitting material layer includes an organometallic compound of Formula 1:

[Formula 1]

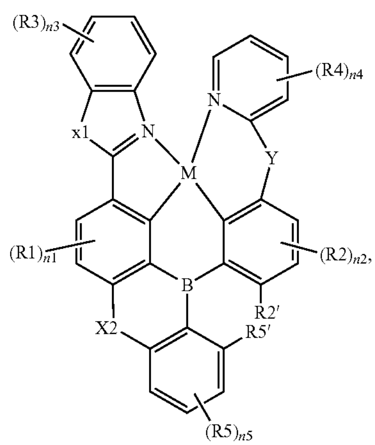

wherein M is platinum (Pt) or palladium (Pd), and X1 is selected from the group consisting of oxygen (O), sulfur (S), and $NR_6$, wherein X2 is $NR_6$, wherein Y is selected from the group consisting of a single bond, *—O—*, *—S—*, *—Se—*, *—CR7R8-*, *—CR7=CR8-*, *—NR9-*, *—C(=O)—*, *—S(=O)—*, *—S(=O)$_2$—*, and *—SiR7R8-*, wherein each of R1 to R9 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic, C3 to C20 heteroalicyclic, C6 to C30 aromatic, and C3 to C30 heteroaromatic, or adjacent two of R1 to R9 are combined with each other to form a fused ring, R2' and R5' are combined with each other to form a fused ring, and wherein each of n1, n2, and n5 is independently an integer of 0 to 2, and each of n3 and n4 is independently an integer of 0 to 4.

15. The organic light emitting display device according to claim 14, wherein the organic light emitting diode further includes:

a second emitting unit including a second emitting material layer and positioned between the first emitting unit and the first electrode; and a first charge generation layer positioned between the first and second emitting units, wherein the second emitting material layer includes a blue dopant.

16. The organic light emitting display device according to claim 15, wherein the first emitting unit further includes a third emitting material layer on or under the first emitting material layer, and wherein the third emitting material layer includes a red dopant.

17. The organic light emitting display device according to claim 15, wherein the organic light emitting diode further includes:

a third emitting unit positioned between the first emitting unit and the second electrode and including a third emitting material layer; and a second charge generation layer positioned between the first and third emitting units, wherein the third emitting material layer includes a green dopant.

18. The organic light emitting display device according to claim 15, wherein the organic light emitting diode further includes:

a third emitting unit positioned between the first emitting unit and the second electrode and including a third emitting material layer; and a second charge generation layer positioned between the first and third emitting units, wherein the first emitting unit further includes a fourth emitting material layer on or under the first emitting material layer, and wherein the third emitting material layer includes a blue dopant, and the fourth emitting material layer includes a red dopant.

19. The organic light emitting display device according to claim 15, wherein a red pixel, a green pixel and a blue pixel are defined on the substrate, and the organic light emitting diode corresponds to each of the red, green and blue pixels, and wherein the organic light emitting device further includes:

a color filter layer disposed between the substrate and the organic light emitting diode or on the organic light emitting diode and corresponding to the red, green and blue pixels.

20. The organic light emitting display device according to claim 14, wherein the Formula 1 is represented by Formula 2:

[Formula 2]

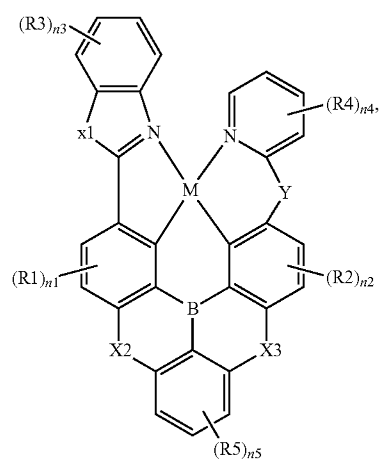

wherein X3 is NR10, O, S, or CR11R12, and wherein each of R10 to R12 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 cycloaliphatic group, C3 to C20 heteroalicyclic group, C6 to C30 aromatic group, and C3 to C30 heteroaromatic group.

21. An organometallic compound is represented by Formula 4-3:

[Formula 4-3]

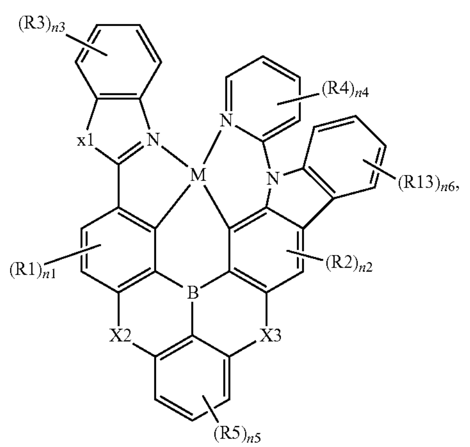

wherein M is platinum (Pt) or palladium (Pd), wherein X1 is selected from the group consisting of oxygen (O), sulfur (S), and $NR_6$, and X2 is $NR_6$, wherein each of R1 to R6 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic, C3 to C20 heteroalicyclic, C6 to C30 aromatic, and C3 to C30 heteroaromatic, or adjacent two of R1 to R6 are combined with each other to form a fused ring, wherein each of n1, n2, and n5 is independently an integer of 0 to 2, and each of n3 and n4 is independently an integer of 0 to 4, wherein R13 is selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic group, C3 to C20 heteroalicyclic group, C6 to C30 aromatic, and C3 to C30 heteroaromatic group, and n6 is an integer of 0 to 4, and wherein X3 is NR10, O, S or CR11R12, and each of R10 to R12 is independently selected from the group consisting of deuterium, halogen, hydroxy group, cyano group, nitro group, amidino group, hydrazine group, hydrazone group, C1 to C20 alkyl group, C2 to C20 alkenyl group, C2 to C20 alkynyl group, C1 to C20 alkoxy group, C3 to C20 alicyclic group, C3 to C20 heteroalicyclic group, C6 to C30 aromatic group, and C3 to C30 heteroaromatic group.

22. The organometallic compound according to claim 21, wherein the organometallic compound is selected from:

31

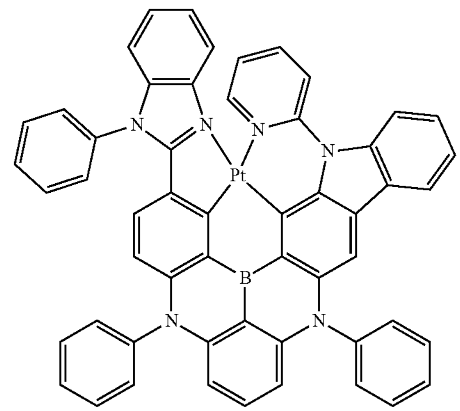

32

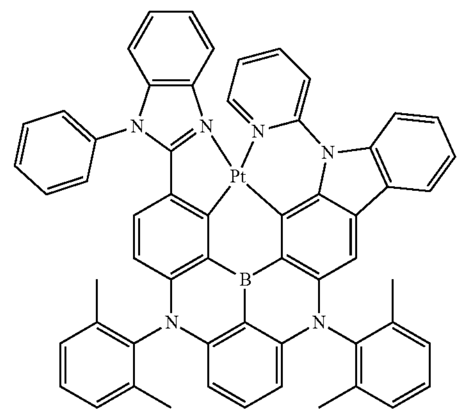

33

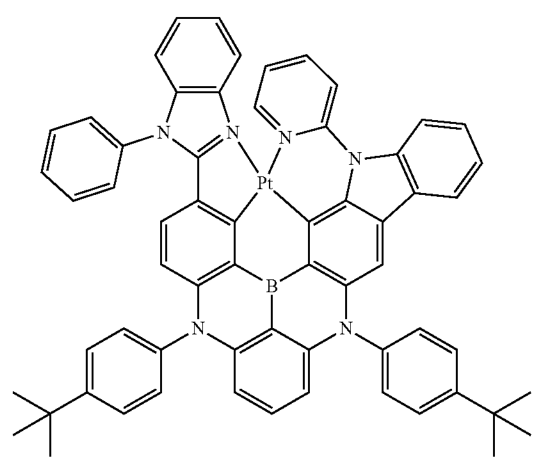

-continued
34
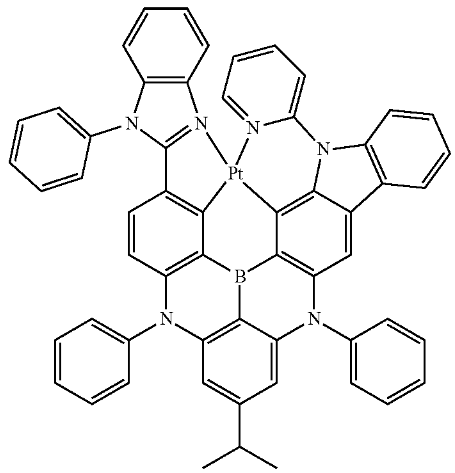
35
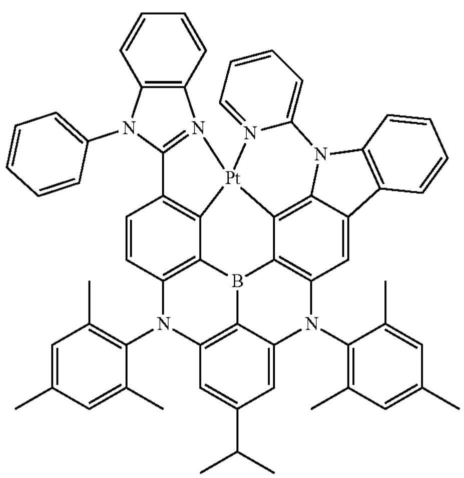
36
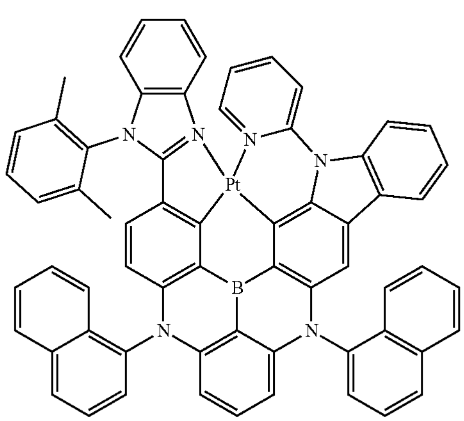
-continued
37
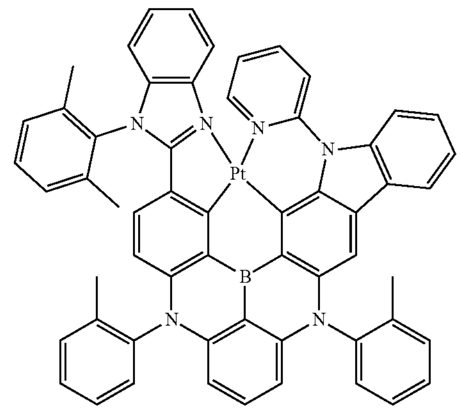
38
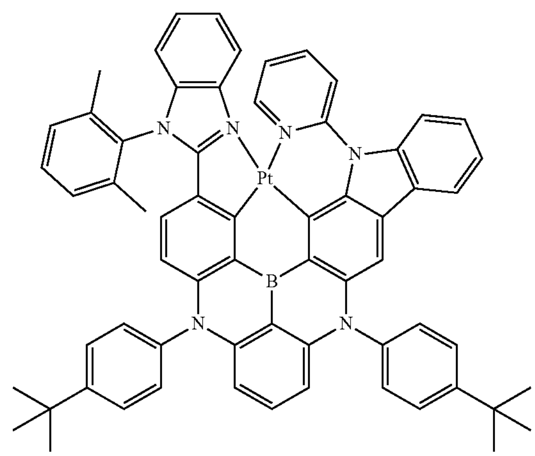
39
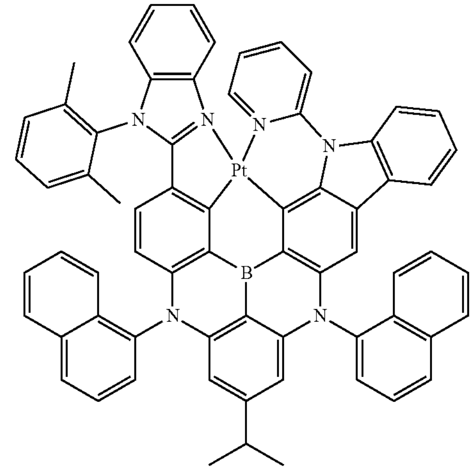

-continued
40
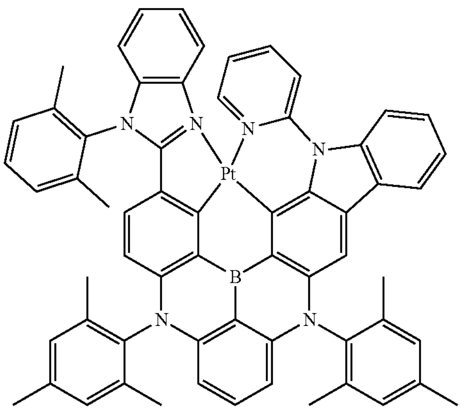
116
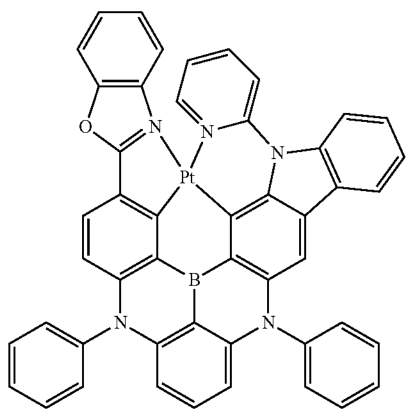
117
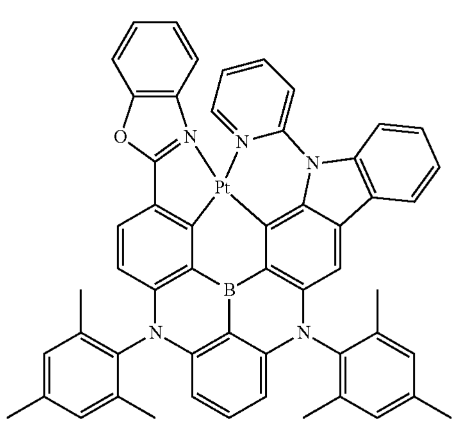
-continued
118
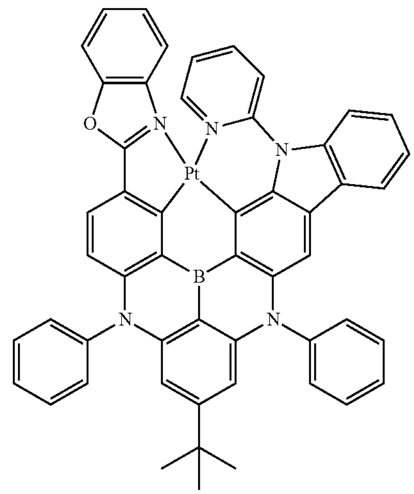
119
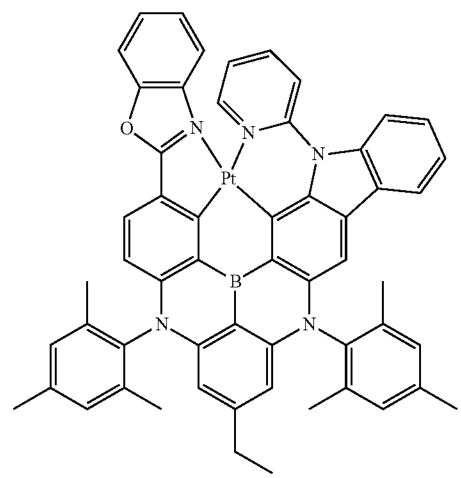
120
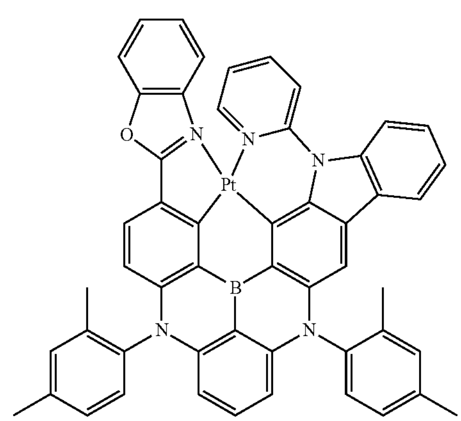

146
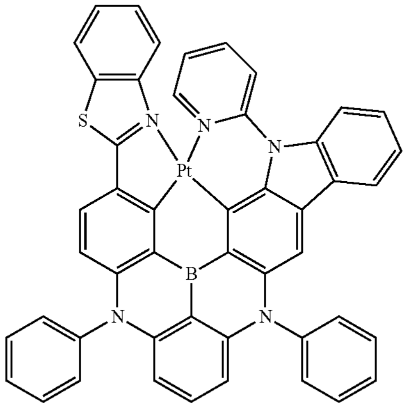
147
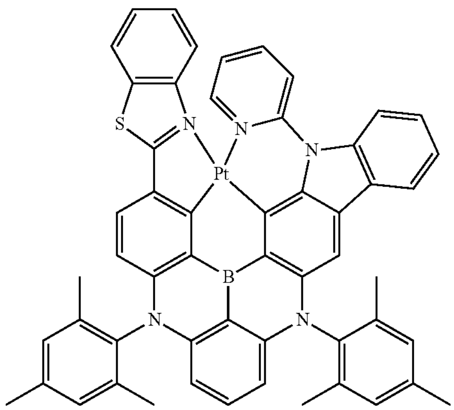
148
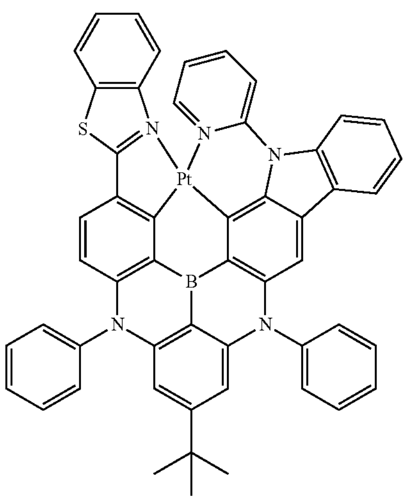
149
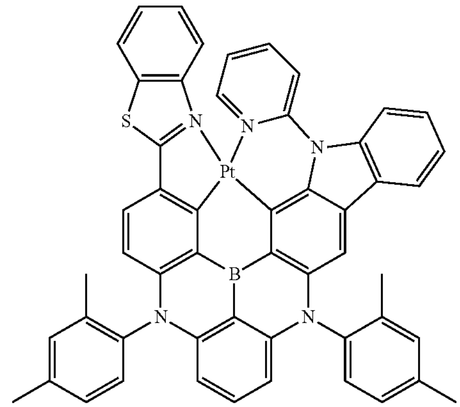
150
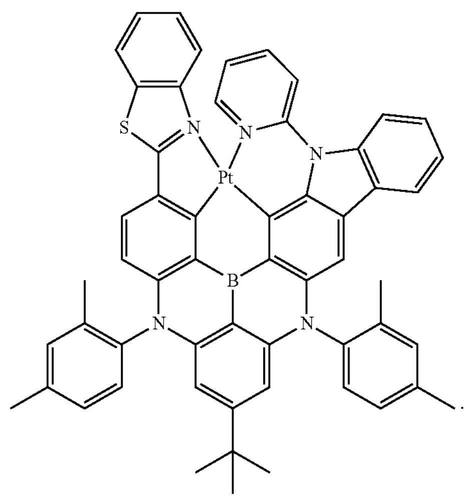
* * * * *